(12) United States Patent
Schwab

(10) Patent No.: US 10,558,026 B2
(45) Date of Patent: Feb. 11, 2020

(54) PROJECTION OPTICAL UNIT FOR IMAGING AN OBJECT FIELD INTO AN IMAGE FIELD, AND PROJECTION EXPOSURE APPARATUS COMPRISING SUCH A PROJECTION OPTICAL UNIT

(71) Applicant: Carl Zeiss SMT GmbH, Oberkochen (DE)

(72) Inventor: Markus Schwab, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/139,474

(22) Filed: Sep. 24, 2018

(65) Prior Publication Data

US 2019/0025562 A1    Jan. 24, 2019

Related U.S. Application Data

(63) Continuation of application No. 14/962,130, filed on Dec. 8, 2015, now Pat. No. 10,146,033, which is a (Continued)

(30) Foreign Application Priority Data

Jul. 29, 2013 (DE) .......................... 10 2013 214 770
Feb. 21, 2014 (DE) .......................... 10 2014 203 190
May 9, 2014 (DE) .......................... 10 2014 208 770

(51) Int. Cl.
    *G03B 27/54* (2006.01)
    *G02B 17/06* (2006.01)
    (Continued)

(52) U.S. Cl.
    CPC ....... *G02B 17/0663* (2013.01); *G02B 5/0891* (2013.01); *G03F 7/70008* (2013.01); *G03F 7/70233* (2013.01); *G21K 1/067* (2013.01)

(58) Field of Classification Search
    CPC ............ G02B 17/0663; G02B 17/0647; G02B 5/0891; G03F 7/70008; G03F 7/70233; G21K 1/067
    See application file for complete search history.

(56) References Cited

U.S. PATENT DOCUMENTS

| 2,759,106 A | 8/1956 | Wolter |
| 2,766,385 A | 10/1956 | Gunther et al. |
(Continued)

FOREIGN PATENT DOCUMENTS

| CN | 102012558 A | 4/2011 |
| DE | 199 23 609 A1 | 12/1999 |
(Continued)

OTHER PUBLICATIONS

Japanese office action, with English translation, for corresponding JP Application No. 2016-530459, dated Aug. 6, 2018.
(Continued)

*Primary Examiner* — Peter B Kim
(74) *Attorney, Agent, or Firm* — Fish & Richardson P.C.

(57) ABSTRACT

A projection optical unit images an object field in an image field. The projection optical unit includes a plurality of mirrors guides imaging light from the object field to the image field. At least two of the mirrors are arranged directly behind one another in the beam path of the imaging light for grazing incidence with an angle of incidence of the imaging light which is greater than 60°. This results in an imaging optical unit that can exhibit a well-corrected imageable field with, at the same time, a high imaging light throughput.

20 Claims, 29 Drawing Sheets

Related U.S. Application Data continuation of application No. PCT/EP2014/066072, filed on Jul. 25, 2014.

(51) Int. Cl.
*G03F 7/20* (2006.01)
*G02B 5/08* (2006.01)
*G21K 1/06* (2006.01)

(56) References Cited

U.S. PATENT DOCUMENTS

| | | | |
|---|---|---|---|
| 5,524,039 | A | 6/1996 | Kamon |
| 6,244,717 | B1 | 6/2001 | Dinger |
| 6,577,443 | B2 | 6/2003 | Dinger et al. |
| 8,027,022 | B2 | 9/2011 | Zellner et al. |
| 10,146,033 | B2 * | 12/2018 | Schwab ............. G03F 7/70233 |
| 2005/0195506 | A1 | 9/2005 | McGuire, Jr. |
| 2007/0058269 | A1 | 3/2007 | Mann et al. |
| 2009/0027644 | A1 | 1/2009 | Zellner et al. |
| 2009/0051890 | A1 * | 2/2009 | Mann ................. G03F 7/70233 355/67 |
| 2010/0134907 | A1 * | 6/2010 | Mann ................. G03F 7/70233 359/858 |
| 2013/0050671 | A1 | 2/2013 | Mann |
| 2013/0088701 | A1 | 4/2013 | Mann |
| 2013/0128251 | A1 | 5/2013 | Mann |
| 2013/0170056 | A1 * | 7/2013 | Ekstein ................ G02B 5/0808 359/838 |
| 2014/0176928 | A1 | 6/2014 | Ruoff et al. |
| 2014/0327898 | A1 * | 11/2014 | Mann ................. G03F 7/70233 355/71 |
| 2016/0085061 | A1 | 3/2016 | Schwab |

FOREIGN PATENT DOCUMENTS

| | | |
|---|---|---|
| DE | 101 55 711 A | 5/2003 |
| DE | 10 2009 032 751 A1 | 4/2010 |
| DE | 10 2009 011 328 A1 | 8/2010 |
| DE | 10 2009 045 096 A1 | 10/2010 |
| DE | 10 2012 202 675 A1 | 1/2013 |
| DE | 10 2011 083 888 A1 | 4/2013 |
| JP | H07-220997 A | 8/1995 |
| JP | 2000-31041 A | 3/2001 |
| JP | 2012-008574 A | 1/2012 |
| WO | WO 8908920 A1 | 9/1989 |
| WO | WO 01/69299 A1 | 9/2001 |
| WO | WO 2012/034995 A | 3/2012 |
| WO | WO 2012/126867 A | 9/2012 |

OTHER PUBLICATIONS

International Search Report and Written Opinion for corresponding PCT Appl. No. PCT/EP2014/066072, dated Nov. 27, 2014.
German Office Action, with translation thereof, for DE Appl No. 10 2013 214 770.8., dated Sep. 20, 2013.
Chinese Office Action, with translation thereof, for corresponding CN Appl No. 2014800425090, dated Apr. 10, 2018.
Taiwanese Office Action and Search Report, with translation thereof, for corresponding Appl No. 103125669, dated Nov. 23, 2018.
Japanese office action, with English translation thereof, for corresponding Appl. No. 2016-530 459, dated Aug. 1, 2019.

* cited by examiner

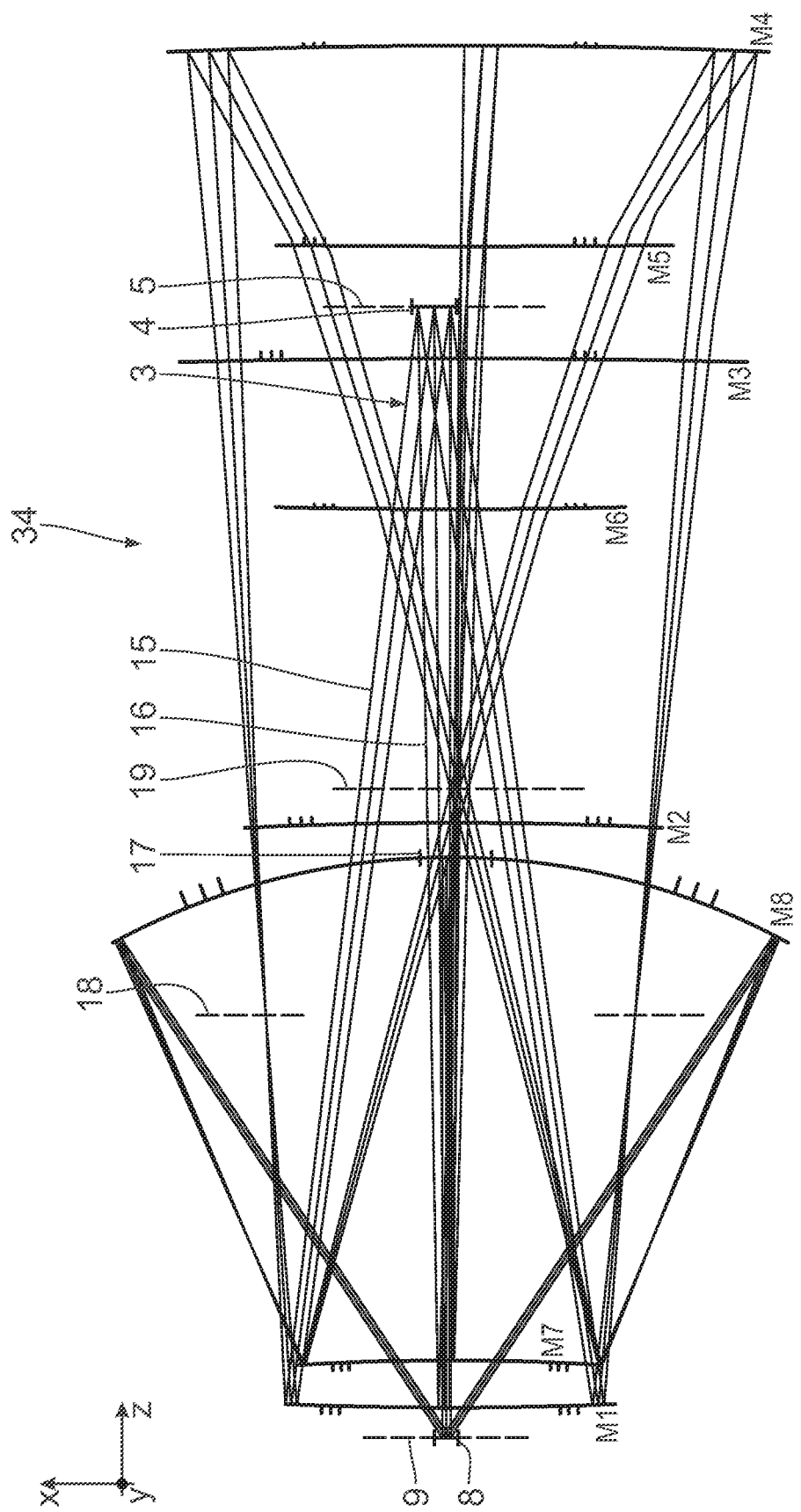

PROJECTION OPTICAL UNIT FOR IMAGING AN OBJECT FIELD INTO AN IMAGE FIELD, AND PROJECTION EXPOSURE APPARATUS COMPRISING SUCH A PROJECTION OPTICAL UNIT

CROSS-REFERENCE TO RELATED APPLICATIONS

The present application is a continuation of, and claims benefit under 35 USC 120 to, U.S. application Ser. No. 14/962,130, filed Dec. 8, 2015, which is a continuation of, and claims benefit under 35 USC 120 to, international application PCT/EP2014/066072, filed Jul. 25, 2014, which claims benefit under 35 USC 119 of German Application No. 10 2014 208 770.8, filed May 9, 2014, 10 2013 214 770.8, filed Jul. 29, 2013, and 10 2014 203 190.7, filed Feb. 21, 2014. The entire disclosures of U.S. application Ser. No. 14/962,130 and international application PCT/EP2014/066072 are incorporated by reference herein.

FIELD

The disclosure relates to a projection optical unit for imaging an object field into an image field. Furthermore, the disclosure relates to an optical system including such a projection optical unit, a projection exposure apparatus including such an optical system, a method for producing a microstructured or nanostructured component using such a projection exposure apparatus and a microstructured or nanostructured component produced by this method.

BACKGROUND

Projection optical units are known from DE 10 2012 202 675 A1, DE 10 2009 011 328 A1, U.S. Pat. No. 8,027,022 B2 and U.S. Pat. No. 6,577,443 B2. An illumination optical unit for a projection exposure apparatus is known from DE 10 2009 045 096 A1.

SUMMARY

The disclosure seeks to provide a projection optical unit which exhibits a well-corrected imageable field with, at the same time, a high imaging light throughput.

In one aspect, the disclosure provides a projection optical unit for imaging an object field into an image field. The projection optical unit includes a plurality of mirrors for guiding imaging light from the object field to the image field. At least two of the mirrors are embodied as mirrors arranged directly behind one another in the beam path of the imaging light for grazing incidence with an angle of incidence of the imaging light which is greater than 60°.

In one aspect, the disclosure provides a projection optical unit for imaging an object field in an image field. The projection optical unit includes a plurality of mirrors for guiding imaging light from the object field to the image field. At least one mirror is embodied as a mirror for grazing incidence with an angle of incidence of the imaging light which is greater than 60°. The projection optical unit has two different imaging scales ($\beta x$, $\beta y$) in two different directions which span the image field.

According to the disclosure, it was discovered that two mirrors, arranged directly behind one another, for grazing incidence within the projection optical unit lead to the possibility of designing a projection optical unit with a high imaging light throughput, which is uniform over the whole field to be imaged, wherein, also at the same time, degrees of freedom are provided for correcting the image in the image field via the mirrors with grazing incidence.

The mirrors of the projection optical unit can carry the coatings which increase the imaging light reflectivity. Ruthenium and/or molybdenum can be used as coating materials for these coatings.

The mirrors for grazing incidence can have a reflectivity which lies in the range between 75 and 95% and which, in particular, can be at least 80%. The mirrors for grazing incidence can have a reflectivity which depends linearly on the angle of incidence. Such a linear dependence can be compensated for by the use of at least one further mirror for grazing incidence, which likewise has a corresponding linear dependence of the reflectivity on the angle of incidence. The projection optical unit is suitable for EUV wavelengths of the imaging light, in particular in the range between 5 nm and 30 nm. The angle of incidence of the imaging light on the mirrors for grazing incidence can be greater than 65°, can be greater than 70°, can be greater than 72°, can be greater than 75°, can be greater than 80° or can also be greater than 85°.

The projection optical unit can be embodied for imaging a portion of a reflecting reticle. To this end, a chief ray of a central object field point can include an angle with a normal of the object plane which is greater than 3° and for example equals 5.5°.

One of the at least two mirrors for grazing incidence can be the first mirror of the projection optical unit downstream of the object field in the imaging beam path. The mirrors for grazing incidence can have reflection surfaces which deviate from a plane surface and can, in particular, have an image aberration-correcting surface form. The reflection surfaces of the mirrors for grazing incidence can be embodied as aspherical surfaces or else as free-form surfaces without rotational symmetry.

An intermediate image plane can be arranged in the region of a reflection on a mirror for grazing incidence. This leads to an advantageous constriction of an imaging light beam in the region of the mirror for grazing incidence and therefore avoids the latter requiring an undesirably large reflection surface.

The projection optical unit can be embodied as a catoptric optical unit.

The projection optical unit can include at least one mirror with a passage opening for the illumination light. The projection optical unit can be embodied as an obscured optical unit.

Alternatively, the projection optical unit can also be embodied in such a way that the reflection surfaces of all mirrors of the projection optical unit are used throughout. The projection optical unit can be embodied as a non-obscured optical unit.

An x/y aspect ratio of a reflection surface optically impinged upon with illumination light, i.e. a used reflection surface, of at least one mirror of the projection optical unit can be less than 1, can be less than 0.8, can equal 0.7, can be less than 0.7, can be less than 0.6 and can equal 0.5. Here, the y-coordinate lies in a plane of incidence of the respectively observed mirror. The x-coordinate lies perpendicular to the plane of incidence of the respectively observed mirror. A scanning direction, in which an object to be imaged and/or a substrate, on which imaging takes place, is displaced, can also extend along the y-coordinate.

An x/y aspect ratio of a reflection surface optically impinged upon with illumination light, i.e. a used reflection surface, of at least one mirror of the projection optical unit can be greater than 1, can equal 2, can be greater than 2, can equal 2.5, can be greater than 2.5, can be greater than 3, can be greater than 4, can be greater than 5, can be greater than 6, can equal 7.5, can be greater than 10 and can equal 15.

The projection optical unit can have a sequence of mirrors in which, in addition to at least one GI mirror pair, i.e. two mirrors for grazing incidence arranged directly behind one another in the beam path, there is also a single GI mirror. The projection optical unit can have three successive GI mirrors.

The projection optical unit can include at least one mirror which has the embodiment of a saddle surface, i.e. which has positive refractive power in one plane and negative refractive power in a plane perpendicular thereto. The projection optical unit can have a plurality of such saddle mirrors.

In some embodiments, the projection optical unit includes exactly two mirrors for grazing incidence. Exactly two mirrors for grazing incidence were found to be particularly suitable for the projection optical unit.

In some embodiments, an object plane in which the object field is arranged has an angle different from 0° with an image plane in which the image field is arranged. Such an angle between the object plane and the image plane enables a particularly compact guidance of the imaging light beam path or imaging beam path. This angle can be greater than 1°, can be greater than 2°, can be greater than 3°, can be greater than 5°, can be greater than 7°, can be greater than 10°, can be greater than 20°, can be greater than 30° and can equal 39°.

In some embodiments, the projection optical unit includes exactly four mirrors for grazing incidence. Exactly four mirrors for grazing incidence were also found to be particularly suitable.

In some embodiments, the four mirrors for grazing incidence are respectively, in a pairwise manner, arranged directly behind one another in the beam path of the imaging light. Such a pairwise arrangement of the mirrors for grazing incidence was found to be suitable for compensating an angle of incidence-dependent reflection. At least one mirror for normal incidence can lie between the pairs of mirrors for grazing incidence. The pairs of mirrors for grazing incidence can be arranged in such a way that a deflecting effect of the two mirrors arranged in succession is summed, i.e. that the angles of reflection are added. Such an embodiment enables a compensation of an angle of incidence-dependent reflectivity on the mirrors for grazing incidence. Alternatively, it is possible to assign to a mirror for grazing incidence a compensation mirror for grazing incidence at a different point in the beam path of the imaging light through the projection optical unit, wherein individual rays which are incident on the mirror for grazing incidence with a relatively large angle of incidence are accordingly incident on the compensation mirror with a smaller angle of incidence, and vice versa. A further mirror for grazing incidence and/or a mirror for normal incidence can be arranged between a mirror with grazing incidence and the compensation mirror assigned thereto. To the extent that more than two mirrors for grazing incidence are provided in the projection optical unit, the compensation effect of a compensation mirror may also apply to more than one of the other mirrors for grazing incidence. Thus, for example, in the case of the three mirrors for grazing incidence, it is possible to provide one compensation mirror for grazing incidence which compensates the angle of incidence dependence of the reflection for two further mirrors for grazing incidence.

In some embodiments, the projection optical unit includes at least two mirrors for normal incidence with an angle of incidence of the imaging light which is less than 45°. Such embodiments were found to be particularly suitable for satisfying boundary conditions placed on a projection optical unit. The at least two mirrors for normal incidence can be impinged upon with an angle of incidence of the imaging light which is less than 40°, which is less than 35°, which is less than 30°, which is less than 25°, which is less than 20° and which can be even smaller.

In some embodiments, the projection optical unit includes four mirrors for normal incidence with an angle of incidence of the imaging light which is less than 45°. Four mirrors for normal incidence lead to the option of a projection optical unit with particularly good image correction.

An image-side numerical aperture of the projection optical unit can be at least 0.4 or 0.5 or 0.6. Such a projection optical unit enables a particularly high resolution.

In some embodiments, the projection optical unit has an overall reflectivity, emerging as the product of the reflectivities of all mirrors of the projection optical unit, that is greater than 9%. Such an overall reflectivity of the projection optical unit can be 9.75%, can be greater than 10%, can be greater than 11%, can equal 11.97%, can be greater than 12% and can, in particular, equal 12.2%. Greater overall reflectivities are also possible, in particular depending on the embodiment of reflection-increasing coatings on the mirrors.

In one aspect, the disclosure provides an EUV projection optical unit for imaging an object field in an image field. The EUV projection optical unit includes a plurality of mirrors for guiding imaging light from the object field to the image field. The EUV projection optical unit has an image-side numerical aperture of at least 0.4. An overall reflectivity of the projection optical unit, emerging as the product of the reflectivities of all mirrors of the projection optical unit is greater than 7%. Such an EUV projection optical unit disclosed herein simultaneously has a high structure resolution and a high throughput for the EUV imaging light. That is to say, little used light is lost during the projection, which in turn reduces an exposure duration and therefore increases the wafer throughput of a projection exposure apparatus equipped with such an EUV projection optical unit. The overall reflectivity can be greater than 8%, can be greater than 9%, can be greater than 10% or can be even greater.

The anamorphic optical unit has different imaging scales for different field coordinates, in particular for orthogonal field coordinates. Here, an absolute reduction factor of the projection optical unit is referred to as imaging scale. By way of example, a projection optical unit reducing by a factor of 4 accordingly has an imaging scale of 4. Then, a larger imaging scale means that there is an increase in the reduction factor. Thus, within this meaning, a projection optical unit with a reduction by a factor of 8 has a larger imaging scale than a projection optical unit with a reduction by a factor of 4.

The anamorphic optical unit can have a direction-dependent, i.e. field coordinate-dependent, object-side numerical aperture.

It was identified that if the object-side numerical aperture increases, the object-side chief ray angle desirably is enlarged, possibly leading to shadowing effects by the absorber structure and to problems with the layer transmission, in particular to strong apodization effects by the reticle coating. It was identified further that, via an anamorphic imaging optical unit, in particular via an anamorphic imaging projection lens, a reticle with a predetermined size can be imaged from an object field with a predetermined imaging scale to a predetermined illumination field, wherein the illumination field is completely illuminated in the direction of the first imaging scale, while an increased imaging scale in a second direction does not have negative effect on the throughput of the projection exposure apparatus, but can be compensated for by suitable measures.

Therefore, an anamorphic lens enables both the complete illumination of an image area with a large object-side numerical aperture in the first direction, without the extent of the imaging reticle needing to be enlarged in this first direction and without this resulting in a reduction in the throughput of the projection exposure apparatus, and also the minimization of the losses in imaging quality caused by the oblique incidence of the illumination light.

As a result of having imaging scales with the same sign in the direction of the two principal sections, an image inversion ("image flip") is avoided. The optical unit has positive imaging scales, in particular in the direction of the two principal sections.

The anamorphic optical unit aids in the generation of an angle of incidence of the imaging light on a reflecting object, which angle of incidence is as small as possible. The larger object-side numerical aperture can be present perpendicular to the incidence plane of the imaging light on the object. The use of a cylindrical optical unit is not mandatory for configuring the anamorphic optical unit. The different imaging scales can have a positive sign for both field coordinates. The different imaging scales can have reducing effect for both field coordinates. The anamorphic projection optical unit can have an elliptical entrance pupil and/or an elliptical exit pupil. The anamorphic projection optical unit can have a rotationally symmetric and an n-fold rotationally symmetric exit pupil.

The different imaging scales for the orthogonal field coordinates can differ by at least a factor of 1.1, at least by a factor of 1.2, at least by a factor of 1.3, at least by a factor of 1.4, at least by a factor of 1.5, at least by a factor of 1.7, at least by a factor of 2, at least by a factor of 2.5 and at least by a factor of 3 or else by an even larger factor.

The object field can have an xy-aspect ratio of greater than 1, wherein the different imaging scales of the projection optical unit are present in the directions of these two object field dimensions (x, y) of this aspect ratio. A reducing imaging scale (βx) in a longer object field dimension (x) is smaller than in a shorter object field dimension (y) perpendicular thereto. A projection objective can have a direction-dependent object-side numerical aperture. The advantages of such embodiments correspond to what was already discussed above. A smaller imaging scale is tantamount to a smaller reducing effect.

The smaller one (βx) of the two different imaging scales can be less than 6. The larger one (βy) of the two imaging scales can be at least 6. Such imaging scales were found to be particularly suitable. By way of example, the smaller one of the two different imaging scales can be 5.4, can be less than 5, can equal 4 or can be even smaller. The larger one of the two different imaging scales can equal 7, can equal 8 or can be even larger.

At least one of the mirrors can have a reflection surface in the form of a free-form surface. Such a mirror reflection surface enables an extension to the design degrees of freedom for the projection optical unit. In particular, an anamorphic effect can be distributed on a plurality of mirror surfaces.

An image-side numerical aperture can be at least 0.4, such as at least 0.5. An object-side chief ray angle (CRAO) for the field center point of less than 7°, wherein the image field has an extent of more than 13 mm, such as more than 20 mm, along a field dimension (x). Such numerical apertures and image field dimensions are well adapted to desirable properties with respect to the imaging quality and the wafer exposure during use in a projection exposure apparatus.

The projection optical unit can have an aperture stop. This aperture stop can lie in a plane or else have a three-dimensional embodiment. The extent of the aperture stop can be smaller in the scanning direction than perpendicular thereto.

The projection optical unit can have an obscuration stop. What was explained above in respect of the aperture stop applies in respect of the embodiment of the obscuration stop.

A projection optical unit can include a stop with a stop edge, the extent of which along a shorter object field dimension (y) is smaller than along a longer object field dimension (x). Such a stop with an extent ratio is adapted to the anamorphic effect of the projection optical unit. The stop can be arranged in an entrance pupil plane of the projection optical unit. The ratio of the extent along the shorter object field dimension and along the longer object field dimensioned can correspond to the ratio of the reducing imaging scales in the longer object field dimension and in the shorter object field dimension.

The features discussed above with reference to the various projection optical units can be realized in any combination with one another.

The advantages of an optical system having a stop with a stop edge, the extent of which along a shorter object field dimension (y) is smaller than along a longer object field dimension (x), correspond to those which were already explained above with reference to the projection optical unit. To the extent that use is made of an anamorphic projection optical unit, the illumination optical unit can be adapted to a non-rotationally symmetric entrance pupil of the projection optical unit.

The advantages of the projection optical unit are particularly pronounced in an optical system that contains a projection optical unit as disclosed herein. A possible operating wavelength for the EUV light source can be 13.5 nm. Alternatively, use can also be made of a DUV light source, that is to say, for example, a light source with a wavelength of 193 nm.

An projection exposure apparatus can include an illumination optical unit for illuminating the object field with illumination and imaging light. The advantages of such a projection exposure apparatus correspond to those which were already explained above with reference to the projection optical unit.

An apparatus can have advantages of the anamorphic projection optical unit.

A reticle for a projection exposure apparatus described herein can have an extent of at least 104 mm×132 mm.

The advantages of a production method and of a microstructured or nanostructured component can correspond to those which were already explained above with reference to the projection optical unit and the optical system and the projection exposure apparatus.

The projection exposure apparatus can be used to produce, in particular, a semiconductor component, for example a memory chip.

BRIEF DESCRIPTION OF THE DRAWINGS

Exemplary embodiments of the disclosure are explained in detail below on the basis of the drawing. In the latter:

FIG. 21 shows a view of the imaging optical unit according to FIG. 20, seen from the viewing direction XXI in FIG. 20;

DETAILED DESCRIPTION

Figure 1:
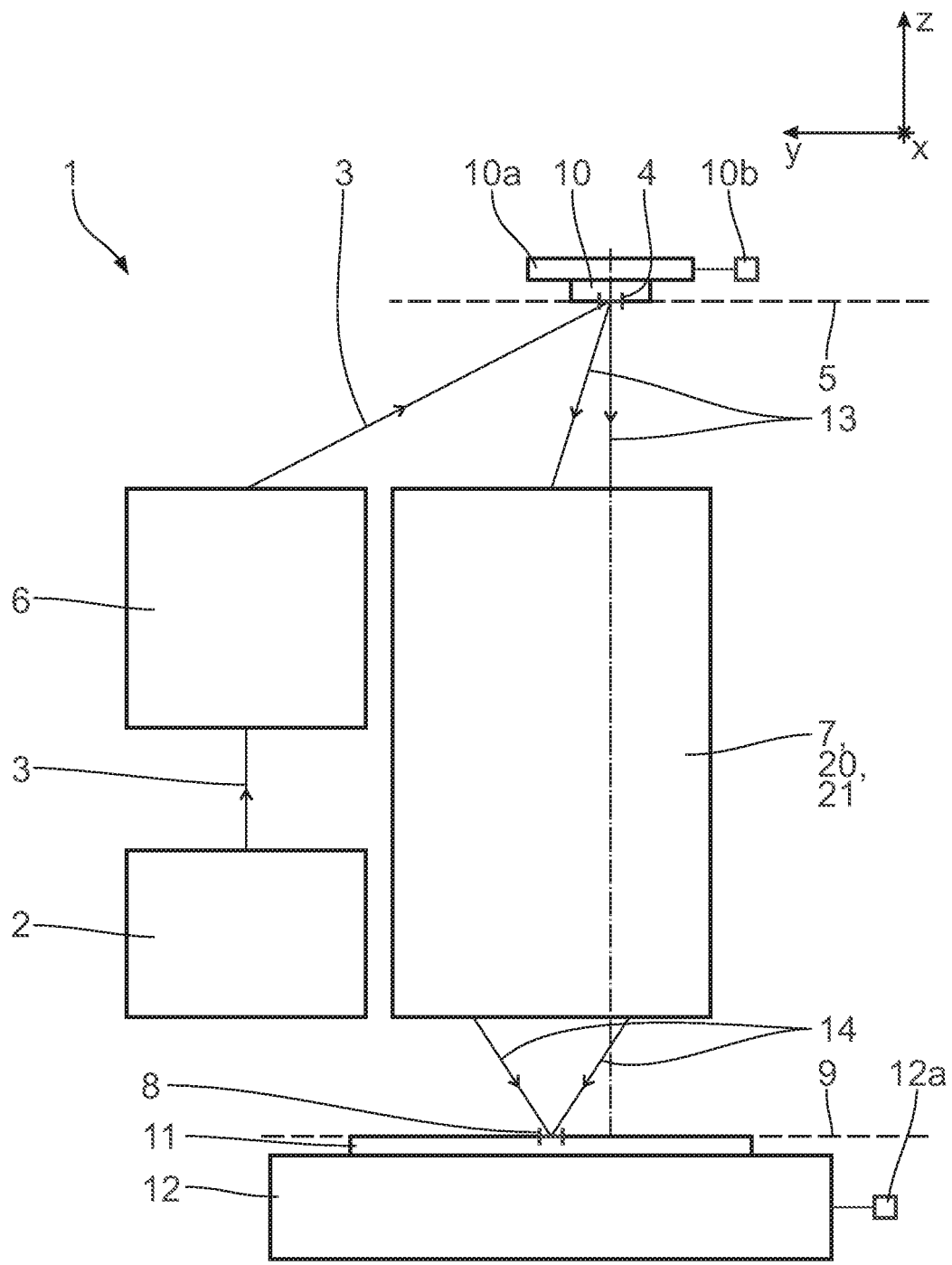
FIG. 1 schematically shows a projection exposure apparatus for EUV microlithography.

A microlithographic projection exposure apparatus 1 includes a light source 2 for illumination light or imaging light 3. The light source 2 is an EUV light source which generates light in a wavelength range of, for example, between 5 nm and 30 nm, in particular between 5 nm and 15 nm. In particular, the light source 2 can be a light source with a wavelength of 13.5 nm or a light source with a wavelength of 6.9 nm. Other EUV wavelengths are also possible. In general, any desired wavelengths, for example visible wavelengths or else other wavelengths which can find use in microlithography (e.g. DUV, vacuum ultraviolet) and for which suitable laser light sources and/or LED light sources are available (for example 365 nm, 248 nm, 193 nm, 157 nm, 129 nm, 109 nm), are also possible for the illumination light 3 guided in the projection exposure apparatus 1. A beam path of the illumination light 3 is depicted very schematically in FIG. 1.

An illumination optical unit 6 serves for guiding the illumination light 3 from the light source 2 to an object field 4 in an object plane 5. Using a projection optical unit or imaging optical unit 7, the object field 4 is imaged in an image field 8 in an image plane 9 with a predetermined reduction scale.

In order to simplify the description of the projection exposure apparatus 1 and the various embodiments of the projection optical unit 7, a Cartesian xyz-coordinate system is specified in the drawing, from which the respective positional relations between the components depicted in the figures emerge. In FIG. 1, the x-direction extends perpendicular to the plane of the drawing and into the latter. The y-direction extends to the left and the z-direction extends upward.

The object field 4 and the image field 8 are rectangular. Alternatively, it is also possible for the object field 4 and image field 8 to be embodied with a bend or curvature, that is to say, in particular, in the form of a partial ring. The object field 4 and the image field 8 have an xy-aspect ratio of greater than 1. Thus, the object field 4 has a longer object field dimension in the x-direction and a shorter object field dimension in the y-direction. These object field dimensions extend along the field coordinates x and y.

Figure 2:
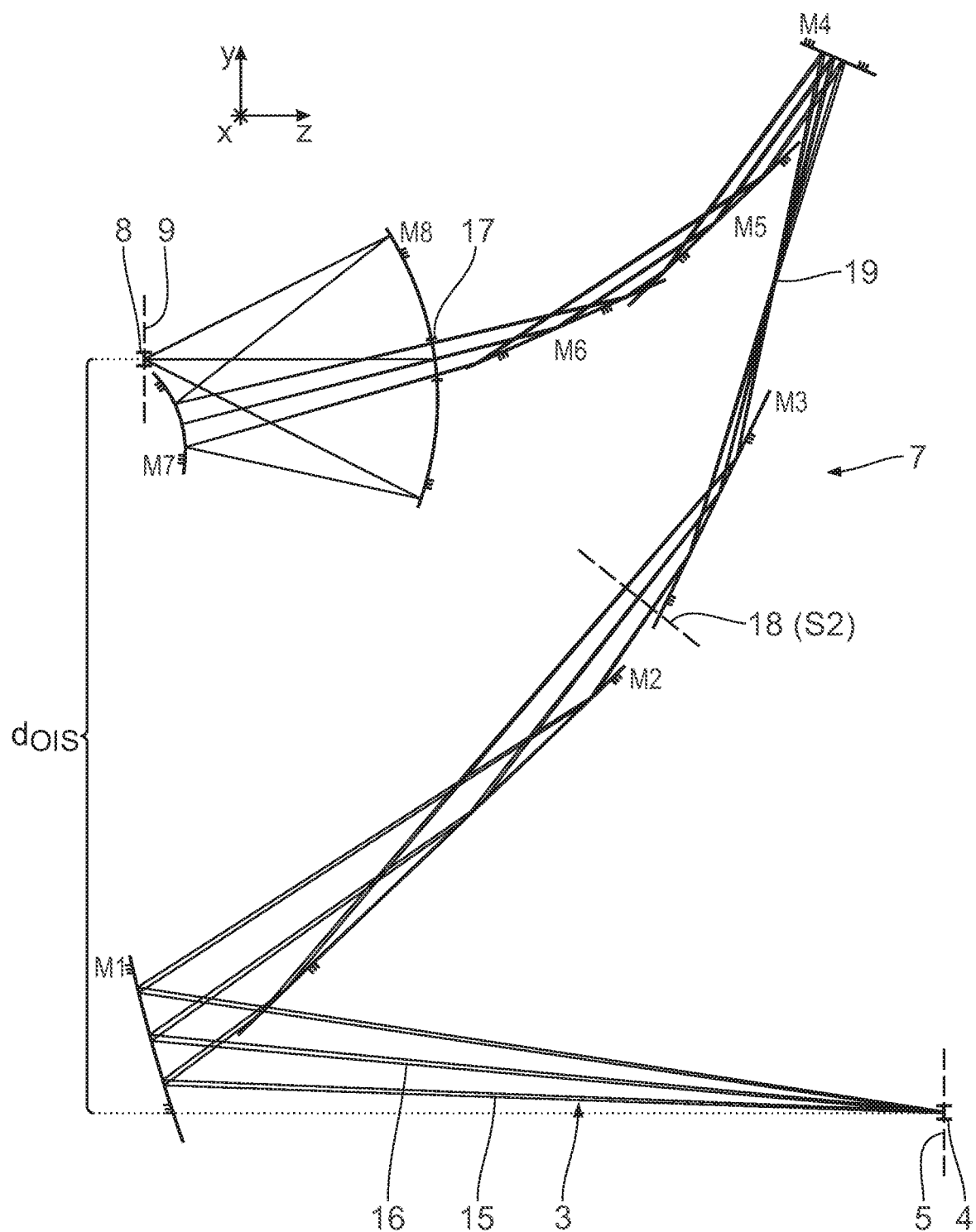
FIG. 2 shows, in a meridional section, an embodiment of an imaging optical unit which can be used as a projection lens in the projection exposure apparatus according to FIG. 1, wherein an imaging beam path for chief rays and for an upper and a lower coma ray of two selected field points is depicted.

One of the exemplary embodiments depicted in FIG. 2ff. can be used for the projection optical unit 7. The projection optical unit 7 according to FIG. 2 has a reduction factor of 8. Other reduction scales are also possible, for example 4×, 5×, or else reduction scales which are greater than 8×. In the embodiments according to FIGS. 2 and 5ff., the image plane 9 in the projection optical unit 7 is arranged parallel to the object plane 5. What is depicted here is a section of a reflection mask 10, which is also referred to as reticle, coinciding with the object field 4. The reticle 10 is carried by a reticle holder 10a. The reticle holder 10a is displaced by a reticle displacement drive 10b.

The imaging by the projection optical unit 7 is carried out on the surface of a substrate 11 in the form of a wafer, which is carried by a substrate holder 12. The substrate holder 12 is displaced by a wafer or substrate displacement drive 12a.

Between the reticle 10 and the projection optical unit 7, a beam 13 of illumination light 3 entering the latter is schematically depicted in FIG. 1, as is, between the projection optical unit 7 and the substrate 11, a beam 14 of the illumination light 3 emerging from the projection optical unit 7. An image field-side numerical aperture (NA) of the projection optical unit 7 is not reproduced to scale in FIG. 1.

The projection exposure apparatus 1 is a scanner-type apparatus. During operation of the projection exposure apparatus 1, both the reticle 10 and the substrate 11 are scanned in the y-direction. A stepper-type projection exposure apparatus 1, in which there is a step-by-step displacement of the reticle 10 and the substrate 11 in the y-direction between individual exposures of the substrate 11, is also possible. These displacements are synchronized to one another by appropriate actuation of the displacement drives 10b and 12a.

FIG. 2 shows the optical design of a first embodiment of the projection optical unit 7. Depicted in FIG. 2 is the beam path of in each case three individual rays 15, which emanate from two object field points that are spaced apart from one another in the y-direction in FIG. 2. Chief rays 16, i.e. individual rays 15 which extend through the center of a pupil in a pupil plane of the projection optical unit 7, and in each case an upper and a lower coma ray of these two object field points are depicted. Proceeding from the object field 4, the chief rays 16 include an angle CRAO of 5.5° with a normal of the object plane 5.

The object plane 5 lies parallel to the image plane 9.

The projection optical unit 7 has an image-side numerical aperture of 0.45.

The projection optical unit 7 has a reducing imaging scale of 8×.

The projection optical unit 7 according to FIG. 2 has a total of eight mirrors which, in the sequence of the beam path of the individual rays 15 emanating from the object field 4, are numbered M1 to M8 in sequence. An imaging optical unit 7 can also have different number of mirrors, for example four mirrors or six mirrors.

FIG. 2 depicts the calculated reflection surfaces of the mirrors M1 to M8. As can be seen from the illustration according to FIG. 2, only a portion of these calculated reflection surfaces is used. Only this actually used region of the reflection surfaces is in fact present in the real mirrors M1 to M8. These used reflection surfaces are carried by mirror bodies in a manner known per se.

In the projection optical unit 7 according to FIG. 2, the mirrors M1, M4, M7 and M8 are embodied as mirrors for normal incidence, that is to say as mirrors on which the imaging light 3 is incident with an angle of incidence that is smaller than 45°. Thus, the projection optical unit 7 according to FIG. 2 has a total of four mirrors M1, M4, M7 and M8 for normal incidence.

The mirrors M2, M3, M5 and M6 are mirrors for grazing incidence of the illumination light 3, that is to say mirrors on which the illumination light 3 is incident with angles of incidence which are greater than 60°. A typical angle of incidence of the individual rays 15 of the imaging light 3 on the mirrors M2, M3 and M5, M6 for grazing incidence lies in the region of 80°. Overall, the projection optical unit 7 according to FIG. 2 includes exactly four mirrors M2, M3, M5 and M6 for grazing incidence.

The mirrors M2 and M3 form a mirror pair arranged directly behind one another in the beam path of the imaging light 3. The mirrors M5 and M6 also form a mirror pair arranged directly behind one another in the beam path of the imaging light 3.

The mirror pairs M2, M3 on the one hand and M5, M6 on the other hand reflect the imaging light 3 in such a way that the angles of reflection of the individual rays 15 on the respective mirrors M2, M3 or M5, M6 of these two mirror pairs add up. Thus, the respective second mirror M3 and M6 of the respective mirror pair M2, M3 and M5, M6 amplifies a deflecting effect exerted by the respectively first mirror M2, M5 on the respective individual ray 15. This arrangement of the mirrors of the mirror pairs M2, M3 and M5, M6 corresponds to the one described in DE 10 2009 045 096 A1 for an illumination optical unit.

The mirrors M2, M3, M5 and M6 for grazing incidence in each case have very large absolute values for the radius, i.e. have a relatively small deviation from a plane surface.

These mirrors M2, M3, M5 and M6 for grazing incidence therefore have practically no optical power, i.e. practically no overall beam-forming effect like a concave or convex mirror, but contribute to specific and, in particular, to local aberration correction.

In order to characterize a deflecting effect of the mirrors of the projection optical unit 7, a deflection direction is defined in the following text on the basis of the respectively depicted meridional sections. As is seen in the respectively incident beam direction in the meridional section, for example according to FIG. 2, a deflecting effect of the respective mirror in the clockwise direction, i.e. a deflection to the right, is denoted by the abbreviation "R". By way of example, the mirror M1 of the projection optical unit 7 has such an "R" deflecting effect. A deflecting effect of a mirror in the counterclockwise direction, i.e. to the left, as seen from the respective beam direction incident on this mirror, is denoted by the abbreviation "L". The mirrors M2 and M3 of the projection optical unit 7 are examples for the "L" deflecting effect. A weakly deflecting effect or an entirely non-deflecting effect of a mirror with a fold angle f, for which −1°<f<1° applies, is denoted by the abbreviation "0". The mirror M7 of the projection optical unit 7 is an example for the "0" deflecting effect. Overall, the projection optical unit 7 for the mirrors M1 to M8 has the following sequence of deflecting effects: RLLLRR0L.

In principle, all described exemplary embodiments of the projection optical units can be mirrored about a plane extending parallel to the xz-plane, without basic imaging properties changing in this case. However, of course, this changes the sequence of the deflecting effects, which for example in the case of a projection optical unit emerging from the projection optical unit 7 by the corresponding mirroring has the following sequence: LRRRLL0R.

A selection of the deflection effect, i.e. a selection of a direction of the respective incident beam, for example on the mirror M4, and a selection of a deflection direction of the mirror pairs M2, M3 and M5, M6 is selected in such a way in each case that an installation space available for the projection optical unit 7 is used efficiently.

The mirrors M1 to M8 carry a coating optimizing the reflectivity of the mirrors M1 to M8 for the imaging light 3. This can be a ruthenium coating, a molybdenum coating or a molybdenum coating with an uppermost layer of ruthenium. In the mirrors M2, M3, M5 and M6 for grazing incidence, use can be made of a coating with e.g. a ply made of molybdenum or ruthenium. These highly reflecting layers, in particular of mirrors M1, M4, M7 and M8 for normal incidence, can be embodied as multi-ply layers, wherein successive layers can be manufactured from different materials. Use can also be made of alternating material layers. A typical multi-ply layer can include 50 bi-plies made of in each case a layer of molybdenum and a layer of silicon.

In order to calculate an overall reflectivity of the projection optical unit 7, a system transmission is calculated as follows: a mirror reflectivity is determined on each mirror surface depending on the angle of incidence of a guide ray, i.e. a chief ray of a central object field point, and combined by multiplication to form the system transmission.

Here, the reflectivity $R_M$ on the mirror in percent emerges as:

$$R_M = c0 x^4 + c1 x^3 + c2 x^2 + c3 x + c4,$$

where x denotes the respective angle of incidence in degrees. The coefficients ci emerge from:

$$ci = \tfrac{1}{2}(ci_{S\text{-}fit} + ci_{P\text{-}fit}),$$

as mean values of the respective coefficients for S-polarization on the one hand and the P-polarization on the other hand.

For an angle of incidence range between 60°<x<88°, the following coefficients emerge for a ruthenium layer, which is therefore impinged upon under grazing incidence angles:

|       | c0 | c1 | c2 | c3 | C4 |
|-------|----|----|----|----|----|
| S-Fit | 0  | $1.59347283 \times 10^{-3}$ | $-4.06503596 \times 10^{-1}$ | $3.56423129 \times 10^{1}$ | $-9.76664971 \times 10^{2}$ |
| P-Fit | 0  | $1.88179657 \times 10^{-3}$ | $-4.79626971 \times 10^{-1}$ | $4.20429269 \times 10^{1}$ | $-1.17059654 \times 10^{3}$ |

For NI mirrors, i.e. in the region of the perpendicular incidence, the following emerges for a molybdenum/silicon multi-ply stack:

|       | c0 | c1 | c2 | c3 | C4 |
|-------|----|----|----|----|----|
| S-Fit | $2.89135870 \times 10^{-6}$ | $-3.90173053 \times 10^{-4}$ | $1.04448085 \times 10^{-2}$ | $-2.65742974 \times 10^{-2}$ | $6.66009436 \times 10^{1}$ |
| P-Fit | $2.05886567 \times 10^{-5}$ | $5.79240629 \times 10^{-4}$ | $-3.37849733 \times 10^{-2}$ | $3.92206533 \times 10^{-2}$ | $6.65307365 \times 10^{1}$ |

Further information in respect of a reflection on a GI mirror (mirror for grazing incidence) is found in WO 2012/126867 A. Further information in respect of the reflectivity of NI mirrors (normal incidence mirrors) is found in DE 101 55 711 A.

An overall reflectivity or system transmission of the projection optical unit 7, emerging as a product of the reflectivities of all mirrors M1 to M8 of the projection optical unit 7, is R=10.43%.

The mirror M8, i.e. the last mirror in the imaging beam path in front of the image field 8, has a passage opening 17 for the imaging light 3, which is reflected from the antepenultimate mirror M6 to the penultimate mirror M7, to pass through. The mirror M8 is used in a reflective manner around the passage opening 17. None of the other mirrors M1 to M7 have passage openings and the mirrors are used in a reflective manner in a continuous region without gaps.

The mirrors M1 to M8 are embodied as free-form surfaces which cannot be described by a rotationally symmetric function. Other embodiments of the projection optical unit 7, in which at least one of the mirrors M1 to M8 is embodied as a rotationally symmetric asphere, are also possible. It is also possible for all mirrors M1 to M8 to be embodied as such aspheres.

A free-form surface can be described by the following free-form surface equation (Equation 1):

$$Z = \frac{c_x x^2 + c_y y^2}{1 + \sqrt{1 - (1+k_x)(c_x x)^2 - (1+k_y)(c_y y)^2}} + \quad (1)$$
$$C_1 x + C_2 y + C_3 x^2 + C_4 xy + C_5 y^2 + C_6 x^3 + \ldots + C_9 y^3 +$$
$$C_{10} x^4 + \ldots + C_{12} x^2 y^2 + \ldots + C_{14} y^4 + C_{15} x^5 + \ldots +$$
$$C_{20} y^5 + C_{21} x^6 + \ldots + C_{24} x^3 y^3 + \ldots + C_{27} y^6 + \ldots$$

The following applies to the parameters of this Equation (1):

Z is the sag of the free-form surface at the point x, y, where $x^2 + y^2 = r^2$. Here, r is the distance from the reference axis of the free-form surface equation (x=0; y=0).

In the free-form surface equation (1), $C_1$, $C_2$, $C_3$ ... denote the coefficients of the free-form surface series expansion in powers of x and y.

In the case of a conical base area, $c_x$, $c_y$ is a constant corresponding to the vertex curvature of a corresponding asphere. Thus, $c_x = 1/R_x$ and $c_y = 1/R_y$ applies. Here, $k_x$ and $k_y$ each corresponds to a conical constant of a corresponding asphere. Thus, Equation (1) describes a bi-conical free-form surface.

An alternative possible free-form surface can be generated from a rotationally symmetric reference surface. Such free-form surfaces for reflection surfaces of the mirrors of projection optical units of microlithographic projection exposure apparatuses are known from US 2007-0058269 A1.

Alternatively, free-form surfaces can also be described with the aid of two-dimensional spline surfaces. Examples for this are Bezier curves or non-uniform rational basis splines (NURBS). By way of example, two-dimensional spline surfaces can be described by a grid of points in an xy-plane and associated z-values, or by these points and the gradients associated therewith. Depending on the respective type of the spline surface, the complete surface is obtained by interpolation between the grid points using e.g. polynomials or functions which have specific properties in respect of the continuity and the differentiability thereof. Examples for this are analytical functions.

The optical design data of the reflection surfaces of the mirrors M1 to M8 of the projection optical unit 7 can be gathered from the following tables. These optical design data in each case proceed from the image plane 9, i.e. describe the respective projection optical unit in the reverse propagation direction of the imaging light 3 between the image plane 9 and the object plane 5.

The first one of these tables provides an overview of the design data of the projection optical unit 7 and summarizes the numerical aperture NA, the calculated design wavelength for the imaging light, the dimensions of the image field in the x- and y-direction, an image field curvature and a location of a stop. This curvature is defined as the inverse radius of curvature of the field.

The second one of these tables specifies vertex radii (Radius_x=$R_x$, Radius_y=$R_y$) and refractive power values (Power_x, Power_y) for the optical surfaces of the optical components. Negative values for the radius mean concave curves towards the incident illumination light 3 in the section of the respective surface with the observed plane (xz, yz), which is spanned by a surface normal at the vertex with the respective direction of curvature (x, y). The two radii Radius_x, Radius_y can explicitly have different signs.

The vertices at each optical surface are defined as points of incidence of a guide ray which extends from an object field center to the image field 8 along a plane of symmetry x=0, i.e. the plane of the drawing of FIG. 2 (meridional plane).

The refractive powers Power_x($P_x$), Power_y($P_y$) at the vertices are defined as:

$$P_x = -\frac{2\cos AOI}{R_x}$$

$$P_y = -\frac{2}{R_y \cos AOI}$$

Here, AOI denotes an angle of incidence of the guide ray in relation to the surface normal.

The third table specifies, for the mirrors M1 to M8 in mm, the conical constants $k_x$ and $k_y$, the vertex radius $R_x$ (=Radius_x) and the free-form surface coefficients $C_n$. Coefficients $C_n$ not found in the table in each case have the value of 0.

The fourth table still specifies the magnitude along which the respective mirror, proceeding from a reference surface, was decentered (DCY) in the y-direction, and displaced (DCZ) and tilted (TLA, TLC) in the z-direction. This corresponds to a parallel displacement and a tilt when carrying out the free-form surface design method. Here, a displacement is carried out in the y-direction and in the z-direction in mm, and tilting is carried out about the x-axis and about the z-axis. Here, the tilt angle is specified in degrees. Decentering is carried out first, followed by tilting. The reference surface during decentering is in each case the first surface of the specified optical design data. Decentering in the y-direction and in the z-direction is also specified for the object field 4. In addition to the surfaces assigned to the individual mirrors, the fourth table also lists the image plane as first surface, the object plane as last surface and possibly a stop surface (denoted by "stop").

The fifth table still specifies the transmission data of the mirrors M8 to M1, namely the reflectivity thereof for the angle of incidence of an illumination light ray incident centrally on the respective mirror. The overall transmission is specified as a proportional factor remaining from an incident intensity after reflection at all mirrors in the projection optical unit.

The sixth table specifies an edge of the stop (surface M8) as a polygonal chain in local xyz coordinates. This stop is arranged at the location of the mirror M8. The stop is, as is described above, decentered and tilted.

| Table 1 for FIG. 2 | |
|---|---|
| Exemplary embodiment | FIG. 2 |
| NA | 0.45 |
| Wavelength | 13.5 nm |
| Field dimension x | 13.0 mm |
| Field dimension y | 0.784 mm |
| Feldkruemmung | 0.0 1/mm |
| Stop | M8 |

| Table 2 for FIG. 2 | | | | | |
|---|---|---|---|---|---|
| Surface | Radius x [mm] | Power x [1/mm] | Radius y [mm] | Power y [1/mm] | Operating |
| M8 | −837.70881927 | 0.00236862 | −757.27364908 | 0.00266207 | REFL |
| M7 | 2488.10131627 | −0.00080383 | 283.66314157 | −0.00705062 | REFL |
| M6 | 4560.51860808 | −0.00007268 | 18476.28162004 | −0.00065317 | REFL |
| M5 | −2531.38864214 | 0.00014365 | — | 0.00010672 | REFL |
| M4 | −2528.42598018 | 0.00077816 | −1442.81510027 | 0.00140906 | REFL |
| M3 | −3050.65046824 | 0.00012933 | 34435.31193357 | −0.00029442 | REFL |
| M2 | — | 0.00000156 | −40926.79441369 | 0.00032129 | REFL |
| M1 | 10833.49940461 | −0.00017328 | −2578.14093233 | 0.00082650 | REFL |

| Table 3a for FIG. 2 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −837.70881930 | 2488.10131600 | 4560.51860800 |
| C7 | −9.0132308e−09 | 1.11394243e−06 | 1.59114264e−07 |
| C9 | −1.00251209e−09 | 2.8860992e−07 | 5.59843391e−09 |
| C10 | −8.87226228e−12 | 1.18917173e−09 | 3.83909581e−10 |
| C12 | −5.08519375e−11 | 5.23800849e−09 | 2.11857784e−10 |
| C14 | −1.88200773e−11 | 1.0734105e−08 | 1.39463766e−11 |
| C16 | 8.82521632e−15 | 3.75808998e−12 | 1.70877645e−12 |
| C18 | −4.19864966e−15 | 1.85595295e−11 | 2.66118623e−13 |
| C20 | −2.11360234e−16 | −1.72133449e−11 | −5.17043474e−14 |
| C21 | −3.19874264e−17 | 3.00011227e−15 | 9.63300464e−16 |
| C23 | −1.22217908e−16 | 4.11542089e−14 | 4.38089836e−15 |
| C25 | −1.30026191e−16 | 1.11642164e−13 | 1.61278968e−15 |
| C27 | −3.67400697e−17 | 3.22598292e−13 | 1.26838989e−16 |
| C29 | 1.14026692e−20 | 2.92869138e−17 | 6.77960834e−18 |
| C31 | 1.0918839e−20 | 1.69415114e−16 | −5.39777251e−19 |
| C33 | −3.04462195e−21 | 4.33073361e−16 | 7.8861342e−19 |
| C35 | 1.02259135e−22 | −7.37362073e−16 | 8.03098684e−19 |
| C36 | −5.63440362e−23 | 1.44942891e−20 | −3.90732961e−21 |
| C38 | −2.66622412e−22 | 3.05621193e−19 | 5.15318073e−20 |
| C40 | −4.32156525e−22 | 1.34609812e−18 | −9.54272183e−21 |
| C42 | −2.89279412e−22 | 2.45287597e−18 | −1.70492308e−20 |
| C44 | −5.99684085e−23 | 2.12868884e−18 | −9.72311004e−22 |
| C46 | 1.18076072e−26 | 2.0799062e−22 | 1.45427907e−22 |
| C48 | 3.74881822e−26 | 2.68414652e−21 | 4.40689789e−22 |

Table 3a for FIG. 2

| Coefficient | M8 | M7 | M6 |
|---|---|---|---|
| C50 | 1.18386812e−26 | 5.8670912e−21 | 2.04987221e−22 |
| C52 | −1.00050188e−26 | −2.33431824e−20 | −7.75365541e−24 |
| C54 | −2.93462929e−27 | −9.59894302e−20 | −3.00655786e−24 |
| C55 | −7.12926517e−29 | 3.05798066e−25 | 2.33655571e−25 |
| C57 | −3.54266327e−28 | 2.94896726e−24 | 7.55277402e−25 |
| C59 | −7.81684172e−28 | 2.54027973e−23 | 1.26094736e−24 |
| C61 | −8.38095482e−28 | 8.05342131e−23 | 6.93792966e−25 |
| C63 | −4.13760156e−28 | 1.24219439e−22 | 9.28250781e−26 |
| C65 | −7.30815611e−29 | 4.10221778e−22 | 5.47302487e−27 |
| C67 | 1.94837068e−32 | 0 | 0 |
| C69 | 1.1397448e−31 | 0 | 0 |
| C71 | 1.34382689e−31 | 0 | 0 |
| C73 | 7.55966183e−32 | 0 | 0 |
| C75 | 1.56253375e−32 | 0 | 0 |
| C77 | 6.40963088e−33 | 0 | 0 |
| C78 | −2.56297737e−34 | 0 | 0 |
| C80 | −1.60836013e−33 | 0 | 0 |
| C82 | −4.69716941e−33 | 0 | 0 |
| C84 | −7.07121378e−33 | 0 | 0 |
| C86 | −5.64664272e−33 | 0 | 0 |
| C88 | −2.27265225e−33 | 0 | 0 |
| C90 | −3.58207435e−34 | 0 | 0 |

Table 3b for FIG. 2

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | −2531.38864200 | −2528.42598000 | −3050.65046800 |
| C7 | 1.72781637e−07 | 5.8018765e−08 | −1.17466046e−07 |
| C9 | 2.14254527e−08 | 8.64375408e−09 | 9.52322648e−09 |
| C10 | 1.91545596e−10 | −1.94203172e−11 | 6.38336565e−11 |
| C12 | −1.30545965e−10 | 7.93780161e−11 | −6.09437242e−11 |
| C14 | 2.29647138e−11 | −4.96311207e−10 | −8.46825762e−11 |
| C16 | −2.76920045e−13 | −4.9519671e−14 | 2.46570227e−13 |
| C18 | 6.31392082e−14 | 1.46606283e−12 | 1.83720452e−13 |
| C20 | 5.5820243e−14 | 1.34097025e−11 | −5.79539787e−14 |
| C21 | −7.00730308e−18 | 8.53806243e−18 | −1.75797003e−16 |
| C23 | 3.41967082e−16 | −9.95579358e−16 | 6.08596054e−16 |
| C25 | −7.70078483e−17 | −1.1212914e−14 | 3.41532358e−16 |
| C27 | 1.30566647e−16 | −5.35527612e−14 | 9.88490631e−17 |
| C29 | 1.16112452e−19 | 2.57671697e−19 | −1.20254031e−18 |
| C31 | −1.62253585e−19 | −3.25217486e−18 | 6.21318065e−19 |
| C33 | −1.22964972e−19 | −2.40795277e−16 | 1.66737236e−19 |
| C35 | 1.96436668e−19 | −4.04068836e−15 | 1.33042899e−18 |
| C36 | 5.2349042e−22 | −3.5496978e−23 | 6.42079101e−22 |
| C38 | −3.65302727e−22 | 1.66117198e−21 | −2.85312334e−21 |
| C40 | 6.2340516e−23 | 3.47327568e−20 | −6.3375684e−22 |
| C42 | 9.80519303e−22 | −1.2946755e−18 | −2.67858747e−21 |
| C44 | −7.581399e−22 | −4.6332565e−17 | 1.89160718e−21 |
| C46 | −2.8051662e−24 | −2.53096392e−25 | 2.79819801e−24 |
| C48 | −8.01335569e−25 | 3.13587836e−24 | −1.95559965e−24 |
| C50 | −2.19615172e−24 | 5.29262773e−22 | −3.25009825e−24 |
| C52 | 2.6523186e−24 | 8.72077688e−21 | −1.69895932e−23 |
| C54 | −3.17905172e−24 | −1.40950195e−19 | −1.24591949e−23 |
| C55 | 1.31200881e−28 | 6.31299438e−31 | 2.44903332e−28 |
| C57 | 6.46975253e−27 | −1.44337304e−27 | 5.45604256e−27 |
| C59 | 4.4689247e−27 | −9.7439448e−26 | 2.50408571e−27 |
| C61 | −1.34855282e−27 | −4.38554687e−25 | −5.44576542e−27 |
| C63 | −6.32570305e−27 | 4.90510476e−23 | −3.43807004e−26 |
| C65 | −2.36233819e−27 | 1.11019478e−22 | −3.46588884e−26 |

Table 3c for FIG. 2

| Coefficient | M2 | M1 |
|---|---|---|
| KY | 0.00000000 | 0.00000000 |
| KX | 0.00000000 | 0.00000000 |
| RX | −194394.06400000 | 10833.49940000 |
| C7 | −8.67070075e−09 | 1.48981967e−09 |
| C9 | −1.03403364e−08 | 4.14892815e−09 |
| C10 | −8.56886085e−11 | 3.38149986e−11 |
| C12 | −2.01940344e−11 | 3.90955095e−11 |
| C14 | −7.15883437e−12 | 1.45830047e−11 |
| C16 | −9.60210917e−14 | −6.21111216e−14 |
| C18 | −2.38815926e−14 | 9.39500532e−14 |
| C20 | −6.65065222e−16 | 1.68138883e−13 |
| C21 | −2.55749187e−16 | 1.57821571e−17 |
| C23 | −1.09151386e−16 | −3.38914384e−17 |
| C25 | −1.97294475e−17 | 7.9460803e−18 |
| C27 | 5.70404899e−18 | 1.16530683e−15 |
| C29 | 1.06431723e−19 | 5.16374316e−19 |
| C31 | −1.64115075e−19 | −1.22836084e−19 |
| C33 | −1.35411374e−20 | −1.90495661e−18 |
| C35 | 7.628521e−21 | 4.76002684e−18 |
| C36 | 7.25331258e−22 | 1.07417031e−21 |
| C38 | −4.73496575e−22 | 4.76896118e−22 |
| C40 | −2.11297656e−22 | −1.10250035e−21 |
| C42 | −1.027530656e−23 | −8.66116391e−21 |
| C44 | 5.07988503e−24 | −1.22722218e−20 |
| C46 | −9.35932524e−25 | −6.27142618e−24 |
| C48 | −2.7783366e−25 | −8.01178971e−24 |
| C50 | −1.59026041e−25 | −3.05243873e−23 |
| C52 | −6.53452661e−27 | 2.93392122e−23 |
| C54 | 1.824705e−27 | −8.82506065e−23 |
| C55 | 2.29320351e−27 | −6.20705864e−26 |
| C57 | 4.07644119e−27 | −1.36210254e−26 |
| C59 | −1.98759397e−28 | −6.17708439e−26 |
| C61 | −4.48732119e−29 | −1.10303922e−25 |
| C63 | −1.85722793e−30 | 1.36969417e−25 |
| C65 | 2.81372879e−31 | −1.05691239e−25 |

Table 4a for FIG. 2

| Surface | DCX | DCY | DCZ |
|---|---|---|---|
| Image plane | 0.00000000 | 0.00000000 | 0.00000000 |
| M8 | 0.00000000 | 0.00000000 | 724.00020000 |
| M7 | 0.00000000 | −156.29867133 | 95.23660203 |
| M6 | 0.00000000 | 69.24296301 | 1002.51687199 |
| M5 | 0.00000000 | 376.70486973 | 1458.55105482 |
| M4 | 0.00000000 | 768.07202185 | 1679.06041506 |
| M3 | 0.00000000 | −418.87445828 | 1388.75512246 |
| M2 | −0.00000000 | −951.87794696 | 999.51576030 |
| M1 | −0.00000000 | −1732.87150302 | 29.24804987 |
| Object plane | −0.00000000 | −1870.89265468 | 1987.57585464 |

Table 4b for FIG. 2

| Surface | TLA [deg] | TLB [deg] | TLC [deg] |
|---|---|---|---|
| Image plane | −0.00000000 | 0.00000000 | −0.00000000 |
| M8 | −7.20360764 | 0.00000000 | −0.00000000 |
| M7 | 164.56899679 | 0.00000000 | −0.00000000 |
| M6 | 66.01183481 | −0.00000000 | 180.00000000 |
| M5 | 46.01183481 | 0.00000000 | 0.00000000 |
| M4 | −66.46601090 | 0.00000000 | −0.00000000 |
| M3 | 26.13973836 | −0.00000000 | 180.00000000 |
| M2 | 46.13973836 | 0.00000000 | −0.00000000 |
| M1 | 164.11964399 | 0.00000000 | 0.00000000 |
| Object plane | 0.00000000 | 0.00000000 | 0.00000000 |

Table 5 for FIG. 2

| Surface | Angle of incidence [deg] | Reflectivity |
|---|---|---|
| M8 | 7.20360764 | 0.66017316 |
| M7 | 0.00000627 | 0.66565840 |
| M6 | 80.46059205 | 0.88430204 |
| M5 | 79.52462332 | 0.87198912 |
| M4 | 10.34002306 | 0.65386862 |
| M3 | 78.62259485 | 0.85965098 |
| M2 | 81.25157420 | 0.89438137 |
| M1 | 20.18260294 | 0.61248770 |
| Overall transmission | | 0.1043 |

Table 6 for FIG. 2

| X [mm] | Y [mm] | Z [mm] |
|---|---|---|
| 0.00000000 | 320.37449215 | −71.38743287 |
| 48.36574379 | 316.80745936 | −71.27476399 |
| 95.79913948 | 306.15249000 | −70.94768730 |
| 141.36313519 | 288.55110075 | −70.43891500 |
| 184.11362993 | 264.24936742 | −69.80243066 |
| 223.10205565 | 233.61232523 | −69.11179911 |
| 257.38560926 | 197.14179980 | −68.45633706 |
| 286.04752607 | 155.49451794 | −67.93434999 |
| 308.22857191 | 109.49597859 | −67.64324197 |
| 323.16872022 | 60.14481518 | −67.66726101 |
| 330.25516914 | 8.60292360 | −68.06468586 |
| 329.07035438 | −43.83122398 | −68.85697088 |
| 319.43251774 | −95.76530795 | −70.02235741 |
| 301.42236387 | −145.76769643 | −71.49560404 |
| 275.39215543 | −192.42726762 | −73.17404386 |
| 241.95716406 | −234.41168219 | −74.92871123 |
| 201.97236169 | −270.51874890 | −76.61837302 |
| 156.49875437 | −299.71790154 | −78.10418339 |
| 106.76380494 | −321.18109072 | −79.26314903 |
| 54.11946362 | −334.30400997 | −79.99924341 |
| 0.00000000 | −338.71937192 | −80.25155891 |
| −54.11946362 | −334.30400997 | −79.99924341 |
| −106.76380494 | −321.18109072 | −79.26314903 |
| −156.49875437 | −299.71790154 | −78.10418339 |
| −201.97236169 | −270.51874890 | −76.61837302 |
| −241.95716406 | −234.41168219 | −74.92871123 |
| −275.39215543 | −192.42726762 | −73.17404386 |
| −301.42236387 | −145.76769643 | −71.49560404 |
| −319.43251774 | −95.76530795 | −70.02235741 |
| −329.07035438 | −43.83122398 | −68.85697088 |
| −330.25516914 | 8.60292360 | −68.06468586 |
| −323.16872022 | 60.14481518 | −67.66726101 |
| −308.22857191 | 109.49597859 | −67.64324197 |
| −286.04752607 | 155.49451794 | −67.93434999 |
| −257.38560926 | 197.14179980 | −68.45633706 |
| −223.10205565 | 233.61232523 | −69.11179911 |
| −184.11362993 | 264.24936742 | −69.80243066 |
| −141.36313519 | 288.55110075 | −70.43891500 |
| −95.79913948 | 306.15249000 | −70.94768730 |
| −48.36574379 | 316.80745936 | −71.27476399 |

An overall reflectivity of the projection optical unit 7 is 10.43%.

The mirrors M1 to M7 are free-form surfaces, in which the free-from surface expansion goes at most to the tenth power of x and y. In the mirror M8, this expansion continues to the twelfth power of x and y.

The axes of rotation symmetry of the aspherical mirrors are generally tilted with respect to a normal of the image plane 9, as is made clear by the tilt values in the tables.

The mirrors M1, M2, M4, M5 and M8 have negative values for the radius, i.e. are, in principle, concave mirrors. The mirrors M3, M6 and M7 have positive values for the radius, i.e. are, in principle, convex mirrors. The mirrors M2, M3, M5 and M6 have very large absolute radii, i.e. only constitute small deviations from plane reflection surfaces.

The image field 8 has an x-extent of two times 6.5 mm and a y-extent of 1 mm. The projection optical unit 7 is optimized for an operating wavelength of the illumination light 3 of 13.5 nm.

A first pupil plane 18 is arranged between the mirrors M2 and M3 in the beam path of the imaging light 3. Unlike what is schematically depicted in FIG. 2, the first pupil plane 18 is tilted relative to the chief ray of a central field point, i.e. it includes an angle of ≠90° with this chief ray. The whole beam of the imaging light 3 is accessible from all sides in the region of the pupil plane 18 between the mirrors M2 and M3. Therefore, an aperture stop can be arranged in the region of the pupil plane 18. In the following text, this stop is also denoted by the reference sign 18. Alternatively or additionally, it is possible, as explained above in conjunction with Table 6 for FIG. 2, for the stop also to be arranged on the mirror M8.

An edge of a stop surface of the stop (cf—also Table 6 for FIG. 2) emerges from intersection points on the stop surface of all rays of the illumination light 3 which, on the image side, propagate at the field center point in the direction of the stop surface with a complete image-side telecentric aperture. When the stop 18 is embodied as an aperture stop, the edge is an inner edge.

The stop 18 can lie in a plane or else have a three-dimensional embodiment. The extent of the stop 18 can be smaller in the scanning direction (y) than in the cross-scanning direction (x).

An intermediate image 19 of the projection optical unit 7 is arranged in the imaging beam path between the mirrors M3 and M4.

A further pupil plane of the projection optical unit 7 is arranged in the region of the reflection of the imaging light 3 on the mirrors M7 and M8. Aperture stops in the region of the mirrors M7 and M8 can be arranged distributed for the x-dimension, on the one hand, and for the y-direction, on the other hand, at two positions in the imaging beam path, for example there can be an aperture stop for primarily providing a restriction along the y-dimension on the mirror M8 and an aperture stop primarily providing a restriction along the x-dimension on the mirror M7.

An installation length of the projection optical unit 7 in the z-direction, i.e. a distance between the object plane 5 and the image plane 9, is approximately 2000 mm. The mirror M8 has a diameter lying in the region of 650 mm. A y-distance do's between a central object field point and a central image field point is 1870 mm.

The projection optical unit 7 has a scanned RMS value of the wavefront aberration which is less than 5 to 10 mλ. The distortion of the projection optical unit 7 is less than 0.12 nm. A telecentricity value of the projection optical unit 7, measured in the x-direction over the image field 8, is less than 6 mrad. A telecentricity value of the projection optical unit 7, measured in the y-direction over the image field 8, is less than 0.4 mrad.

The projection optical unit 7 is approximately telecentric on the image side.

A working distance between the mirror M7 closest to the image field and the image field 8 is 78 mm.

Less than 15% of the numerical aperture is obscured due to the passage opening 17. The obscuration edge is constructed analogously to the way the stop edge is constructed, as explained above in conjunction with the stop 18. When embodied as an obscuration stop, the edge is an outer edge of the stop. In a system pupil of the projection optical unit 7, a surface which cannot be illuminated due to the obscuration is less than $0.15^2$ of the surface of the overall system pupil. The non-illuminated surface within the system pupil can have a different extent in the x-direction than in the y-direction. The non-illuminated surface in the system pupil can be round, elliptical, square or rectangular. Moreover, this surface in the system pupil which cannot be illuminated can be decentered in the x-direction and/or in the y-direction in relation to a center of the system pupil.

A further embodiment of a projection optical unit 20, which can be used in the projection exposure apparatus 1 according to FIG. 1 instead of the projection optical unit 7, is explained in the following text on the basis of FIG. 3. Components and functions which were already explained above in the context of FIGS. 1 and 2 are appropriately denoted by the same reference signs and are not discussed again in detail.

The mirrors M1 to M6 are once again embodied as free-form surface mirrors, for which the free-form surface equation (1) specified above applies. The optical design data of the projection optical unit 20 can be gathered from the following tables, which in terms of their design correspond to the tables in respect of the projection optical unit 7 according to FIG. 2.

Figure 3:
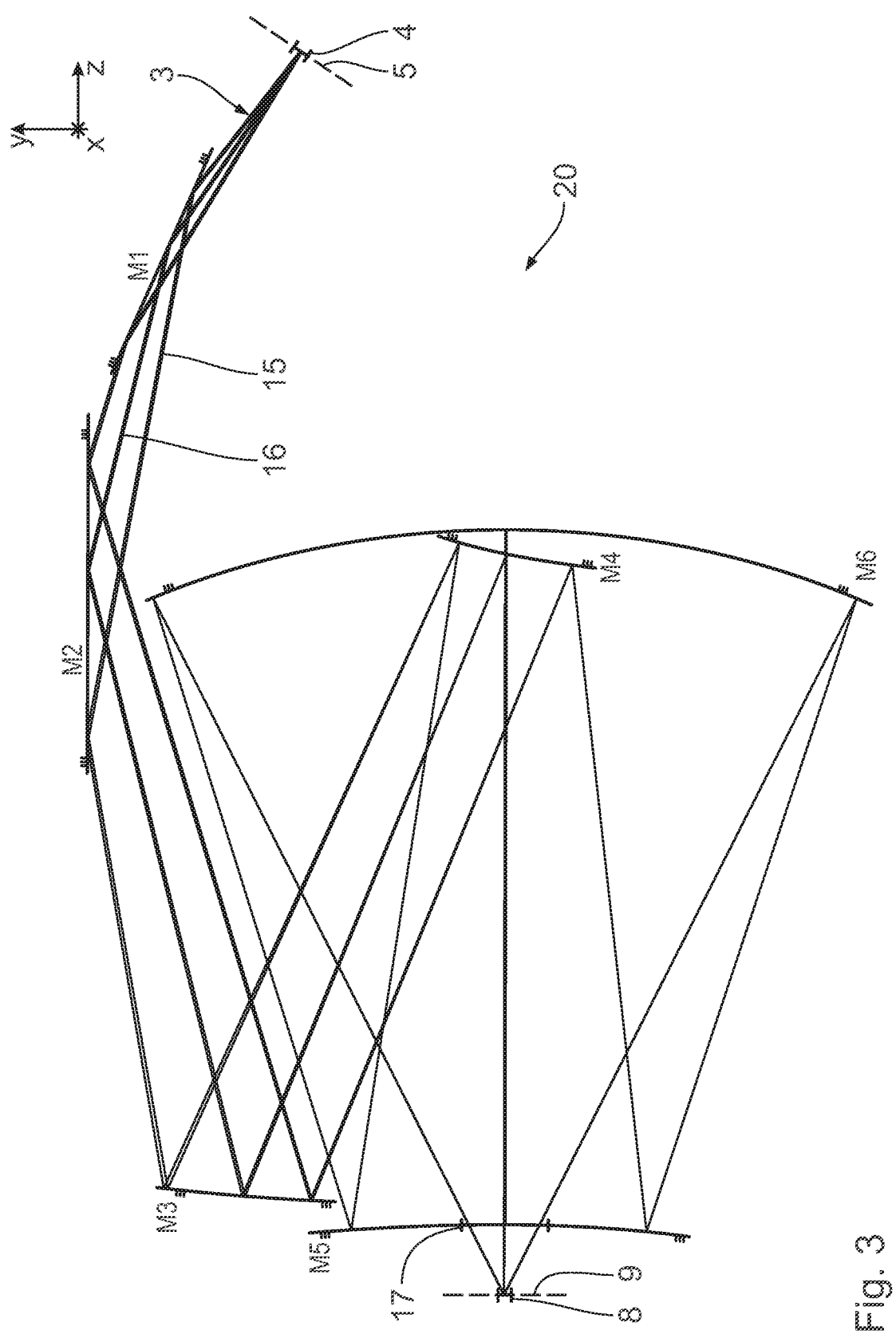
FIGS. 3 to 13 respectively show, in an illustration similar to FIG. 2, further embodiments of an imaging optical unit which can be used as a projection lens in the projection exposure apparatus according to FIG. 1.

| Table 1 for FIG. 3 | |
|---|---|
| Exemplary embodiment | FIG. 3 |
| NA | 0.45 |
| Wavelength | 13.5 nm |
| Field dimension x | 13.0 mm |
| Field dimension y | 0.784 mm |
| Feldkruemmung | 0.0 1/mm |
| Stop | M6 |

| Table 2 for FIG. 3 | | | | | |
|---|---|---|---|---|---|
| Surface | Radius_x [mm] | Power_x [1/mm] | Radius_y [mm] | Power_y [1/mm] | Operating |
| M6 | −1404.14350601 | 0.00142436 | −1309.12297977 | 0.00152774 | REFL |
| M5 | 5382.39322209 | −0.00037158 | 2573.23597524 | −0.00077723 | REFL |
| M4 | 1869.70984553 | −0.00105007 | 1245.12728595 | −0.00163626 | REFL |
| M3 | −5275.63794156 | 0.00036040 | −2876.86701766 | 0.00073127 | REFL |
| M2 | — | 0.00002889 | 117297.48607361 | −0.00007065 | REFL |
| M1 | — | 0.00000889 | −59894.00868988 | 0.00018903 | REFL |

| Table 3a for FIG. 3 | | | |
|---|---|---|---|
| Coefficient | M6 | M5 | M4 |
| KY | 0.00000000 | 0.00000000 | 0.00000000 |
| KX | 0.00000000 | 0.00000000 | 0.00000000 |
| RX | −1404.14350600 | 5382.39322200 | 1869.70984600 |
| C7 | 2.03330045e−08 | 2.3344482e−07 | 7.23054695e−07 |
| C9 | 4.65863782e−09 | 1.18051932e−07 | 1.24097017e−06 |
| C10 | −7.84668249e−12 | 1.62577951e−10 | 1.87744351e−10 |
| C12 | −1.7637487e−11 | 5.87834308e−10 | 8.29505595e−10 |
| C14 | −6.18838343e−12 | 2.5617744e−10 | 3.12998874e−09 |
| C16 | 9.06006234e−15 | 2.50004118e−13 | 9.06901063e−13 |
| C18 | 1.02692539e−14 | 4.14837589e−13 | 1.32517565e−12 |
| C20 | 4.29131815e−15 | 2.84090337e−13 | 1.73975885e−11 |
| C21 | −5.55421623e−18 | 1.40965954e−16 | 5.47388002e−16 |
| C23 | −1.88026398e−17 | 9.40416055e−16 | 1.58311459e−15 |
| C25 | −1.54749472e−17 | 8.25709315e−16 | 2.17853503e−14 |
| C27 | −4.79448181e−18 | 5.01235176e−16 | 8.48825036e−14 |
| C29 | 4.15266197e−21 | 3.91907237e−19 | 2.95779995e−18 |
| C31 | 8.9008726e−21 | 1.24932564e−18 | −9.00584397e−18 |
| C33 | 8.90593911e−21 | 1.73719878e−18 | 1.70412678e−16 |
| C35 | 3.09195946e−21 | 9.75392684e−19 | 3.3318325e−16 |
| C36 | −3.35220532e−24 | 1.95464646e−22 | −2.10907241e−21 |
| C38 | −1.54416412e−23 | 1.95489479e−21 | −3.54137492e−20 |
| C40 | −2.0112602e−23 | 2.59845192e−21 | 7.5377104e−20 |
| C42 | −1.26210611e−23 | 3.18819744e−21 | 1.25792108e−18 |
| C44 | −3.17245779e−24 | 1.20046993e−21 | 2.21018136e−18 |
| C46 | 2.57983572e−27 | 1.17913803e−24 | −1.59573436e−23 |
| C48 | 9.18263006e−27 | 6.27728863e−24 | 7.54265613e−23 |
| C50 | 1.41039202e−26 | 1.17489651e−23 | 3.92042663e−21 |
| C52 | 6.68942097e−27 | 5.23414869e−24 | 9.85615328e−21 |
| C54 | 1.98073687e−28 | −3.40518909e−24 | 1.56979448e−20 |
| C55 | −1.54418379e−30 | 2.82069597e−28 | 7.73972202e−26 |
| C57 | −7.38488366e−30 | 4.3385682e−27 | 1.18049046e−24 |
| C59 | −1.24334052e−29 | 1.31986693e−26 | 7.47854689e−24 |
| C61 | −1.45721166e−29 | 2.79892262e−26 | 2.8778736e−23 |
| C63 | −8.46049004e−30 | 1.43392203e−26 | 4.2065804e−23 |
| C65 | −1.46997251e−30 | 2.39797376e−27 | 5.84041106e−23 |
| C67 | 1.37077767e−33 | 0 | 0 |
| C69 | 5.96198912e−33 | 0 | 0 |
| C71 | 1.01109499e−32 | 0 | 0 |
| C73 | 6.86378346e−33 | 0 | 0 |
| C75 | 1.49095714e−33 | 0 | 0 |

-continued

Table 3a for FIG. 3

| Coefficient | M6 | M5 | M4 |
|---|---|---|---|
| C77 | −9.91986177e−34 | 0 | 0 |
| C78 | −1.55332549e−36 | 0 | 0 |
| C80 | −1.18750127e−35 | 0 | 0 |
| C82 | −3.4522721e−35 | 0 | 0 |
| C84 | −4.95083176e−35 | 0 | 0 |
| C86 | −3.9770171e−35 | 0 | 0 |
| C88 | −1.77881031e−35 | 0 | 0 |
| C90 | −4.7556972e−36 | 0 | 0 |

Table 3b for FIG. 3

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | −5275.63794200 | −16708.20815000 | −39723.46084000 |
| C7 | 8.64742859e−08 | −8.48534383e−09 | −2.08763509e−08 |
| C9 | 3.58476501e−07 | 3.56008272e−08 | 4.00254821e−09 |
| C10 | −9.89224446e−12 | 7.79106894e−12 | 6.10160158e−12 |
| C12 | 1.89327581e−10 | −3.72471221e−11 | 2.5509318e−11 |
| C14 | −2.20258778e−11 | 8.74900994e−12 | −2.0034758e−12 |
| C16 | 3.36193204e−14 | −9.31983872e−15 | −3.37582455e−14 |
| C18 | −2.12152315e−14 | −1.05001591e−14 | −2.60298094e−15 |
| C20 | 1.59066226e−12 | 4.18135526e−14 | 1.5188487e−14 |
| C21 | −3.57227533e−17 | 2.48094952e−16 | −2.46535966e−18 |
| C23 | 3.58646429e−16 | −5.00075703e−16 | 4.78079643e−16 |
| C25 | −1.15198491e−15 | 4.51130937e−17 | −3.26758719e−17 |
| C27 | 2.69006089e−15 | −9.86544399e−17 | 1.98569101e−17 |
| C29 | 2.41625825e−19 | 9.76505015e−19 | −7.87248278e−19 |
| C31 | −2.87191946e−18 | −2.8203702e−19 | −2.06138283e−19 |
| C33 | 6.65153055e−18 | 5.40607111e−19 | 7.02649602e−19 |
| C35 | −5.72207985e−19 | 2.31901108e−19 | −1.87549676e−19 |
| C36 | 6.83729655e−22 | −1.00234103e−20 | −8.03851852e−20 |
| C38 | 1.73175943e−21 | 1.71755837e−21 | 1.11388044e−20 |
| C40 | −2.72288684e−20 | 1.22332554e−20 | −1.96231837e−20 |
| C42 | −2.97819086e−21 | −1.20581608e−21 | 1.6679562e−22 |
| C44 | −6.38720395e−20 | −5.106798e−22 | 6.16920305e−22 |
| C46 | −5.68914983e−24 | −5.45078584e−23 | 2.3674629e−22 |
| C48 | −2.84889707e−23 | −6.64895561e−23 | −3.49242868e−22 |
| C50 | 3.83000613e−23 | −4.29346478e−23 | −1.19854415e−24 |
| C52 | −4.35843617e−22 | −4.88783101e−24 | −2.79173067e−24 |
| C54 | −3.75443641e−22 | 5.45348307e−25 | −3.58898078e−24 |
| C55 | −1.91069212e−26 | 5.17580849e−25 | 1.20339e−23 |
| C57 | −1.72210512e−25 | 7.20583842e−25 | −3.2258403e−24 |
| C59 | −1.79738954e−25 | 1.20881577e−25 | 1.09042629e−24 |
| C61 | 4.86608652e−25 | 5.18691604e−26 | −1.64197128e−26 |
| C63 | −1.43412851e−24 | 1.31385226e−26 | −2.52495238e−26 |
| C65 | −1.41254772e−24 | 1.87401871e−28 | 9.47040406e−27 |

Table 4a for FIG. 3

| Surface | DCX | DCY | DCZ |
|---|---|---|---|
| Image plane | 0.00000000 | 0.00000000 | 0.00000000 |
| M6 | 0.00000000 | 0.00000000 | 1074.41519438 |
| M5 | 0.00000000 | 0.00000000 | 99.48354955 |
| M4 | 0.00000000 | −18.05249415 | 1035.70751868 |
| M3 | 0.00000000 | 354.51020937 | 138.41973030 |
| M2 | 0.00000000 | 583.20780276 | 1031.25041556 |
| M1 | 0.00000000 | 480.41270702 | 1449.24921820 |
| Object plane | 0.00000000 | 285.24003154 | 1740.57897606 |

Table 4b for FIG. 3

| Surface | TLA [deg] | TLB [deg] | TLC [deg] |
|---|---|---|---|
| Image plane | −0.00000000 | 0.00000000 | −0.00000000 |
| M6 | −0.00000000 | 0.00000000 | −0.00000000 |
| M5 | 180.10113984 | 0.00000000 | −0.00000000 |
| M4 | 10.44914510 | 0.00000000 | −0.00000000 |
| M3 | 183.92725161 | 0.00000000 | −0.00000000 |
| M2 | −90.00000000 | 0.00000000 | −0.00000000 |
| M1 | −65.87304931 | 0.00000000 | −0.00000000 |
| Object plane | 219.81806502 | 0.00000000 | −0.00000000 |

Table 5 for FIG. 3

| Surface | AOI [deg] | Reflectivity |
| --- | --- | --- |
| M6 | 0.00000000 | 0.66565840 |
| M5 | 0.10113984 | 0.66566360 |
| M4 | 10.98797784 | 0.65222749 |
| M3 | 18.06949355 | 0.62484145 |
| M2 | 76.03503185 | 0.82099428 |
| M1 | 79.82551612 | 0.87599782 |
| Overall transmission | | 0.1299 |

Table 6 for FIG. 3

| X [mm] | Y [mm] | Z [mm] |
| --- | --- | --- |
| 0.00000000 | 492.97220996 | −96.10794925 |
| 77.13108081 | 486.98647828 | −95.94002807 |
| 152.43816471 | 469.15642998 | −95.45692466 |
| 224.12261559 | 439.86539988 | −94.71825918 |
| 290.44072269 | 399.75735967 | −93.81572137 |
| 349.74050124 | 349.74050124 | −92.86218695 |
| 400.50664890 | 290.98511318 | −91.97772489 |
| 441.41186799 | 224.91058045 | −91.27386447 |
| 471.36993312 | 153.15737548 | −90.83815133 |
| 489.58364884 | 77.54243221 | −90.72167600 |
| 495.58014901 | 0.00000000 | −90.93247362 |
| 489.22770728 | −77.48605661 | −91.43684982 |
| 470.73236324 | −152.95021647 | −92.16852700 |
| 440.61763177 | −224.50589688 | −93.04283923 |
| 399.69380564 | −290.39454798 | −93.97161858 |
| 349.02334931 | −349.02334931 | −94.87488676 |
| 289.88633185 | −398.99430615 | −95.68748150 |
| 223.74683115 | −439.12788139 | −96.36090853 |
| 152.21937846 | −468.48307512 | −96.86197052 |
| 77.03412861 | −486.37434617 | −97.16995149 |
| 0.00000000 | −492.38475170 | −97.27376481 |
| −77.03412861 | −486.37434617 | −97.16995149 |
| −152.21937846 | −468.48307512 | −96.86197052 |
| −223.74683115 | −439.12788139 | −96.36090853 |
| −289.88633185 | −398.99430615 | −95.68748150 |
| −349.02334931 | −349.02334931 | −94.87488676 |
| −399.69380564 | −290.39454798 | −93.97161858 |
| −440.61763177 | −224.50589688 | −93.04283923 |
| −470.73236324 | −152.95021647 | −92.16852700 |
| −489.22770728 | −77.48605661 | −91.43684982 |
| −495.58014901 | −0.00000000 | −90.93247362 |
| −489.58364884 | 77.54243221 | −90.72167600 |
| −471.36993312 | 153.15737548 | −90.83815133 |
| −441.41186799 | 224.91058045 | −91.27386447 |
| −400.50664890 | 290.98511318 | −91.97772489 |
| −349.74050124 | 349.74050124 | −92.86218695 |
| −290.44072269 | 399.75735967 | −93.81572137 |
| −224.12261559 | 439.86539988 | −94.71825918 |
| −152.43816471 | 469.15642998 | −95.45692466 |
| −77.13108081 | 486.98647828 | −95.94002807 |

An overall reflectivity of the projection optical unit 20 is 12.99%.

The projection optical unit 20 has an image-side numerical aperture of 0.45. The image field 8 has an x-extent of two times 6.5 mm and a y-extent of 1 mm. The projection optical unit 20 is optimized for an operating wavelength of the illumination light 3 of 13.5 nm.

The projection optical unit 20 has a reducing imaging scale of 8×(β=8).

The projection optical unit 20 has exactly six mirrors M1 to M6. The mirrors M1 and M2 are once again embodied as mirrors for grazing incidence and, as a mirror pair, are arranged directly behind one another in the imaging beam path. The projection optical unit 20 has exactly two mirrors for grazing incidence, namely the mirrors M1 and M2.

The mirrors M3 to M6 are embodied as mirrors for normal incidence.

The projection optical unit 20 has an overall reflectivity which is greater than 11.97%.

In absolute terms, the object plane 5 is tilted with respect to the image plane 9 by an angle of approximately 39° about the x-axis. Accordingly, a value TLA of approximately 219° is specified for the object field in the last table above (Table 3b for FIG. 3).

A z-distance between the object field 4 and the image field 8 is approximately 1740 mm. The mirror with the largest diameter is the mirror M6 with a diameter value of 1000 mm. A y-distance between the object field 4 and the image field 8, i.e. the value do's, is 285 mm at the object field 4. Just as in the projection optical unit 7, an object field-side chief ray angle CRAO is 5.5° in the projection optical unit 20. A scanned RMS value for the wavefront aberration is less than 10.5 mλ in the projection optical unit 20. A distortion value in the projection optical unit 20 is less than 0.1 nm. A telecentricity value of the projection optical unit 20, in the x-direction, is less than 5 mrad on the image field side. A telecentricity value of the projection optical unit 20, in the y-direction, is less than 0.45 mrad on the image field side.

In the projection optical unit 20, a pupil plane is arranged in the region of a reflection of the imaging light 3 on the penultimate mirror M5 in the beam path upstream of the image field 8. Therefore, an aperture stop can be arranged on the mirror M5, or else on the mirror M6. The polygonal edge in accordance with preceding Table 6 for FIG. 3 relates to a stop on the mirror M6.

The projection optical unit 20 is substantially telecentric on the image side. A working distance between the mirror M5 closest to the image field and the image field 8 is approximately 90 mm.

The image field 8 lies in the first image plane of the projection optical unit 20 downstream of the object field 4. Therefore, the projection optical unit 20 does not generate an intermediate image in the imaging beam path between the object field 4 and the image field 8.

A pupil obscuration of the projection optical unit 20 is caused by an arrangement of the antepenultimate mirror M4 in the imaging beam path directly in front of a center of the last mirror M6. This obscuration is less than 26% of the image-side numerical aperture of the projection optical unit 20.

Only the penultimate mirror M5 in the imaging beam path has a passage opening 17 for the imaging light 3. All other mirrors M1 to M4 and M6 have a continuous reflection surface.

The reflection surface of the mirror M5 is used around the passage opening 17 of the latter. The reflection surface of the mirror M6 is not used continuously but only where there is no obscuration by the mirror M4 arranged in front of the reflection surface of the mirror M6.

The two mirrors M1 and M2 for grazing incidence deflect the imaging light 3 laterally past the last mirror M6 and around the reflection surface thereof.

The mirror M2 is rotated by 90° about the x-axis in relation to the image plane 9, i.e. it is practically perpendicular to the image plane 9.

The mirrors M1, M3 and M6 have negative values for the radius, i.e., are, in principle, concave mirrors. The mirrors M2, M4 and M5 have a positive value for the radius, i.e. are, in principle, convex mirrors. The mirrors M1 and M2 for grazing incidence once again have very large radii, i.e. only constitute small deviations from plane reflection surfaces.

A further embodiment of a projection optical unit 21, which can be used in the projection exposure apparatus 1 according to FIG. 1 instead of the projection optical unit 7, is explained in the following text on the basis of FIG. 4. Components and functions which were already explained above in the context of FIGS. 1 to 3 are appropriately denoted by the same reference signs and are not discussed in detail again.

The mirrors M1 to M6 are once again embodied as free-form surfaces, for which the free-form surface equation (1), specified above, applies. The optical design data of the projection optical unit 21 can be gathered from the following tables which, in terms of their design, correspond to the tables in relation to the projection optical unit 7 according to FIG. 2.

Figure 4:
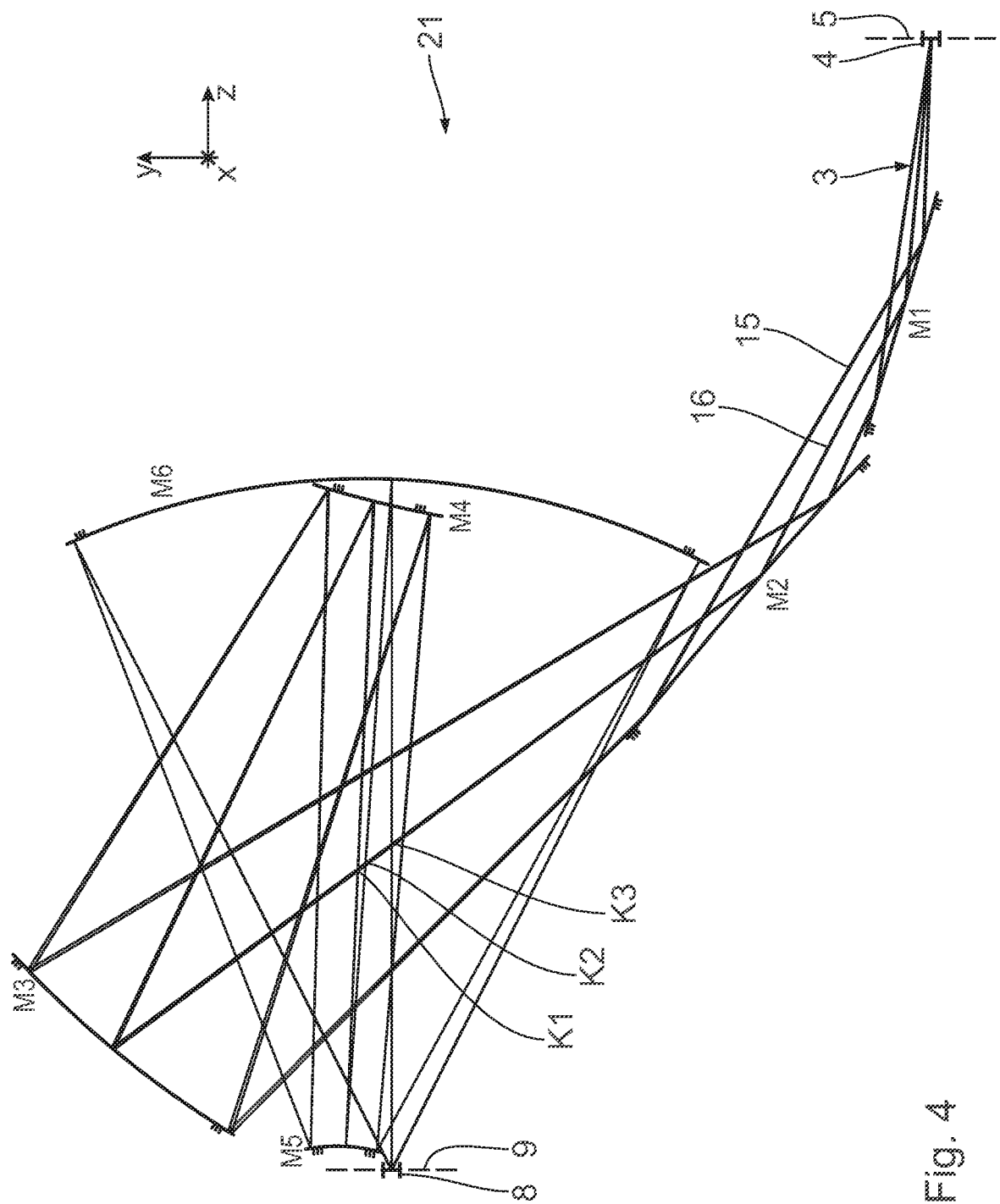

Table 1 for FIG. 4

| Exemplary embodiment | FIG. 4 |
|---|---|
| NA | 0.45 |
| Wavelength | 13.5 nm |
| Field dimension x | 13.0 mm |
| Field dimension y | 0.72 mm |
| Feldkruemmung | 0.0 1/mm |
| Stop | M6 |

Table 2 for FIG. 4

| Surface | Radius x [mm] | Power x [1/mm] | Radius y [mm] | Power y [1/mm] | Operating |
|---|---|---|---|---|---|
| M6 | −1833.09710653 | 0.00109040 | −1385.57542302 | 0.00144431 | REFL |
| M5 | 18877.49637144 | −0.00010594 | 277.21693985 | −0.00721519 | REFL |
| M4 | 1438.66217038 | −0.00136186 | 2430.30119114 | −0.00084006 | REFL |
| M3 | −5662.42216724 | 0.00034243 | −2106.61551667 | 0.00097927 | REFL |
| M2 | −2969.78461968 | 0.00015377 | 6812.60965389 | −0.00128573 | REFL |
| M1 | −2412.85320295 | 0.00015904 | — | 0.00054720 | REFL |

Table 3a for FIG. 4

| Coefficient | M6 | M5 | M4 |
|---|---|---|---|
| KY | 0.00000000 | 0.00000000 | 0.00000000 |
| KX | 0.00000000 | 0.00000000 | 0.00000000 |
| RX | −1833.09710700 | 18877.49637000 | 1438.66217000 |
| C7 | 7.14702547e−09 | 1.33000904e−07 | 2.160143e−07 |
| C9 | 1.45748065e−09 | 1.5551429e−06 | 1.9750259e−07 |
| C10 | −1.34433863e−12 | 3.23052512e−11 | 5.21219354e−10 |
| C12 | −8.65246158e−12 | 5.51908435e−10 | 1.38068278e−09 |
| C14 | −1.26897363e−12 | 8.494392e−09 | 2.47542622e−09 |
| C16 | 2.49155269e−15 | 7.83281848e−14 | 1.30801781e−12 |
| C18 | 2.81581124e−15 | 2.59073558e−12 | 2.75791629e−12 |
| C20 | 2.0590302e−16 | −3.40842288e−12 | −8.77664173e−13 |
| C21 | −8.77508671e−19 | 1.53250792e−17 | 1.64959774e−15 |
| C23 | −5.17996772e−18 | 9.13281795e−16 | 6.92468226e−15 |
| C25 | −5.66728016e−18 | 2.13183138e−14 | 1.40378342e−14 |
| C27 | −7.76369168e−19 | 1.54890141e−13 | −1.72019847e−15 |
| C29 | 7.88863678e−22 | 6.55771751e−20 | 7.43041791e−18 |
| C31 | 1.75672504e−21 | 3.84581458e−18 | 2.35894363e−17 |
| C33 | 1.18814584e−21 | 1.39333507e−16 | 9.97718923e−18 |
| C35 | 1.7493548e−22 | 9.81761115e−16 | −8.01499171e−17 |
| C36 | −3.26021342e−25 | 4.67363491e−24 | 8.85753541e−21 |
| C38 | −2.46229027e−24 | 7.7058017e−22 | 4.5880821e−20 |
| C40 | −4.93976866e−24 | 4.33147562e−20 | 9.06865917e−20 |
| C42 | −3.29404362e−24 | 1.02682561e−18 | 2.64402588e−20 |
| C44 | −2.40295612e−25 | −5.42295264e−18 | −1.60806374e−19 |
| C46 | 2.57227242e−28 | 7.65609824e−26 | 4.63076076e−23 |
| C48 | 9.19738739e−28 | 9.96764671e−24 | 1.91012714e−22 |
| C50 | 1.09743754e−27 | 3.12974539e−22 | 1.20398721e−22 |
| C52 | 6.66432955e−28 | 4.91785424e−21 | −6.82880718e−22 |
| C54 | 4.73076e−29 | −1.02818878e−19 | −1.43891315e−22 |
| C55 | −1.11030431e−31 | 1.20361818e−29 | 5.11515109e−27 |
| C57 | −8.81991592e−31 | 1.86280552e−27 | 7.24559338e−26 |
| C59 | −2.38622966e−30 | 9.47962857e−26 | 6.67407339e−25 |
| C61 | −2.66847543e−30 | 1.96385049e−24 | 4.01261999e−25 |
| C63 | −1.24137091e−30 | 3.77800757e−23 | 1.66791629e−24 |
| C65 | −2.2904696e−31 | 1.60420604e−22 | 1.13771785e−23 |
| C67 | 7.25951889e−35 | 0 | 0 |
| C69 | 4.78438869e−34 | 0 | 0 |
| C71 | 1.10917899e−33 | 0 | 0 |
| C73 | 1.07566223e−33 | 0 | 0 |
| C75 | 3.02812827e−34 | 0 | 0 |
| C77 | −3.25579859e−35 | 0 | 0 |
| C78 | −6.82496446e−38 | 0 | 0 |
| C80 | −7.3260874e−37 | 0 | 0 |
| C82 | −2.69415965e−36 | 0 | 0 |
| C84 | −4.80262328e−36 | 0 | 0 |

Table 3a for FIG. 4

| Coefficient | M6 | M5 | M4 |
|---|---|---|---|
| C86 | −4.4443622e−36 | 0 | 0 |
| C88 | −1.8807898e−36 | 0 | 0 |
| C90 | −1.49017219e−37 | 0 | 0 |

Table 3b for FIG. 4

| Coefficient | M3 | M2 | M1 |
|---|---|---|---|
| KY | 0.00000000 | 0.00000000 | 0.00000000 |
| KX | 0.00000000 | 0.00000000 | 0.00000000 |
| RX | −5662.42216700 | −2969.78462000 | −2412.85320300 |
| C7 | −2.05061152e−08 | −9.01491023e−09 | 3.75760309e−08 |
| C9 | −2.38681532e−08 | −1.07722528e−08 | −1.82353448e−08 |
| C10 | −4.85387951e−11 | 4.11164421e−11 | 5.36007066e−11 |
| C12 | −7.98597183e−11 | 4.52376364e−11 | 6.33402678e−11 |
| C14 | −1.11064223e−10 | 5.55561647e−11 | −2.21093738e−11 |
| C16 | 3.94476467e−14 | −6.11601685e−15 | 4.38538416e−14 |
| C18 | 3.00776935e−15 | 3.77778718e−14 | 5.55251888e−14 |
| C20 | −3.12244022e−14 | 8.99013939e−14 | 3.83809162e−14 |
| C21 | −3.00816505e−18 | 1.02603871e−16 | 5.41186271e−17 |
| C23 | −1.21678874e−17 | 8.68697433e−17 | −5.28283589e−17 |
| C25 | 7.00694254e−17 | −2.96767637e−17 | 1.22856285e−16 |
| C27 | 1.94317927e−16 | 7.96011589e−17 | 1.88629304e−16 |
| C29 | 1.8490636e−20 | 5.54481729e−19 | 1.47830311e−18 |
| C31 | −4.13981835e−20 | −1.54413661e−19 | 2.63725411e−20 |
| C33 | −7.30655263e−20 | −5.09614703e−19 | −1.57531897e−18 |
| C35 | −1.01967973e−19 | 2.01225435e−19 | 8.95399962e−19 |
| C36 | −1.7395787e−22 | 6.68694592e−21 | −3.03140695e−20 |
| C38 | −4.94707313e−23 | 2.32782668e−21 | −4.39942988e−21 |
| C40 | 1.78489699e−23 | −5.19392946e−22 | 5.04820517e−21 |
| C42 | −6.0518318e−22 | −1.28561877e−21 | −5.75788873e−21 |
| C44 | −6.16746237e−22 | 2.31456185e−22 | 2.29885486e−21 |
| C46 | −4.02009642e−25 | −1.74361335e−23 | 3.84621986e−23 |
| C48 | −3.28096057e−25 | −2.28128679e−24 | −3.25886976e−23 |
| C50 | 3.55844765e−27 | −1.29996778e−24 | 2.31874654e−23 |
| C52 | 2.77737882e−25 | −3.09482301e−24 | −3.60029308e−24 |
| C54 | 7.20889308e−26 | −3.20584144e−25 | 1.90845046e−24 |
| C55 | 2.93653556e−27 | −2.73182908e−25 | 2.44630793e−24 |
| C57 | 3.4262361e−27 | −1.1889464e−25 | 5.67957006e−25 |
| C59 | 1.45309977e−28 | −8.784571e−27 | −1.36102401e−25 |
| C61 | 6.41931285e−28 | −3.29041198e−27 | 3.37050556e−26 |
| C63 | 9.79557956e−28 | −3.38378135e−27 | 8.90781735e−27 |
| C65 | 7.94905548e−28 | −6.28588637e−28 | −9.66111645e−28 |

Table 4a for FIG. 4

| Surface | DCX | DCY | DCZ |
|---|---|---|---|
| Image plane | 0.00000000 | 0.00000000 | 0.00000000 |
| M6 | 0.00000000 | 0.00000000 | 1336.04673264 |
| M5 | 0.00000000 | 88.98262746 | 49.91664546 |
| M4 | 0.00000000 | 34.16051206 | 1290.78810464 |
| M3 | 0.00000000 | 536.44795589 | 234.08633307 |
| M2 | 0.00000000 | −715.74434374 | 1150.16573744 |
| M1 | 0.00000000 | −995.94799367 | 1693.10641178 |
| Object plane | 0.00000000 | −1039.51678260 | 2186.05270414 |

Table 4b for FIG. 4

| Surface | TLA [deg] | TLB [deg] | TLC [deg] |
|---|---|---|---|
| Image plane | −0.00000000 | 0.00000000 | −0.00000000 |
| M6 | 1.98476664 | 0.00000000 | −0.00000000 |
| M5 | 183.27217830 | 0.00000000 | −0.00000000 |
| M4 | 14.01024317 | 0.00000000 | −0.00000000 |
| M3 | 219.65811514 | 0.00000000 | −0.00000000 |
| M2 | 130.80142743 | 0.00000000 | −0.00000000 |
| M1 | 106.49725896 | 0.00000000 | −0.00000000 |
| Object plane | −0.00000000 | 0.00000000 | −0.00000000 |

Table 5 for FIG. 4

| Surface | Angle of incidence [deg] | Reflectivity |
|---|---|---|
| M6 | 1.98476664 | 0.66533020 |
| M5 | 0.75200847 | 0.66564033 |
| M4 | 11.58467514 | 0.65060513 |
| M3 | 14.19064083 | 0.64216831 |

-continued

Table 5 for FIG. 4

| Surface | Angle of incidence [deg] | Reflectivity |
|---|---|---|
| M2 | 76.80106420 | 0.83300871 |
| M1 | 78.93793736 | 0.86402184 |
| Overall transmission | | 0.1332 |

Table 6 for FIG. 4

| X [mm] | Y [mm] | Z [mm] |
|---|---|---|
| 0.00000000 | 608.52234041 | −140.64683575 |
| 95.94023321 | 601.25931900 | −139.86882799 |
| 189.75379987 | 579.58413919 | −137.60310659 |
| 279.30462104 | 543.84975389 | −134.05121860 |
| 362.44987510 | 494.67987297 | −129.53696039 |
| 437.06577774 | 433.01415623 | −124.48536770 |
| 501.10457736 | 360.15495964 | −119.38904049 |
| 552.68495125 | 277.79910686 | −114.76081019 |
| 590.20868666 | 188.03626648 | −111.07562152 |
| 612.48557340 | 93.29913092 | −108.70965207 |
| 618.84016352 | −3.73883968 | −107.88877482 |
| 609.17368855 | −100.30707275 | −108.65869405 |
| 583.96436539 | −193.69806970 | −110.88422162 |
| 544.20637659 | −281.41366860 | −114.27689980 |
| 491.30439984 | −361.27238788 | −118.44241764 |
| 426.94956472 | −431.46613730 | −122.93554700 |
| 353.00187334 | −490.56898267 | −127.31151102 |
| 271.39634739 | −537.51059935 | −131.16696091 |
| 184.08035860 | −571.53072807 | −134.16843492 |
| 92.98146093 | −592.12968050 | −136.06958267 |
| 0.00000000 | −599.02618416 | −136.72010822 |
| −92.98146093 | −592.12968050 | −136.06958267 |
| −184.08035860 | −571.53072807 | −134.16843492 |
| −271.39634739 | −537.51059935 | −131.16696091 |
| −353.00187334 | −490.56898267 | −127.31151102 |
| −426.94956472 | −431.46613730 | −122.93554700 |
| −491.30439984 | −361.27238788 | −118.44241764 |
| −544.20637659 | −281.41366860 | −114.27689980 |
| −583.96436539 | −193.69806970 | −110.88422162 |
| −609.17368855 | −100.30707275 | −108.65869405 |
| −618.84016352 | −3.73883968 | −107.88877482 |
| −612.48557340 | 93.29913092 | −108.70965207 |
| −590.20868666 | 188.03626648 | −111.07562152 |
| −552.68495125 | 277.79910686 | −114.76081019 |
| −501.10457736 | 360.15495964 | −119.38904049 |
| −437.06577774 | 433.01415623 | −124.48536770 |
| −362.44987510 | 494.67987297 | −129.53696039 |
| −279.30462104 | 543.84975389 | −134.05121860 |
| −189.75379987 | 579.58413919 | −137.60310659 |
| −95.94023321 | 601.25931900 | −139.86882799 |

An overall reflectivity of the projection optical unit 21 is 13.32%.

The projection optical unit 21 has a reducing imaging scale of 8×(β=8).

The image field 8 has an x-extent of two times 6.5 mm and a y-extent of 0.8 mm. The projection optical unit 21 is optimized for an operating wavelength of the illumination light 3 of 13.5 nm.

Like the projection optical unit 20, the projection optical unit 21 is also a purely catoptric projection optical unit with exactly six mirrors M1 to M6. Like in the projection optical unit 20, the first two mirrors M1 and M2 of the projection optical unit 21 in the imaging beam path downstream of the object field 4 are embodied as mirrors for grazing incidence. The further mirrors M3 to M6 are embodied as mirrors for normal incidence.

Unlike the beam guidance of the projection optical units 7 and 20, the chief rays cross in the beam guidance of the projection optical unit 21. This crossing occurs between the partial imaging beam paths between the mirrors M2 and M3 on the one hand and between M4 and M5 on the other hand, where a crossing region K1 is indicated. A further crossing of the chief rays of the imaging partial beam between the mirrors M2 and M3 occurs with the chief rays of the imaging partial beams on the one hand between the mirrors M5 and M6 and between the mirror M6 and the image field on the other hand, which is indicated by further crossing regions K2 and K3.

In the projection optical unit 21, the object plane 5 and the image plane 9 extend parallel to one another.

The mirrors M1, M3 and M6 have negative values for the radius, i.e. are, in principle, concave mirrors. The mirrors M2, M4 and M5 have positive values for the radius, i.e. are, in principle, convex mirrors. The mirrors M1 and M2 once again have very large absolute radii, i.e. only constitute small deviations from plane reflection surfaces.

Like in the projection optical unit 20, the antepenultimate mirror M4 of the projection optical unit 21 is arranged in front of a center of a reflection surface of the last mirror M6 and therefore causes a pupil obscuration of the projection optical unit 21.

In the projection optical unit 21, none of the mirrors M1 to M6 have a passage opening for the imaging light 3. Except for in the case of the mirror M6, all reflection surfaces of the projection optical unit 21, i.e. the reflection surfaces of the mirrors M1 to M5, can be used without gaps. The reflection surface of the mirror M6 is used were no obscuration due to the mirror M4 occurs.

In the projection optical unit 21, a z-distance between the object plane 5 and the image plane 9 is approximately 2200 mm.

A typical diameter of the largest mirror M6 is approximately 1200 mm.

An object/image offset $d_{OIS}$ is approximately 1100 mm in the projection optical unit 21. In the projection optical unit 21, the object field-side chief rays 16 also include an angle CRAO of 5.5° with a normal of the object plane 5.

The projection optical unit 21 has a scanned RMS value of the image field-side wavefront which is less than 11 mλ. In the projection optical unit 21, an image field-side distortion value is less than 0.1 nm. In the projection optical unit 21, an image-side telecentricity value in the x-direction is less than 4 mrad. In the projection optical unit 21, an image-side telecentricity value in the y-direction is less than 0.3 mrad.

In the projection optical unit 21, a pupil plane is arranged in the region of a reflection of the imaging light 3 on the mirror M6. Therefore, an aperture stop can be provided on the mirror M6. The polygonal edge in accordance with preceding Table 6 for FIG. 4 relates to this stop position on the mirror M6. Like the projection optical unit 20, the projection optical unit 21 does not have an intermediate image either.

The projection optical unit 21 is substantially telecentric on the image side.

A working distance between the mirror closest to the image field, the penultimate mirror M5 in the imaging beam path, and the image field 8 is 36 mm.

The mirror M4 defines an image-side obscuration, which is less than 23% of the image-side numerical aperture of the projection optical unit 21.

A further embodiment of a projection optical unit 22, which can be used in the projection exposure apparatus 1 according to FIG. 1 instead of e.g. the projection optical unit 7, is explained in the following text on the basis of FIG. 5.

Components and functions which were already explained above in the context of FIGS. 1 to 4 are appropriately denoted by the same reference signs and are not discussed again in detail.

Overall, the projection optical unit 22 has seven mirrors M1 to M7. The projection optical unit 22 has three mirrors for grazing incidence, namely the mirrors M1 to M3, and four mirrors for normal incidence, namely the mirrors M4 to M7. These mirrors M1 to M7 are once again configured as free-form surfaces, for which the free-form surface equation (1), specified above, applies. The optical design data from the projection optical unit 22 can be gathered from the following tables, which, in terms of their design, correspond to the tables in relation to the projection optical unit 7 according to FIG. 2.

Figure 5:
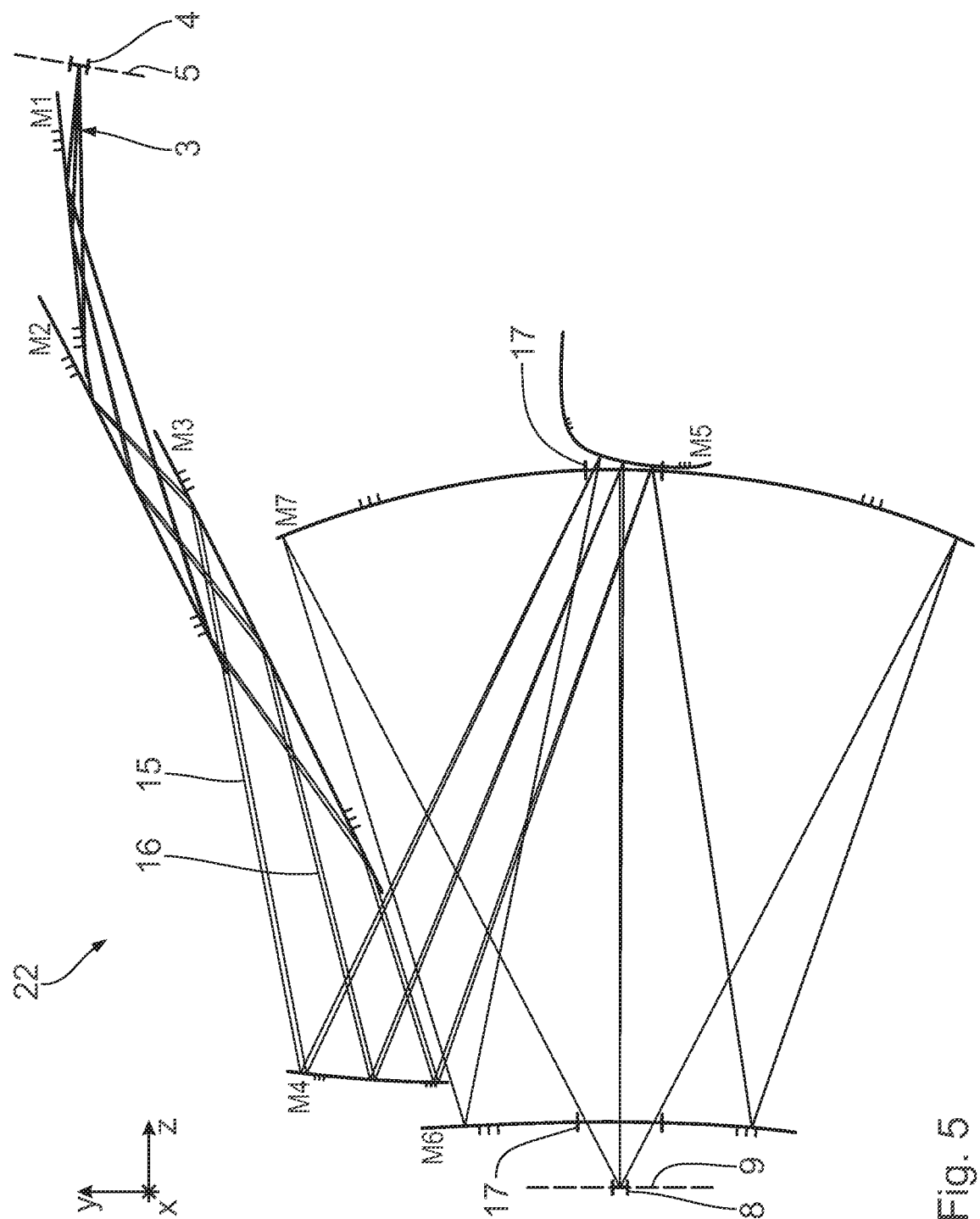

Table 1 for FIG. 5

| Exemplary embodiment | FIG. 5 |
|---|---|
| NA | 0.45 |
| Wavelength | 13.5 nm |
| Field dimension x | 13.0 mm |
| Field dimension y | 0.98 mm |
| Feldkruemmung | 0.0 1/mm |
| Stop | M7 |

Table 2 for FIG. 5

| Surface | Radius_x [mm] | Power_x [1/mm] | Radius_y [mm] | Power_y [1/mm] | Operating |
|---|---|---|---|---|---|
| M7 | — | 0.00117460 | — | 0.00125545 | REFL |
| M6 | 7360.39271982 | −0.00027172 | 3417.65341930 | −0.00058520 | REFL |
| M5 | 2115.61242515 | −0.00092738 | 1567.72388388 | −0.00130046 | REFL |
| M4 | — | 0.00031874 | — | 0.00057981 | REFL |
| M3 | 0.00000000 | −inf | 0.00000000 | −inf | REFL |
| M2 | 0.00000000 | −inf | 0.00000000 | −inf | REFL |
| M1 | 0.00000000 | inf | 0.00000000 | inf | REFL |

Table 3a for FIG. 5

| Coefficient | M7 | M6 | M5 |
|---|---|---|---|
| KY | 0.00000000 | 0.00000000 | 0.00000000 |
| KX | 0.00000000 | 0.00000000 | 0.00000000 |
| RX | −1702.70024300 | 7360.39272000 | 2115.61242500 |
| C7 | 1.79847891e−08 | 1.92019811e−07 | 6.09839447e−07 |
| C9 | 3.08103036e−09 | 7.1188267e−08 | 7.08555971e−07 |
| C10 | −4.24845893e−12 | 8.96360067e−11 | 1.42628939e−10 |
| C12 | −9.53203499e−12 | 3.27897349e−10 | 6.15654836e−10 |
| C14 | −3.56696766e−12 | 1.32008619e−10 | 1.24698071e−09 |
| C16 | 5.53144807e−15 | 1.36194158e−13 | 6.05714405e−13 |
| C18 | 6.34539803e−15 | 2.34455978e−13 | 1.21593408e−12 |
| C20 | 1.81140787e−15 | 9.69419966e−14 | 5.15369198e−12 |
| C21 | −2.11810311e−18 | 5.15348174e−17 | 2.91434391e−16 |
| C23 | −7.16043548e−18 | 3.75752681e−16 | 1.25156571e−15 |
| C25 | −5.88402712e−18 | 3.19181834e−16 | 8.70563351e−15 |
| C27 | −1.92557933e−18 | 1.53807396e−16 | 1.63908034e−14 |
| C29 | 1.70059672e−21 | 1.40780709e−19 | 1.39069823e−18 |
| C31 | 3.75540269e−21 | 4.85996976e−19 | −1.28410259e−18 |
| C33 | 3.28133541e−21 | 5.1910323e−19 | 4.8095941e−17 |
| C35 | 8.57809825e−22 | 2.15178451e−19 | 4.41927219e−17 |
| C36 | −8.85938941e−25 | 4.80137725e−23 | −6.58463052e−22 |
| C38 | −4.20002708e−24 | 5.52918171e−22 | −1.31151539e−20 |
| C40 | −5.24288951e−24 | 7.37589979e−22 | 3.29070838e−20 |
| C42 | −3.32443155e−24 | 7.62607475e−22 | 2.45737341e−19 |
| C44 | −8.41638073e−25 | 2.11429097e−22 | 1.98567595e−19 |
| C46 | 7.40583899e−28 | 2.94044566e−25 | −2.1351782e−24 |
| C48 | 2.7860108e−27 | 1.65594542e−24 | 5.42339274e−23 |
| C50 | 4.05802066e−27 | 2.67363596e−24 | 9.40249237e−22 |
| C52 | 1.8873941e−27 | 1.45438443e−24 | 1.40511532e−21 |
| C54 | 1.32906947e−28 | −1.74731802e−25 | 8.67008547e−22 |
| C55 | −2.72625411e−31 | 4.57055919e−29 | 1.975511e−26 |
| C57 | −1.09517773e−30 | 8.24315234e−28 | 3.5245026e−25 |
| C59 | −1.54140059e−30 | 2.7846066e−27 | 1.86064293e−24 |
| C61 | −2.03920564e−30 | 5.04844296e−27 | 5.56594105e−24 |
| C63 | −1.39151659e−30 | 2.65275439e−27 | 4.93123257e−24 |
| C65 | −3.04302425e−31 | 4.47315051e−28 | 2.25513424e−24 |
| C67 | 2.65932555e−34 | 0 | 0 |
| C69 | 1.07192285e−33 | 0 | 0 |
| C71 | 1.59913365e−33 | 0 | 0 |
| C73 | 9.28830744e−34 | 0 | 0 |
| C75 | 2.99613864e−34 | 0 | 0 |
| C77 | −2.87821803e−35 | 0 | 0 |
| C78 | −1.91467081e−37 | 0 | 0 |
| C80 | −1.59911782e−36 | 0 | 0 |
| C82 | −4.94780249e−36 | 0 | 0 |
| C84 | −7.14686431e−36 | 0 | 0 |
| C86 | −5.51076275e−36 | 0 | 0 |
| C88 | −2.16822816e−36 | 0 | 0 |
| C90 | −4.19310084e−37 | 0 | 0 |

Table 3b for FIG. 5

| Coefficient | M4 | M3 | M2 |
|---|---|---|---|
| KY | 0.00000000 | 0.00000000 | 0.00000000 |
| KX | 0.00000000 | 0.00000000 | 0.00000000 |
| RX | −5959.73835900 | 0.00000000 | 0.00000000 |
| C7 | 7.09371063e−08 | 0 | 0 |
| C9 | 1.9620957e−07 | 0 | 0 |
| C10 | −5.80501996e−12 | 0 | 0 |
| C12 | 1.02443869e−10 | 0 | 0 |
| C14 | −1.92463151e−11 | 0 | 0 |
| C16 | 1.52210927e−14 | 0 | 0 |
| C18 | 1.53632928e−14 | 0 | 0 |
| C20 | 5.26048968e−13 | 0 | 0 |
| C21 | −1.12436683e−17 | 0 | 0 |
| C23 | 1.73824765e−16 | 0 | 0 |
| C25 | −2.15389944e−16 | 0 | 0 |
| C27 | 6.93749405e−16 | 0 | 0 |
| C29 | 7.32299538e−20 | 0 | 0 |
| C31 | −8.96220063e−19 | 0 | 0 |
| C33 | 2.89314095e−18 | 0 | 0 |
| C35 | 3.66266246e−19 | 0 | 0 |
| C36 | 1.37832263e−22 | 0 | 0 |
| C38 | 4.81965046e−22 | 0 | 0 |
| C40 | −7.84784597e−21 | 0 | 0 |
| C42 | −4.14050678e−22 | 0 | 0 |
| C44 | −6.21735194e−21 | 0 | 0 |
| C46 | −8.56329267e−25 | 0 | 0 |
| C48 | −5.86480301e−24 | 0 | 0 |

Table 3b for FIG. 5

| Coefficient | M4 | M3 | M2 |
|---|---|---|---|
| C50 | 7.86836679e-24 | 0 | 0 |
| C52 | -7.38234303e-23 | 0 | 0 |
| C54 | -1.90896327e-23 | 0 | 0 |
| C55 | -3.44134447e-27 | 0 | 0 |
| C57 | -4.07630281e-26 | 0 | 0 |
| C59 | -2.05268913e-26 | 0 | 0 |
| C61 | 7.40916254e-26 | 0 | 0 |
| C63 | -1.66787506e-25 | 0 | 0 |
| C65 | -9.99341642e-26 | 0 | 0 |

Table 3c for FIG. 5

| Coefficient | M1 |
|---|---|
| KY | 0.00000000 |
| KX | 0.00000000 |
| RX | 0.00000000 |

Table 4a for FIG. 5

| Surface | DCX | DCY | DCZ |
|---|---|---|---|
| Image plane | 0.00000000 | 0.00000000 | 0.00000000 |
| M7 | 0.00000000 | 0.00000000 | 1294.60000000 |
| M6 | 0.00000000 | 0.00000000 | 121.16860083 |
| M5 | 0.00000000 | -23.39645080 | 1255.70266623 |
| M4 | 0.00000000 | 428.84722309 | 176.16839633 |
| M3 | 0.00000000 | 643.29322055 | 973.30911463 |
| M2 | 0.00000000 | 877.39404910 | 1272.63636377 |
| M1 | -0.00000000 | 985.69698677 | 1709.40915790 |
| Object plane | -0.00000000 | 972.97083537 | 2079.13057086 |

Table 4b for FIG. 5

| Surface | TLA [deg] | TLB [deg] | TLC [deg] |
|---|---|---|---|
| Image plane | -0.00000000 | 0.00000000 | -0.00000000 |
| M7 | -0.00000000 | 0.00000000 | -0.00000000 |
| M6 | 180.07648095 | 0.00000000 | -0.00000000 |
| M5 | 10.52960478 | 0.00000000 | -0.00000000 |
| M4 | 184.02255945 | 0.00000000 | -0.00000000 |
| M3 | 64.02255945 | 0.00000000 | 180.00000000 |
| M2 | 244.02255945 | -0.00000000 | 0.00000000 |
| M1 | 84.02255945 | -0.00000000 | 180.00000000 |
| Object plane | -11.95488111 | 0.00000000 | 180.00000000 |

Table 5 for FIG. 5

| Surface | AOI [deg] | Reflectivity |
|---|---|---|
| M7 | 0.00000000 | 0.66565840 |
| M6 | 0.07648095 | 0.66566255 |
| M5 | 11.18955982 | 0.65169152 |
| M4 | 18.22917890 | 0.62398638 |
| M3 | 77.94883571 | 0.85008675 |
| M2 | 77.94883571 | 0.85008675 |
| M1 | 97.94883571 | 1.13089334 |
| Overall transmission | | 0.1473 |

Table 6 for FIG. 5

| X [mm] | Y [mm] | Z [mm] |
|---|---|---|
| 0.00000000 | 594.49311802 | -114.82371082 |
| 93.01621208 | 587.28124992 | -114.60806119 |
| 183.83820338 | 565.79581204 | -113.99060454 |
| 270.29866175 | 530.49099318 | -113.05582694 |
| 350.29086890 | 482.13401886 | -111.93168041 |
| 421.81384811 | 421.81384811 | -110.77184822 |
| 483.02993602 | 350.94179082 | -109.73400756 |
| 532.33125383 | 271.23632139 | -108.95707827 |
| 568.40749899 | 184.68679191 | -108.54096691 |
| 590.30508838 | 93.49514104 | -108.53242876 |
| 597.46792407 | 0.00000000 | -108.92018472 |
| 589.75339789 | -93.40776185 | -109.64091015 |
| 567.42315516 | -184.36695921 | -110.59493328 |
| 531.11439345 | -270.61630005 | -111.66734917 |
| 481.80099693 | -350.04891430 | -112.74857877 |
| 420.75295187 | -420.75295187 | -113.74927261 |
| 349.49841703 | -481.04330244 | -114.60719325 |
| 269.78833350 | -529.48941760 | -115.28660147 |
| 183.56074169 | -564.94187277 | -115.77246418 |
| 92.90157512 | -586.55746064 | -116.06233121 |
| 0.00000000 | -593.82052455 | -116.15847788 |
| -92.90157512 | -586.55746064 | -116.06233121 |
| -183.56074169 | -564.94187277 | -115.77246418 |
| -269.78833350 | -529.48941760 | -115.28660147 |
| -349.49841703 | -481.04330244 | -114.60719325 |
| -420.75295187 | -420.75295187 | -113.74927261 |
| -481.80099693 | -350.04891430 | -112.74857877 |
| -531.11439345 | -270.61630005 | -111.66734917 |
| -567.42315516 | -184.36695921 | -110.59493328 |
| -589.75339789 | -93.40776185 | -109.64091015 |
| -597.46792407 | -0.00000000 | -108.92018472 |
| -590.30508838 | 93.49514104 | -108.53242876 |
| -568.40749899 | 184.68679191 | -108.54096691 |
| -532.33125383 | 271.23632139 | -108.95707827 |
| -483.02993602 | 350.94179082 | -109.73400756 |
| -421.81384811 | 421.81384811 | -110.77184822 |
| -350.29086890 | 482.13401886 | -111.93168041 |
| -270.29866175 | 530.49099318 | -113.05582694 |
| -183.83820338 | 565.79581204 | -113.99060454 |
| -93.01621208 | 587.28124992 | -114.60806119 |

An overall reflectivity of the projection optical unit 22 is 11.89%.

The projection optical unit 22 has a reducing imaging scale of 8×(β=8).

The image field 8 has an x-extent of two times 6.5 mm and a y-extent of 1 mm. The projection optical unit 22 is optimized for an operating wavelength of the illumination light 3 of 13.5 nm.

In the region of, on the one hand, the mirrors M1 and M2 and, on the other hand, the mirrors M4 to M7, the beam path of the projection optical unit 22 corresponds qualitatively to that from the projection optical unit 20 according to FIG. 3. In contrast to the projection optical unit 20, a further mirror M3 for grazing incidence is arranged between the mirror M2 for grazing incidence and the mirror M4 for normal incidence in the projection optical unit 22. Compared to the deflecting effect of the mirrors M1 and M2 for grazing incidence, this further mirror causes a reverse deflection of the imaging light 3 toward the mirror M4 in such a way that, unlike in the case of the projection optical unit 20, the object plane 5 in the projection optical unit 22 is not arranged with such a strong tilt with respect to the image plane 9. Alternatively, the projection optical unit 22 can also be embodied in such a way that the object plane 5 is arranged parallel to the image plane 9. The mirrors M1 and M2 once again form a pair of mirrors for grazing incidence, arranged directly behind one another in the beam path of the imaging light 3.

A further difference in the guidance of the imaging light 3 in the projection optical unit 22 compared to in the projection optical unit 20 lies in the fact that the mirror M7 includes a passage opening 17 for the imaging light 3 between the mirrors M4 and M5 on the one hand and the mirrors M5 and M6 on the other hand. A reflection surface of the mirror M5 is arranged recessed relative to this passage opening 17 in the mirror M7.

The mirrors M1, M3, M4 and M7 have negative values for the radius, i.e. are, in principle, concave mirrors. The mirrors M2, M5 and M6 have positive values for the radius, i.e. are, in principle, convex mirrors.

The mirrors M6 and M7 respectively have a passage opening 17 for the imaging light 3. The other mirrors M1 to M5 do not have passage openings for the imaging light 3.

The reflection surfaces of the mirrors M6 and M7 are used around the respective passage opening 17 thereof.

In the projection optical unit 22, an aperture stop is arranged on the mirror M7. The polygon data in accordance with preceding Table 6 for FIG. 5 relate thereto.

In the projection optical unit 22, a z-distance between the object plane and the image plane 9 is approximately 2200 mm.

A typical diameter of the largest mirror M7 is approximately 1350 mm. In the projection optical unit 22, an object/image offset $d_{OIS}$ is approximately 1050 mm. In the projection optical unit 22, the object field-side chief rays 16 also include an angle CRAO of 5.5° with a normal of the object plane 5.

The projection optical unit 22 has a scanned RMS value of the image field-side wavefront which is approximately 100 mλ. An image field-side distortion value is approximately 2 nm in the projection optical unit 22. In the projection optical unit 22, an image-side telecentricity value in the x-direction is less than 2 mrad. In the projection optical unit 22, an image-side telecentricity value in the y-direction is less than 0.5 mrad.

In the projection optical unit 22, the chief rays 16 propagate divergently with respect to one another between the object field 4 and the mirror M1.

The mirror M6 defines an image-side obscuration in the x-dimension which is less than 26% of the image-side numerical aperture of the projection optical unit 22. In the y-direction, the obscuration is significantly smaller and moreover decentered.

A further embodiment of a projection optical unit 23, which can be used in the projection exposure apparatus 1 according to FIG. 1 instead of e.g. the projection optical unit 7, is explained in the following text on the basis of FIG. 6. Components and functions which were already explained above in the context of FIGS. 1 to 5 are appropriately denoted by the same reference signs and are not discussed again in detail.

Overall, the projection optical unit 23 has eight mirrors M1 to M8. Of these, the mirrors M1, M4, M7 and M8 are embodied as mirrors for normal incidence and the mirrors M2, M3 as well as M5 and M6 are embodied as mirrors for grazing incidence. The mirrors M1 to M8 are configured as free-form surfaces, for which the free-form surface equation (1), specified above, applies. The optical design data from the projection optical unit 23 can be gathered from the following tables, which, in terms of their design, correspond to the tables for the projection optical unit 7 according to FIG. 2. The specification "stop S8" in Table 1 for FIG. 6 means that the stop is arranged at the location of the eighth surface of the design surfaces, counted including the image plane (cf. in this respect Tables 4a, 4b for FIG. 6). Corresponding specifications concerning the location of the stop can also be found in the described embodiments of the projection optical unit still to follow.

Figure 6:
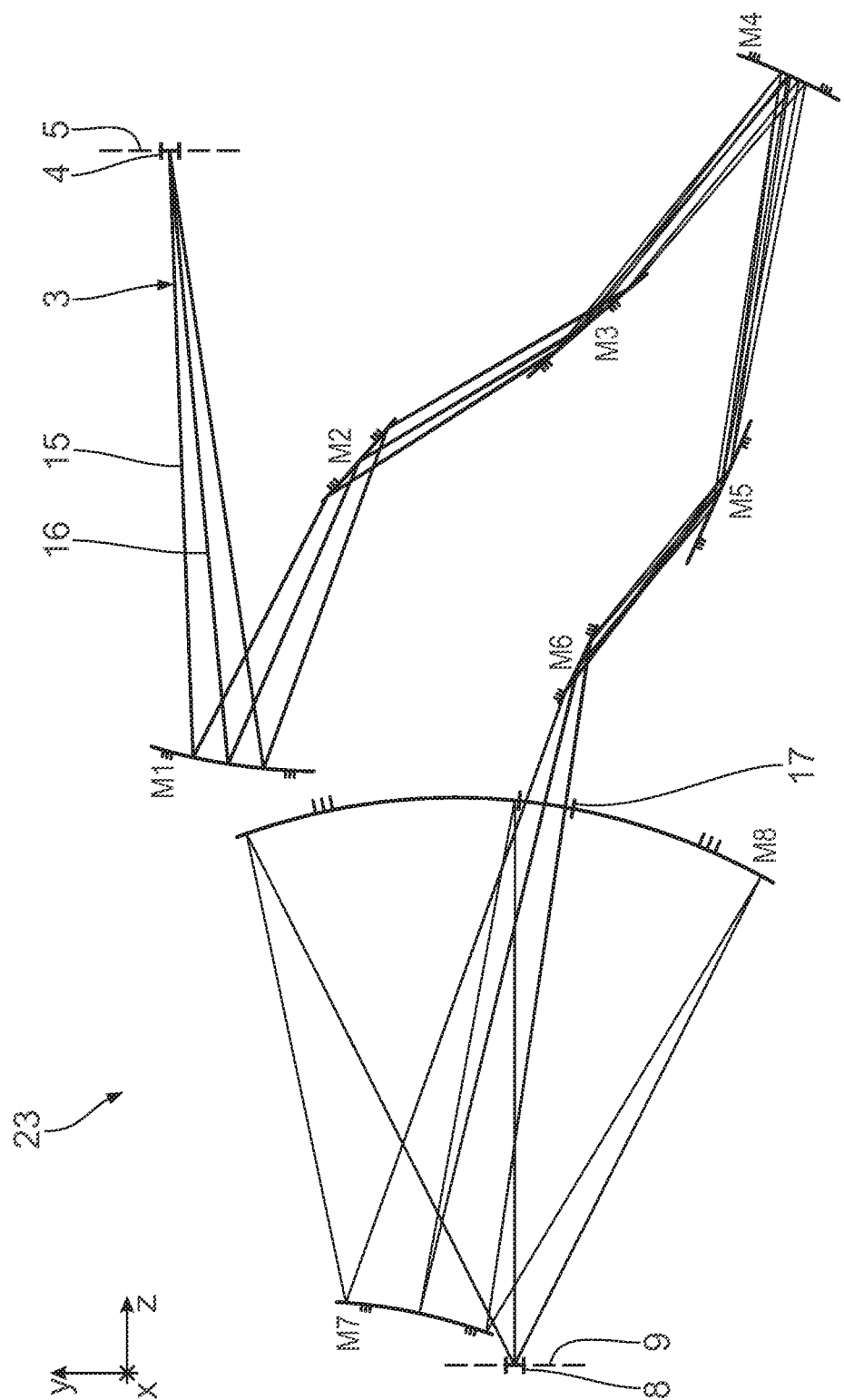

Table 1 for FIG. 6

| Exemplary embodiment | FIG. 6 |
| --- | --- |
| NA | 0.45 |
| Wavelength | 13.5 nm |
| Field dimension x | 13.0 mm |
| Field dimension y | 0.784 mm |
| Feldkruemmung | 0.0 l/mm |
| Stop | S8 |

Table 2 for FIG. 6

| Surface | Radius_x [mm] | Power_x [1/mm] | Radius_y [mm] | Power_y [1/mm] | Operating mode |
| --- | --- | --- | --- | --- | --- |
| M8 | −958.97089575 | 0.00207686 | −961.85646760 | 0.00208803 | REFL |
| M7 | 781.70184576 | −0.00255743 | 800.14521302 | −0.00250061 | REFL |
| M6 | 2530.53650030 | −0.00017248 | 1099.72037229 | −0.00833342 | REFL |
| M5 | −959.51707616 | 0.00053343 | −5824.08776793 | 0.00134184 | REFL |
| M4 | −1015.89947977 | 0.00190347 | −1037.47638976 | 0.00199381 | REFL |
| M3 | −1396.79419984 | 0.00025079 | 5530.47714724 | −0.00206466 | REFL |
| M2 | 453.37653174 | −0.00134551 | 3069.00502651 | −0.00213656 | REFL |
| M1 | −1105.89546966 | 0.00175044 | −898.04924515 | 0.00230091 | REFL |

Table 3a for FIG. 6

| Coefficient | M8 | M7 | M6 |
| --- | --- | --- | --- |
| KY | 0.00000000 | 0.00000000 | 0.00000000 |
| KX | 0.00000000 | 0.00000000 | 0.00000000 |
| RX | −958.97089570 | 781.70184580 | 2530.53650000 |
| C7 | −6.24261885e−09 | −4.79337518e−07 | −7.1009777e−07 |
| C9 | 3.40176704e−09 | −2.2271152e−08 | −8.2763755e−07 |
| C10 | −9.52920854e−12 | 1.39847445e−09 | −5.28790727e−09 |
| C12 | −2.17138503e−11 | 2.59902235e−09 | −5.83047016e−09 |
| C14 | −5.53794085e−12 | 3.82503297e−10 | 3.85928616e−09 |
| C16 | −4.89194598e−15 | −7.5682079e−13 | 4.16412253e−11 |
| C18 | −5.31097983e−15 | 2.0123627e−13 | 3.27030642e−11 |
| C20 | 3.35556271e−15 | 1.18707056e−12 | −1.69195332e−11 |
| C21 | −1.29683082e−17 | 6.50353918e−15 | −1.04672087e−14 |
| C23 | −4.0507372e−17 | 1.51137687e−14 | −2.41277384e−14 |
| C25 | −3.91228171e−17 | 1.36743637e−14 | −2.38109022e−13 |
| C27 | −8.22368178e−18 | 2.04416547e−15 | 9.07489874e−14 |
| C29 | −4.09694624e−21 | −2.41814134e−18 | 4.54711839e−16 |
| C31 | −8.94104942e−21 | −2.23789497e−19 | −8.11985983e−16 |
| C33 | −2.65451858e−21 | 1.31365906e−17 | 1.31994251e−15 |
| C35 | 3.82604616e−21 | 1.24161702e−17 | −6.01734444e−16 |
| C36 | −1.25909252e−23 | 5.60405318e−20 | −1.9034482e−18 |
| C38 | −5.04636427e−23 | 1.727638e−19 | −1.29641861e−17 |
| C40 | −7.58006457e−23 | 2.38455591e−19 | 6.23929199e−18 |
| C42 | −4.61626479e−23 | 9.83846873e−20 | −1.3014572e−17 |

Table 3a for FIG. 6

| Coefficient | M8 | M7 | M6 |
|---|---|---|---|
| C44 | −8.32692765e−24 | 3.34129348e−20 | 5.06711727e−18 |
| C46 | −8.53689744e−27 | 0 | 0 |
| C48 | −2.77252948e−26 | 0 | 0 |
| C50 | −2.88379308e−26 | 0 | 0 |
| C52 | −3.62035322e−27 | 0 | 0 |
| C54 | 6.3984309e−27 | 0 | 0 |
| C55 | −2.76049035e−29 | 0 | 0 |
| C57 | −1.41544439e−28 | 0 | 0 |
| C59 | −2.85021143e−28 | 0 | 0 |
| C61 | −2.76943917e−28 | 0 | 0 |
| C63 | −1.24085088e−28 | 0 | 0 |
| C65 | −1.81757986e−29 | 0 | 0 |

Table 3b for FIG. 6

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | −959.51707620 | −1015.89948000 | −1396.79420000 |
| C7 | −4.08359998e−07 | −2.15395805e−07 | −2.38764091e−07 |
| C9 | 3.4748349e−08 | 1.36820595e−07 | 4.64016378e−08 |
| C10 | −9.13196608e−10 | −4.36123019e−11 | −4.14715679e−09 |
| C12 | 9.44559924e−11 | 1.25327362e−09 | −9.81520016e−10 |
| C14 | −5.88672435e−11 | −1.25208732e−10 | 2.37258013e−11 |
| C16 | −1.87521812e−12 | −2.06101634e−12 | 9.14454531e−12 |
| C18 | −1.37465885e−12 | −6.89740416e−12 | 2.95923304e−12 |
| C20 | 1.1992969e−13 | 1.04902531e−12 | 3.68847523e−13 |
| C21 | −4.39551393e−14 | −5.27163213e−17 | −2.48685307e−13 |
| C23 | −6.94239353e−15 | 2.41662997e−14 | −1.22998777e−13 |
| C25 | 1.42589153e−15 | 4.92614883e−14 | −1.38722747e−14 |
| C27 | 4.24263352e−17 | −2.58241283e−14 | 1.75833705e−14 |
| C29 | 1.63548588e−16 | −3.62334861e−17 | 1.422768e−15 |
| C31 | 9.81035253e−17 | −3.34821808e−16 | 5.43158823e−16 |
| C33 | −7.95045663e−18 | −1.33308143e−16 | 6.79918691e−17 |
| C35 | −5.12592669e−19 | −4.92438934e−16 | 6.81835572e−19 |
| C36 | 6.9842749e−19 | 2.51610148e−21 | −5.8931813e−18 |
| C38 | −1.66279358e−19 | 7.3298455e−19 | −6.55610075e−18 |
| C40 | −6.28447234e−19 | 1.69443664e−18 | −1.55271887e−18 |
| C42 | 2.04767376e−20 | −3.36811757e−19 | −1.30349519e−19 |
| C44 | 2.18932434e−21 | −1.74132521e−17 | 1.24548926e−20 |

Table 3c for FIG. 6

| Coefficient | M2 | M1 |
|---|---|---|
| KY | 0.00000000 | 0.00000000 |
| KX | 0.00000000 | 0.00000000 |
| RX | 453.37653170 | −1105.89547000 |
| C7 | −3.64021023e−06 | −1.53061966e−08 |
| C9 | −4.1440416e−07 | 2.02696728e−07 |
| C10 | 1.73428138e−10 | 5.3320966e−11 |
| C12 | 1.50361672e−08 | 3.69218174e−10 |
| C14 | 8.05092825e−11 | −4.33240146e−11 |
| C16 | 3.86788386e−11 | 6.58986798e−14 |
| C18 | −6.30736684e−11 | −9.56533957e−13 |
| C20 | 3.23174009e−12 | 1.76624492e−15 |
| C21 | 1.06689208e−13 | −2.93652599e−17 |
| C23 | −9.8827162e−14 | −1.44343666e−15 |
| C25 | 2.53626119e−13 | 4.60503135e−15 |
| C27 | −6.71346795e−17 | 3.22197521e−15 |
| C29 | −3.85691883e−16 | 7.4131948e−19 |
| C31 | −8.34354289e−17 | 1.97074044e−17 |
| C33 | −1.00493209e−15 | −4.84993134e−19 |
| C35 | −9.32551743e−18 | 1.5674206e−18 |
| C36 | 3.32160664e−18 | −2.75117422e−22 |
| C38 | 2.42658882e−18 | 1.69392814e−21 |
| C40 | 8.35990203e−19 | −9.62768209e−20 |
| C42 | 2.82957021e−18 | −4.99071337e−20 |
| C44 | −2.18809094e−19 | −2.52307032e−19 |

Table 4a for FIG. 6

| Surface | DCX | DCY | DCZ |
|---|---|---|---|
| Image plane | 0.00000000 | 0.00000000 | 0.00000000 |
| M8 | 0.00000000 | 0.00000000 | 857.25842051 |
| M7 | 0.00000000 | 143.72846278 | 78.92107486 |
| M6 | 0.00000000 | −97.73260418 | 1061.22710854 |
| M5 | 0.00000000 | −310.85339013 | 1324.12983099 |
| M4 | 0.00000000 | −415.10458760 | 1955.31068719 |
| M3 | 0.00000000 | −109.21713535 | 1576.99752720 |
| Stop | 0.00000000 | 53.83767037 | 1451.75625757 |
| M2 | 0.00000000 | 233.83461505 | 1371.94162077 |
| M1 | 0.00000000 | 434.90609681 | 911.92780520 |
| Object plane | 0.00000000 | 524.23007379 | 1839.29231153 |

Table 4b for FIG. 6

| Surface | TLA [deg] | TLB [deg] | TLC [deg] |
|---|---|---|---|
| Image plane | −0.00000000 | 0.00000000 | −0.00000000 |
| M8 | 5.23773203 | 0.00000000 | −0.00000000 |
| M7 | 192.16152597 | 0.00000000 | −0.00000000 |
| M6 | −63.56651549 | 0.00000000 | −0.00000000 |
| M5 | 114.20489964 | 0.00000000 | −0.00000000 |
| M4 | 24.16726666 | 0.00000000 | −0.00000000 |
| M3 | 139.04415820 | 0.00000000 | −0.00000000 |
| Stop | 238.00000000 | 0.00000000 | −0.00000000 |
| M2 | −48.62779604 | 0.00000000 | −0.00000000 |
| M1 | 189.05463777 | 0.00000000 | −0.00000000 |
| Object plane | −0.00000000 | 0.00000000 | −0.00000000 |

Table 5 for FIG. 6

| Surface | Angle of incidence | Reflectivity |
|---|---|---|
| M8 | 5.23773203 | 0.66285728 |
| M7 | 1.67316319 | 0.66544123 |
| M6 | 77.39460590 | 0.84197074 |
| M5 | 75.17194229 | 0.80679858 |
| M4 | 14.78988644 | 0.63989082 |
| M3 | 79.91239948 | 0.87714614 |
| M2 | 72.24113995 | 0.75250143 |
| M1 | 14.55657686 | 0.64079353 |
| Overall transmission | | 0.0811 |

Table 6 for FIG. 6

| X [mm] | Y [mm] | Z [mm] |
|---|---|---|
| 0.00000000 | −42.55550630 | 0.00000000 |
| −5.71360072 | −42.41904079 | 0.00000000 |
| −11.28570917 | −42.00337327 | 0.00000000 |
| −16.57923089 | −41.29199297 | 0.00000000 |
| −21.46534853 | −40.26432853 | 0.00000000 |
| −25.82651690 | −38.90419369 | 0.00000000 |
| −29.55850056 | −37.20856137 | 0.00000000 |
| −32.57173218 | −35.19456381 | 0.00000000 |
| −34.79247198 | −32.90306161 | 0.00000000 |

-continued

Table 6 for FIG. 6

| X [mm] | Y [mm] | Z [mm] |
|---|---|---|
| −36.16417382 | −30.39803509 | 0.00000000 |
| −36.64920435 | −27.76194540 | 0.00000000 |
| −36.23077173 | −25.08805998 | 0.00000000 |
| −34.91468027 | −22.47140643 | 0.00000000 |
| −32.73039949 | −20.00022495 | 0.00000000 |
| −29.73098648 | −17.74953050 | 0.00000000 |
| −25.99165105 | −15.77778545 | 0.00000000 |
| −21.60711600 | −14.12677772 | 0.00000000 |
| −16.68821822 | −12.82386652 | 0.00000000 |
| −11.35826608 | −11.88531994 | 0.00000000 |
| −5.74952640 | −11.31971544 | 0.00000000 |
| −0.00000000 | −11.13084157 | 0.00000000 |
| 5.74952640 | −11.31971544 | 0.00000000 |
| 11.35826608 | −11.88531994 | 0.00000000 |
| 16.68821822 | −12.82386652 | 0.00000000 |
| 21.60711600 | −14.12677772 | 0.00000000 |
| 25.99165105 | −15.77778545 | 0.00000000 |
| 29.73098648 | −17.74953050 | 0.00000000 |
| 32.73039949 | −20.00022495 | 0.00000000 |
| 34.91468027 | −22.47140643 | 0.00000000 |
| 36.23077173 | −25.08805998 | 0.00000000 |
| 36.64920435 | −27.76194540 | 0.00000000 |
| 36.16417382 | −30.39803509 | 0.00000000 |
| 34.79247198 | −32.90306161 | 0.00000000 |
| 32.57173218 | −35.19456381 | 0.00000000 |
| 29.55850056 | −37.20856137 | 0.00000000 |
| 25.82651690 | −38.90419369 | 0.00000000 |
| 21.46534853 | −40.26432853 | 0.00000000 |
| 16.57923089 | −41.29199297 | 0.00000000 |
| 11.28570917 | −42.00337327 | 0.00000000 |
| 5.71360072 | −42.41904079 | 0.00000000 |

An overall reflectivity of the projection optical unit 23 is 8.11%.

The projection optical unit 23 has a reducing imaging scale of 8×(β=8).

The image field 8 has an x-extent of two times 6.5 mm and a y-extent of 1 mm. The projection optical unit 23 is optimized for an operating wavelength of the illumination light 3 of 13.5 nm.

Deviating from the other projection optical units, the projection optical unit 23 has an image-side numerical aperture of 0.45.

A beam path of the imaging light 3 through the projection optical unit 23 between the mirror M6 and the image field 8 corresponds qualitatively to the beam path between the mirror M6 and the image field 8 in the projection optical unit 7 according to FIG. 2, albeit mirrored about a plane parallel to the xz-plane.

The mirrors M2 and M3, on the one hand, and the mirrors M5 and M6, on the other hand, for grazing incidence are arranged in such a way that they have a respective reverse deflecting effect, that is to say that the deflecting effect of the respective second mirror M3 and M6 of these mirror pairs M2, M3 and M5, M6 is subtracted from the deflecting effect of the respective first mirror M2 and M5. In respect of in each case one of the mirrors M2 and M3, the mirrors M5 and M6 have a reverse dependence on the reflectivity for respective individual rays 15 of the imaging light 3, i.e. these represent compensation mirrors such that the four mirrors M2, M3, M5 and M6 for grazing incidence do not have an undesired overall dependence on the reflectivity over the image field 8 or over the illumination angle distribution thereof.

A pupil plane of the projection optical unit 23 lies in the region of the deflection on the mirror M2. An aperture stop effective for the x-dimension can be arranged in the beam path of the imaging light 3 between the mirrors M1 and M2, adjacent to M2. An aperture stop acting in the y-dimension can be arranged in the beam path of the imaging light 3 between the mirrors M2 and M3, once again adjacent to the mirror M2. An intermediate image plane of the projection optical unit 23 lies in the region of the deflection on the mirror M5. A further pupil plane lies in the beam path of the imaging light 3 between the mirrors M7 and M8. There, an aperture stop effective for the x-dimension can likewise be arranged.

In sections, the mirrors M1 and M8 are embodied back-to-back.

Only the mirror M8 has a passage opening 17 for the passage of imaging light 3 in the imaging beam path between the mirrors M6 and M7.

The mirrors M1, M4, M5 and M8 have negative values for the radius, i.e. are, in principle, concave mirrors. The mirrors M2, M3, M6 and M7 have positive values for the radius, i.e. are, in principle, convex mirrors. The mirrors M2, M3 and M5 have very large absolute radii, i.e. only constitute small deviations from plane reflection surfaces.

A z-distance between the object plane 5 and the image plane 9 is approximately 1840 mm in the projection optical unit 23.

A typical diameter of the largest mirror M8 is approximately 800 mm.

In the projection optical unit 23, an object/image offset $d_{OIS}$ is approximately 520 mm. In the projection optical unit 23, the object field-side chief rays 16 also include an angle CRAO of 5.5° with a normal of the object plane 5.

The projection optical unit 23 has a scanned RMS value of the image field-side wavefront which is less than 70 mλ. An image field-side distortion value is approximately 1.2 nm in the projection optical unit 23.

In the projection optical unit 23, the chief rays 16 propagate divergently with respect to one another between the object field 4 and the mirror M1.

The mirror M8 defines an image-side obscuration in the x-dimension which is less than 20% of the image-side numerical aperture of the projection optical unit 23. In the y-direction, the obscuration is significantly smaller and moreover decentered.

A further embodiment of a projection optical unit 24, which can be used in the projection exposure apparatus 1 according to FIG. 1 instead of e.g. the projection optical unit 7, is explained in the following text on the basis of FIG. 7. Components and functions which were already explained above in the context of FIGS. 1 to 6 are appropriately denoted by the same reference signs and are not discussed again in detail.

The imaging beam path of the projection optical unit 24 corresponds qualitatively to that of the projection optical unit 23 according to FIG. 6. The projection optical unit 24 also includes eight mirrors M1 to M8, of which the mirrors M1, M4, M7 and M8 are embodied as mirrors for normal incidence and the mirrors M2, M3, M5 and M6 are embodied as mirrors for grazing incidence. The deflecting effects of the mirrors M2 and M3 on the one hand, and M5 and M6 on the other hand are subtracted from one another.

The mirrors M1 to M8 are configured as free-form surfaces, for which the free-form surface equation (1), specified above, applies. The optical design data from the projection optical unit 24 can be gathered from the following tables, which, in terms of their design, correspond to the tables for the projection optical unit 7 according to FIG. 2.

Figure 7:
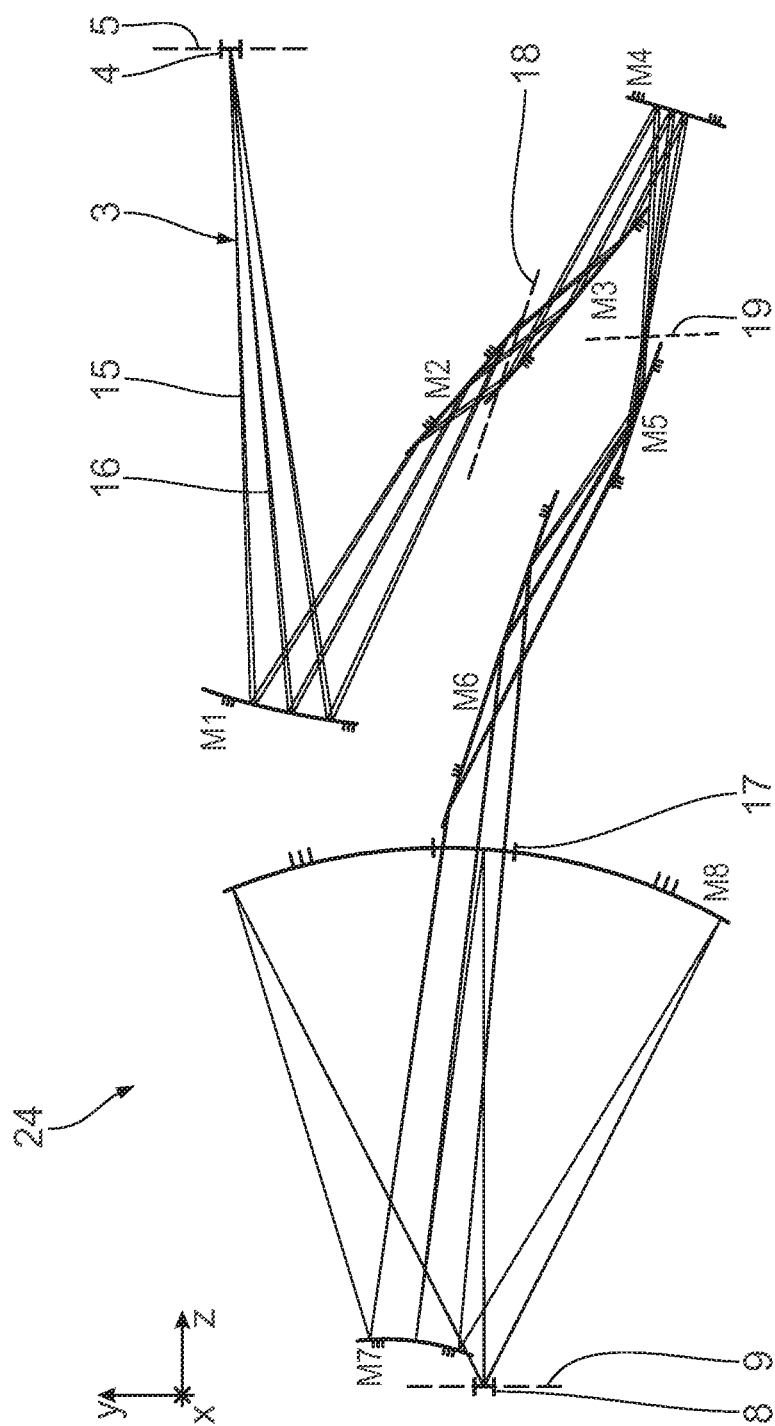

Table 1 for FIG. 7

| Exemplary embodiment | FIG. 7 |
|---|---|
| NA | 0.45 |
| Wavelength | 13.5 nm |
| Field dimension x | 13.0 mm |
| Field dimension y | 0.784 mm |
| Field curvature | 0.0 1/mm |
| Stop | S7 |

Table 2 for FIG. 7

| Surface | Radius x [mm] | Power x [1/mm] | Radius y [mm] | Power y [1/mm] | Operating |
|---|---|---|---|---|---|
| M8 | −828.90624658 | 0.00240718 | −813.73184215 | 0.00246356 | REFL |
| M7 | 452.59444650 | −0.00441888 | 343.07524055 | −0.00582974 | REFL |
| M6 | 1112.77153576 | −0.00035436 | −8434.60343947 | 0.00120266 | REFL |
| M5 | −743.46091318 | 0.00053356 | 10280.07421667 | −0.00098089 | REFL |
| M4 | −835.77975524 | 0.00235223 | −929.01694099 | 0.00219010 | REFL |
| M3 | — | 0.00007233 | −4677.48375823 | 0.00212963 | REFL |
| M2 | — | 0.00023122 | 1872.02689047 | −0.00534493 | REFL |
| M1 | −880.94474613 | 0.00217245 | −929.96827744 | 0.00224746 | REFL |

Table 3a for FIG. 7

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −828.90624660 | 452.59444650 | 1112.77153600 |
| C7 | 6.74198948e−09 | 1.8198381e−07 | 4.73297971e−07 |
| C9 | 3.90647354e−09 | −1.03077896e−07 | 5.71100371e−08 |
| C10 | −1.60344671e−11 | 5.15323975e−09 | 2.05867386e−09 |
| C12 | −2.86549213e−11 | 1.1999558e−08 | −8.29784809e−10 |
| C14 | −1.26862354e−11 | 7.63575592e−09 | −9.58970523e−11 |
| C16 | 4.78369091e−15 | 1.39254302e−12 | −2.17825923e−11 |
| C18 | 8.51266815e−15 | 7.38520647e−12 | 6.3635415e−13 |
| C20 | 2.82358426e−15 | −2.36224044e−12 | 1.31296379e−13 |
| C21 | −2.65461735e−17 | 6.84835025e−14 | −1.01503317e−13 |
| C23 | −7.72188599e−17 | 2.86517775e−13 | 4.04729312e−14 |
| C25 | −7.21196735e−17 | 3.43322922e−13 | 5.59417154e−16 |
| C27 | −1.90211316e−17 | 7.51227642e−14 | −1.51792851e−16 |
| C29 | 4.92227907e−21 | 4.09353626e−17 | 2.54136872e−16 |
| C31 | 1.20218531e−20 | 1.27335094e−16 | −5.10416424e−17 |
| C33 | 8.40798497e−21 | 1.22660287e−16 | −2.15218211e−18 |
| C35 | 3.23694092e−21 | −4.21844295e−17 | 1.02982467e−19 |
| C36 | −3.28705775e−23 | 1.68544205e−18 | −2.64826102e−19 |
| C38 | −1.3081706e−22 | 9.48378409e−18 | −4.72935253e−19 |
| C40 | −1.91271179e−22 | 1.93084784e−17 | 1.36626279e−20 |
| C42 | −1.20985451e−22 | 1.51684275e−17 | 1.50910444e−21 |
| C44 | −2.87133882e−23 | 5.71789768e−18 | −1.52076385e−23 |
| C46 | 9.04401197e−27 | 0 | 0 |
| C48 | 3.06652794e−26 | 0 | 0 |
| C50 | 3.95339353e−26 | 0 | 0 |
| C52 | 2.12427278e−26 | 0 | 0 |
| C54 | 6.19479308e−27 | 0 | 0 |
| C55 | −9.56418704e−29 | 0 | 0 |
| C57 | −4.73070844e−28 | 0 | 0 |
| C59 | −9.34446589e−28 | 0 | 0 |
| C61 | −9.13157935e−28 | 0 | 0 |
| C63 | −4.41677071e−28 | 0 | 0 |
| C65 | −7.86181975e−29 | 0 | 0 |

Table 3b for FIG. 7

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | −743.46091320 | −835.77975520 | −5551.96069600 |
| C7 | 8.15313049e−07 | 1.08411968e−06 | 8.1725158e−08 |
| C9 | 1.15936905e−07 | 2.66713006e−07 | 2.11082779e−08 |
| C10 | −2.17231701e−09 | 1.97364815e−09 | −7.51877121e−09 |
| C12 | 2.45410579e−09 | 1.29311988e−09 | 9.83512366e−10 |
| C14 | 8.78996519e−10 | 1.55808687e−08 | −1.39425604e−10 |
| C16 | −1.4388317e−11 | −7.24177347e−12 | 1.61763526e−11 |
| C18 | 2.43340771e−12 | 3.70702943e−15 | 1.05071826e−12 |
| C20 | 8.01706893e−12 | −2.73262347e−10 | −1.62527109e−13 |
| C21 | 2.02931387e−14 | −9.2131432e−15 | 3.04337357e−13 |
| C23 | −2.63254556e−14 | 5.85039506e−14 | −7.58462902e−14 |
| C25 | −5.41315246e−15 | −3.84690423e−13 | −1.81428849e−15 |

-continued

Table 3b for FIG. 7

| Coefficient | M5 | M4 | M3 |
|---|---|---|---|
| C27 | 6.80497633e−14 | 4.35189326e−12 | −7.18902516e−16 |
| C29 | −7.38761627e−18 | 4.09273025e−17 | −1.95967055e−15 |
| C31 | −1.6406802e−16 | −1.32466527e−15 | 2.23232144e−16 |
| C33 | 4.6161003e−17 | 1.11389945e−14 | 1.45669424e−17 |
| C35 | 3.46981394e−16 | −8.00414961e−14 | −5.3737245e−19 |
| C36 | 6.56861624e−19 | 3.51522585e−21 | −3.51163866e−17 |
| C38 | 2.53098962e−19 | 5.30473647e−20 | 8.4177008e−18 |
| C40 | −1.17789383e−18 | 1.14555302e−17 | 4.49375372e−19 |
| C42 | 7.13915336e−19 | −1.10798161e−16 | −2.61682976e−20 |
| C44 | 6.00248794e−19 | 6.75342377e−16 | 2.31069209e−21 |

Table 3c for FIG. 7

| Coefficient | M2 | M1 |
|---|---|---|
| KY | 0.00000000 | 0.00000000 |
| KX | 0.00000000 | 0.00000000 |
| RX | −1728.90769600 | −880.94474610 |
| C7 | 3.08450816e−06 | −4.70279039e−08 |
| C9 | −2.17253795e−08 | 1.08990881e−07 |
| C10 | −3.75473915e−08 | −3.45672808e−11 |
| C12 | −1.81552974e−08 | 2.73887057e−11 |
| C14 | 7.96803985e−11 | −4.28414412e−10 |
| C16 | 2.0647621e−10 | 2.40236171e−14 |
| C18 | 7.22424709e−11 | −6.19613419e−13 |
| C20 | 1.47510283e−12 | 1.08423073e−12 |
| C21 | 1.77572753e−12 | −1.52199951e−17 |
| C23 | −6.59234699e−14 | −1.8034018e−15 |
| C25 | −2.26260751e−13 | −3.76723043e−15 |
| C27 | −5.706268e−15 | −5.40832792e−15 |
| C29 | −2.77294786e−14 | −2.49126053e−19 |
| C31 | −4.84971158e−15 | −3.60876052e−18 |

Table 3c for FIG. 7

| Coefficient | M2 | M1 |
|---|---|---|
| C33 | 3.35099874e−16 | 1.99785264e−18 |
| C35 | 2.39450375e−17 | 8.80558903e−18 |
| C36 | 2.21806273e−16 | −5.44564635e−22 |
| C38 | 1.36037517e−16 | −4.37847046e−20 |
| C40 | 2.00582463e−17 | −7.42210048e−20 |
| C42 | 1.83054058e−19 | −1.69927808e−19 |
| C44 | −5.75280548e−20 | 1.02060681e−19 |

Table 4a for FIG. 7

| Surface | DCX | DCY | DCZ |
|---|---|---|---|
| Image plane | 0.00000000 | 0.00000000 | 0.00000000 |
| M8 | 0.00000000 | 0.00000000 | 764.50361369 |
| M7 | 0.00000000 | 96.82652457 | 64.27191627 |
| M6 | 0.00000000 | −27.92847503 | 1058.54662453 |
| M5 | 0.00000000 | −219.64054559 | 1392.20908570 |
| M4 | 0.00000000 | −271.24388131 | 1813.78075704 |
| Stop | 0.00000000 | −198.32156886 | 1677.53219215 |
| M3 | 0.00000000 | −128.24179216 | 1546.81115682 |
| M2 | 0.00000000 | 16.78357234 | 1430.95006703 |
| 10 | 0.00000000 | 8791.56176200 | −7122.00998575 |
| M1 | 0.00000000 | 272.34233418 | 956.66066528 |
| Object plane | 0.00000000 | 362.68180636 | 1900.18311637 |

Table 4b for FIG. 7

| Surface | TLA [deg] | TLB [deg] | TLC [deg] |
|---|---|---|---|
| Image plane | −0.00000000 | 0.00000000 | −0.00000000 |
| M8 | 3.91596926 | 0.00000000 | −0.00000000 |
| M7 | 187.39186836 | 0.00000000 | −0.00000000 |
| M6 | −71.50714996 | 0.00000000 | −0.00000000 |
| M5 | 108.42016373 | 0.00000000 | −0.00000000 |
| M4 | 17.56397197 | 0.00000000 | −0.00000000 |
| Stop | −36.24096693 | 0.00000000 | −0.00000000 |
| M3 | 129.75252018 | 0.00000000 | −0.00000000 |
| M2 | −50.20499466 | 0.00000000 | −0.00000000 |
| 10 | 135.94318124 | 0.00000000 | −0.00000000 |
| M1 | 191.41461048 | 0.00000000 | −0.00000000 |
| Object plane | −0.00000000 | 0.00000000 | −0.00000000 |

Table 5 for FIG. 7

| Surface | Angle of incidence [deg] | Reflectivity |
|---|---|---|
| M8 | 3.91596926 | 0.66415239 |
| M7 | 0.35585461 | 0.66566616 |
| M6 | 78.62897953 | 0.85974012 |
| M5 | 78.56000002 | 0.85877563 |
| M4 | 10.58806423 | 0.65325493 |
| M3 | 78.41763467 | 0.85677489 |
| M2 | 78.46987638 | 0.85751067 |
| M1 | 16.88179312 | 0.63082790 |
| Overall transmission | | 0.0988 |

Table 6 for FIG. 7

| X [mm] | Y [mm] | Z [mm] |
|---|---|---|
| 0.00000000 | −47.76389383 | 0.00000000 |
| 0.75722478 | −47.21490944 | 0.00000000 |
| 1.44466231 | −45.56440865 | 0.00000000 |
| 1.99925630 | −42.80616853 | 0.00000000 |
| 2.37083821 | −38.94314949 | 0.00000000 |
| 2.52737588 | −34.00299920 | 0.00000000 |
| 2.45862703 | −28.05153657 | 0.00000000 |
| 2.17710208 | −21.19917906 | 0.00000000 |
| 1.71593988 | −13.59913606 | 0.00000000 |
| 1.12445586 | −5.43943918 | 0.00000000 |
| 0.46249291 | 3.06794966 | 0.00000000 |
| −0.20557575 | 11.69767212 | 0.00000000 |
| −0.81666564 | 20.21943325 | 0.00000000 |
| −1.31433675 | 28.40487722 | 0.00000000 |
| −1.65354402 | 36.03372730 | 0.00000000 |
| −1.80460322 | 42.89898816 | 0.00000000 |
| −1.75605283 | 48.81111176 | 0.00000000 |
| −1.51602869 | 53.60229092 | 0.00000000 |
| −1.11184253 | 57.13213052 | 0.00000000 |
| −0.58761247 | 59.29431617 | 0.00000000 |
| −0.00000000 | 60.02254886 | 0.00000000 |
| 0.58761247 | 59.29431617 | 0.00000000 |
| 1.11184253 | 57.13213052 | 0.00000000 |
| 1.51602869 | 53.60229092 | 0.00000000 |
| 1.75605283 | 48.81111176 | 0.00000000 |
| 1.80460322 | 42.89898816 | 0.00000000 |
| 1.65354402 | 36.03372730 | 0.00000000 |
| 1.31433675 | 28.40487722 | 0.00000000 |
| 0.81666564 | 20.21943325 | 0.00000000 |
| 0.20557575 | 11.69767212 | 0.00000000 |
| −0.46249291 | 3.06794966 | 0.00000000 |
| −1.12445586 | −5.43943918 | 0.00000000 |
| −1.71593988 | −13.59913606 | 0.00000000 |
| −2.17710208 | −21.19917906 | 0.00000000 |
| −2.45862703 | −28.05153657 | 0.00000000 |
| −2.52737588 | −34.00299920 | 0.00000000 |
| −2.37083821 | −38.94314949 | 0.00000000 |
| −1.99925630 | −42.80616853 | 0.00000000 |
| −1.44466231 | −45.56440865 | 0.00000000 |
| −0.75722478 | −47.21490944 | 0.00000000 |

An overall reflectivity of the projection optical unit 24 is 9.88%.

The projection optical unit 24 has a reducing imaging scale of 8×($\beta$=8).

The image field 8 has an x-extent of two times 6.5 mm and a y-extent of 0.8 mm. The projection optical unit 24 is optimized for an operating wavelength of the illumination light 3 of 13.5 nm.

In the projection optical unit 24, a pupil plane 18 is arranged in the beam path of the imaging light 3 between the mirrors M2 and M3. An intermediate image plane 19 is arranged in the imaging beam path between the mirrors M4 and M5.

The mirrors M1, M3, M4, M6 and M8 have negative values for the radius, i.e. are, in principle, concave mirrors. The mirrors M2, M5 and M7 have positive values for the radius, i.e. are, in principle, convex mirrors. The mirrors M3, M5 and M6 have very large absolute radii, i.e. only constitute small deviations from plane reflection surfaces.

It is also the case in the projection optical unit 24 that only the last mirror M8 includes a passage opening 17 in the imaging beam path for the imaging light 3 guided between the mirrors M6 and M7.

An installation length of the projection optical unit 24 in the z-direction, i.e. a distance between the object plane 5 and the image plane 9, is 1900 mm. The mirror M8 has the largest diameter of all mirrors in the projection optical unit 24, the diameter lying in the region of 700 mm.

In the projection optical unit 24, an object/image offset $d_{OIS}$ is approximately 360 mm. In the projection optical unit 24, the object field-side chief rays 16 also include an angle CRAO of 5.5° with a normal of the object plane 5.

The projection optical unit 24 has a scanned RMS value of the image field-side wavefront which is in the region of 100 mλ. An image field-side distortion value is in the region of 0.6 nm in the projection optical unit 24.

An aperture stop effective for the y-dimension can be arranged in the beam path of the imaging light 3 between the mirrors M2 and M3.

In the projection optical unit 24, the chief rays 16 of the imaging light 3 propagate divergently between the object field 4 and the mirror M1.

The mirror M8 defines an image-side obscuration which in the x-dimension is less than 24% of the image-side numerical aperture of the projection optical unit 24.

In the y-direction, the obscuration is significantly smaller and moreover decentered.

A further embodiment of a projection optical unit 25, which can be used in the projection exposure apparatus 1 according to FIG. 1 instead of e.g. the projection optical unit 7, is explained in the following text on the basis of FIG. 8. Components and functions which were already explained above in the context of FIGS. 1 to 7 are appropriately denoted by the same reference signs and are not discussed again in detail.

The imaging beam path of the projection optical unit 25 corresponds qualitatively to that of the projection optical units 23 and 24 according to FIGS. 6 and 7. The projection optical unit 25 also includes eight mirrors M1 to M8, of which the mirrors M1, M4, M7 and M8 are embodied as mirrors for normal incidence and the mirrors M2, M3, M5 and M6 are embodied as mirrors for grazing incidence. The deflecting effects of the mirrors M2 and M3 on the one hand, and M5 and M6 on the other hand are subtracted from one another.

The mirrors M1 to M8 are configured as free-form surfaces, for which the free-form surface equation (1), specified above, applies. The optical design data from the projection optical unit 25 can be gathered from the following tables, which, in terms of their design, correspond to the tables for the projection optical unit 7 according to FIG. 2.

Figure 8:
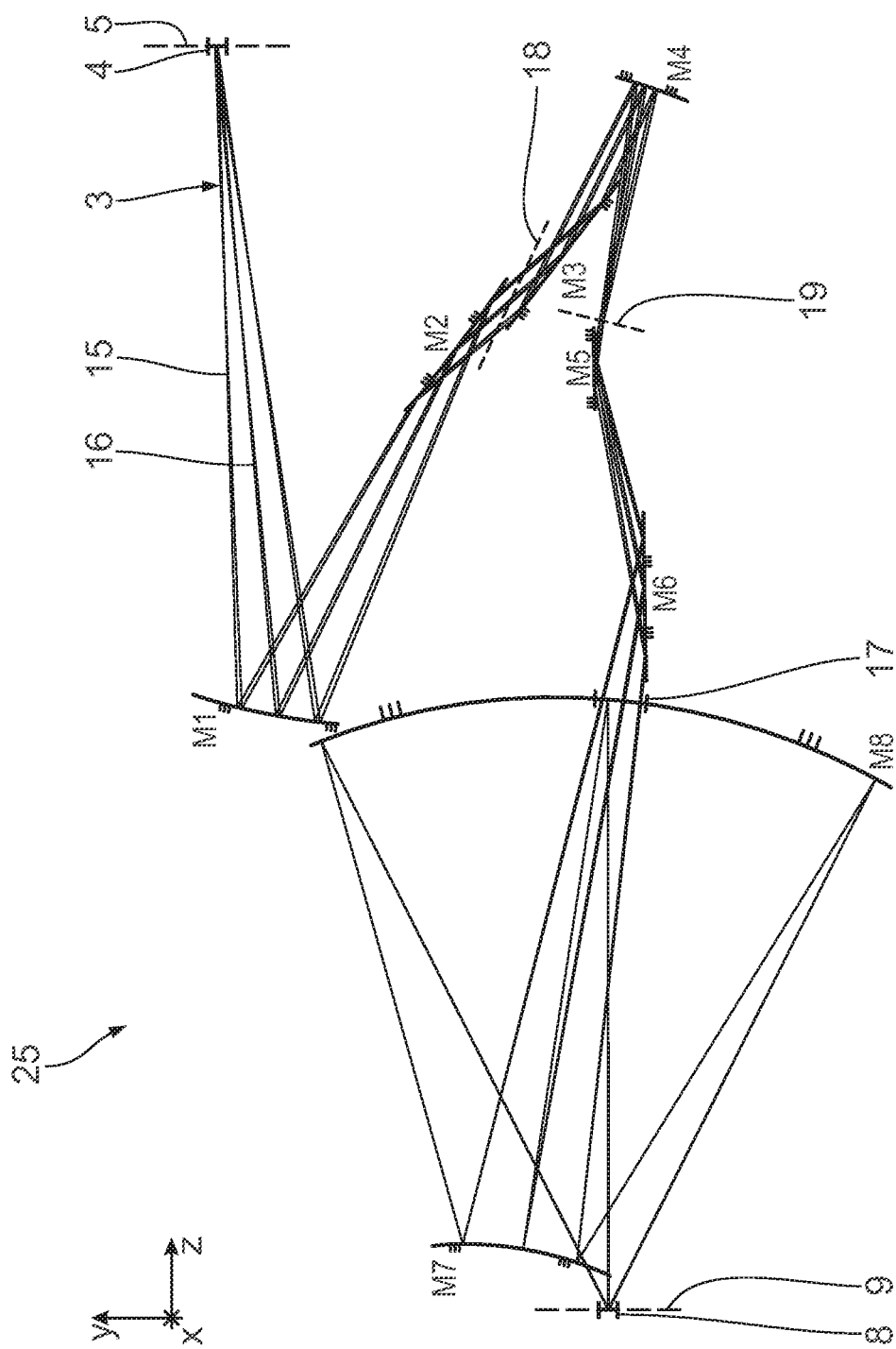

Table 1 for FIG. 8

| Exemplary embodiment | FIG. 8 |
|---|---|
| NA | 0.45 |
| Wavelength | 13.5 nm |
| Field dimension x | 13.0 mm |
| Field dimension y | 0.784 mm |
| Field curvature | 0.0 1/mm |
| Stop | S9 |

Table 2 for FIG. 8

| Surface | Radius x [mm] | Power x [1/mm] | Radius y [mm] | Power y [1/mm] | Operating |
|---|---|---|---|---|---|
| M8 | −1049.60389641 | 0.00189993 | −986.01437231 | 0.00203430 | REFL |
| M7 | 1052.05094258 | −0.00190085 | 516.30074958 | −0.00387413 | REFL |
| M6 | 672.07102892 | −0.00059408 | 6476.96591445 | −0.00154677 | REFL |
| M5 | −799.22989968 | 0.00049907 | −9635.87145309 | 0.00104073 | REFL |
| M4 | −655.82100664 | 0.00302260 | −1132.34738046 | 0.00178202 | REFL |
| M3 | 2083.13733086 | −0.00019163 | −8161.78002389 | 0.00122769 | REFL |
| M2 | — | 0.00001224 | 2513.72027155 | −0.00398819 | REFL |
| M1 | −1124.77927352 | 0.00171284 | −993.83277453 | 0.00208912 | REFL |

Table 3a for FIG. 8

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −1049.60389600 | 1052.05094300 | 672.07102890 |
| C7 | 8.94830424e−09 | 6.82707408e−08 | 5.39977203e−07 |
| C9 | 3.00569958e−09 | 5.0133583e−08 | 5.0463779e−08 |
| C10 | −1.0205043e−11 | 9.13305341e−10 | 2.96374987e−09 |
| C12 | −1.78212052e−11 | 2.88849001e−09 | 3.61953024e−09 |
| C14 | −6.16611869e−12 | 1.70930306e−09 | 9.8625888e−11 |
| C16 | 5.53369586e−15 | 6.46391137e−13 | 1.62428612e−11 |
| C18 | 7.14785588e−15 | 1.61691667e−12 | 6.55853805e−12 |
| C20 | 1.2952174e−15 | −1.12568271e−13 | 9.89173718e−14 |
| C21 | −1.15962082e−17 | 3.2230907e−15 | 2.17786681e−14 |
| C23 | −3.29641744e−17 | 1.94684249e−14 | 7.78862843e−14 |
| C25 | −2.88253574e−17 | 2.8363428e−14 | 2.06500061e−14 |
| C27 | −7.61491275e−18 | 9.96975622e−15 | 5.79706038e−17 |
| C29 | 3.95947425e−21 | 4.40316043e−18 | 1.76578906e−16 |
| C31 | 9.59189e−21 | 3.61186907e−17 | 1.59804916e−16 |
| C33 | 5.9075341e−21 | 2.40890432e−17 | 4.63612518e−17 |
| C35 | 4.91436138e−22 | −2.08227139e−17 | −1.15451621e−18 |
| C36 | −9.78221988e−24 | 2.17340086e−20 | 4.62607032e−20 |
| C38 | −3.80396711e−23 | 1.769269e−20 | 2.36610599e−19 |
| C40 | −5.3008359e−23 | 5.27416888e−19 | 3.60474258e−19 |
| C42 | −3.05920471e−23 | 3.79026666e−19 | 8.8347498e−20 |
| C44 | −6.20613311e−24 | −4.57440157e−20 | −2.35018949e−21 |
| C46 | 4.59926677e−27 | 0 | 0 |
| C48 | 1.58065492e−26 | 0 | 0 |
| C50 | 1.76803708e−26 | 0 | 0 |
| C52 | 7.68522982e−27 | 0 | 0 |
| C54 | 5.34537619e−28 | 0 | 0 |
| C55 | −1.6671251e−29 | 0 | 0 |
| C57 | −8.60661791e−29 | 0 | 0 |
| C59 | −1.74742916e−28 | 0 | 0 |
| C61 | −1.71631988e−28 | 0 | 0 |
| C63 | −7.97461918e−29 | 0 | 0 |
| C65 | −1.37837693e−29 | 0 | 0 |

Table 3b for FIG. 8

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | −799.22989970 | −655.82100660 | 2083.13733100 |
| C7 | −2.06359045e−07 | 1.79769856e−06 | −1.23888727e−06 |
| C9 | 4.53272901e−08 | 2.37465306e−06 | 8.86422249e−08 |
| C10 | 4.98518606e−10 | −1.48557245e−09 | −3.40006344e−09 |
| C12 | −1.31134892e−09 | −2.80514774e−10 | 2.03241635e−09 |
| C14 | 2.98465492e−12 | 3.01097166e−09 | −3.36768492e−11 |
| C16 | 4.49053513e−12 | 3.15577912e−11 | −1.66141091e−11 |
| C18 | 1.64207121e−12 | 7.30259248e−11 | −7.13724906e−12 |
| C20 | −1.0335036e−12 | 3.09731752e−10 | 5.4031591e−13 |
| C21 | −2.93206259e−14 | −2.05672375e−14 | −4.18881657e−13 |
| C23 | −5.92456689e−14 | 2.22350106e−14 | −6.83276534e−14 |
| C25 | −5.80080861e−14 | 1.08931865e−12 | −7.07864185e−15 |

Table 3b for FIG. 8

| Co-efficient | M5 | M4 | M3 |
|---|---|---|---|
| C27 | 2.2172926e−14 | −1.42234054e−12 | 5.63121269e−16 |
| C29 | 1.40438563e−17 | 8.53769578e−16 | −8.08308771e−16 |
| C31 | −6.66032602e−17 | 2.70533891e−15 | 2.67861368e−16 |
| C33 | 7.30170261e−16 | −1.62676517e−15 | −3.42472444e−17 |
| C35 | 3.16423462e−16 | 4.49594522e−14 | 1.66873362e−18 |
| C36 | −1.81264397e−18 | −3.66571047e−19 | −6.54742071e−17 |
| C38 | −5.39055928e−20 | −3.12546568e−18 | 4.62927488e−18 |
| C40 | −2.02947052e−18 | 7.95440303e−17 | −4.8710506e−18 |
| C42 | −2.24011839e−18 | 6.67587526e−16 | −2.67955705e−19 |
| C44 | −7.82360967e−18 | 3.07878704e−16 | 2.12454918e−22 |

Table 3c for FIG. 8

| Coefficient | M2 | M1 |
|---|---|---|
| KY | 0.00000000 | 0.00000000 |
| KX | 0.00000000 | 0.00000000 |
| RX | −32587.82702000 | −1124.77927400 |
| C7 | −4.74483513e−07 | 2.20095584e−09 |
| C9 | 3.93556671e−08 | 1.960322e−07 |
| C10 | −2.66024165e−09 | −2.88589459e−11 |
| C12 | −2.10042981e−09 | −1.13714912e−11 |
| C14 | −4.96647358e−11 | −1.87229835e−10 |
| C16 | 3.63968975e−11 | −1.00857126e−13 |
| C18 | −6.32882695e−12 | −1.48327939e−14 |
| C20 | 1.40830966e−12 | 1.42850505e−12 |
| C21 | −3.43617167e−13 | −3.03067897e−17 |
| C23 | 2.78640456e−15 | −3.68437637e−16 |
| C25 | −2.10521417e−14 | 2.77481379e−15 |
| C27 | −3.31782506e−16 | −2.91734364e−15 |
| C29 | 3.53276862e−15 | 5.08698618e−19 |
| C31 | −7.40107603e−16 | 7.73915869e−18 |
| C33 | 2.47602209e−17 | −6.54164067e−19 |
| C35 | 3.81467272e−18 | 1.85860304e−17 |
| C36 | −5.81173248e−18 | 1.22184892e−21 |
| C38 | −1.24881103e−17 | 1.12627739e−20 |
| C40 | 6.79836244e−18 | 3.74180742e−20 |
| C42 | −6.71427793e−19 | 3.54376196e−20 |
| C44 | 2.7467903e−20 | −9.46214624e−20 |

Table 4a for FIG. 8

| Surface | DCX | DCY | DCZ |
|---|---|---|---|
| Image plane | 0.00000000 | 0.00000000 | 0.00000000 |
| M8 | 0.00000000 | 0.00000000 | 921.48007420 |
| M7 | 0.00000000 | 127.69651360 | 91.87626879 |
| M6 | 0.00000000 | −54.51524583 | 1081.95671536 |
| M5 | 0.00000000 | 20.29114222 | 1416.57838942 |
| M4 | 0.00000000 | −58.31889420 | 1844.49683317 |
| M3 | 0.00000000 | 59.41629968 | 1599.41318117 |
| M2 | 0.00000000 | 224.00188768 | 1454.69416858 |
| Stop | 0.00000000 | 273.52466623 | 1404.16528501 |
| M1 | 0.00000000 | 493.26104418 | 894.61377093 |
| Object plane | 0.00000000 | 589.57009799 | 1900.28701404 |

Table 4b for FIG. 8

| Surface | TLA [deg] | TLB [deg] | TLC [deg] |
|---|---|---|---|
| Image plane | −0.00000000 | 0.00000000 | −0.00000000 |
| M8 | 4.37615932 | 0.00000000 | −0.00000000 |
| M7 | 189.59363600 | 0.00000000 | −0.00000000 |
| M6 | 88.91365207 | 0.00000000 | −0.00000000 |
| M5 | 268.90218087 | 0.00000000 | −0.00000000 |
| M4 | 18.03860636 | 0.00000000 | −0.00000000 |
| M3 | 127.17947272 | 0.00000000 | −0.00000000 |
| M2 | −52.81127402 | 0.00000000 | −0.00000000 |
| Stop | 206.02771128 | 0.00000000 | −0.00000000 |
| M1 | 190.10376344 | 0.00000000 | −0.00000000 |
| Object plane | −0.00000000 | 0.00000000 | −0.00000000 |

Table 5 for FIG. 8

| Surface | Angle of incidence [deg] | Reflectivity |
|---|---|---|
| M8 | 4.37615932 | 0.66374698 |
| M7 | 0.83845517 | 0.66562989 |
| M6 | 78.48451336 | 0.85771648 |
| M5 | 78.49604650 | 0.85787855 |
| M4 | 7.63115384 | 0.65946494 |
| M3 | 78.48653632 | 0.85774492 |
| M2 | 78.49242558 | 0.85782768 |
| M1 | 15.57417594 | 0.63670200 |
| Overall transmission | | 0.1004 |

Table 6 for FIG. 8

| X [mm] | Y [mm] | Z [mm] |
|---|---|---|
| 0.00000000 | 47.81303970 | 0.00000000 |
| −5.44429277 | 47.46175497 | 0.00000000 |
| −10.74517286 | 46.42220229 | 0.00000000 |
| −15.76391160 | 44.73636357 | 0.00000000 |
| −20.37088960 | 42.47121905 | 0.00000000 |
| −24.44946621 | 39.71451489 | 0.00000000 |
| −27.89907302 | 36.56933710 | 0.00000000 |
| −30.63749814 | 33.14808875 | 0.00000000 |
| −32.60243065 | 29.56653666 | 0.00000000 |
| −33.75231387 | 25.93835392 | 0.00000000 |
| −34.06656777 | 22.37033180 | 0.00000000 |
| −33.54529452 | 18.95837628 | 0.00000000 |
| −32.20854890 | 15.78438787 | 0.00000000 |
| −30.09518802 | 12.91406977 | 0.00000000 |
| −27.26136068 | 10.39574244 | 0.00000000 |
| −23.77878796 | 8.26036180 | 0.00000000 |
| −19.73295948 | 6.52296509 | 0.00000000 |
| −15.22125595 | 5.18562681 | 0.00000000 |
| −10.35095305 | 4.24175823 | 0.00000000 |
| −5.23706775 | 3.68124886 | 0.00000000 |
| −0.00000000 | 3.49551844 | 0.00000000 |
| 5.23706775 | 3.68124886 | 0.00000000 |
| 10.35095305 | 4.24175823 | 0.00000000 |
| 15.22125595 | 5.18562681 | 0.00000000 |
| 19.73295948 | 6.52296509 | 0.00000000 |
| 23.77878796 | 8.26036180 | 0.00000000 |
| 27.26136068 | 10.39574244 | 0.00000000 |
| 30.09518802 | 12.91406977 | 0.00000000 |
| 32.20854890 | 15.78438787 | 0.00000000 |
| 33.54529452 | 18.95837628 | 0.00000000 |
| 34.06656777 | 22.37033180 | 0.00000000 |
| 33.75231387 | 25.93835392 | 0.00000000 |
| 32.60243065 | 29.56653666 | 0.00000000 |
| 30.63749814 | 33.14808875 | 0.00000000 |
| 27.89907302 | 36.56933710 | 0.00000000 |
| 24.44946621 | 39.71451489 | 0.00000000 |
| 20.37088960 | 42.47121905 | 0.00000000 |
| 15.76391160 | 44.73636357 | 0.00000000 |
| 10.74517286 | 46.42220229 | 0.00000000 |
| 5.44429277 | 47.46175497 | 0.00000000 |

An overall reflectivity of the projection optical unit 25 is 10.04%.

The projection optical unit 25 has a reducing imaging scale of 8×(β=8).

The image field 8 has an x-extent of two times 6.5 mm and a y-extent of 1 mm. The projection optical unit 25 is optimized for an operating wavelength of the illumination light 3 of 13.5 nm.

The mirrors M1, M3, M4, M5 and M8 have negative values for the radius, i.e. are, in principle, concave mirrors. The mirrors M2, M6 and M7 have positive values for the radius, i.e. are, in principle, convex mirrors. The mirrors M3, M5 and M6 have very large absolute radii, i.e. only constitute small deviations from plane reflection surfaces.

It is also the case in the projection optical unit 25 that only the last mirror M8 includes a passage opening 17 for the imaging light 3 guided between the mirrors M6 and M7.

In the projection optical unit 25, a pupil plane 18 is arranged between the mirror M2 and the mirror M3. In the projection optical unit 25, an intermediate image plane 19 is arranged in the region of the reflection on the mirror M5 for grazing incidence.

In the projection optical unit 25, a z-distance between the object plane 5 and the image plane 9 is 1900 mm.

In the projection optical unit 25, a typical diameter of the largest mirror M8 is approximately 800 mm.

In the projection optical unit 25, an object/image offset $d_{OIS}$ is approximately 600 mm. In the projection optical unit 25, the object field-side chief rays 16 also include an angle CRAO of 5.5° with a normal of the object plane 5.

The projection optical unit 25 has a scanned RMS value of the image field-side wavefront which is approximately 70 mλ. An image field-side distortion value is approximately 3 nm in the projection optical unit 25.

In the projection optical unit 25, an aperture stop can be arranged in the beam path of the imaging light 3 between the mirrors M2 and M3.

In the projection optical unit 25, the chief rays 16 propagate divergently between the object field 4 and the mirror M1.

The mirror M8 defines an image-side obscuration which in the x-dimension is less than 20% of the image-side numerical aperture of the projection optical unit 25. In the y-direction, the obscuration is significantly smaller and moreover decentered.

A further embodiment of a projection optical unit 26, which can be used in the projection exposure apparatus 1 according to FIG. 1 instead of e.g. the projection optical unit 7, is explained in the following text on the basis of FIG. 9. Components and functions which were already explained above in the context of FIGS. 1 to 8 are appropriately denoted by the same reference signs and are not discussed again in detail.

The projection optical unit 26 has a total of eight mirrors M1 to M8. These are configured as free-form surfaces, for which the free-form surface equation (1), specified above, applies. The imaging beam path of the projection optical unit 26 corresponds qualitatively to that of the projection optical unit 7, mirrored about a plane parallel to the xz-plane.

The mirrors M2 and M3 on the one hand, and M5 and M6 on the other hand once again constitute pairs of mirrors for grazing incidence, the deflecting effect of which for the imaging light adds up. The other mirrors M1, M4, M7 and M8 are mirrors for normal incidence.

The optical design data from the projection optical unit 26 can be gathered from the following tables, which, in terms of their design, correspond to the tables for the projection optical unit 7 according to FIG. 2.

Figure 9:
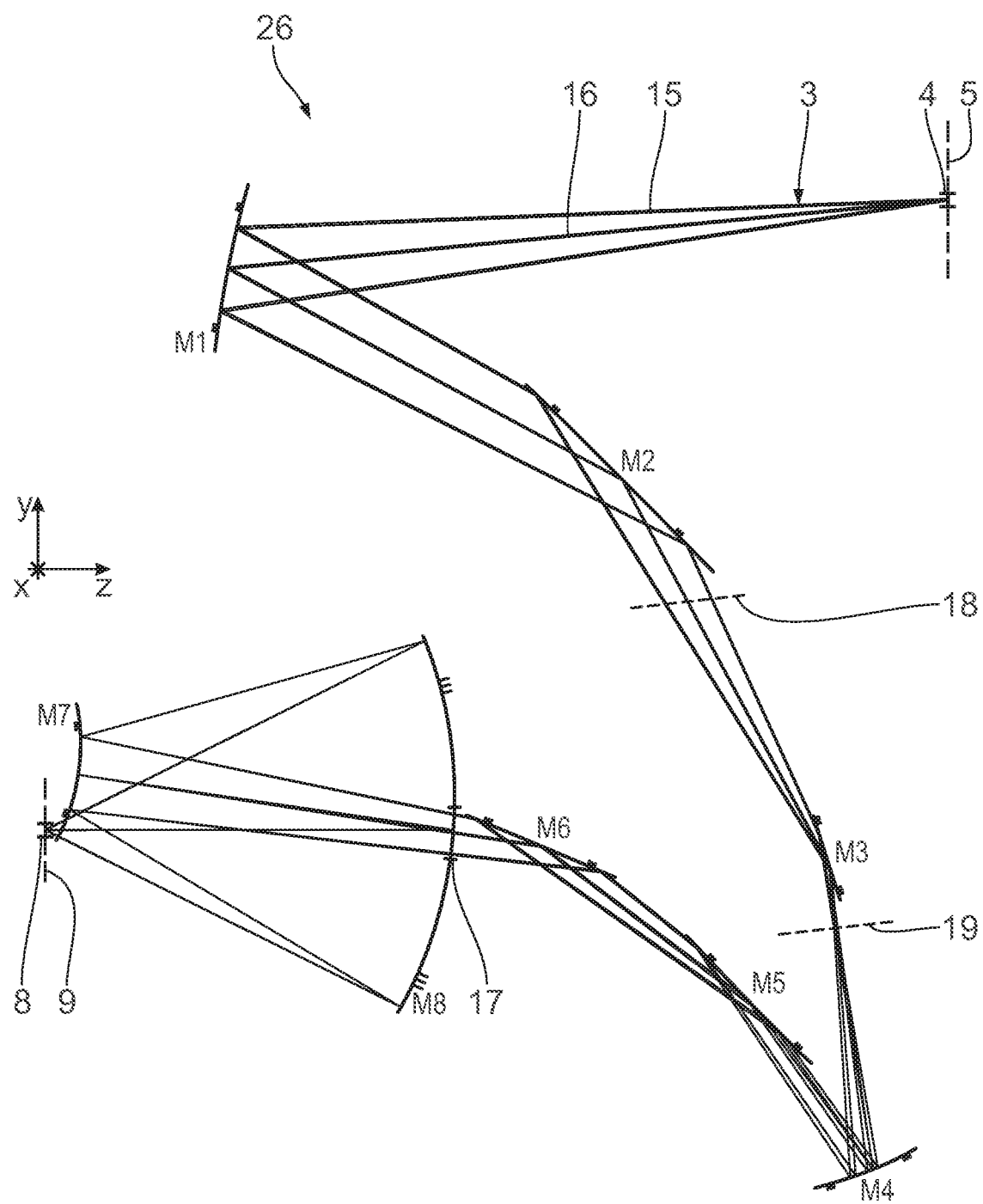

| Table 1 for FIG. 9 | |
|---|---|
| Exemplary embodiment | FIG. 9 |
| NA | 0.45 |
| Wavelength | 13.5 nm |
| Field dimension x | 13.0 mm |
| Field dimension y | 0.784 mm |
| Field curvature | 0.0 1/mm |
| Stop | S8 |

| Table 2 for FIG. 9 | | | | | |
|---|---|---|---|---|---|
| Surface | Radius x [mm] | Power x [1/mm] | Radius y [mm] | Power y [1/mm] | Operating |
| M8 | — | 0.00195413 | −933.33549787 | 0.00214871 | REFL |
| M7 | 1354.53748928 | −0.00147651 | 452.31842933 | −0.00442170 | REFL |
| M6 | — | 0.00034472 | 15664.51705589 | −0.00052721 | REFL |
| M5 | 3999.20552730 | −0.00007886 | 7254.86511412 | −0.00174817 | REFL |
| M4 | — | 0.00164064 | −894.72802928 | 0.00230144 | REFL |
| M3 | 4681.74323636 | −0.00007653 | 5171.50582521 | −0.00215877 | REFL |
| M2 | 852.69172547 | −0.00067816 | — | 0.00062397 | REFL |
| M1 | — | 0.00097408 | −2270.56487894 | 0.00092083 | REFL |

| Table 3a for FIG. 9 | | | |
|---|---|---|---|
| Co-efficient | M8 | M7 | M6 |
| KY | 0.00000000 | 0.00000000 | 0.00000000 |
| KX | 0.00000000 | 0.00000000 | 0.00000000 |
| RX | −1020.68473900 | 1354.53748900 | −1405.06283600 |
| C7 | −4.5731683e−10 | −3.41690693e−07 | −5.65649344e−08 |
| C9 | 2.45996777e−09 | 3.83206678e−08 | 1.89544462e−09 |
| C10 | −9.85395846e−12 | 6.44749036e−10 | −1.93920244e−10 |
| C12 | −2.34897758e−11 | 2.85639184e−09 | −3.25598414e−11 |
| C14 | −8.72926178e−12 | 3.07364292e−09 | −1.12164645e−13 |
| C16 | 6.07361769e−16 | −3.09291494e−13 | 3.36943064e−12 |
| C18 | 2.41094328e−15 | 2.31337277e−13 | 6.29413154e−13 |
| C20 | 1.32110071e−15 | 1.3381722e−12 | 1.29643368e−13 |
| C21 | −1.23303721e−17 | 1.38415935e−15 | 4.62316004e−14 |
| C23 | −4.20277144e−17 | 1.20452307e−14 | 8.27538418e−15 |
| C25 | −4.08488297e−17 | 3.55373943e−14 | 8.69367918e−16 |
| C27 | −1.08210387e−17 | 1.90903669e−14 | 9.15499041e−18 |
| C29 | 1.07931282e−21 | −1.26240025e−19 | −1.09629551e−16 |
| C31 | 3.53989366e−21 | 7.87268568e−18 | −2.60340852e−19 |
| C33 | 3.24535646e−21 | 3.94705236e−17 | −1.56739759e−18 |
| C35 | 1.50192167e−21 | 6.62304e−17 | −1.72905085e−19 |
| C36 | −1.14892505e−23 | 6.66100206e−21 | 1.66079634e−18 |
| C38 | −5.06654961e−23 | 8.27654198e−20 | 8.50117627e−20 |
| C40 | −7.8424464e−23 | 4.19476166e−19 | −1.05681234e−19 |
| C42 | −4.9856421e−23 | 8.00362496e−19 | −5.2250027e−21 |
| C44 | −1.06579309e−23 | 5.55709617e−19 | 1.40460138e−22 |

Table 3a for FIG. 9

| Coefficient | M8 | M7 | M6 |
|---|---|---|---|
| C46 | 2.08122398e−27 | 0 | 0 |
| C48 | 6.60530624e−27 | 0 | 0 |
| C50 | 7.61977765e−27 | 0 | 0 |
| C52 | 4.50302264e−27 | 0 | 0 |
| C54 | 1.39426672e−27 | 0 | 0 |
| C55 | −2.0882185e−29 | 0 | 0 |
| C57 | −1.18627262e−28 | 0 | 0 |
| C59 | −2.58588211e−28 | 0 | 0 |
| C61 | −2.72003773e−28 | 0 | 0 |
| C63 | −1.3620868e−28 | 0 | 0 |
| C65 | −2.53756018e−29 | 0 | 0 |

Table 3b for FIG. 9

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 3999.20552700 | −1184.01227800 | 4681.74323600 |
| C7 | 8.69357878e−08 | 7.62650744e−09 | 1.82926331e−07 |
| C9 | −2.20256023e−08 | −6.79819355e−07 | −2.74549952e−08 |
| C10 | 6.23391082e−10 | −6.30875708e−11 | 1.36557421e−10 |
| C12 | 2.15155751e−10 | 6.40787678e−12 | 5.55467106e−10 |
| C14 | 6.51961859e−11 | −3.52233076e−09 | 1.76746757e−10 |
| C16 | 8.39711467e−13 | −2.68662388e−14 | 1.76890882e−12 |
| C18 | 2.30182337e−13 | −1.32962452e−12 | −4.71589056e−13 |
| C20 | −4.46761962e−14 | −2.08675862e−11 | 1.39910872e−13 |
| C21 | −4.34103393e−15 | −6.57999966e−17 | −1.21518032e−14 |
| C23 | 3.68657946e−15 | −8.04594597e−16 | 9.50534732e−15 |
| C25 | 1.89166259e−16 | −3.29911674e−15 | −8.40961008e−15 |
| C27 | 1.06520031e−16 | −1.32487137e−13 | −8.07445146e−15 |
| C29 | 1.3373458e−17 | 9.49001529e−19 | 6.03691731e−18 |
| C31 | 1.69029919e−17 | −8.32008838e−18 | 9.40385193e−17 |
| C33 | 2.62169884e−18 | 8.1099079e−17 | 1.1838444e−16 |
| C35 | −3.09635883e−19 | −1.03894539e−15 | 9.19224029e−17 |
| C36 | 3.39460047e−19 | −9.69222081e−22 | 1.64007551e−19 |
| C38 | 1.19302799e−19 | 1.76179484e−21 | 6.27204932e−20 |
| C40 | 6.54223006e−20 | 1.83258474e−20 | −4.59136703e−19 |
| C42 | −4.52075866e−21 | 1.01522211e−18 | −4.92528089e−19 |
| C44 | 7.14188701e−22 | −5.99497164e−18 | −3.46025607e−19 |

Table 3c for FIG. 9

| Coefficient | M2 | M1 |
|---|---|---|
| KY | 0.00000000 | 0.00000000 |
| KX | 0.00000000 | 0.00000000 |
| RX | 852.69172550 | −1964.03237500 |
| C7 | −7.81658255e−07 | −4.55147095e−09 |
| C9 | 1.56377907e−09 | −5.53517249e−08 |
| C10 | 5.58543355e−10 | −6.87418275e−12 |
| C12 | 1.03807562e−09 | −1.8936292e−11 |
| C14 | −7.16700901e−13 | 2.34208295e−10 |
| C16 | −2.34728814e−12 | 2.34056772e−14 |
| C18 | −1.28373035e−12 | 1.87499703e−13 |
| C20 | −7.57748125e−15 | −8.87948384e−13 |
| C21 | −1.15979439e−15 | 1.42512308e−18 |
| C23 | 4.32890616e−15 | 2.07491865e−17 |
| C25 | 1.60432619e−15 | −9.62467925e−16 |
| C27 | 2.85253744e−18 | 2.00812e−15 |
| C29 | 3.98866926e−18 | 1.34308944e−20 |
| C31 | −4.89809284e−18 | −1.00614084e−19 |
| C33 | −1.71062114e−18 | 4.24046777e−18 |
| C35 | 7.20763643e−21 | −2.92886467e−18 |
| C36 | 6.42255749e−21 | −3.18411183e−24 |
| C38 | −3.70862193e−21 | −1.94058082e−23 |
| C40 | 3.05690863e−21 | 9.71214773e−22 |
| C42 | 1.05972674e−21 | −7.95009632e−21 |
| C44 | −1.21554754e−23 | 6.09195055e−21 |

Table 4a for FIG. 9

| Surface | DCX | DCY | DCZ |
|---|---|---|---|
| Image plane | 0.00000000 | 0.00000000 | 0.00000000 |
| M8 | 0.00000000 | 0.00000000 | 865.29422222 |
| M7 | 0.00000000 | 118.52490924 | 68.26504872 |
| M6 | 0.00000000 | −36.78487779 | 1055.95508411 |
| M5 | 0.00000000 | −363.53035676 | 1490.07075809 |
| M4 | 0.00000000 | −730.26441301 | 1745.75557040 |
| M3 | 0.00000000 | −69.28979005 | 1660.49873728 |
| Stop | 0.00000000 | 343.22961949 | 1432.58044567 |
| M2 | 0.00000000 | 752.01678132 | 1223.96788517 |
| M1 | 0.00000000 | 1204.58566704 | 386.83503296 |
| Object plane | 0.00000000 | 1351.26144344 | 1909.74496129 |

Table 4b for FIG. 9

| Surface | TLA [deg] | TLB [deg] | TLC [deg] |
|---|---|---|---|
| Image plane | −0.00000000 | 0.00000000 | −0.00000000 |
| M8 | 4.22991607 | 0.00000000 | −0.00000000 |
| M7 | 188.70125998 | 0.00000000 | −0.00000000 |
| M6 | −67.04744721 | 0.00000000 | −0.00000000 |
| M5 | −43.95927660 | 0.00000000 | −0.00000000 |
| M4 | 68.88242468 | 0.00000000 | −0.00000000 |
| M3 | −17.67119969 | 0.00000000 | −0.00000000 |
| Stop | −59.23477257 | 0.00000000 | −0.00000000 |
| M2 | −44.79701653 | 0.00000000 | −0.00000000 |
| M1 | 191.44774020 | 0.00000000 | −0.00000000 |
| Object plane | −0.00000000 | 0.00000000 | −0.00000000 |

Table 5 for FIG. 9

| Surface | Angle of incidence [deg] | Reflectivity |
|---|---|---|
| M8 | 4.22991607 | 0.66388105 |
| M7 | 0.23883275 | 0.66566686 |
| M6 | 75.98494377 | 0.82019012 |
| M5 | 80.92687210 | 0.89027623 |
| M4 | 13.76746994 | 0.64369696 |
| M3 | 79.67997395 | 0.87406508 |
| M2 | 73.19415034 | 0.77128309 |
| M1 | 16.94892910 | 0.63050655 |
| Overall transmission | | 0.0883 |

Table 6 for FIG. 9

| X [mm] | Y [mm] | Z [mm] |
|---|---|---|
| 0.00000000 | −80.47093417 | 0.00000000 |
| −10.25746907 | −79.94987076 | 0.00000000 |
| −20.26826613 | −78.37210765 | 0.00000000 |
| −29.79066890 | −75.69797214 | 0.00000000 |
| −38.59312691 | −71.87406347 | 0.00000000 |
| −46.45979046 | −66.85028467 | 0.00000000 |
| −53.19615576 | −60.60006602 | 0.00000000 |
| −58.63447748 | −53.13981514 | −0.00000000 |
| −62.63850784 | −44.54314891 | 0.00000000 |

-continued

Table 6 for FIG. 9

| X [mm] | Y [mm] | Z [mm] |
|---|---|---|
| −65.10719435 | −34.94724292 | 0.00000000 |
| −65.97718636 | −24.55138803 | 0.00000000 |
| −65.22420672 | −13.60979294 | 0.00000000 |
| −62.86345402 | −2.42134193 | 0.00000000 |
| −58.94921668 | 8.68142822 | 0.00000000 |
| −53.57381986 | 19.34327530 | 0.00000000 |
| −46.86592081 | 29.19797884 | 0.00000000 |
| −38.98806545 | 37.88260901 | 0.00000000 |
| −30.13336574 | 45.05554784 | −0.00000000 |
| −20.52118204 | 50.41779081 | −0.00000000 |
| −10.39177552 | 53.73519155 | 0.00000000 |
| −0.00000000 | 54.85815175 | 0.00000000 |
| 10.39177552 | 53.73519155 | −0.00000000 |
| 20.52118204 | 50.41779081 | 0.00000000 |
| 30.13336574 | 45.05554784 | −0.00000000 |
| 38.98806545 | 37.88260901 | 0.00000000 |
| 46.86592081 | 29.19797884 | 0.00000000 |
| 53.57381986 | 19.34327530 | 0.00000000 |
| 58.94921668 | 8.68142822 | 0.00000000 |
| 62.86345402 | −2.42134193 | 0.00000000 |
| 65.22420672 | −13.60979294 | 0.00000000 |
| 65.97718636 | −24.55138803 | 0.00000000 |
| 65.10719435 | −34.94724292 | 0.00000000 |
| 62.63850784 | −44.54314891 | 0.00000000 |
| 58.63447748 | −53.13981514 | −0.00000000 |
| 53.19615576 | −60.60006602 | 0.00000000 |
| 46.45979046 | −66.85028467 | 0.00000000 |
| 38.59312691 | −71.87406347 | 0.00000000 |
| 29.79066890 | −75.69797214 | 0.00000000 |
| 20.26826613 | −78.37210765 | −0.00000000 |
| 10.25746907 | −79.94987076 | 0.00000000 |

An overall reflectivity of the projection optical unit 26 is 8.83%.

The projection optical unit 26 has a reducing imaging scale of 8×(β=8).

The image field 8 has an x-extent of two times 6.5 mm and a y-extent of 1 mm. The projection optical unit 26 is optimized for an operating wavelength of the illumination light 3 of 13.5 nm.

The mirrors M1, M2, M4 and M8 have negative values for the radius, i.e. are, in principle, concave mirrors. The mirrors M3, M5, M6 and M7 have positive values for the radius, i.e. are, in principle, convex mirrors. The mirrors M2, M3, M5 and M6 have very large absolute radii, i.e. only constitute small deviations from plane reflection surfaces.

A pupil plane 18 of the projection optical unit 26 lies in the beam path between the mirrors M2 and M3. Unlike what is schematically indicated in FIG. 9, this stop plane is tilted in relation to a chief ray of the central field point. An intermediate image plane 19 of the projection optical unit 26 lies in the region of a reflection on the mirror M3.

It is also the case in the projection optical unit 26 that the mirror M8 is the only mirror including a passage opening 17 in the imaging beam path for the imaging light 3 between the mirrors M6 and M7.

In the projection optical unit 26, a z-distance between the object plane 5 and the image plane 9 is 1900 mm.

In the projection optical unit 26, a typical diameter of the largest mirror M8 is approximately 800 mm.

In the projection optical unit 26, an object/image offset $d_{OIS}$ is approximately 1350 mm. In the projection optical unit 26, the object field-side chief rays 16 also include an angle CRAO of 5.5° with a normal of the object plane 5.

The projection optical unit 26 has a scanned RMS value of the image field-side wavefront which is approximately 30 mλ. An image field-side distortion value is approximately 1.0 nm in the projection optical unit 26.

In the projection optical unit 26, a stop effective for the x-direction can be arranged in the beam path of the imaging light 3 between the mirrors M1 and M2 and a stop effective for the y-dimension can be arranged in the beam path between the mirrors M2 and M3.

In the projection optical unit 26, the chief rays 16 propagate divergently in the beam path of the imaging light 3 between the object field 4 and the mirror M1.

The mirror M8 defines an image-side obscuration which in the x-dimension is less than 20% of the image-side numerical aperture of the projection optical unit 26. In the y-direction, the obscuration is significantly smaller and moreover decentered.

A further embodiment of a projection optical unit 27, which can be used in the projection exposure apparatus 1 according to FIG. 1 instead of e.g. the projection optical unit 7, is explained in the following text on the basis of FIG. 10. Components and functions which were already explained above in the context of FIGS. 1 to 9 are appropriately denoted by the same reference signs and are not discussed again in detail.

The projection optical unit 27 has a total of nine mirrors M1 to M9. The mirrors M1, M3, M5, M6 and M7 are embodied as mirrors for grazing incidence. The mirrors M2, M4, M8 and M9 are embodied as mirrors for normal incidence. After the reflection on the mirror M1, the imaging beam path of the projection optical unit 27 corresponds qualitatively to that of the projection optical unit 26 before the reflection on the mirror M1 located there.

Unlike in the projection optical unit 26, the object plane 5 and the image plane 9 in the projection optical unit 27 do not extend parallel to one another, but rather have an angle with respect to one another. The angle between the object plane 5 and the image plane 9 is approximately 25°. A different angle between object plane 5 and the image plane 9 is also possible, for example an angle of 9°.

The mirrors M1 to M9 are embodied as free-form surfaces, for which the free-form surface equation (1), specified above, applies. The optical design data from the projection optical unit 27 can be gathered from the following tables, which, in terms of their design, correspond to the tables in relation to the projection optical unit 7 according to FIG. 2.

Figure 10:
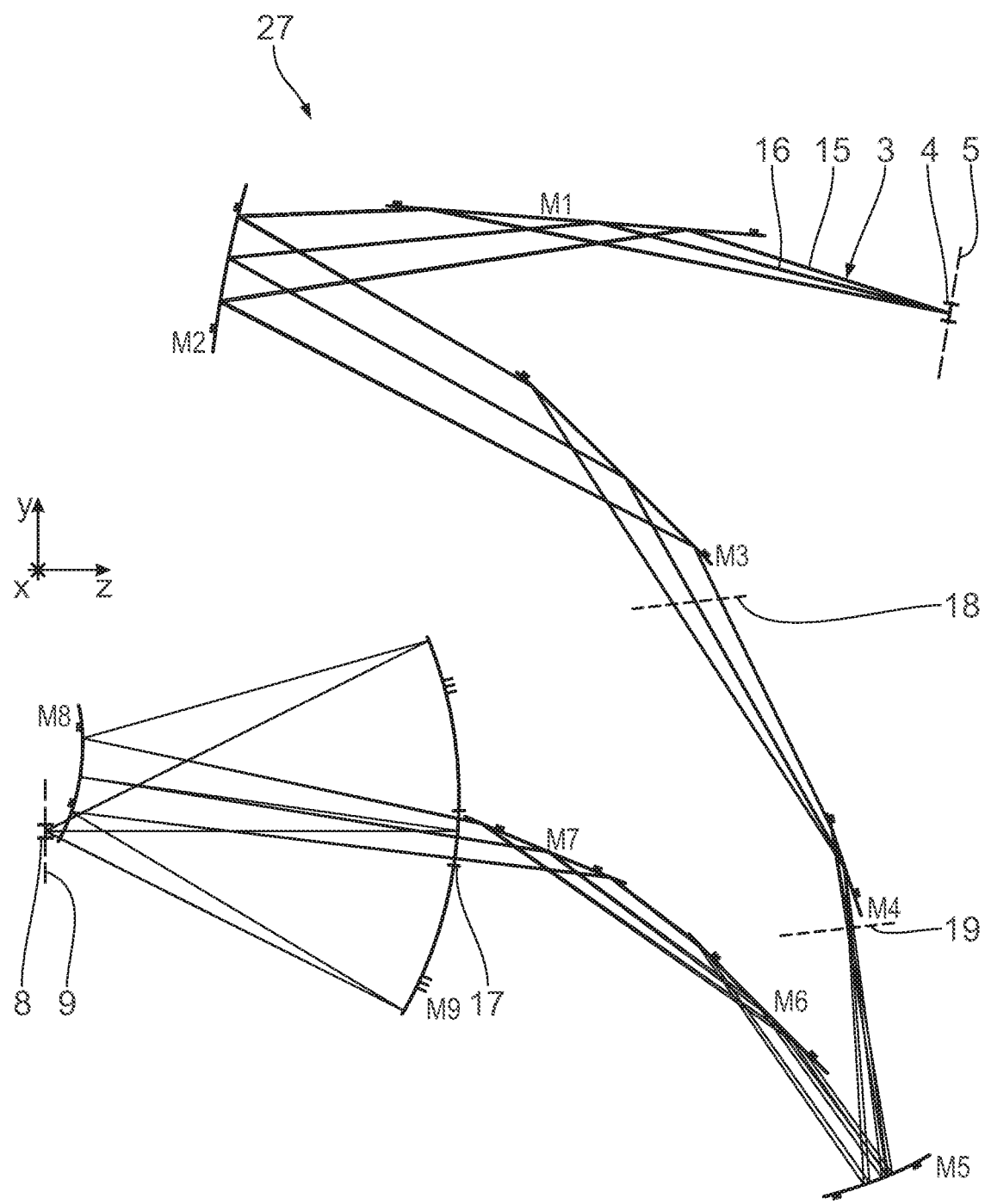

Table 1 for FIG. 10

| Exemplary embodiment | FIG. 10 |
|---|---|
| NA | 0.45 |
| Wavelength | 13.5 nm |
| Field dimension x | 13.0 mm |
| Field dimension y | 0.784 mm |
| Field curvature | 0.0 1/mm |
| Stop | S8 |

| Table 2 for FIG. 10 | | | | | |
|---|---|---|---|---|---|
| Surface | Radius x [mm] | Power x [1/mm] | Radius y [mm] | Power y [1/mm] | Operating |
| M9 | −927.06163241 | 0.00215195 | −844.37553102 | 0.00237456 | REFL |
| M8 | 1260.16184110 | −0.00158703 | 401.08562452 | −0.00498668 | REFL |
| M7 | −1168.04413588 | 0.00040107 | 11410.61912595 | −0.00074830 | REFL |
| M6 | 4599.68965912 | −0.00006782 | 8916.30231166 | −0.00143804 | REFL |
| M5 | −1096.76971549 | 0.00176717 | −863.86589235 | 0.00238902 | REFL |
| M4 | 4376.93959430 | −0.00008826 | 4854.36195700 | −0.00213313 | REFL |
| M3 | 694.47986096 | −0.00078202 | −11204.91072986 | 0.00065732 | REFL |
| M2 | −1794.72340819 | 0.00106428 | −2029.30630895 | 0.00103195 | REFL |
| M1 | 56094.16071744 | −0.00000619 | 2455768.87767400 | −0.00000469 | REFL |

| Table 3a for FIG. 10 | | | |
|---|---|---|---|
| Coefficient | M9 | M8 | M7 |
| KY | 0.00000000 | 0.00000000 | 0.00000000 |
| KX | 0.00000000 | 0.00000000 | 0.00000000 |
| RX | −927.06163240 | 1260.16184100 | −1168.04413600 |
| C7 | −2.23517614e−09 | −4.50960587e−07 | −6.09122113e−08 |
| C9 | 3.6145057e−09 | 2.20913057e−07 | −7.41514642e−09 |
| C10 | −1.30846827e−11 | 8.26856896e−10 | −4.23871389e−10 |
| C12 | −3.31679633e−11 | 3.96892634e−09 | −8.1925409e−11 |
| C14 | −1.11333628e−11 | 3.96037785e−09 | 5.90888948e−12 |
| C16 | −1.35234341e−15 | −7.57597915e−13 | 3.35805375e−12 |
| C18 | 2.4979396e−15 | 7.50962025e−13 | 5.21136649e−13 |
| C20 | 2.05872696e−15 | 1.71669679e−12 | 1.05276252e−13 |
| C21 | −1.94087173e−17 | 1.87848046e−15 | 8.25497656e−14 |
| C23 | −7.12735855e−17 | 2.02345088e−14 | 1.69291777e−14 |
| C25 | −6.73063611e−17 | 5.75563235e−14 | 1.53606778e−15 |
| C27 | −1.82798337e−17 | 5.09562952e−14 | 3.54149717e−17 |
| C29 | −3.20697386e−24 | −7.22215501e−19 | −3.97944158e−16 |
| C31 | 3.5532586e−21 | 2.1496672e−17 | −2.2247379e−17 |
| C33 | 5.38887498e−21 | 6.98750447e−17 | 1.44225902e−18 |
| C35 | 2.90441791e−21 | 1.60217048e−16 | 2.10047652e−19 |
| C36 | −2.16831662e−23 | 1.02346305e−20 | 7.76582807e−18 |
| C38 | −1.024839e−22 | 1.50853153e−19 | 2.1988537e−18 |
| C40 | −1.5739648e−22 | 7.95625269e−19 | 8.70609334e−20 |
| C42 | −9.99598149e−23 | 1.67352786e−18 | 3.47122436e−22 |
| C44 | −2.1418847e−23 | 1.35065244e−18 | −3.9650949e−23 |
| C46 | 1.75635066e−27 | 0 | 0 |
| C48 | 3.95925628e−27 | 0 | 0 |
| C50 | 9.08959768e−27 | 0 | 0 |
| C52 | 7.51947576e−27 | 0 | 0 |
| C54 | 2.95311155e−27 | 0 | 0 |
| C55 | −4.9313257e−29 | 0 | 0 |
| C57 | −2.91657271e−28 | 0 | 0 |
| C59 | −6.40825581e−28 | 0 | 0 |
| C61 | −6.7271506e−28 | 0 | 0 |
| C63 | −3.36939719e−28 | 0 | 0 |
| C65 | −6.32994338e−29 | 0 | 0 |

| Table 3b for FIG. 10 | | | |
|---|---|---|---|
| Coefficient | M6 | M5 | M4 |
| KY | 0.00000000 | 0.00000000 | 0.00000000 |
| KX | 0.00000000 | 0.00000000 | 0.00000000 |
| RX | 4599.68965900 | −1096.76971500 | 4376.93959400 |
| C7 | 1.03365575e−07 | 1.77442565e−08 | 2.85338602e−07 |
| C9 | −1.54020378e−08 | −6.87485517e−07 | −1.50086102e−08 |
| C10 | 6.24726933e−10 | −6.07852311e−11 | −2.45993749e−10 |
| C12 | 2.40839743e−10 | 5.8774529e−11 | 7.01376961e−10 |
| C14 | 5.40400123e−11 | −4.141262e−09 | 2.22502751e−10 |
| C16 | 8.59548973e−13 | 6.15732667e−14 | 3.90716877e−12 |
| C18 | 3.88970513e−13 | −1.96817792e−12 | −8.40526435e−13 |

Table 3b for FIG. 10

| Coefficient | M6 | M5 | M4 |
| --- | --- | --- | --- |
| C20 | −4.05623477e−14 | −2.89315132e−11 | 4.02410751e−13 |
| C21 | −1.20558697e−14 | 2.96793339e−17 | −3.71431043e−14 |
| C23 | 3.60545789e−15 | −1.07466885e−15 | 2.86503345e−14 |
| C25 | 4.90623123e−16 | −7.66590675e−15 | −1.34184278e−14 |
| C27 | 1.09460213e−16 | −2.25511385e−13 | −1.60120001e−14 |
| C29 | −4.29010487e−19 | 2.6566245e−18 | −1.11931312e−16 |
| C31 | 2.82057928e−17 | −4.89526911e−18 | 1.96219169e−16 |
| C33 | 3.64606722e−18 | 1.17410302e−16 | 1.62404628e−16 |
| C35 | −1.9616745e−19 | −1.76366177e−15 | 2.00776571e−16 |
| C36 | 4.55297641e−19 | −1.10261165e−21 | 2.17082945e−21 |
| C38 | 1.72685649e−19 | 4.71570588e−21 | −1.71177213e−19 |
| C40 | 1.19053297e−19 | 1.68707682e−19 | −5.48323926e−19 |
| C42 | 2.84505286e−21 | 1.74228055e−18 | −7.77652616e−19 |
| C44 | 3.95736521e−22 | −8.4090687e−18 | −8.35475752e−19 |

Table 3c for FIG. 10

| Coefficient | M3 | M2 | M1 |
| --- | --- | --- | --- |
| KY | 0.00000000 | 0.00000000 | 0.00000000 |
| KX | 0.00000000 | 0.00000000 | 0.00000000 |
| RX | 694.47986100 | −1794.72340800 | 56094.16072000 |
| C7 | −9.05001362e−07 | 2.43898758e−08 | −4.50372077e−08 |
| C9 | 3.15550349e−09 | −3.56700561e−08 | −1.70664296e−09 |
| C10 | 6.34026502e−10 | 9.89791173e−13 | −4.70024759e−11 |
| C12 | 1.18596959e−09 | −6.80752791e−11 | −1.3238749e−11 |
| C14 | 1.06817193e−12 | 2.4496293e−10 | 5.60439886e−14 |
| C16 | −3.63455516e−12 | −5.25512666e−15 | 1.47433739e−13 |
| C18 | −1.41249895e−12 | 4.60707008e−13 | 2.95667054e−14 |
| C20 | −1.74617944e−14 | −1.2047971e−12 | 4.8002619e−15 |
| C21 | −1.91218475e−15 | −2.29258544e−18 | 1.9028315e−16 |
| C23 | 7.60619654e−15 | 1.4721488e−16 | 3.97100834e−16 |
| C25 | 1.76329071e−15 | −2.52607323e−15 | 5.02793845e−17 |
| C27 | 1.20304383e−17 | 2.91792964e−15 | 1.19507083e−17 |
| C29 | 6.27376885e−18 | 6.5563985e−20 | 7.22310933e−20 |
| C31 | −9.91733853e−18 | −8.95631485e−19 | 3.50704599e−19 |
| C33 | −2.07433776e−18 | 8.24988356e−18 | 6.30478322e−20 |
| C35 | 8.04274126e−21 | −6.16363923e−18 | 1.42780131e−20 |
| C36 | 1.68635395e−20 | −3.79475169e−23 | 1.84200486e−21 |
| C38 | −2.47873133e−21 | −5.38421564e−22 | −8.43097684e−22 |
| C40 | 7.02632851e−21 | 1.78624244e−21 | 1.73741471e−22 |
| C42 | 1.58722416e−21 | −1.78993463e−20 | 3.02938088e−23 |
| C44 | −3.21703854e−23 | 5.70718198e−21 | 7.7900247e−24 |

Table 4a for FIG. 10

| Surface | DCX | DCY | DCZ |
| --- | --- | --- | --- |
| Image plane | 0.00000000 | 0.00000000 | 0.00000000 |
| M9 | 0.00000000 | 0.00000000 | 786.63111111 |
| M8 | 0.00000000 | 102.63834162 | 66.28304947 |
| M7 | 0.00000000 | −42.20392704 | 963.45589840 |
| M6 | 0.00000000 | −330.28870287 | 1356.10968115 |
| M5 | 0.00000000 | −662.92650671 | 1595.87409890 |
| M4 | 0.00000000 | −55.87386363 | 1518.97310352 |
| Stop | 0.00000000 | 312.02692681 | 1302.34585970 |
| M3 | 0.00000000 | 677.24956983 | 1104.30311012 |
| M2 | 0.00000000 | 1096.20099718 | 348.22303178 |
| M1 | 0.00000000 | 1163.41792826 | 1046.10952756 |
| Object plane | −0.00000000 | 990.09733323 | 1716.14318698 |

Table 4b for FIG. 10

| Surface | TLA [deg] | TLB [deg] | TLC [deg] |
| --- | --- | --- | --- |
| Image plane | −0.00000000 | 0.00000000 | −0.00000000 |
| M9 | 4.05665761 | 0.00000000 | −0.00000000 |
| M8 | 188.65127645 | 0.00000000 | −0.00000000 |
| M7 | −67.27942550 | 0.00000000 | −0.00000000 |
| M6 | −44.75934404 | 0.00000000 | −0.00000000 |
| M5 | 68.49763755 | 0.00000000 | −0.00000000 |
| M4 | −18.35688966 | 0.00000000 | −0.00000000 |
| Stop | −59.23477257 | 0.00000000 | −0.00000000 |
| M3 | −45.24965445 | 0.00000000 | −0.00000000 |
| M2 | 191.74671318 | 0.00000000 | −0.00000000 |
| M1 | −85.49756738 | −0.00000000 | 180.00000000 |
| Object plane | 9.00279525 | −0.00000000 | 180.00000000 |

Table 5 for FIG. 10

| Surface | Angle of incidence [deg] | Reflectivity |
|---|---|---|
| M9 | 4.05665761 | 0.66403357 |
| M8 | 0.53044148 | 0.66565924 |
| M7 | 76.45362613 | 0.82762443 |
| M6 | 81.02626853 | 0.89153746 |
| M5 | 14.28246533 | 0.64182800 |
| M4 | 78.86369490 | 0.86299856 |
| M3 | 74.24363169 | 0.79067680 |
| M2 | 17.24608899 | 0.62906014 |
| M1 | 79.99938209 | 0.87829176 |
| Overall transmission | | 0.0789 |

Table 6 for FIG. 10

| X [mm] | Y [mm] | Z [mm] |
|---|---|---|
| 0.00000000 | −77.36899626 | 0.00000000 |
| −9.63805104 | −76.89174932 | 0.00000000 |
| −19.04585126 | −75.44603498 | 0.00000000 |
| −27.99720457 | −72.99379120 | 0.00000000 |
| −36.27449492 | −69.48369854 | 0.00000000 |
| −43.67382900 | −64.86713406 | 0.00000000 |
| −50.01062298 | −59.11655450 | 0.00000000 |
| −55.12523420 | −52.24278088 | 0.00000000 |
| −58.88805408 | −44.30771100 | 0.00000000 |
| −61.20346679 | −35.43047265 | 0.00000000 |
| −62.01235694 | −25.78715767 | 0.00000000 |
| −61.29323966 | −15.60585844 | 0.00000000 |
| −59.06229034 | −5.15917759 | 0.00000000 |
| −55.37254326 | 5.24425982 | 0.00000000 |
| −50.31248449 | 15.26910313 | 0.00000000 |
| −44.00419258 | 24.56450552 | 0.00000000 |
| −36.60098665 | 32.77884030 | 0.00000000 |
| −28.28434784 | 39.57860245 | 0.00000000 |
| −19.25989969 | 44.67051183 | 0.00000000 |
| −9.75241853 | 47.82425257 | 0.00000000 |
| −0.00000000 | 48.89242200 | 0.00000000 |
| 9.75241853 | 47.82425257 | 0.00000000 |
| 19.25989969 | 44.67051183 | 0.00000000 |
| 28.28434784 | 39.57860245 | 0.00000000 |
| 36.60098665 | 32.77884030 | 0.00000000 |
| 44.00419258 | 24.56450552 | 0.00000000 |
| 50.31248449 | 15.26910313 | 0.00000000 |
| 55.37254326 | 5.24425982 | 0.00000000 |
| 59.06229034 | −5.15917759 | 0.00000000 |
| 61.29323966 | −15.60585844 | 0.00000000 |
| 62.01235694 | −25.78715767 | 0.00000000 |
| 61.20346679 | −35.43047265 | 0.00000000 |
| 58.88805408 | −44.30771100 | 0.00000000 |
| 55.12523420 | −52.24278088 | 0.00000000 |
| 50.01062298 | −59.11655450 | 0.00000000 |
| 43.67382900 | −64.86713406 | 0.00000000 |
| 36.27449492 | −69.48369854 | 0.00000000 |
| 27.99720457 | −72.99379120 | 0.00000000 |
| 19.04585126 | −75.44603498 | 0.00000000 |
| 9.63805104 | −76.89174932 | 0.00000000 |

An overall reflectivity of the projection optical unit 27 is 7.89%.

The projection optical unit 27 has a reducing imaging scale of 8×($\beta$=8).

The image field 8 has an x-extent of two times 6.5 mm and a y-extent of 1 mm. The projection optical unit 27 is optimized for an operating wavelength of the illumination light 3 of 13.5 nm.

In the projection optical unit 27, a pupil plane 18 is arranged in the imaging beam path between the mirrors M3 and M4. Unlike what is depicted schematically, the pupil plane 18 is tilted in relation to a chief ray of the central field point. An intermediate image plane 19 is arranged in the imaging beam path between the mirrors M4 and M5, near the mirror M4.

In the projection optical unit 27, the mirrors M3 and M4 on the one hand and M6 and M7 on the other hand form pairs of mirrors for grazing incidence, the deflecting effect of which on the imaging light 3 adds up.

The mirrors M1, M4, M6, M7 and M8 have positive values for the radius, i.e. are, in principle, convex mirrors. The mirrors M2, M3, M5 and M9 have negative values for the radius, i.e. are, in principle, concave mirrors. The mirrors M1, M3, M4, M6 and M7 have very large absolute radii, i.e. only constitute small deviations from plane reflection surfaces.

It is in turn the case in the projection optical unit 27 that the mirror M9 is the only mirror including a passage opening 17 for the passage of the imaging light 3 guided between the mirrors M7 and M8.

In the projection optical unit 27, a z-distance between the object plane 5 and the image plane 9 is approximately 1700 mm.

In the projection optical unit 27, a typical diameter of the largest mirror M9 is approximately 730 mm.

In the projection optical unit 27, an object/image offset $d_{OIS}$ is approximately 1000 mm. In the projection optical unit 27, the object field-side chief rays 16 also include an angle CRAO of 5.5° with a normal of the object plane 5.

The projection optical unit 27 has a scanned RMS value of the image field-side wavefront which is approximately 30 m$\lambda$. An image field-side distortion value is approximately 0.6 nm in the projection optical unit 27.

A stop effective for the x-dimension can be arranged in the beam path of the imaging light 3 between the mirrors M2 and M3. In the projection optical unit 27, a stop effective for the y-dimension can be arranged in the beam path between the mirrors M3 and M4.

Chief rays 16 in the projection optical unit 27 have a divergent propagation in the beam path of the imaging light 3 between the object field 4 and the mirror M1.

The mirror M9 defines an image-side obscuration which, over the x-dimension, is less than 20% of the image-side numerical aperture of the projection optical unit 27. In the y-direction, the obscuration is significantly smaller and moreover decentered.

A further embodiment of a projection optical unit 28, which can be used in the projection exposure apparatus 1 according to FIG. 1 instead of e.g. the projection optical unit 7, is explained in the following text on the basis of FIG. 11. Components and functions which were already explained above in the context of FIGS. 1 to 10 are appropriately denoted by the same reference signs and are not discussed again in detail.

The projection optical unit 28 has a total of eight mirrors M1 to M8. The mirrors M1, M4, M7 and M8 are embodied as mirrors for normal incidence. The mirrors M2, M3, M5 and M6 are embodied as mirrors for grazing incidence. After the mirror M4, the beam path in the projection optical unit 28 corresponds qualitatively to the beam path after the mirror M5 in the projection optical unit 27 according to FIG. 10, wherein the penultimate mirror M7 in the projection optical unit 28 is arranged mirrored about a plane parallel to the xz-plane in comparison with the arrangement of the penultimate mirror M8 of the projection optical unit 27.

In the beam guidance of the projection optical unit 28, the chief rays 16 of the beam path cross between the mirrors M1 and M2 on the one hand and the beam path between the mirrors M5 and M6 on the other hand.

The two mirrors M2 and M3 on the one hand and the two mirrors M5 and M6 on the other hand, for grazing incidence, are in each case embodied as a pair of mirrors, the deflecting effects of which add up.

In the projection optical unit 28, only the last mirror M8 is embodied with a passage opening 17 for the passage of the imaging light 3 guided between the mirrors M6 and M7.

In the projection optical unit 28, a z-distance of the object plane 5 from the image plane 9 is approximately 2000 mm. In the projection optical unit 28, an object/image offset is approximately 1000 mm.

A further embodiment of a projection optical unit 29, which can be used in the projection exposure apparatus 1 according to FIG. 1 instead of e.g. the projection optical unit 7, is explained in the following text on the basis of FIG. 12. Components and functions which were already explained above in the context of FIGS. 1 to 11 are appropriately denoted by the same reference signs and are not discussed again in detail.

The projection optical unit 29 has a total of eight mirrors M1 to M8. The mirrors M1, M7 and M8 are embodied as mirrors for normal incidence. The mirrors M2, M3, M4, M5 and M6 are embodied as mirrors for grazing incidence. Thus, the projection optical unit 29 has five mirrors for grazing incidence arranged in succession. All mirrors for grazing incidence M2 to M6 have an adding deflecting effect on the imaging light 3 in the projection optical unit 29.

After the mirror M5, the beam path in the projection optical unit 29 corresponds qualitatively to that in the projection optical unit 7 according to FIG. 2.

In the projection optical unit 29, only the last mirror M8, once again, includes a passage opening 17 for the passage of the imaging light 3 guided between the mirrors M6 and M7.

In the projection optical unit 29, a z-distance between the object and image planes 5, 9, parallel to one another, is approximately 2500 mm. In the projection optical unit 29, an object/image offset is approximately 3000 mm.

Figure 12:
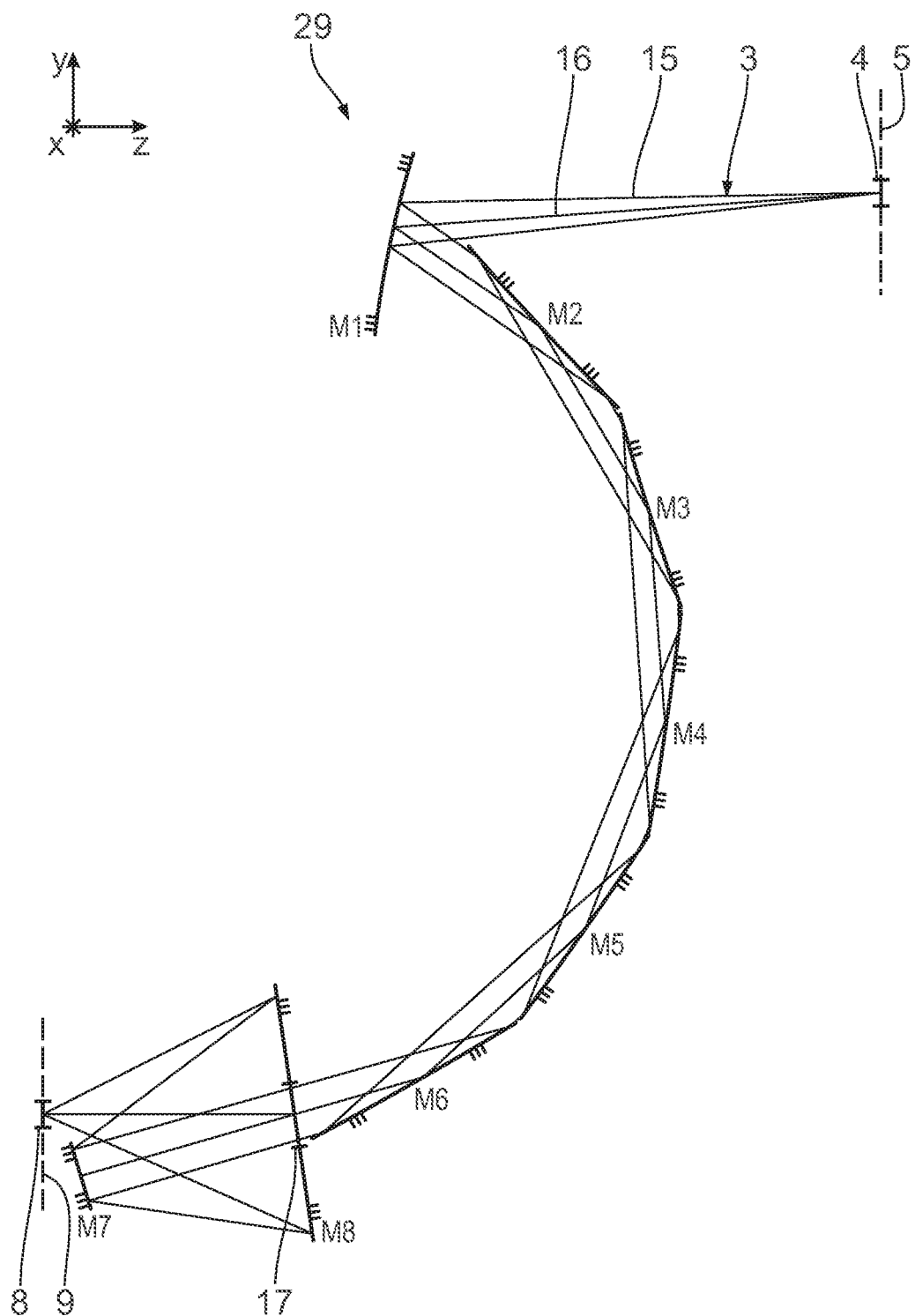
Figure 13:
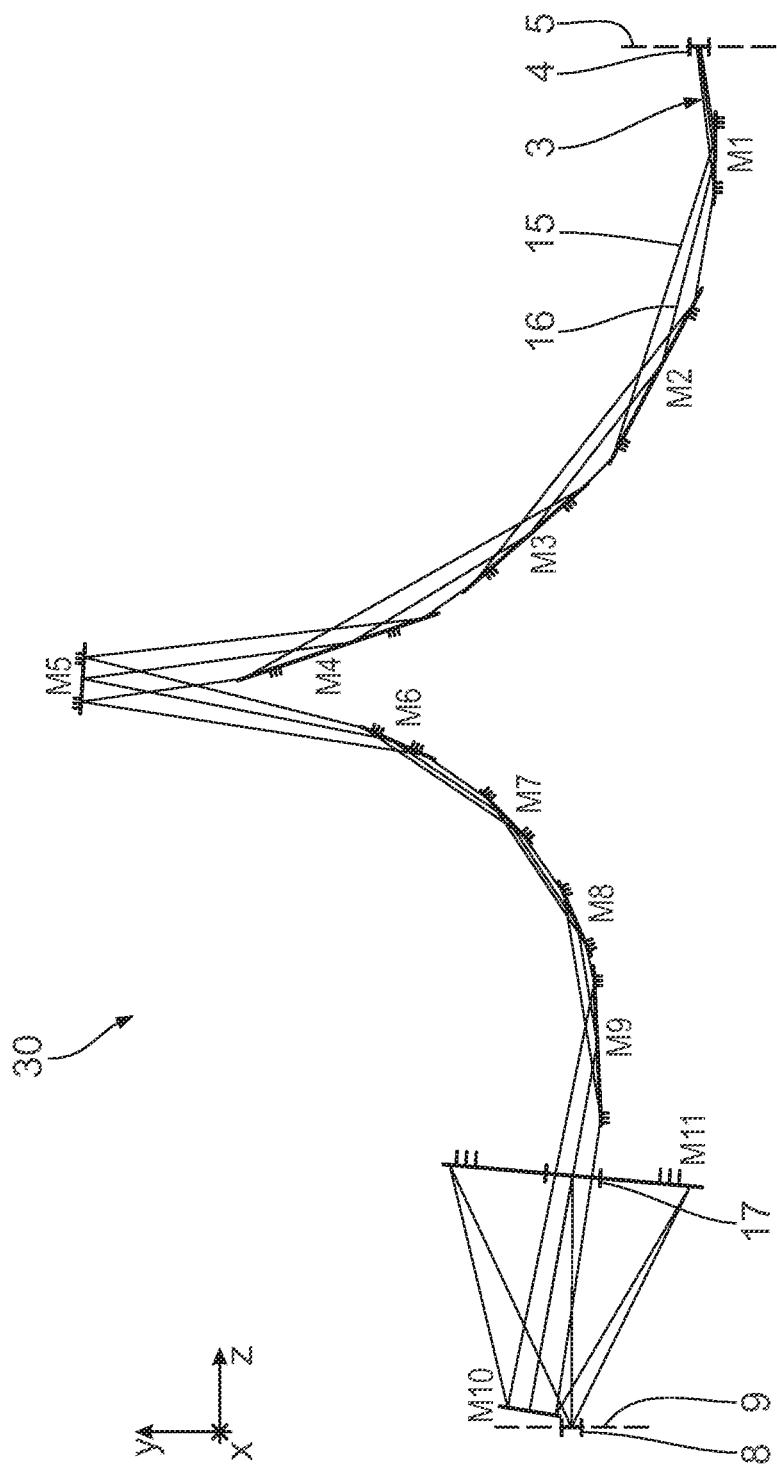

A further embodiment of a projection optical unit 30, which can be used in the projection exposure apparatus 1 according to FIG. 1 instead of e.g. the projection optical unit 7, is explained in the following text on the basis of FIG. 13. Components and functions which were already explained above in the context of FIGS. 1 to 12 are appropriately denoted by the same reference signs and are not discussed again in detail.

The projection optical unit 30 has a total of eleven mirrors M1 to M11. The mirrors M5, M10 and M11 are embodied as mirrors for normal incidence. The mirrors M1, M2, M3, M4, M6, M7, M8 and M9 are embodied as mirrors for grazing incidence. Thus, the projection optical unit 30 has two groups with in each case four mirrors for grazing incidence arranged in succession. The deflecting effects of the mirrors M1 to M4 for grazing incidence add up. The deflecting effects of the mirrors M6 to M9 for grazing incidence add up.

Figure 11:
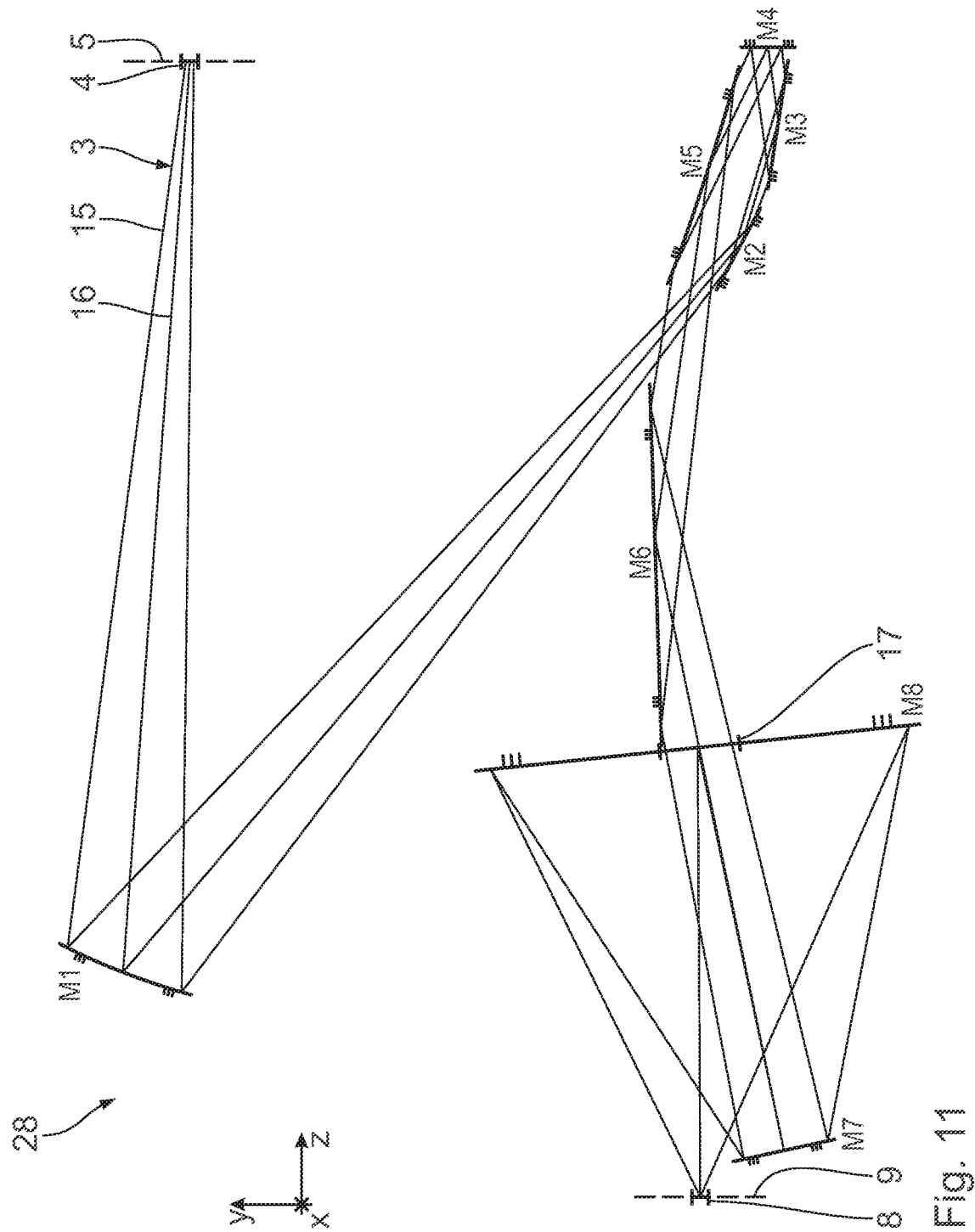

After the mirror M8, the imaging beam path in the projection optical unit 30 corresponds qualitatively to that in the projection optical unit 28 according to FIG. 11, after the mirror M4 therein, mirrored about a plane parallel to the xz-plane.

Figure 14:
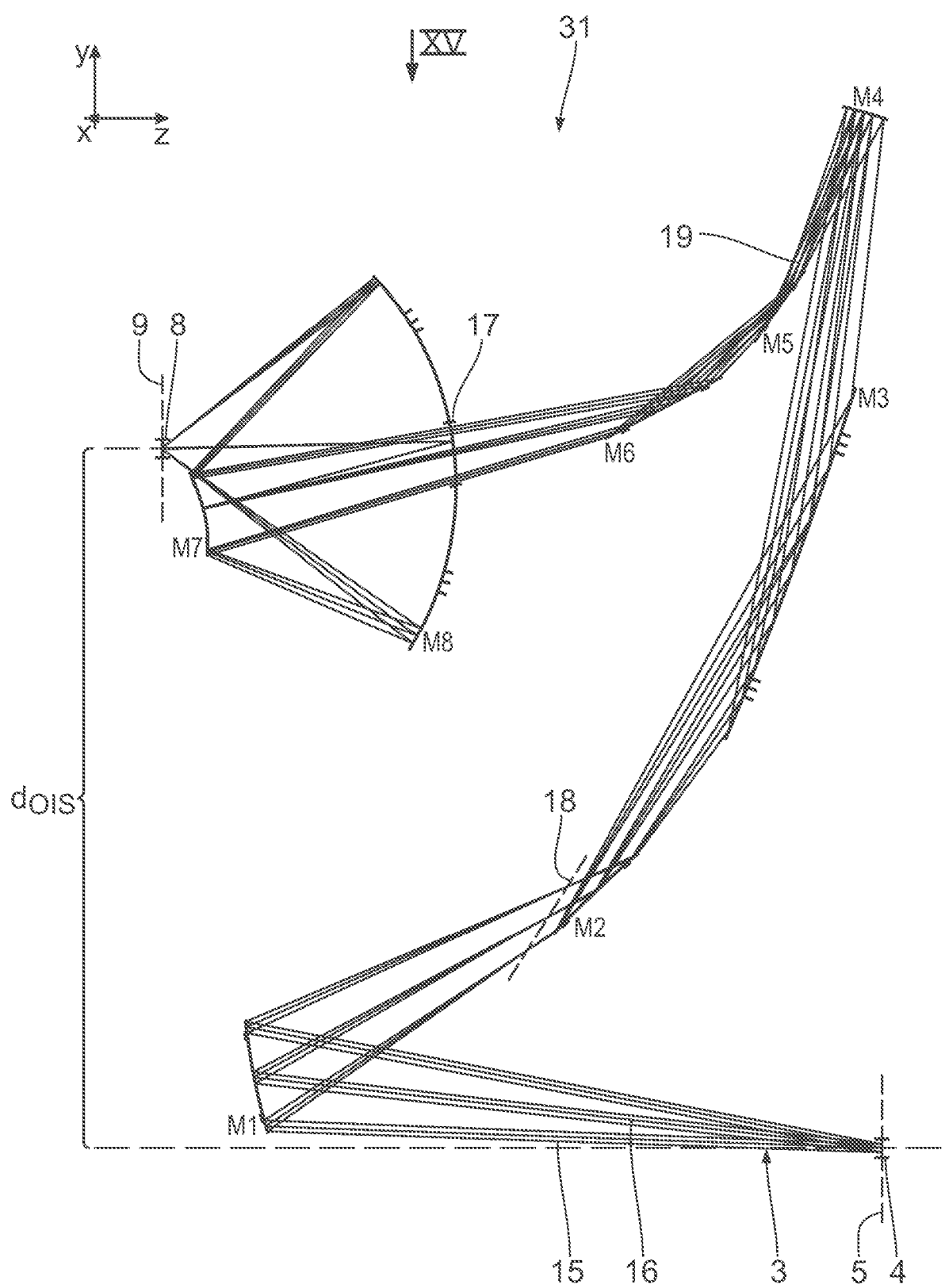
FIG. 14 shows, in an illustration similar to FIG. 2, a further embodiment of an imaging optical unit which can be used as a projection lens in the projection exposure apparatus according to FIG. 1, with a curved field and divergent chief rays emanating from the object field.
Figure 15:
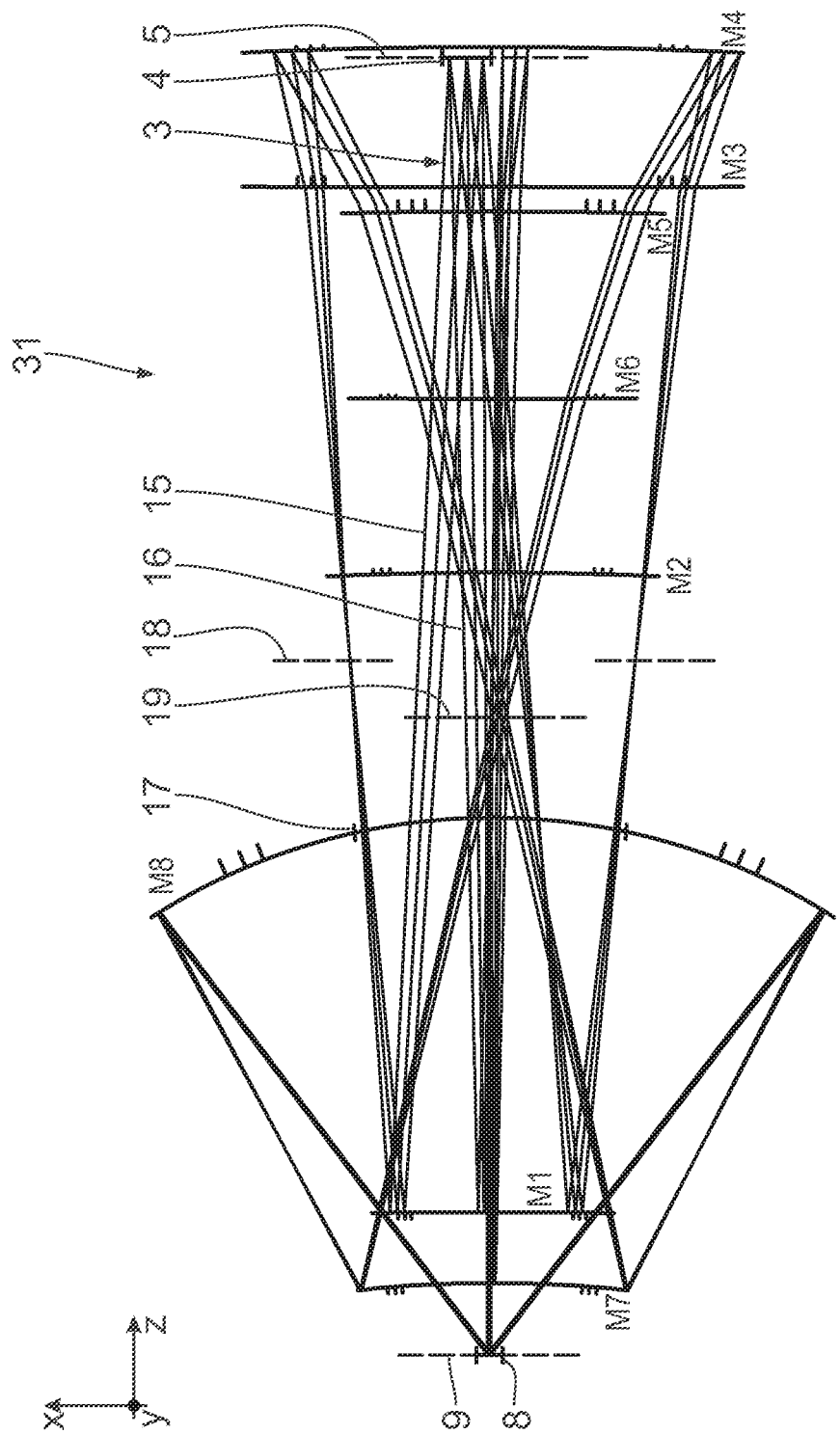
FIG. 15 shows a view of the imaging optical unit according to FIG. 14, seen from the viewing direction XV in FIG. 14.

A further embodiment of a projection optical unit 31, which can be used in the projection exposure apparatus 1 according to FIG. 1 instead of e.g. the projection optical unit 7, is explained in the following text on the basis of FIGS. 14 and 15. Components and functions which were already explained above in the context of FIGS. 1 to 13 are appropriately denoted by the same reference signs and are not discussed again in detail. FIG. 14 shows a meridional section of the projection optical unit 31. FIG. 15 shows a sagittal view of the projection optical unit 31.

The projection optical unit 31 has a total of 8 mirrors M1 to M8 and, in terms of the basic design thereof, it is similar to e.g. the projection optical unit 7 according to FIG. 2.

The mirrors M1 to M8 are once again embodied as free-form surface mirrors, for which the free-form surface equation (1), specified above, applies. The optical design data from the projection optical unit 31 can be gathered from the following tables, which, in terms of their design, correspond to the tables for the projection optical unit 7 according to FIG. 2.

Table 1 for FIG. 14/15

| Exemplary embodiment | FIG. 14/15 |
|---|---|
| NA | 0.6 |
| Wavelength | 13.5 nm |
| Field dimension x | 13.0 mm |
| Field dimension y | 1.2 mm |
| Field curvature | 0.049315 1/mm |
| Stop | S9 |

Table 2 for FIG. 14/15

| Surface | Radius x [mm] | Power x [1/mm] | Radius y [mm] | Power y [1/mm] | Operating |
|---|---|---|---|---|---|
| M8 | −760.70350941 | 0.00261095 | −690.41137663 | 0.00291701 | REFL |
| M7 | 1660.51779822 | −0.00120425 | 351.41973469 | −0.00569210 | REFL |
| M6 | 22413.77181938 | −0.00002294 | — | 0.00038276 | REFL |
| M5 | — | 0.00000694 | 6970.73341488 | −0.00134567 | REFL |
| M4 | −1968.89132935 | 0.00100852 | −1867.99412600 | 0.00107840 | REFL |
| M3 | −8443.92486351 | 0.00004792 | −8485.60225377 | 0.00116489 | REFL |
| M2 | −2785.90885659 | 0.00017702 | 2068.91589871 | −0.00392049 | REFL |
| M1 | 19049.58074618 | −0.00009999 | −1346.04479234 | 0.00156005 | REFL |

| Table 3a for FIG. 14/15 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −760.70350940 | 1660.51779800 | 22413.77182000 |
| C7 | −2.33007014e−08 | 2.88578547e−07 | 2.2753674e−07 |
| C9 | −1.18967539e−08 | −3.88069638e−07 | −1.7457017e−07 |
| C10 | −2.72776659e−11 | 1.49271555e−09 | 6.68609309e−10 |
| C12 | −7.0442837e−11 | 5.59222539e−09 | −3.8203442e−10 |
| C14 | −2.75271127e−11 | 6.67807776e−09 | −5.77862714e−10 |
| C16 | −2.23080012e−14 | 1.04050752e−12 | −3.23543892e−12 |
| C18 | −4.50583763e−14 | −4.27223388e−12 | 8.34265088e−13 |
| C20 | −1.4274792e−14 | −1.06939915e−11 | −2.23351616e−12 |
| C21 | −7.56087206e−17 | 4.59226247e−15 | −3.59682046e−15 |
| C23 | −2.39764985e−16 | 3.8987218e−14 | 1.13689144e−14 |
| C25 | −2.30791712e−16 | 1.29791609e−13 | −6.73241398e−16 |
| C27 | −6.65038444e−17 | 1.43884373e−13 | −9.82855694e−15 |
| C29 | −2.53005387e−20 | 1.04942825e−17 | 2.27512685e−17 |
| C31 | −1.01909319e−19 | 1.61698231e−17 | −3.69216905e−17 |
| C33 | −9.10891737e−20 | −1.87239071e−16 | −9.10355957e−20 |
| C35 | −2.22321038e−20 | −3.6078348e−16 | −4.66136303e−17 |
| C36 | −1.15852474e−22 | 2.8817043e−20 | 1.65439247e−19 |
| C38 | −6.28157898e−22 | 3.07592107e−19 | −6.87738716e−20 |
| C40 | −9.6788962e−22 | 1.31683563e−18 | 1.27689461e−19 |
| C42 | −6.41461387e−22 | 3.2410417e−18 | −8.59875947e−22 |
| C44 | −1.5313164e−22 | 3.93814067e−18 | −2.18742961e−19 |
| C46 | −1.13873934e−25 | 1.33094976e−22 | −8.48120432e−22 |
| C48 | −2.12040282e−25 | −1.87148715e−22 | 8.70636092e−22 |
| C50 | −3.26381834e−25 | −2.12882905e−21 | 5.2058061e−22 |
| C52 | −1.88634319e−25 | −8.06669662e−21 | 1.43430743e−22 |
| C54 | −3.77802198e−26 | −1.65415378e−20 | −8.35116913e−22 |
| C55 | −2.78299672e−28 | 1.62987882e−25 | −1.26276164e−23 |
| C57 | −1.13733455e−27 | 3.09234722e−24 | −1.06004981e−23 |
| C59 | −2.50973358e−27 | 2.05233308e−23 | −1.18561349e−23 |
| C61 | −2.36012273e−27 | 6.71690321e−23 | −4.77169105e−25 |
| C63 | −1.07735394e−27 | 1.14300682e−22 | 2.74390777e−25 |
| C65 | −1.68978578e−28 | 8.85821016e−23 | −3.96110871e−24 |
| C67 | 1.51915362e−32 | −2.32859315e−27 | 8.22294799e−26 |
| C69 | −5.49655364e−31 | 1.39198769e−26 | −4.76626411e−26 |
| C71 | −1.02066385e−30 | 6.61474215e−26 | −9.93012444e−26 |
| C73 | −1.18308652e−30 | 4.75522732e−26 | −6.29472298e−26 |
| C75 | −5.84567673e−31 | −7.56976341e−26 | −5.49230676e−27 |
| C77 | −1.06877542e−31 | 6.97381799e−26 | −4.17957059e−26 |
| C78 | −6.57287449e−34 | −1.11031193e−30 | 5.04699814e−28 |
| C80 | −4.98973258e−33 | −3.42075816e−29 | 3.32058589e−28 |
| C82 | −1.47067638e−32 | −1.97911989e−28 | 1.10888783e−27 |
| C84 | −2.39766693e−32 | −8.4948077e−28 | 9.24713394e−29 |
| C86 | −2.10528972e−32 | −4.47266704e−28 | −1.36080649e−28 |
| C88 | −9.49212101e−33 | 3.40835449e−27 | −3.22056057e−29 |
| C90 | −1.85536567e−33 | 6.09359424e−27 | −3.22300574e−28 |
| C92 | 1.14904466e−37 | 4.55084533e−32 | −2.32548127e−30 |
| C94 | −3.94852331e−37 | −6.02019105e−32 | 2.65660093e−30 |
| C96 | −6.82573646e−37 | −1.80150194e−30 | 4.77721528e−30 |
| C98 | 3.49439171e−37 | −6.96859581e−30 | 4.3682388e−30 |
| C100 | 8.37743218e−37 | −2.35053497e−29 | 1.52429646e−30 |
| C102 | 4.22187524e−37 | −7.01661753e−29 | −1.0247849e−31 |
| C104 | 1.07716944e−37 | −9.6147079e−29 | −1.20989386e−30 |
| C105 | 7.66857985e−40 | 4.18651817e−35 | −8.36182433e−33 |
| C107 | 5.95979105e−39 | 1.31671069e−33 | −3.54017002e−33 |
| C109 | 2.67422787e−38 | 9.8779453e−33 | −4.83481101e−32 |
| C111 | 6.45464453e−38 | 5.60289315e−32 | −8.16147728e−33 |
| C113 | 8.78194876e−38 | 1.58284154e−31 | 1.4522278e−32 |
| C115 | 6.57244583e−38 | 2.85637687e−31 | 5.61495185e−33 |
| C117 | 2.60731766e−38 | 4.34645199e−31 | −2.42083693e−34 |
| C119 | 4.80920542e−39 | 4.05075079e−31 | −1.74525827e−33 |
| C121 | −7.24465698e−43 | 0 | 0 |
| C123 | −5.06090521e−42 | 0 | 0 |
| C125 | −2.11201601e−41 | 0 | 0 |
| C127 | −3.93520662e−41 | 0 | 0 |
| C129 | −4.26707116e−41 | 0 | 0 |
| C131 | −2.6866198e−41 | 0 | 0 |
| C133 | −9.02589569e−42 | 0 | 0 |
| C135 | −1.35713124e−42 | 0 | 0 |
| C136 | −6.18315205e−45 | 0 | 0 |
| C138 | −5.64222317e−44 | 0 | 0 |
| C140 | −2.25923694e−43 | 0 | 0 |
| C142 | −5.2742383e−43 | 0 | 0 |
| C144 | −7.72344846e−43 | 0 | 0 |

-continued

Table 3a for FIG. 14/15

| Coefficient | M8 | M7 | M6 |
|---|---|---|---|
| C146 | −7.07223784e−43 | 0 | 0 |
| C148 | −3.9358099e−43 | 0 | 0 |
| C150 | −1.23782731e−43 | 0 | 0 |
| C152 | −1.76195917e−44 | 0 | 0 |

Table 3b for FIG. 14/15

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | −61404.35326000 | −1968.89132900 | −8443.92486400 |
| C7 | −1.68207907e−07 | −9.69253223e−08 | −1.61488272e−08 |
| C9 | −1.68739886e−07 | −4.92868764e−07 | 2.12423419e−08 |
| C10 | 1.37381131e−10 | −4.29245796e−12 | −3.01016486e−11 |
| C12 | 1.73273328e−10 | 2.8015583e−10 | −3.01270218e−11 |
| C14 | 3.39901777e−10 | 2.62958278e−09 | −3.12591627e−11 |
| C16 | −2.02771855e−13 | −6.55098858e−14 | 5.94264568e−14 |
| C18 | −2.74086745e−13 | −2.19243624e−12 | 1.84091903e−14 |
| C20 | −1.11184944e−12 | −1.64987945e−11 | 2.75233054e−14 |
| C21 | −1.66473292e−16 | 5.11085588e−18 | 5.26119437e−17 |
| C23 | −1.53971529e−16 | 5.55797544e−16 | −6.75020173e−17 |
| C25 | −1.4400902e−16 | 1.63350353e−14 | −5.16160437e−17 |
| C27 | 2.78000528e−15 | 1.23712765e−13 | −3.82616113e−17 |
| C29 | −4.21493833e−19 | −8.59118066e−20 | −6.89623715e−20 |
| C31 | 1.37929257e−18 | −5.35246837e−18 | 6.50922922e−20 |
| C33 | 7.35166575e−18 | −1.3798481e−16 | 5.66413099e−20 |
| C35 | −2.94790982e−17 | −8.56072868e−16 | 4.52051441e−20 |
| C36 | −3.95620249e−21 | 3.9780575e−23 | −1.10791979e−21 |
| C38 | 7.20372936e−21 | 1.07488208e−21 | −3.83039519e−22 |
| C40 | −3.66632457e−20 | 7.37896563e−20 | −8.63659651e−23 |
| C42 | 1.11889421e−19 | 1.33985205e−18 | −9.65351264e−23 |
| C44 | −2.23316105e−19 | 5.21035424e−18 | −6.41320506e−23 |
| C46 | 6.98222374e−23 | 4.14830144e−25 | 9.00262127e−25 |
| C48 | 1.89025842e−23 | −2.64909189e−23 | 1.42487114e−24 |
| C50 | −6.54336013e−22 | −9.0106405e−22 | 3.32110828e−25 |
| C52 | 2.37305051e−21 | −6.69630166e−21 | 1.54439296e−25 |
| C54 | −2.44135026e−21 | −4.36511688e−20 | 7.91478948e−26 |
| C55 | 3.57408258e−26 | 6.04631528e−29 | 4.61140016e−27 |
| C57 | −5.70542383e−25 | −2.22061343e−27 | 1.19061262e−26 |
| C59 | 2.23346131e−24 | −3.29453086e−25 | −2.43403831e−27 |
| C61 | −1.086608159e−23 | −3.59843538e−24 | −1.04602448e−27 |
| C63 | 4.01727698e−23 | 1.17803737e−22 | −3.01269966e−28 |
| C65 | −3.08466704e−23 | 1.2589272e−21 | −9.07944125e−29 |
| C67 | −9.09279986e−28 | −2.73791414e−30 | −1.05225381e−29 |
| C69 | 1.84008908e−28 | 1.67755413e−28 | −3.76114547e−29 |
| C71 | 2.98171505e−26 | 7.89504238e−27 | 1.08887944e−30 |
| C73 | −1.45773298e−25 | 1.37144291e−25 | 9.62125603e−31 |
| C75 | 5.4755988e−25 | −1.75156336e−24 | 4.40838424e−31 |
| C77 | −6.88817386e−25 | 0 | 1.65923732e−31 |
| C78 | −1.93722111e−31 | −6.27481076e−34 | −4.32487572e−32 |
| C80 | 8.17303266e−30 | 2.11008905e−32 | −1.14299001e−31 |
| C82 | −6.67999871e−29 | 5.2310253e−30 | 4.65450563e−32 |
| C84 | 2.67006152e−28 | 3.0291707e−28 | 8.73563385e−33 |
| C86 | −1.53075751e−27 | 2.20926318e−27 | 1.52319789e−33 |
| C88 | 5.16885409e−27 | 2.74028858e−27 | −7.11278706e−34 |
| C90 | −8.23017746e−27 | 0 | −4.3534126e−34 |
| C92 | 9.28021791e−33 | 1.61499153e−35 | 3.4340304e−34 |
| C94 | 1.69089847e−32 | −8.96493937e−34 | 3.93253353e−34 |
| C96 | −3.39525427e−31 | −7.08991192e−32 | −4.73501064e−35 |
| C98 | 1.66641579e−30 | −3.0950904e−30 | −2.05074664e−35 |
| C100 | −9.51326703e−30 | −9.26698789e−29 | −2.50411785e−36 |
| C102 | 2.94059028e−29 | 0 | 1.04321451e−36 |
| C104 | −4.69127888e−29 | 0 | 6.43577491e−37 |
| C105 | −1.7696216e−36 | 4.64103982e−39 | −1.04049749e−37 |
| C107 | −8.97432009e−35 | 2.19653265e−38 | −4.82828467e−37 |
| C109 | 5.43884259e−34 | −1.60384827e−35 | −3.57026561e−37 |
| C111 | −8.8263867e−34 | −2.16883676e−33 | 6.55702741e−38 |
| C113 | 5.276912e−33 | −4.68627022e−32 | 6.67841412e−39 |
| C115 | −2.42873892e−32 | −1.04759785e−30 | 8.77078073e−40 |

-continued

Table 3b for FIG. 14/15

| Coefficient | M5 | M4 | M3 |
|---|---|---|---|
| C117 | 7.30432753e−32 | 0 | −6.91810729e−40 |
| C119 | −1.02386637e−31 | 0 | −3.62760873e−40 |

Table 3c for FIG. 14/15

| Coefficient | M2 | M1 |
|---|---|---|
| KY | 0.00000000 | 0.00000000 |
| KX | 0.00000000 | 0.00000000 |
| RX | −2785.90885700 | 19049.58075000 |
| C7 | 1.02179797e−07 | −1.83712276e−07 |
| C9 | 2.08877338e−07 | −4.58660126e−08 |
| C10 | −2.19824304e−10 | −1.67890734e−11 |
| C12 | −4.14802496e−10 | 4.67483698e−11 |
| C14 | 9.46958508e−10 | 1.1339512e−11 |
| C16 | 6.64712822e−13 | −2.5185941e−13 |
| C18 | 1.1708882e−13 | −6.01722521e−13 |
| C20 | 2.83635538e−12 | −4.88209081e−14 |
| C21 | 2.7928674e−16 | −2.02129522e−18 |
| C23 | 1.42351482e−15 | −7.27365863e−16 |
| C25 | −1.92431341e−15 | 4.83885181e−16 |
| C27 | 8.77128791e−15 | −1.97905684e−17 |
| C29 | 7.21451366e−18 | −1.28398658e−18 |
| C31 | 6.30102696e−18 | 9.94551948e−19 |
| C33 | 3.50555759e−18 | 1.88504443e−18 |
| C35 | 3.12699312e−17 | 1.06434779e−19 |
| C36 | −3.68339425e−20 | −2.27688495e−21 |
| C38 | 3.61485045e−20 | −1.70028002e−20 |
| C40 | 5.05283454e−21 | −1.07042666e−20 |
| C42 | 1.99680032e−21 | 1.04162271e−20 |
| C44 | 1.24570222e−19 | −1.55097266e−21 |
| C46 | −3.21749539e−22 | 5.12417577e−23 |
| C48 | 1.68890864e−22 | −3.98185412e−23 |
| C50 | 1.15552342e−24 | −5.91175233e−23 |
| C52 | −1.84254516e−23 | −1.14320553e−22 |
| C54 | 3.61172897e−22 | −6.223901e−23 |
| C55 | 2.57524069e−25 | 1.13131912e−25 |
| C57 | −1.72472199e−24 | 8.57655135e−25 |
| C59 | 2.79637731e−25 | 2.11373459e−24 |
| C61 | −2.11635905e−24 | 2.45014709e−25 |
| C63 | −3.38605775e−24 | −5.95868212e−25 |
| C65 | −5.51007018e−25 | −8.97281776e−26 |
| C67 | 1.78442615e−27 | −3.12729249e−28 |
| C69 | −4.68488975e−27 | 1.28492955e−26 |
| C71 | 1.54333938e−26 | 2.09200168e−26 |
| C73 | 1.94658666e−26 | 1.65108524e−26 |
| C75 | 6.09850146e−27 | 7.04786074e−27 |
| C77 | 4.18619136e−27 | 4.5184573e−27 |
| C78 | 1.54200314e−31 | −1.32478619e−30 |
| C80 | 6.95048519e−30 | 2.51954717e−29 |
| C82 | −3.04720781e−29 | −3.83569962e−29 |
| C84 | 5.24989858e−29 | −4.69742338e−30 |
| C86 | 2.04128459e−28 | 4.07157123e−29 |
| C88 | 2.00406824e−28 | 3.07404295e−29 |
| C90 | 9.4685541e−29 | 1.13319109e−29 |
| C92 | 3.87396229e−32 | −6.19892982e−32 |
| C94 | 6.51760335e−32 | −6.54903162e−31 |
| C96 | −2.20158879e−31 | −1.35223368e−30 |
| C98 | −3.33335228e−31 | −1.59978619e−30 |
| C100 | −1.8982851e−31 | −9.29567239e−31 |
| C102 | 2.55028572e−32 | −2.74472497e−31 |
| C104 | 9.15729393e−32 | −1.39144572e−31 |
| C105 | 1.54616461e−35 | −4.43620458e−35 |
| C107 | 2.57448706e−34 | −2.24105011e−33 |
| C109 | 4.15070906e−34 | −4.2791598e−33 |
| C111 | −4.57189383e−34 | −5.88226204e−33 |
| C113 | −2.7712617e−33 | −7.99527615e−33 |
| C115 | −5.61503186e−33 | −4.25467966e−33 |

-continued

Table 3c for FIG. 14/15

| Coefficient | M2 | M1 |
|---|---|---|
| C117 | −3.62496099e−33 | −1.32244101e−33 |
| C119 | −9.3965259e−34 | −5.41759129e−34 |

Table 4a for FIG. 14/15

| Surface | DCX | DCY | DCZ |
|---|---|---|---|
| Image plane | 0.00000000 | 0.00000000 | 0.00000000 |
| M8 | 0.00000000 | 1.58228046 | 644.46684396 |
| M7 | 0.00000000 | −130.94320893 | 86.28913162 |
| M6 | −0.00000000 | 79.00389588 | 1146.86693841 |
| M5 | −0.00000000 | 315.04839618 | 1400.80720652 |
| M4 | −0.00000000 | 708.31755783 | 1568.71377057 |
| M3 | −0.00000000 | −353.76795180 | 1371.20626759 |
| M2 | −0.00000000 | −1004.08161985 | 938.25663352 |
| Stop | −0.00000000 | −1059.88207749 | 829.40621334 |
| M1 | −0.00000000 | −1419.83403251 | 171.07007671 |
| Object plane | −0.00000000 | −1596.59832123 | 1556.09991381 |

Table 4b for FIG. 14/15

| Surface | TLA [deg] | TLB [deg] | TLC [deg] |
|---|---|---|---|
| Image plane | −0.00000000 | 0.00000000 | −0.00000000 |
| M8 | −6.87697088 | 0.00000000 | −0.00000000 |
| M7 | 167.05654494 | 0.00000000 | −0.00000000 |
| M6 | 63.67723779 | −0.00000000 | 0.00000000 |
| M5 | 37.03218867 | −0.00000000 | −0.00000000 |
| M4 | −72.57292341 | 0.00000000 | −0.00000000 |
| M3 | 21.99697785 | −0.00000000 | −0.00000000 |
| M2 | 47.89820238 | −0.00000000 | 0.00000000 |
| Stop | 33.48047202 | −0.00000000 | 180.00000000 |
| M1 | 169.48262671 | 0.00000000 | −0.00000000 |
| Object plane | 1.44970929 | −0.00000000 | 0.00000000 |

Table 5 for FIG. 14/15

| Surface | Angle of incidence [deg] | Reflectivity |
|---|---|---|
| M8 | 6.74473267 | 0.66088293 |
| M7 | 1.02118653 | 0.66560218 |
| M6 | 75.10308995 | 0.80563416 |
| M5 | 77.68931628 | 0.84631558 |
| M4 | 6.86410776 | 0.66070326 |
| M3 | 78.32667965 | 0.85548939 |
| M2 | 75.72513685 | 0.81598083 |
| M1 | 17.74444012 | 0.62654454 |
| Overall transmission | | 0.0867 |

Table 6 for FIG. 14/15

| X [mm] | Y [mm] | Z [mm] |
|---|---|---|
| −0.00000000 | 88.44258973 | 0.00000000 |
| 24.64699112 | 87.07599581 | 0.00000000 |
| 48.84374950 | 83.04125797 | 0.00000000 |
| 72.13433069 | 76.52735358 | 0.00000000 |
| 94.05344206 | 67.82941768 | 0.00000000 |
| 114.12656538 | 57.32195581 | 0.00000000 |
| 131.87509715 | 45.42746439 | 0.00000000 |
| 146.82707628 | 32.58529760 | 0.00000000 |
| 158.53331961 | 19.22513587 | 0.00000000 |
| 166.58810289 | 5.74816752 | 0.00000000 |
| 170.65260767 | −7.48326159 | 0.00000000 |
| 170.47874487 | −20.14984875 | 0.00000000 |
| 165.93088822 | −31.97720096 | 0.00000000 |
| 157.00305460 | −42.73762190 | 0.00000000 |
| 143.82941376 | −52.25207120 | 0.00000000 |
| 126.68708163 | −60.39119625 | 0.00000000 |
| 105.99130912 | −67.07383413 | 0.00000000 |
| 82.28375334 | −72.26173300 | 0.00000000 |
| 56.21483844 | −75.94958583 | 0.00000000 |
| 28.52131067 | −78.15089981 | 0.00000000 |
| 0.00000000 | −78.88229478 | 0.00000000 |
| −28.52131067 | −78.15089981 | 0.00000000 |
| −56.21483844 | −75.94958583 | 0.00000000 |
| −82.28375334 | −72.26173300 | 0.00000000 |
| −105.99130912 | −67.07383413 | 0.00000000 |
| −126.68708163 | −60.39119625 | 0.00000000 |
| −143.82941376 | −52.25207120 | 0.00000000 |
| −157.00305460 | −42.73762190 | 0.00000000 |
| −165.93088822 | −31.97720096 | 0.00000000 |
| −170.47874487 | −20.14984875 | 0.00000000 |
| −170.65260767 | −7.48326159 | 0.00000000 |
| −166.58810289 | 5.74816752 | 0.00000000 |
| −158.53331961 | 19.22513587 | 0.00000000 |
| −146.82707628 | 32.58529760 | 0.00000000 |
| −131.87509715 | 45.42746439 | 0.00000000 |
| −114.12656538 | 57.32195581 | 0.00000000 |
| −94.05344206 | 67.82941768 | 0.00000000 |
| −72.13433069 | 76.52735358 | 0.00000000 |
| −48.84374950 | 83.04125797 | 0.00000000 |
| −24.64699112 | 87.07599581 | 0.00000000 |

An overall reflectivity of the projection optical unit 31 is 8.67%.

The projection optical unit 31 has an image-side numerical aperture of 0.6. The image field 8 has an x-extent of two times 6.5 mm and a y-extent of 1.20 mm. The image field 8 is curved symmetrically with respect to the y-axis with a radius of curvature of e.g. 20.28 mm. Thus, the projection optical unit 31 has arced fields and no rectangular fields. The projection optical unit 31 is optimized for an operating wavelength of the illumination light 3 of 13.5 nm.

The projection optical unit 31 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 31 has exactly four mirrors for grazing incidence, namely the mirrors M2, M3, M5 and M6. The mirrors M1, M4, M7 and M8 are embodied as mirrors for normal incidence.

In the projection optical unit 31, a stop 18 is arranged in the beam path between the mirrors M1 and M2, near the grazing incidence on the mirror M2. Alternatively or additionally, a stop can be arranged directly on the surface of the mirror M2.

The projection optical unit 31 has a reducing imaging scale β=8.00.

An angle of incidence of the chief rays 16 in the object plane 5 is 6.3°.

In the meridional section according to FIG. 14, the chief rays extend between the object field 4 and the mirror M1 in a divergent manner. In the yz-plane, an entrance pupil of the projection optical unit 31 lies −3500 mm in front of the object field 4 in the beam path of the illumination light. In the xz-plane (cf. FIG. 15), the entrance pupil lies 2100 mm after the object field in the imaging beam path of the projection optical unit 31.

In the xz-section (cf. FIG. 15), the stop 18 can lie at a position displaced in the z-direction compared to its position in the yz-section.

A z-distance between the object field 4 and the image field 8 is approximately 1600 mm. An object/image offset ($d_{OIS}$) is approximately 1560 mm.

A free working distance between the mirror M7 and the image field 8 is 61 mm.

In the projection optical unit 31, a scanned RMS value for the wavefront aberration is at most 8 mλ and, on average, 7 mλ.

A maximum distortion value is at most 0.12 nm in the x-direction and at most 0.08 nm in the y-direction. A telecentricity value in the x-direction is at most 0.61 mrad on the image field-side and a telecentricity value in the y-direction is at most 1.16 mrad on the image field-side.

Further mirror data emerge from the following table.

TABLE 7 for FIG. 14/15

| | M1 | M2 | M3 | M4 | M5 | M6 | M7 | M8 |
|---|---|---|---|---|---|---|---|---|
| Maximum angle of incidence [deg] | 18.4 | 78.2 | 79.3 | 10.8 | 82.3 | 78.9 | 18.8 | 7.3 |
| Mirror extent (x) [mm] | 245.4 | 366.0 | 506.8 | 606.2 | 426.9 | 218.7 | 323.2 | 804.5 |
| Mirror extent (y) [mm] | 246.9 | 252.0 | 795.8 | 84.5 | 175.8 | 270.5 | 173.3 | 788.5 |
| Maximum mirror diameter [mm] | 252.6 | 366.3 | 803.8 | 606.2 | 426.9 | 281.1 | 323.4 | 805.8 |

There is an intermediate image 19 in the beam path in the region of a reflection on the mirror M5 in the yz-plane (FIG. 14) and in the imaging beam path region between the mirrors M6 and M7 in the xz-plane (FIG. 15).

The mirror M8 is obscured and includes a passage opening 17 for the passage of the illumination light 3 in the imaging beam path between the mirrors M6 and M7.

Only the last mirror M8 in the imaging beam path includes a passage opening 17 for the imaging light 3. All other mirrors M1 to M7 have a continuous reflection surface. The reflection surface of the mirror M8 is used around the passage opening 17 thereof.

The mirrors M1, M3, M4, M6 and M8 have negative values for the radius, i.e. are, in principle, concave mirrors. The other mirrors M2, M5 and M7 have positive values for the radius, i.e. are, in principle, convex mirrors. The mirrors M2, M3, M5 and M6 for grazing incidence have very large radii and only constitute small deviations from plane reflection surfaces.

Figure 15A:
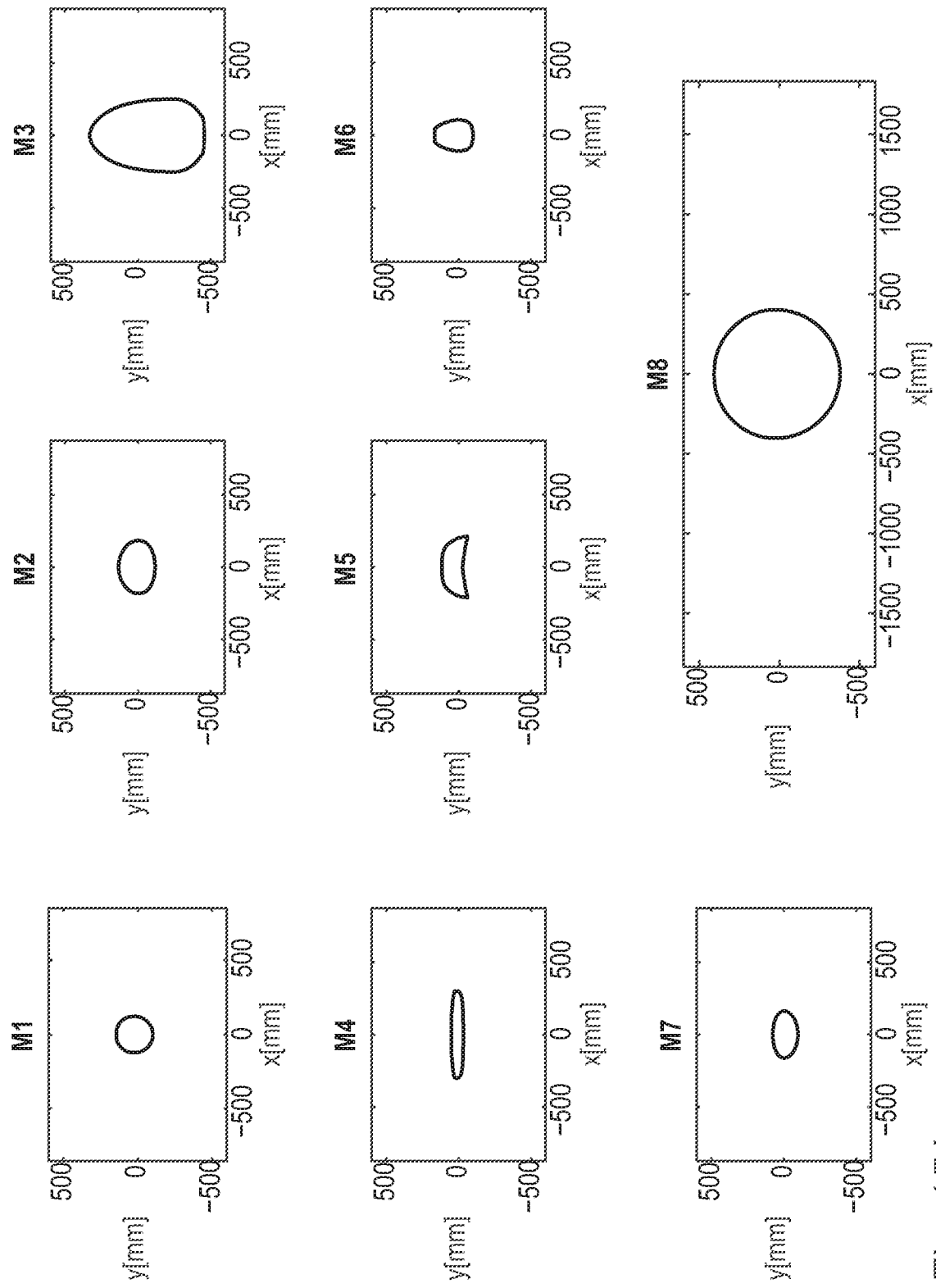
FIG. 15A shows views of edge contours of optically used surfaces of the mirrors of the imaging optical unit according to FIGS. 14 and 15.

FIG. 15A shows edge contours of the surfaces on the mirrors M1 to M8 of the projection optical unit 31 which are in each case impinged upon by illumination light 3, i.e. the so-called footprints of the mirrors M1 to M8. These edge contours are in each case depicted in an x/y-diagram which corresponds to the local x- and y-coordinates of the respective mirror M1 to M8. The illustrations are true to scale in millimeters. The mirrors M1, M2, M6 and M8 have an x/y-aspect ratio which does not deviate, or only deviates slightly, from the value 1. The mirror M3 has an x/y-aspect ratio of approximately 0.55. The mirror M4 has an x/y-aspect ratio of approximately 7.5. The mirror M5 has an x/y-aspect ratio of approximately 2.5. The mirror M7 has an x/y-aspect ratio of approximately 2.

Figure 16:
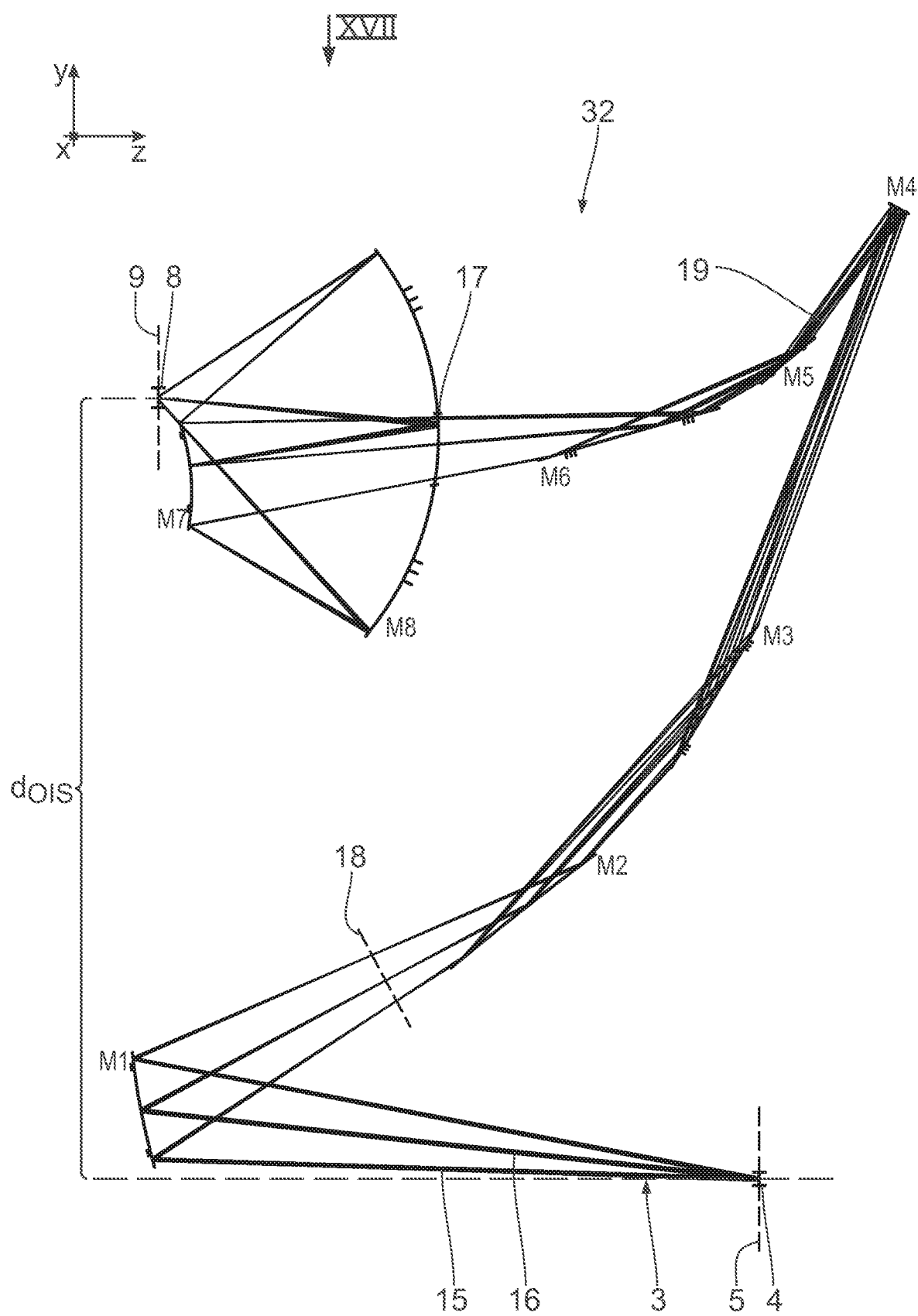
FIG. 16 shows, in an illustration similar to FIG. 2, a further embodiment of an imaging optical unit which can be used as a projection lens in the projection exposure apparatus according to FIG. 1.
Figure 17:
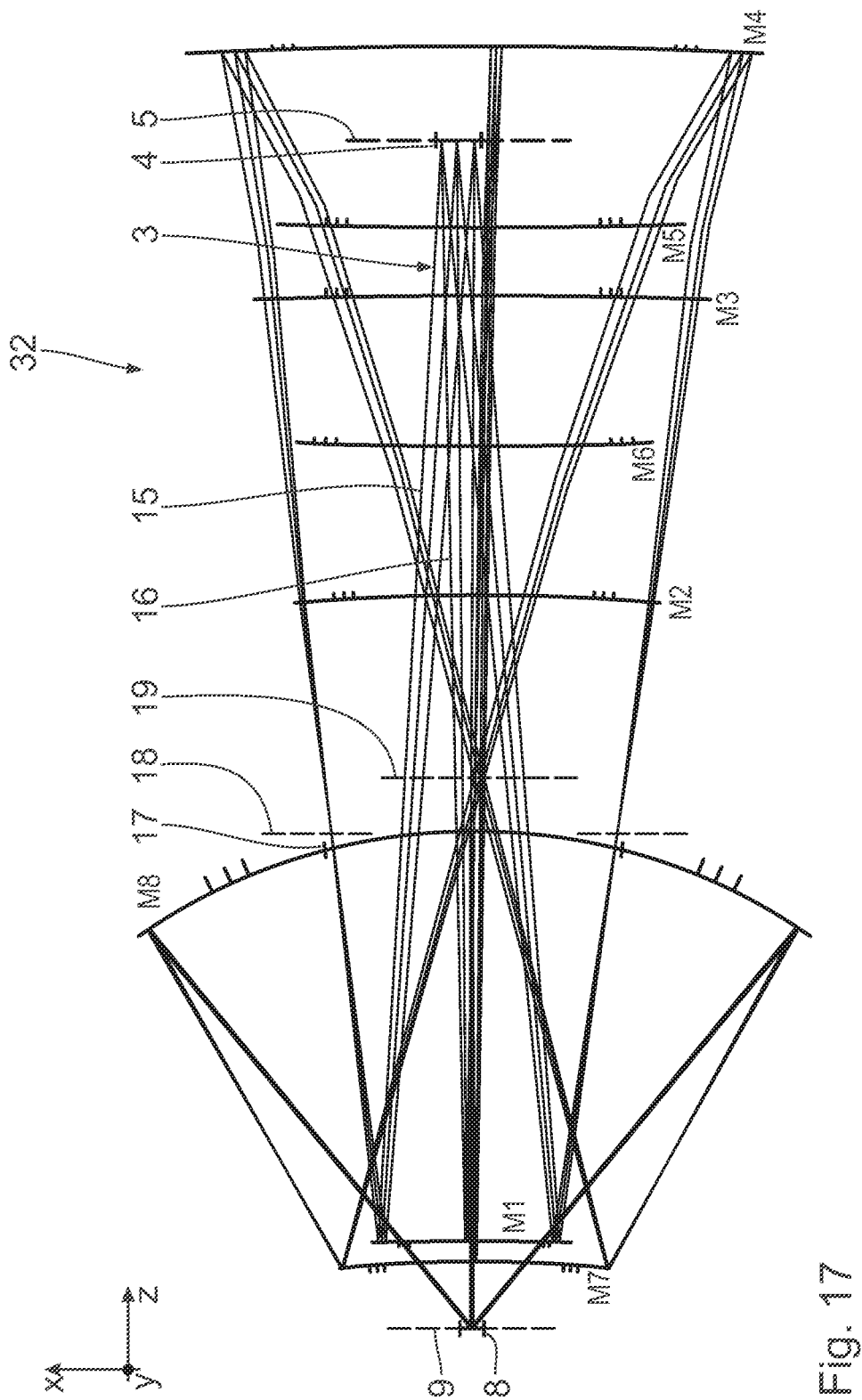
FIG. 17 shows a view of the imaging optical unit according to FIG. 16, seen from the viewing direction XVII in FIG. 16.

A further embodiment of a projection optical unit 32, which can be used in the projection exposure apparatus 1 according to FIG. 1 instead of e.g. the projection optical unit 7, is explained in the following text on the basis of FIGS. 16 and 17. Components and functions which were already explained above in the context of FIGS. 1 to 15 are appropriately denoted by the same reference signs and are not discussed again in detail. FIG. 16 shows a meridional section of the projection optical unit 32. FIG. 17 shows a sagittal view of the projection optical unit 32.

The projection optical unit 32 has a total of 8 mirrors M1 to M8 and, in terms of the basic design thereof, it is similar to e.g. the projection optical unit 7 according to FIG. 2.

The mirrors M1 to M8 are once again embodied as free-form surface mirrors, for which the free-form surface equation (1), specified above, applies. The optical design data from the projection optical unit 32 can be gathered from the following tables, which, in terms of their design, correspond to the tables for the projection optical unit 7 according to FIG. 2.

Table 1 for FIG. 16/17

| Exemplary embodiment | FIG. 16/17 |
|---|---|
| NA | 0.63 |
| Wavelength | 13.5 nm |
| Field dimension x | 13.0 mm |
| Field dimension y | 1.2 mm |
| Field curvature | 0.0 1/mm |
| Stop | S9 |

Table 2 for FIG. 16/17

| Surface | Radius x [mm] | Power x [1/mm] | Radius y [mm] | Power y [1/mm] | Operating |
|---|---|---|---|---|---|
| M8 | −931.70840871 | 0.00212869 | −869.27604763 | 0.00232012 | REFL |
| M7 | 2483.73117622 | −0.00080462 | 590.74829460 | −0.00338815 | REFL |
| M6 | 4073.92459627 | −0.00009230 | 18265.52467135 | −0.00058241 | REFL |
| M5 | 7333.37887582 | −0.00006439 | 2756.23195835 | −0.00307339 | REFL |
| M4 | −2343.60828683 | 0.00084551 | −1275.30707722 | 0.00158285 | REFL |
| M3 | −8176.83666005 | 0.00004510 | −22705.81965249 | 0.00047771 | REFL |
| M2 | −2347.82420977 | 0.00014956 | 5323.37610244 | −0.00213994 | REFL |
| M1 | 7536.03761813 | −0.00025355 | −1766.43613919 | 0.00118510 | REFL |

Table 3a for FIG. 16/17

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −931.70840870 | 2483.73117600 | 4073.92459600 |
| C7 | −2.91071984e−08 | 1.03086086e−08 | 1.42663812e−08 |
| C9 | −1.4873513e−08 | −2.95346773e−07 | −1.46095442e−08 |
| C10 | −1.35088934e−11 | 7.46509583e−10 | 1.66564805e−10 |
| C12 | −3.04656958e−11 | 1.97488711e−09 | 4.76376807e−11 |
| C14 | −1.4685502e−11 | 1.96447383e−09 | −6.83009219e−11 |
| C16 | −2.0880499e−14 | −2.54564229e−13 | −4.64702132e−13 |
| C18 | −3.50367731e−14 | −1.15902664e−12 | 4.62582078e−14 |
| C20 | −1.30121192e−14 | −2.52789708e−12 | −2.03948925e−13 |
| C21 | −2.58185385e−17 | 1.1522247e−15 | −2.7157107e−17 |
| C23 | −7.74145665e−17 | 7.55596284e−15 | 9.77435168e−16 |
| C25 | −7.78695864e−17 | 1.95378488e−14 | 2.0332385e−16 |
| C27 | −2.47396927e−17 | 1.84775168e−14 | −6.22309514e−16 |
| C29 | −1.76814258e−20 | 2.09437366e−18 | −1.49864939e−19 |
| C31 | −5.60530841e−20 | 5.96908377e−19 | −9.33357714e−19 |
| C33 | −4.97811363e−20 | −2.08627141e−17 | 3.07259452e−19 |
| C35 | −1.3997665e−20 | −3.46362367e−17 | −1.96498619e−18 |
| C36 | −3.36480331e−23 | 5.9536477e−21 | −5.41486656e−21 |
| C38 | −1.43652378e−22 | 3.57217041e−20 | −2.3879585e−21 |
| C40 | −2.19649946e−22 | 1.05418252e−19 | 1.2923996e−21 |
| C42 | −1.50444552e−22 | 2.35618312e−19 | −1.0808335e−21 |
| C44 | −3.74578417e−23 | 1.91215151e−19 | −6.45753285e−21 |
| C46 | −3.13089528e−26 | −3.39340782e−23 | −3.83895365e−23 |
| C48 | −7.18534794e−26 | −6.31648018e−23 | −1.051438e−22 |
| C50 | −1.09073223e−25 | −3.26404881e−22 | −2.85984644e−23 |
| C52 | −6.83064745e−26 | −9.21698689e−22 | −1.08466535e−23 |
| C54 | −1.42936475e−26 | −6.02090954e−22 | −2.26713596e−23 |
| C55 | −1.98418542e−29 | −2.78722687e−26 | 1.37273683e−25 |
| C57 | −1.18366952e−28 | 4.63896896e−26 | 4.78797534e−25 |
| C59 | −2.85319764e−28 | 8.94639444e−25 | 2.0872644e−25 |
| C61 | −2.84788816e−28 | 2.79795669e−24 | 4.69038748e−27 |
| C63 | −1.29159985e−28 | 3.56080821e−24 | −5.79635406e−28 |

-continued

| Table 3a for FIG. 16/17 | | | |
|---|---|---|---|
| Coefficient | M8 | M7 | M6 |
| C65 | −2.10189947e−29 | 2.1127208e−24 | −8.21926722e−26 |
| C67 | −2.32273683e−32 | 4.1958734e−28 | 3.52289657e−27 |
| C69 | −2.40813769e−31 | 6.21640783e−28 | 6.54476369e−27 |
| C71 | −4.32683743e−31 | 5.44469541e−27 | 1.39064733e−27 |
| C73 | −4.15492269e−31 | 1.39187594e−26 | 3.08809486e−28 |
| C75 | −1.90762176e−31 | 2.23223868e−26 | 2.68993428e−28 |
| C77 | −3.53653344e−32 | 6.58181727e−27 | −2.56565757e−28 |
| C78 | −1.28401944e−34 | 4.22239739e−31 | −5.6263208e−30 |
| C80 | −8.00611222e−34 | 1.4969115e−30 | −3.65636379e−29 |
| C82 | −2.08044469e−33 | 9.27586881e−31 | −2.82097568e−29 |
| C84 | −2.99812506e−33 | −2.81205697e−29 | 1.23362854e−30 |
| C86 | −2.44765003e−33 | −5.59224504e−29 | 3.32486225e−31 |
| C88 | −1.08671322e−33 | −1.78093061e−29 | 1.1699384e−30 |
| C90 | −2.11573397e−34 | 5.14032892e−29 | −5.63928364e−31 |
| C92 | 3.23220481e−38 | −2.38769667e−33 | −5.74687656e−32 |
| C94 | 3.21925323e−37 | −3.11471422e−33 | −1.32786862e−31 |
| C96 | 7.57126123e−37 | −6.66791486e−32 | −4.22660394e−32 |
| C98 | 9.69365768e−37 | −2.934094e−31 | 9.32991054e−34 |
| C100 | 7.04923179e−37 | −6.52696174e−31 | −6.22093735e−33 |
| C102 | 2.62042917e−37 | −1.04820586e−30 | 2.08603643e−33 |
| C104 | 4.07988929e−38 | −7.5774402e−31 | −7.31578585e−34 |
| C105 | 1.66061587e−40 | −4.99206036e−37 | 8.05574038e−35 |
| C107 | 1.25271974e−39 | 5.59249922e−36 | 6.75124517e−34 |
| C109 | 4.10714369e−39 | 6.2048029e−35 | 7.7682584e−34 |
| C111 | 7.47611007e−39 | 6.35194423e−34 | −4.50825615e−36 |
| C113 | 8.28548592e−39 | 2.16520675e−33 | −3.39262679e−35 |
| C115 | 5.5390038e−39 | 3.67754227e−33 | −1.22938875e−35 |
| C117 | 2.08161823e−39 | 4.05364531e−33 | 1.44193642e−36 |
| C119 | 3.61466995e−40 | 2.14759918e−33 | −4.15418675e−37 |
| C121 | −1.7470143e−43 | 0 | 0 |
| C123 | −1.24194664e−42 | 0 | 0 |
| C125 | −3.89205838e−42 | 0 | 0 |
| C127 | −6.57194445e−42 | 0 | 0 |
| C129 | −6.52993268e−42 | 0 | 0 |
| C131 | −3.87022353e−42 | 0 | 0 |
| C133 | −1.24875231e−42 | 0 | 0 |
| C135 | −1.70148907e−43 | 0 | 0 |
| C136 | −3.91176552e−46 | 0 | 0 |
| C138 | −3.37053804e−45 | 0 | 0 |
| C140 | −1.30298939e−44 | 0 | 0 |
| C142 | −2.82508364e−44 | 0 | 0 |
| C144 | −3.81978621e−44 | 0 | 0 |
| C146 | −3.31582016e−44 | 0 | 0 |
| C148 | −1.79377138e−44 | 0 | 0 |
| C150 | −5.55598461e−45 | 0 | 0 |
| C152 | −7.76672874e−46 | 0 | 0 |

| Table 3b for FIG. 16/17 | | | |
|---|---|---|---|
| Coefficient | M5 | M4 | M3 |
| KY | 0.00000000 | 0.00000000 | 0.00000000 |
| KX | 0.00000000 | 0.00000000 | 0.00000000 |
| RX | 7333.37887600 | −2343.60828700 | −8176.83666000 |
| C7 | −8.06007218e−08 | −3.48950166e−08 | 4.05927788e−09 |
| C9 | −2.08509486e−07 | 8.94289204e−08 | 1.77611145e−08 |
| C10 | 4.87512053e−11 | −3.68853182e−12 | −2.10548784e−12 |
| C12 | 6.98533228e−11 | −1.68926357e−12 | −1.81838078e−11 |
| C14 | 7.56830797e−10 | −7.16019789e−10 | −1.28620718e−11 |
| C16 | −4.21056731e−14 | −9.71341862e−15 | 1.51233551e−14 |
| C18 | 2.16257556e−13 | 1.0109964e−13 | 2.12796111e−14 |
| C20 | −2.45524747e−12 | 2.43722256e−12 | 1.97634161e−14 |
| C21 | −1.00355924e−16 | 1.46336047e−18 | −3.64595782e−17 |
| C23 | −8.60207099e−17 | −7.86037179e−18 | −1.04353271e−17 |
| C25 | −1.04377426e−15 | −4.99679238e−16 | −4.48160081e−17 |
| C27 | 9.80765672e−15 | −7.9361522e−15 | −2.3137161e−17 |
| C29 | 5.00768352e−20 | −1.44519643e−20 | −1.3579059e−21 |
| C31 | −4.94223102e−19 | 3.37633547e−20 | 5.80350123e−20 |
| C33 | 7.13421062e−18 | 8.97303449e−19 | 6.79018066e−20 |
| C35 | −4.57055281e−17 | −2.14705684e−16 | 3.32978205e−20 |

-continued

Table 3b for FIG. 16/17

| Coefficient | M5 | M4 | M3 |
|---|---|---|---|
| C36 | 6.29537322e−22 | −5.41983346e−24 | 2.94852673e−22 |
| C38 | 4.56244955e−21 | 8.73176771e−25 | 2.28099588e−23 |
| C40 | −5.65666291e−22 | −4.49558052e−21 | −7.30396947e−23 |
| C42 | −1.97093015e−20 | −5.08595618e−19 | −7.04354696e−23 |
| C44 | 2.25870745e−19 | −1.86162624e−18 | −6.57401088e−23 |
| C46 | −4.76975597e−25 | 3.18692569e−26 | −5.31469542e−25 |
| C48 | −2.62153771e−23 | 7.33616878e−26 | −1.56666314e−25 |
| C50 | −8.35149543e−23 | −3.1998671e−22 | 1.17242589e−25 |
| C52 | 2.06972807e−22 | 1.67741969e−22 | 4.56588177e−25 |
| C54 | −8.42020489e−22 | 1.29228647e−19 | 1.50592072e−25 |
| C55 | −8.54723421e−27 | 3.09703897e−29 | −2.51969622e−27 |
| C57 | −2.15095808e−26 | −1.45976138e−27 | 1.12593984e−27 |
| C59 | 2.73391474e−25 | −7.44808008e−26 | −6.80649268e−28 |
| C61 | 5.18559089e−25 | 3.81005555e−24 | −3.08355376e−27 |
| C63 | −2.47889841e−24 | 3.09020753e−22 | −1.76838539e−27 |
| C65 | 5.34614791e−25 | 1.92266397e−21 | −1.90865204e−29 |
| C67 | −2.25910931e−30 | −4.54679793e−31 | 4.05513465e−30 |
| C69 | 1.74490344e−28 | −3.06527261e−29 | 5.09507467e−30 |
| C71 | −9.47792011e−28 | 3.40412751e−27 | 1.35919614e−29 |
| C73 | −1.28041726e−27 | 2.17008338e−25 | 1.12809097e−29 |
| C75 | 1.16717661e−26 | 5.05227073e−24 | 1.33613049e−31 |
| C77 | 2.41916614e−26 | 1.23707257e−24 | 2.90705483e−31 |
| C78 | 4.99191675e−32 | −2.63305732e−35 | 6.4801327e−33 |
| C80 | 2.40587164e−31 | 5.98530383e−33 | −2.08464487e−32 |
| C82 | −1.49661977e−30 | 9.35640119e−31 | −4.42072324e−32 |
| C84 | −5.16969383e−30 | 7.40737374e−29 | −3.85234173e−32 |
| C86 | 2.80547586e−29 | 2.36087579e−27 | −8.47384767e−34 |
| C88 | −5.66097673e−29 | 3.80301606e−26 | 1.2873158e−33 |
| C90 | −1.65077574e−28 | −1.84363909e−25 | −2.11409931e−33 |
| C92 | −9.95571829e−35 | 1.28242738e−36 | −2.84775083e−36 |
| C94 | −2.55937997e−33 | 3.19723428e−34 | 6.69265283e−35 |
| C96 | 1.72531216e−32 | 1.04943712e−32 | 9.69063033e−35 |
| C98 | 1.30347826e−32 | 3.93847703e−31 | 5.84595971e−36 |
| C100 | −1.82235259e−31 | 1.39933265e−29 | −2.43085728e−35 |
| C102 | 3.33993384e−31 | 1.0462556e−28 | 1.45322044e−35 |
| C104 | 3.61923001e−31 | −1.37953609e−27 | 2.87194159e−37 |
| C105 | −9.27081346e−38 | −3.28332618e−41 | −3.88255253e−39 |
| C107 | 5.90554811e−37 | 1.77805509e−38 | −1.21407691e−39 |
| C109 | 5.75559924e−36 | 1.9649268e−36 | −7.40697936e−38 |
| C111 | −6.21170396e−35 | −1.27239557e−35 | −7.22725357e−38 |
| C113 | 1.18750818e−34 | 1.69960241e−33 | 8.51832143e−38 |
| C115 | 1.0492163e−34 | 2.21579419e−32 | −3.56423101e−38 |
| C117 | −4.95984269e−34 | 6.99631983e−32 | 1.79158311e−39 |
| C119 | −2.2869355e−34 | −3.11861224e−30 | −3.49739868e−40 |

Table 3c for FIG. 16/17

| Coefficient | M2 | M1 |
|---|---|---|
| KY | 0.00000000 | 0.00000000 |
| KX | 0.00000000 | 0.00000000 |
| RX | −2347.82421000 | 7536.03761800 |
| C7 | −7.03485497e−08 | −1.86250955e−07 |
| C9 | 9.59401595e−09 | −5.82539372e−08 |
| C10 | −8.37768666e−11 | −2.02011333e−11 |
| C12 | −2.254116e−10 | 5.08465307e−11 |
| C14 | 1.12290556e−11 | −1.50961208e−11 |
| C16 | 1.29016905e−13 | −1.19111437e−13 |
| C18 | 1.01010377e−13 | −2.20807707e−13 |
| C20 | 5.5795716e−14 | −4.18443714e−14 |
| C21 | −8.62874665e−17 | 1.04483703e−16 |
| C23 | −2.60494693e−16 | 4.60051315e−17 |
| C25 | −4.92392033e−17 | −1.435823e−16 |
| C27 | 1.25996639e−16 | −6.05169215e−18 |
| C29 | 6.11488553e−19 | 7.87050699e−19 |
| C31 | 4.24373257e−19 | 1.12622911e−19 |
| C33 | 2.22031302e−19 | 2.89213141e−19 |
| C35 | 1.26284752e−19 | 2.81920022e−19 |
| C36 | −1.33244714e−21 | −1.46603103e−21 |
| C38 | −6.52230969e−22 | −6.37096287e−21 |
| C40 | −1.36827685e−21 | −1.09951069e−21 |
| C42 | −1.19387383e−21 | −2.71718561e−21 |
| C44 | 4.6650984e−23 | 8.53547123e−23 |
| C46 | −9.78213588e−24 | −3.184402e−23 |
| C48 | 2.1349715e−24 | −4.73107403e−23 |
| C50 | 2.30513651e−24 | −8.85417497e−23 |
| C52 | −1.30422404e−24 | −2.08672516e−23 |
| C54 | 2.56099182e−24 | −1.11997994e−23 |
| C55 | −2.01832009e−27 | 6.22382668e−26 |
| C57 | −2.09810378e−26 | 3.74797998e−25 |
| C59 | 4.07233629e−29 | 5.10816825e−26 |
| C61 | 3.6325349e−26 | −9.00558717e−26 |
| C63 | 1.56403725e−26 | 1.07987651e−25 |
| C65 | 8.21661731e−27 | 5.68528189e−26 |
| C67 | 7.63814345e−29 | 7.63520422e−28 |
| C69 | 5.02221412e−30 | 1.3232798e−27 |
| C71 | 1.77729214e−29 | 5.33156044e−27 |
| C73 | 2.79158365e−29 | 4.63514451e−27 |
| C75 | 2.53015945e−29 | 1.30513775e−27 |
| C77 | −1.4759564e−29 | 3.5264471e−28 |

Table 3c for FIG. 16/17

| Coefficient | M2 | M1 |
|---|---|---|
| C78 | 3.46417745e−32 | −5.78316004e−31 |
| C80 | 1.45159699e−31 | −1.10067449e−29 |
| C82 | 9.0694834e−32 | −1.42216857e−31 |
| C84 | −6.89700486e−31 | 1.16109131e−29 |
| C86 | −7.49364228e−31 | 1.17727865e−29 |
| C88 | −1.7339254e−31 | −2.80482217e−30 |
| C90 | −4.47739797e−32 | −2.81074177e−30 |
| C92 | −1.81662263e−34 | −6.13529779e−33 |
| C94 | 1.28959854e−34 | −4.08542518e−33 |
| C96 | 4.86782417e−35 | −7.56607259e−32 |
| C98 | 4.67335248e−35 | −1.27523429e−31 |
| C100 | 6.049461e−34 | −8.28428683e−32 |
| C102 | 1.19416219e−34 | −1.88207341e−32 |
| C104 | 2.22522278e−34 | −5.85049322e−33 |
| C105 | −1.53243521e−37 | −5.49967483e−36 |
| C107 | −6.52477544e−37 | 1.45163725e−34 |
| C109 | −1.61717488e−36 | 8.41098542e−36 |
| C111 | 3.3725318e−36 | −2.0054224e−34 |
| C113 | 8.27472276e−36 | −4.23023623e−34 |
| C115 | 6.99221137e−36 | −2.55382174e−34 |
| C117 | 1.36584295e−36 | 2.10184113e−36 |
| C119 | 5.55470158e−37 | 3.89090885e−35 |

Table 4a for FIG. 16/17

| Surface | DCX | DCY | DCZ |
|---|---|---|---|
| Image plane | 0.00000000 | 0.00000000 | 0.00000000 |
| M8 | 0.00000000 | 0.00000000 | 784.93663307 |
| M7 | 0.00000000 | −179.68746470 | 105.44220179 |
| M6 | 0.00000000 | 55.20438485 | 1396.55879809 |
| M5 | 0.00000000 | 268.65063753 | 1738.35972839 |
| M4 | 0.00000000 | 722.06496295 | 2007.61241376 |
| M3 | −0.00000000 | −674.41946224 | 1630.11468301 |
| M2 | −0.00000000 | −1315.57939299 | 1157.79929585 |
| Stop | −0.00000000 | −1561.97639547 | 784.10794177 |
| M1 | −0.00000000 | −1988.27617201 | 137.57190792 |
| Object plane | −0.00000000 | −2017.39023229 | 1874.54221542 |

Table 4b for FIG. 16/17

| Surface | TLA [deg] | TLB [deg] | TLC [deg] |
|---|---|---|---|
| Image plane | −0.00000000 | 0.00000000 | −0.00000000 |
| M8 | −7.40619844 | 0.00000000 | −0.00000000 |
| M7 | 167.43829886 | −0.00000000 | −0.00000000 |
| M6 | 68.85261659 | 0.00000000 | −0.00000000 |
| M5 | 44.35975235 | 0.00000000 | −0.00000000 |
| M4 | −67.08503447 | 0.00000000 | −0.00000000 |
| M3 | 25.75208383 | −0.00000000 | −0.00000000 |
| M2 | 46.48912783 | −0.00000000 | 0.00000000 |
| Stop | −33.39924707 | 180.00000000 | 0.00000000 |
| M1 | 163.78051035 | 0.00000000 | −0.00000000 |
| Object plane | −5.37252548 | −0.00000000 | 0.00000000 |

Table 5 for FIG. 16/17

| Surface | Angle of incidence [deg] | Reflectivity |
|---|---|---|
| M8 | 7.40619844 | 0.65984327 |
| M7 | 2.25069574 | 0.66521806 |
| M6 | 79.16362199 | 0.86711124 |
| M5 | 76.34351377 | 0.82589579 |
| M4 | 7.78830058 | 0.65919310 |
| M3 | 79.37458111 | 0.86997104 |
| M2 | 79.88837490 | 0.87682901 |
| M1 | 17.17975742 | 0.62938643 |
| Overall transmission | | 0.0995 |

Table 6 for FIG. 16/17

| X [mm] | Y [mm] | Z [mm] |
|---|---|---|
| 0.00000000 | −64.68191562 | 0.00000000 |
| 33.53875145 | −63.83359071 | 0.00000000 |
| 66.38499140 | −61.30381759 | 0.00000000 |
| 97.85010336 | −57.13847210 | 0.00000000 |
| 127.25390981 | −51.41487055 | 0.00000000 |
| 153.93066205 | −44.24293063 | 0.00000000 |
| 177.23821823 | −35.76660175 | 0.00000000 |
| 196.57137775 | −26.16552395 | 0.00000000 |
| 211.37968084 | −15.65654763 | 0.00000000 |
| 221.18976357 | −4.49338596 | 0.00000000 |
| 225.63064082 | 7.03803149 | 0.00000000 |
| 224.45920695 | 18.62872113 | 0.00000000 |
| 217.58261451 | 29.96013697 | 0.00000000 |
| 205.07441971 | 40.72010810 | 0.00000000 |
| 187.18211570 | 50.61868899 | 0.00000000 |
| 164.32450058 | 59.40103368 | 0.00000000 |
| 137.07897670 | 66.85526038 | 0.00000000 |
| 106.16044703 | 72.81504783 | 0.00000000 |
| 72.39462700 | 77.15696291 | 0.00000000 |
| 36.68840284 | 79.79582533 | 0.00000000 |
| 0.00000000 | 80.68107104 | 0.00000000 |
| −36.68840284 | 79.79582533 | 0.00000000 |
| −72.39462700 | 77.15696291 | 0.00000000 |
| −106.16044703 | 72.81504783 | 0.00000000 |
| −137.07897670 | 66.85526038 | 0.00000000 |
| −164.32450058 | 59.40103368 | 0.00000000 |
| −187.18211570 | 50.61868899 | 0.00000000 |
| −205.07441971 | 40.72010810 | 0.00000000 |
| −217.58261451 | 29.96013697 | 0.00000000 |
| −224.45920695 | 18.62872113 | 0.00000000 |
| −225.63064082 | 7.03803149 | 0.00000000 |
| −221.18976357 | −4.49338596 | 0.00000000 |
| −211.37968084 | −15.65654763 | 0.00000000 |
| −196.57137775 | −26.16552395 | 0.00000000 |
| −177.23821823 | −35.76660175 | 0.00000000 |
| −153.93066205 | −44.24293063 | 0.00000000 |
| −127.25390981 | −51.41487055 | 0.00000000 |
| −97.85010336 | −57.13847210 | 0.00000000 |
| −66.38499140 | −61.30381759 | 0.00000000 |
| −33.53875145 | −63.83359071 | 0.00000000 |

An overall reflectivity of the projection optical unit 32 is 9.95%.

The projection optical unit 32 has an image-side numerical aperture of 0.63. The image field 8 has an x-extent of two times 6.5 mm and a y-extent of 1.20 mm. The projection optical unit 32 is optimized for an operating wavelength of the illumination light 3 of 13.5 nm.

The projection optical unit 32 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 32 has exactly four mirrors for grazing incidence, namely the mirrors M2, M3, M5 and M6. The mirrors M1, M4, M7 and M8 are embodied as mirrors for normal incidence.

In the projection optical unit 32, a stop 18 is arranged in the beam path between the mirrors M1 and M2, near the grazing incidence on the mirror M2. Alternatively or additionally, a stop can be arranged directly on the surface of the mirror M2.

The projection optical unit 32 has a reducing imaging scale β=8.00.

An angle of incidence of the chief rays 16 in the object plane 5 is 6.3°.

In the projection optical unit 32, the entrance pupil lies downstream of the object field 4 in the imaging beam path, both in the xz-plane and in the yz-plane. An extent of the chief rays 16 emanating from the object field 4 is therefore convergent both in the meridional section according to FIG. 16 and in the view according to FIG. 17.

In the xz-section (cf. FIG. 17), the stop 18 can lie at a position displaced in the z-direction compared to its position in the yz-section.

A z-distance between the object field 4 and the image field 8 is approximately 1680 mm.

An object/image offset ($d_{OIS}$) is approximately 2180 mm.

A free working distance between the mirror M7 and the image field 8 is 66 mm.

In the projection optical unit 32, a scanned RMS value for the wavefront aberration is at most 10 mλ and, on average, 10 mλ.

A maximum distortion value is at most 0.05 nm in the x-direction and at most 0.05 nm in the y-direction. A telecentricity value in the x-direction is at most 0.56 mrad on the image field-side and a telecentricity value in the y-direction is at most 0.90 mrad on the image field-side.

Further mirror data emerge from the following table.

TABLE 7 for FIG. 16

| | M1 | M2 | M3 | M4 | M5 | M6 | M7 | M8 |
|---|---|---|---|---|---|---|---|---|
| Maximum angle of incidence [deg] | 17.7 | 83.2 | 80.6 | 9.6 | 79.6 | 83.6 | 20.1 | 9.0 |
| Mirror extent (x) [mm] | 303.5 | 566.4 | 758.8 | 892.8 | 684.3 | 320.4 | 428.8 | 1036.2 |
| Mirror extent (y) [mm] | 297.5 | 442.9 | 668.0 | 123.3 | 268.7 | 464.1 | 277.5 | 1030.7 |
| Maximum mirror diameter [mm] | 307.4 | 566.5 | 882.6 | 892.8 | 684.4 | 465.6 | 429.0 | 1042.4 |

There is an intermediate image 19 in the beam path in the region of a reflection on the mirror M5 in the yz-plane (FIG. 16) and in the imaging beam path region between the mirrors M6 and M7 in the xz-plane (FIG. 17).

The mirror M8 is obscured and includes a passage opening 17 for the passage of the illumination light 3 in the imaging beam path between the mirrors M6 and M7.

Only the last mirror M8 in the imaging beam path includes a passage opening 17 for the imaging light 3. All other mirrors M1 to M7 have a continuous reflection surface. The reflection surface of the mirror M8 is used around the passage opening 17 thereof.

The mirrors M1, M3, M4 and M8 have negative values for the radius, i.e. are, in principle, concave mirrors. The other mirrors M2, M5, M6 and M7 have positive values for the radius, i.e. are, in principle, convex mirrors. The mirrors M2, M3, M5 and M6 for grazing incidence have very large radii and only constitute small deviations from plane reflection surfaces.

Figure 18:
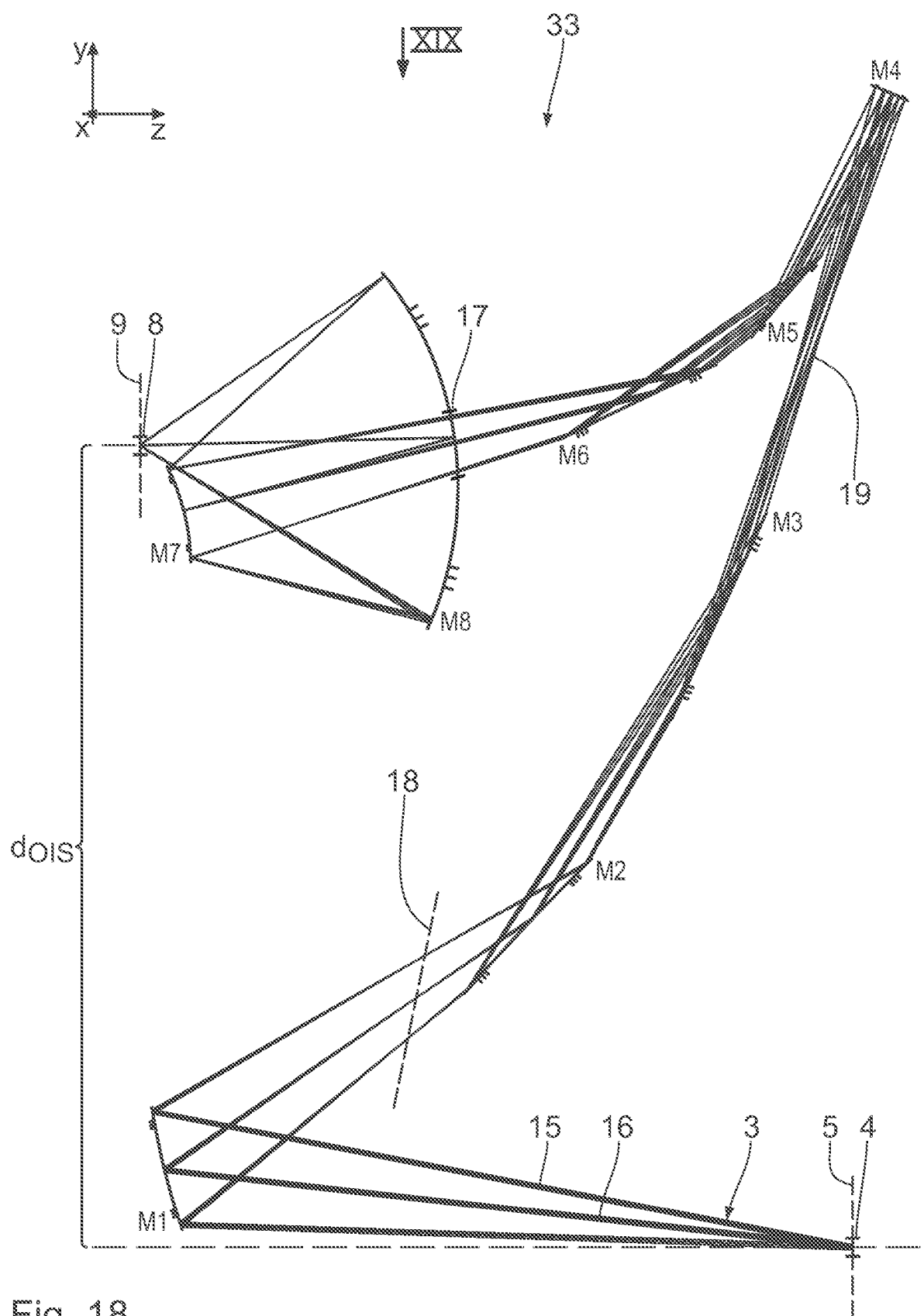
FIG. 18 shows, in an illustration similar to FIG. 2, a further embodiment of an imaging optical unit which can be used as a projection lens in the projection exposure apparatus according to FIG. 1.
Figure 19:
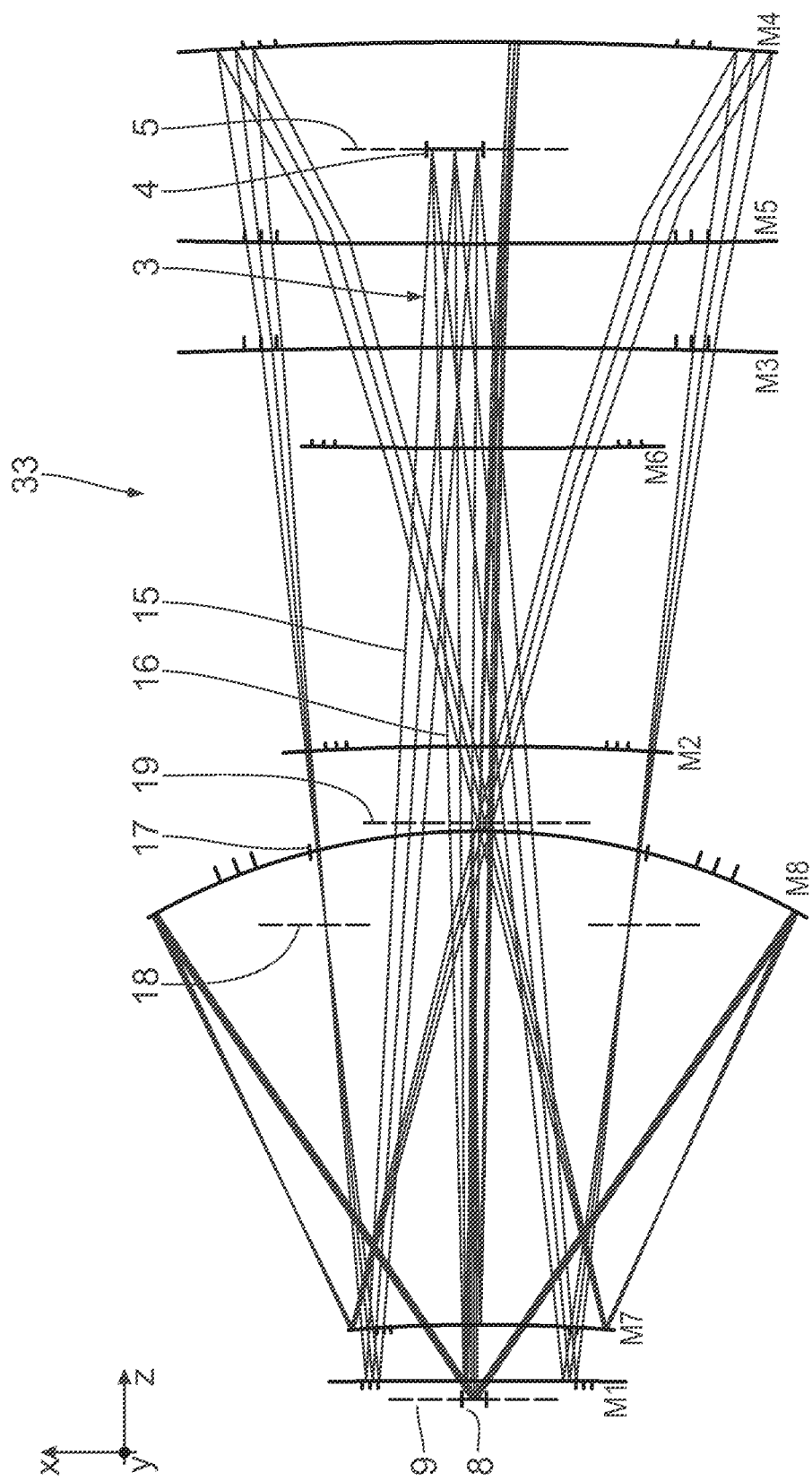
FIG. 19 shows a view of the imaging optical unit according to FIG. 18, seen from the viewing direction XIX in FIG. 18.

A further embodiment of a projection optical unit 33, which can be used in the projection exposure apparatus 1 according to FIG. 1 instead of e.g. the projection optical unit 7, is explained in the following text on the basis of FIGS. 18 and 19. Components and functions which were already explained above in the context of FIGS. 1 to 17 are appropriately denoted by the same reference signs and are not discussed again in detail. FIG. 18 shows a meridional section of the projection optical unit 33. FIG. 19 shows a sagittal view of the projection optical unit 33.

The projection optical unit 33 has a total of 8 mirrors M1 to M8 and, in terms of the basic design thereof, it is similar to e.g. the projection optical unit 7 according to FIG. 2.

The mirrors M1 to M8 are once again embodied as free-form surface mirrors, for which the free-form surface equation (1), specified above, applies. The optical design data from the projection optical unit 33 can be gathered from the following tables, which, in terms of their design, correspond to the tables for the projection optical unit 7 according to FIG. 2.

| Table 1 for FIG. 18/19 | |
|---|---|
| Exemplary embodiment | FIG. 18/19 |
| NA | 0.55 |
| Wavelength | 13.5 nm |
| Field dimension x | 13.0 mm |
| Field dimension y | 1.2 mm |
| Field curvature | 0.0 1/mm |
| Stop | S9 |

Table 2 for FIG. 18/19

| Surface | Radius x [mm] | Power x [1/mm] | Radius y [mm] | Power y [1/mm] | Operating |
|---|---|---|---|---|---|
| M8 | −670.35797232 | 0.00296240 | −627.58435329 | 0.00320950 | REFL |
| M7 | 1745.55712015 | −0.00114571 | 412.50033390 | −0.00484870 | REFL |
| M6 | 4421.01009198 | −0.00008931 | 7185.41512590 | −0.00140985 | REFL |
| M5 | 15855.02373559 | −0.00002796 | 4171.22179090 | −0.00216291 | REFL |
| M4 | −1741.78725861 | 0.00114424 | −1057.57554686 | 0.00189775 | REFL |
| M3 | −9485.62754332 | 0.00002417 | — | 0.00014374 | REFL |
| M2 | −2182.91143597 | 0.00019422 | 5519.10498181 | −0.00170943 | REFL |
| M1 | 15030.83113395 | −0.00012472 | −1265.49778066 | 0.00168608 | REFL |

| Table 3a for FIG. 18/19 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −670.35797230 | 1745.55712000 | 4421.01009200 |
| C7 | −4.81288458e−08 | −3.55811479e−08 | 1.10191288e−07 |
| C9 | −1.43025013e−08 | −2.65021944e−08 | 6.09862305e−08 |
| C10 | −2.9090628e−11 | 2.00521492e−09 | 4.47450933e−10 |
| C12 | −7.81857726e−11 | 5.80590938e−09 | −4.87603276e−12 |
| C14 | −4.02236114e−11 | 4.94771956e−09 | 1.0068161e−10 |
| C16 | −7.43164532e−14 | −1.95204523e−12 | −2.12453013e−12 |
| C18 | −8.64425143e−14 | −5.06245222e−12 | 7.37281997e−13 |
| C20 | −1.71739056e−14 | −1.20800077e−13 | 3.37980344e−13 |
| C21 | −1.1968188e−16 | 4.87171182e−15 | −1.08375275e−15 |
| C23 | −3.75329564e−16 | 4.39287253e−14 | 8.747056e−15 |
| C25 | −3.8109341e−16 | 1.16541403e−13 | 2.36512505e−15 |
| C27 | −1.19138037e−16 | 6.70791361e−14 | 1.37590246e−15 |
| C29 | −1.04340624e−19 | 2.0215171e−17 | 5.61602094e−18 |
| C31 | −2.79317699e−19 | 4.75537085e−17 | −1.60443831e−17 |
| C33 | −1.86065365e−19 | −1.1064442e−16 | 1.42151097e−17 |
| C35 | −2.70598188e−20 | −1.50020521e−17 | 6.37515084e−18 |
| C36 | −2.60850039e−22 | 5.08968358e−20 | −2.32816563e−20 |
| C38 | −1.30441247e−21 | 4.6799942e−19 | −4.47727577e−20 |
| C40 | −1.96796788e−21 | 1.10597229e−18 | 5.12611591e−20 |
| C42 | −1.2977623e−21 | 1.89364881e−18 | 7.02851213e−20 |
| C44 | −3.09054832e−22 | 9.05751028e−19 | 2.94917341e−20 |
| C46 | −3.15590698e−25 | −2.08971584e−22 | 1.62115204e−22 |
| C48 | −6.69894425e−25 | 1.9553723e−22 | −2.33180972e−22 |
| C50 | −9.10706455e−25 | 9.99600993e−22 | −1.77260159e−22 |
| C52 | −4.09789778e−25 | 8.73317101e−22 | 3.10774876e−22 |
| C54 | −5.39704308e−26 | 1.78769324e−21 | 1.12292429e−22 |
| C55 | −6.93874331e−28 | −5.67024671e−26 | 9.56176548e−25 |
| C57 | −3.23605914e−27 | 2.18766705e−26 | 3.05575248e−24 |
| C59 | −7.20445617e−27 | 6.74742059e−24 | 4.95411355e−24 |
| C61 | −7.31071717e−27 | 1.7636561e−23 | 8.45206669e−25 |
| C63 | −3.76538565e−27 | 4.45369389e−23 | 7.568151e−25 |
| C65 | −8.10033369e−28 | 4.74178513e−23 | 2.96782466e−25 |
| C67 | −3.52005901e−31 | 3.12504796e−27 | 3.10279996e−27 |
| C69 | −2.88238592e−30 | −1.30629101e−27 | 2.16886937e−26 |
| C71 | −4.82651049e−30 | −6.24964383e−26 | 6.07431187e−27 |
| C73 | −3.68260801e−30 | −4.92689158e−26 | −2.84115615e−27 |
| C75 | −1.0653794e−30 | −5.7005461e−26 | 7.30804157e−28 |
| C77 | 5.47094621e−32 | −8.75138214e−26 | 4.6058713e−28 |
| C78 | −2.14791056e−33 | 9.06722616e−30 | −1.033614e−29 |
| C80 | −1.60510489e−32 | 1.35117848e−28 | −1.70589275e−28 |
| C82 | −3.93788896e−32 | 5.55787384e−28 | −2.81428982e−28 |
| C84 | −5.49581485e−32 | 1.47508315e−27 | −1.13602715e−28 |
| C86 | −4.35705736e−32 | 1.78392254e−27 | −4.04142212e−30 |
| C88 | −1.75652936e−32 | 7.3734889e−28 | 9.12651931e−32 |
| C90 | −2.46762348e−33 | −8.31242313e−28 | 3.00200174e−31 |
| C92 | −3.88333351e−37 | 0 | 0 |
| C94 | −2.23671833e−37 | 0 | 0 |
| C96 | −2.43165031e−36 | 0 | 0 |
| C98 | −2.13457216e−36 | 0 | 0 |
| C100 | −9.67295232e−37 | 0 | 0 |
| C102 | −1.1876732e−36 | 0 | 0 |
| C104 | −1.14382449e−36 | 0 | 0 |
| C105 | 1.53654914e−39 | 0 | 0 |
| C107 | 1.69206394e−38 | 0 | 0 |
| C109 | 3.52182989e−38 | 0 | 0 |
| C111 | 6.26135172e−38 | 0 | 0 |
| C113 | 8.30656407e−38 | 0 | 0 |
| C115 | 6.21596876e−38 | 0 | 0 |
| C117 | 1.77571315e−38 | 0 | 0 |
| C119 | −5.25174568e−40 | 0 | 0 |
| C121 | −7.01031193e−42 | 0 | 0 |
| C123 | −4.46476068e−41 | 0 | 0 |
| C125 | −1.30369062e−40 | 0 | 0 |
| C127 | −2.05416782e−40 | 0 | 0 |
| C129 | −1.82756747e−40 | 0 | 0 |
| C131 | −8.61446766e−41 | 0 | 0 |
| C133 | −1.58867275e−41 | 0 | 0 |
| C135 | 1.58701316e−42 | 0 | 0 |
| C136 | −3.01497099e−44 | 0 | 0 |
| C138 | −2.83753936e−43 | 0 | 0 |
| C140 | −1.00487157e−42 | 0 | 0 |
| C142 | −2.10202761e−42 | 0 | 0 |
| C144 | −2.8129687e−42 | 0 | 0 |

Table 3a for FIG. 18/19

| Coefficient | M8 | M7 | M6 |
|---|---|---|---|
| C146 | −2.44024498e−42 | 0 | 0 |
| C148 | −1.28745661e−42 | 0 | 0 |
| C150 | −3.62092429e−43 | 0 | 0 |
| C152 | −3.68635908e−44 | 0 | 0 |

Table 3b for FIG. 18/19

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 15855.02374000 | −1741.78725900 | −9485.62754300 |
| C7 | −1.31721076e−07 | −4.59832284e−08 | 3.52848287e−09 |
| C9 | −6.83242366e−08 | 1.26772922e−07 | 6.00270333e−09 |
| C10 | 1.86511896e−10 | −6.7240665e−12 | −3.86514933e−11 |
| C12 | 1.02645567e−10 | 1.40642009e−11 | −1.04260025e−11 |
| C14 | 3.25328748e−10 | −1.44116181e−09 | −1.39250403e−12 |
| C16 | 1.15440436e−13 | 1.54655389e−14 | 1.41839307e−13 |
| C18 | 9.78984308e−14 | 4.72881604e−14 | −7.16656945e−15 |
| C20 | −4.13371452e−13 | 6.75771744e−12 | 5.02664635e−15 |
| C21 | −9.27197923e−16 | 1.22282675e−17 | −3.31198094e−16 |
| C23 | −1.09172383e−15 | −1.54608007e−16 | −5.35714413e−19 |
| C25 | −3.20953448e−15 | −1.0400161e−15 | −1.84536642e−17 |
| C27 | 5.96725454e−16 | −4.25077515e−14 | 6.21451944e−19 |
| C29 | 2.62826512e−18 | −1.61888596e−20 | 1.34420461e−20 |
| C31 | 5.55652996e−18 | 1.56291853e−18 | 1.40973329e−19 |
| C33 | 2.7740609e−17 | 2.95936057e−18 | −4.11709921e−20 |
| C35 | 4.55586057e−18 | −1.37954952e−15 | 2.58219786e−20 |
| C36 | −2.54645948e−21 | 4.64220138e−23 | −1.02171124e−21 |
| C38 | 2.59467077e−21 | 2.40346499e−22 | 1.13743233e−22 |
| C40 | −2.63246351e−20 | 2.2463419e−20 | 2.11256444e−22 |
| C42 | −1.44139765e−19 | 2.97984423e−19 | −1.29143298e−22 |
| C44 | −1.47693917e−20 | −9.36301568e−17 | 3.98789946e−23 |
| C46 | 3.92320225e−23 | −1.29229238e−25 | 3.09631337e−25 |
| C48 | 6.16075361e−23 | 2.86131689e−24 | −8.082018e−25 |
| C50 | −1.29691393e−22 | 4.15685135e−22 | 2.98588259e−25 |
| C52 | 6.01647413e−22 | 2.59285728e−20 | −1.63194404e−25 |
| C54 | −2.80843932e−22 | −2.64870198e−18 | −5.22760512e−25 |
| C55 | −1.90991039e−26 | 7.33311088e−29 | −2.91457225e−28 |
| C57 | −4.94174349e−25 | −3.38477536e−27 | −6.65349621e−28 |
| C59 | −2.34601421e−25 | −6.27781517e−25 | 6.27762913e−27 |
| C61 | 1.83858604e−24 | 1.36415701e−23 | −3.36674024e−27 |
| C63 | −2.23642007e−24 | 3.28284286e−22 | 5.96549035e−27 |
| C65 | 3.66468868e−24 | −4.01324036e−20 | −1.49374281e−27 |
| C67 | 2.66992017e−28 | −5.84759414e−31 | 7.70928561e−30 |
| C69 | 2.07117026e−27 | −1.72399089e−28 | −1.27896735e−29 |
| C71 | −3.5305907e−28 | −5.73139683e−27 | −8.13201754e−30 |
| C73 | −7.57480134e−27 | 1.35355592e−25 | −2.66054764e−29 |
| C75 | 6.95016816e−27 | 1.92585784e−24 | 1.80471214e−29 |
| C77 | −1.70051404e−26 | −3.11308211e−22 | 9.00721038e−31 |
| C78 | 4.16730333e−32 | 4.62818363e−35 | 6.62810428e−33 |
| C80 | −1.17092721e−30 | −1.17159673e−32 | −1.00672006e−32 |
| C82 | −1.53899025e−30 | 4.95758204e−32 | −2.55215318e−32 |
| C84 | −3.41614885e−31 | −6.16523277e−29 | 1.34231774e−31 |
| C86 | 1.41066094e−29 | 1.05235757e−27 | −6.94396951e−32 |
| C88 | −1.32369475e−29 | −2.78941647e−27 | −9.85278164e−33 |
| C90 | 2.98460269e−29 | −9.71953419e−25 | 2.65172705e−33 |

Table 3c for FIG. 18/19

| Coefficient | M2 | M1 |
|---|---|---|
| KY | 0.00000000 | 0.00000000 |
| KX | 0.00000000 | 0.00000000 |
| RX | −2182.91143600 | 15030.83113000 |
| C7 | 4.52959985e−08 | −2.95215933e−07 |
| C9 | 7.3997303e−09 | −1.06249503e−07 |
| C10 | −3.37134993e−10 | −1.38418241e−11 |
| C12 | −4.37041985e−10 | −2.98703844e−11 |

Table 3c for FIG. 18/19

| Coefficient | M2 | M1 |
|---|---|---|
| C14 | −4.88477799e−12 | −3.88213158e−11 |
| C16 | 8.58895599e−13 | −6.42604386e−13 |
| C18 | 6.73225729e−13 | −1.25787194e−12 |
| C20 | 7.54302364e−14 | −1.92589494e−13 |
| C21 | −3.21076173e−16 | 5.29527426e−16 |
| C23 | −1.19828167e−15 | −2.79446453e−16 |
| C25 | −8.61713642e−16 | −1.12508948e−15 |
| C27 | −9.46017861e−17 | −3.35422436e−16 |
| C29 | 6.17495108e−18 | 7.41744768e−19 |
| C31 | 6.43677926e−18 | −5.12492497e−19 |
| C33 | 3.08530058e−18 | −2.24552982e−18 |
| C35 | 6.92654359e−20 | 5.26633314e−20 |
| C36 | −1.39923821e−20 | −3.80030801e−21 |
| C38 | −1.75236161e−20 | −3.41743066e−21 |
| C40 | −2.44288564e−20 | 3.36222578e−21 |
| C42 | −7.5084993e−21 | 1.13386246e−20 |
| C44 | 3.60382311e−22 | −1.57547758e−21 |
| C46 | 8.49074446e−24 | 7.10295318e−23 |
| C48 | 1.29274185e−22 | 1.77073952e−22 |
| C50 | 1.21275303e−22 | 5.45121326e−23 |
| C52 | 2.7448388e−23 | −1.80762516e−23 |
| C54 | −2.99667085e−24 | −2.67701771e−23 |
| C55 | 8.3997029e−26 | 2.48012197e−25 |
| C57 | −6.89387465e−26 | 9.08010504e−25 |
| C59 | −1.69030389e−25 | −1.40396358e−24 |
| C61 | −1.63503627e−25 | −1.98765714e−24 |
| C63 | −4.50856916e−26 | 6.60490918e−25 |
| C65 | −2.69350712e−26 | 5.05364735e−25 |
| C67 | 1.81339959e−28 | −2.43315212e−27 |
| C69 | −1.13047878e−27 | −8.88349423e−27 |
| C71 | −2.086832e−27 | −1.73693921e−26 |
| C73 | −9.67392348e−28 | −1.34931036e−26 |
| C75 | −7.15331766e−31 | 8.58630418e−27 |
| C77 | 2.26098895e−29 | 7.80811576e−27 |
| C78 | −2.38436227e−31 | −6.67264596e−30 |
| C80 | 1.8322377e−30 | −4.06002422e−29 |
| C82 | 6.0376388e−30 | −4.8867685e−29 |
| C84 | 6.31126749e−30 | −4.62454207e−29 |
| C86 | 2.03909262e−30 | −2.42505377e−29 |
| C88 | 3.81494935e−31 | 3.31286928e−29 |
| C90 | −7.68322344e−33 | 2.3776391e−29 |

Table 4a for FIG. 18/19

| Surface | DCX | DCY | DCZ |
|---|---|---|---|
| Image plane | 0.00000000 | 0.00000000 | 0.00000000 |
| M8 | 0.00000000 | −1.30183991 | 570.42723037 |
| M7 | 0.00000000 | −120.34881071 | 75.51681848 |
| M6 | 0.00000000 | 80.00209606 | 956.51104535 |
| M5 | 0.00000000 | 221.25925669 | 1160.16077268 |
| M4 | 0.00000000 | 611.93258157 | 1362.59488679 |
| M3 | 0.00000000 | −309.46726913 | 1055.74659104 |
| M2 | 0.00000000 | −912.91463513 | 655.60876883 |
| Stop | 0.00000000 | −1017.01458447 | 474.86644530 |
| M1 | 0.00000000 | −1353.15078666 | 18.46126376 |
| Object plane | 0.00000000 | −1490.55625877 | 1255.06787017 |

Table 4b for FIG. 18/19

| Surface | TLA [deg] | TLB [deg] | TLC [deg] |
|---|---|---|---|
| Image plane | −0.00000000 | 0.00000000 | −0.00000000 |
| M8 | −6.69497001 | 0.00000000 | −0.00000000 |
| M7 | 166.96937929 | 0.00000000 | −0.00000000 |
| M6 | 66.23453752 | 0.00000000 | −0.00000000 |
| M5 | 41.49642028 | 0.00000000 | −0.00000000 |
| M4 | −66.77054272 | 0.00000000 | −0.00000000 |
| M3 | 26.08077591 | 0.00000000 | −0.00000000 |
| M2 | 44.38277950 | 0.00000000 | −0.00000000 |
| Stop | 12.99307149 | 0.00000000 | −0.00000000 |
| M1 | 165.88573894 | 0.00000000 | −0.00000000 |
| Object plane | 1.47794550 | 0.00000000 | −0.00000000 |

Table 5 for FIG. 18/19

| Surface | Angle of incidence [deg] | Reflectivity |
|---|---|---|
| M8 | 6.81465749 | 0.66077811 |
| M7 | 0.54649170 | 0.66565825 |
| M6 | 78.61351241 | 0.85952413 |
| M5 | 77.19223505 | 0.83894755 |
| M4 | 4.79028139 | 0.66334071 |
| M3 | 83.41785810 | 0.92088922 |
| M2 | 77.76117032 | 0.84736477 |
| M1 | 20.39282100 | 0.61112963 |
| Overall transmission | | 0.1003 |

Table 6 for FIG. 18/19

| X [mm] | Y [mm] | Z [mm] |
|---|---|---|
| 0.00000000 | −74.74428964 | 0.00000000 |
| −21.97577930 | −73.71157746 | 0.00000000 |
| −43.54745003 | −70.64584812 | 0.00000000 |
| −64.30774000 | −65.64223665 | 0.00000000 |
| −83.84419262 | −58.85273624 | 0.00000000 |
| −101.73934320 | −50.47789491 | 0.00000000 |
| −117.57413522 | −40.75791226 | 0.00000000 |
| −130.93536243 | −29.96439172 | 0.00000000 |
| −141.42743062 | −18.39295269 | 0.00000000 |
| −148.68831187 | −6.35605158 | 0.00000000 |
| −152.40909162 | 5.82486902 | 0.00000000 |
| −152.35588367 | 17.82898189 | 0.00000000 |
| −148.39195432 | 29.34768633 | 0.00000000 |
| −140.49688466 | 40.09648351 | −0.00000000 |
| −128.77941498 | 49.82515047 | −0.00000000 |
| −113.48180409 | 58.32554432 | −0.00000000 |
| −94.97550387 | 65.43621405 | 0.00000000 |
| −73.74931338 | 71.04353087 | 0.00000000 |
| −50.39169073 | 75.07859450 | 0.00000000 |
| −25.56884640 | 77.50751380 | 0.00000000 |
| −0.00000000 | 78.31797873 | 0.00000000 |
| 25.56884640 | 77.50751380 | 0.00000000 |
| 50.39169073 | 75.07859450 | 0.00000000 |
| 73.74931338 | 71.04353087 | 0.00000000 |
| 94.97550387 | 65.43621405 | 0.00000000 |
| 113.48180409 | 58.32554432 | −0.00000000 |
| 128.77941498 | 49.82515047 | 0.00000000 |
| 140.49688466 | 40.09648351 | 0.00000000 |
| 148.39195432 | 29.34768633 | −0.00000000 |
| 152.35588367 | 17.82898189 | 0.00000000 |
| 152.40909162 | 5.82486902 | 0.00000000 |
| 148.68831187 | −6.35605158 | 0.00000000 |
| 141.42743062 | −18.39295269 | 0.00000000 |
| 130.93536243 | −29.96439172 | 0.00000000 |
| 117.57413522 | −40.75791226 | 0.00000000 |
| 101.73934320 | −50.47789491 | 0.00000000 |
| 83.84419262 | −58.85273624 | −0.00000000 |
| 64.30774000 | −65.64223665 | 0.00000000 |
| 43.54745003 | −70.64584812 | 0.00000000 |
| 21.97577930 | −73.71157746 | 0.00000000 |

An overall reflectivity of the projection optical unit 33 is 10.03%.

The projection optical unit 33 has an image-side numerical aperture of 0.55. The image field 8 has an x-extent of two times 6.5 mm and a y-extent of 1.20 mm. The projection optical unit 33 is optimized for an operating wavelength of the illumination light 3 of 13.5 nm.

The projection optical unit 33 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 33 has exactly four mirrors for grazing incidence, namely the mirrors M2, M3, M5 and M6. The mirrors M1, M4, M7 and M8 are embodied as mirrors for normal incidence.

In the projection optical unit 33, a stop 18 is arranged in the beam path between the mirrors M1 and M2, near the grazing incidence on the mirror M2. Alternatively or additionally, a stop can be arranged directly on the surface of the mirror M2.

The projection optical unit 33 has a reducing imaging scale $\beta=7.00$.

An angle of incidence of the chief rays 16 in the object plane 5 is 6.4°.

In the yz-plane, an entrance pupil of the projection optical unit 33 lies 7700 mm in front of the object field 4 in the beam path of the illumination light. In the xy-plane (cf. FIG. 19), the entrance pupil lies 1775 mm after the object field in the imaging beam path of the projection optical unit 33. An extent of the chief rays 16 emanating from the object field 4 is therefore convergent both in the meridional section according to FIG. 18 and in the view according to FIG. 19.

In the xz-section (cf. FIG. 19), the stop 18 can lie at a position displaced in the z-direction compared to its position in the yz-section.

A z-distance between the object field 4 and the image field 8 is approximately 1290 mm.

An object/image offset ($d_{OIS}$) is approximately 1460 mm.

A free working distance between the mirror M7 and the image field 8 is 50 mm.

In the projection optical unit 33, a scanned RMS value for the wavefront aberration is at most 10 mλ and, on average, 8 mλ.

A maximum distortion value is at most 0.03 nm in the x-direction and at most 0.08 nm in the y-direction. A telecentricity value in the x-direction is at most 0.79 mrad on the image field-side and a telecentricity value in the y-direction is at most 0.37 mrad on the image field-side.

Further mirror data emerge from the following table.

TABLE 7 for FIG. 18/19

|  | M1 | M2 | M3 | M4 | M5 | M6 | M7 | M8 |
|---|---|---|---|---|---|---|---|---|
| Maximum angle of incidence [deg] | 20.9 | 81.5 | 85.5 | 6.0 | 79.1 | 81.9 | 17.1 | 8.3 |
| Mirror extent (x) [mm] | 224.5 | 366.3 | 511.9 | 611.2 | 448.5 | 225.0 | 261.2 | 652.2 |
| Mirror extent (y) [mm] | 219.5 | 326.9 | 514.4 | 83.3 | 225.0 | 308.6 | 167.8 | 642.2 |
| Maximum mirror diameter [mm] | 229.2 | 368.5 | 640.9 | 611.3 | 448.5 | 310.5 | 261.6 | 652.5 |

There is an intermediate image 19 in the beam path in the imaging beam path region between the mirrors M3 and M4 in the yz-plane (FIG. 18) and in the imaging beam path region between the mirrors M6 and M7 in the xz-plane (FIG. 19). The intermediate image 19 can also be present in the region of a reflection on the mirror M5 in the yz-plane.

The mirror M8 is obscured and includes a passage opening 17 for the passage of the illumination light 3 in the imaging beam path between the mirrors M6 and M7.

A pupil obscuration of the projection optical unit 33 is 14% of the image-side numerical aperture of the projection optical unit 33.

Only the last mirror M8 in the imaging beam path includes a passage opening 17 for the imaging light 3. All other mirrors M1 to M7 have a continuous reflection surface. The reflection surface of the mirror M8 is used around the passage opening 17 thereof.

The mirrors M1, M3, M4 and M8 have negative values for the radius, i.e. are, in principle, concave mirrors. The other mirrors M2, M5, M6 and M7 have positive values for the radius, i.e. are, in principle, convex mirrors. The mirrors M2, M3, M5 and M6 for grazing incidence have very large radii and only constitute small deviations from plane reflection surfaces.

Figure 20:
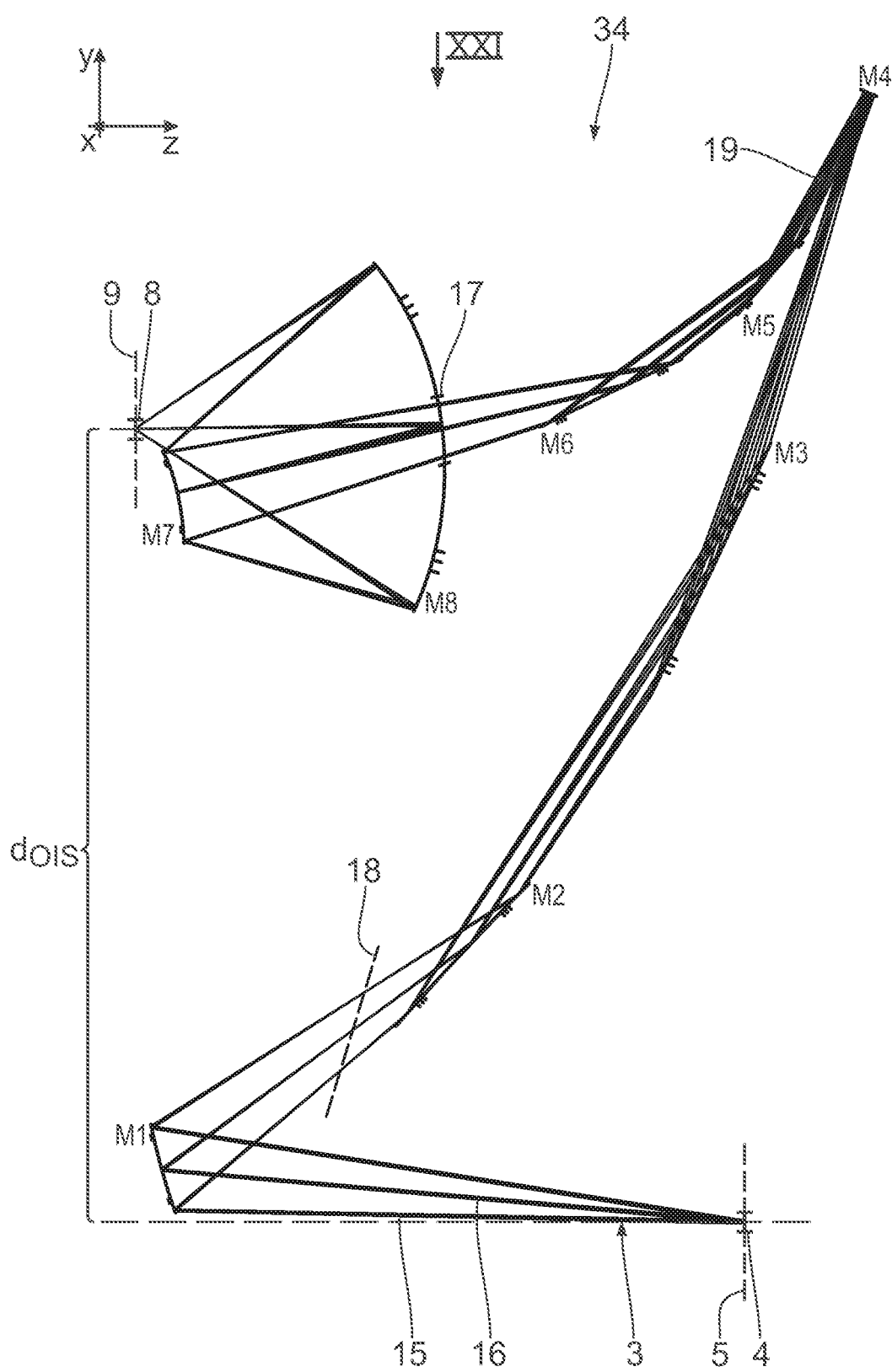
FIG. 20 shows, in an illustration similar to FIG. 2, a further embodiment of an imaging optical unit which can be used as a projection lens in the projection exposure apparatus according to FIG. 1, configured as an anamorphic optical unit.

A further embodiment of a projection optical unit 34, which can be used in the projection exposure apparatus 1 according to FIG. 1 instead of e.g. the projection optical unit 7, is explained in the following text on the basis of FIGS. 20 and 21. Components and functions which were already explained above in the context of FIGS. 1 to 19 are appropriately denoted by the same reference signs and are not discussed again in detail. FIG. 20 shows a meridional section of the projection optical unit 34. FIG. 21 shows a sagittal view of the projection optical unit 34.

The projection optical unit 34 has a total of 8 mirrors M1 to M8 and, in terms of the basic design thereof, it is similar to e.g. the projection optical unit 7 according to FIG. 2.

The projection optical unit 34 is embodied as anamorphic optical unit. In the yz-section according to FIG. 20, the projection optical unit 34 has a reducing imaging scale $\beta_y$ of 8.00. In the xz-plane (cf. FIG. 21) perpendicular thereto, the projection optical unit 34 has a reducing imaging scale $\beta_x$ of 4.00.

In combination with a rotationally symmetric exit pupil of the projection optical unit 34, these different imaging scales $\beta_x$, $\beta_y$ lead to an object-side numerical aperture being half the size in the yz-plane compared to the xz-plane, as emerges immediately from comparison between FIGS. 20 and 21. As a result of this, an advantageously small chief ray angle CRAO of 5.1° is obtained in the yz-plane.

Advantages of an anamorphic projection lens connected herewith are also discussed in US 2013/0128251 A1, which is incorporated in its entirety in this application by reference.

The anamorphic effect of the projection optical unit 34 is distributed to all optical surfaces of the mirrors M1 to M8.

The mirrors M1 to M8 are once again embodied as free-form surface mirrors, for which the free-form surface equation (1), specified above, applies. The optical design data from the projection optical unit 34 can be gathered from the following tables, which, in terms of their design, correspond to the tables for the projection optical unit 7 according to FIG. 2.

| Table 1 for FIG. 20/21 | |
|---|---|
| Exemplary embodiment | FIG. 20/21 |
| NA | 0.55 |
| Wavelength | 13.5 nm |
| Field dimension x | 26.0 mm |
| Field dimension y | 1.2 mm |
| Field curvature | 0.0 1/mm |
| Stop | S9 |

| Table 2 for FIG. 20/21 | | | | | |
|---|---|---|---|---|---|
| Surface | Radius x [mm] | Power x [1/mm] | Radius y [mm] | Power y [1/mm] | Operating |
| M8 | −1133.32747304 | 0.00175233 | −1023.64934352 | 0.00196760 | REFL |
| M7 | 4406.38826107 | −0.00045387 | 690.91205607 | −0.00289482 | REFL |
| M6 | 4739.61979766 | −0.00008693 | 10074.88948477 | −0.00096360 | REFL |
| M5 | 21144.94473278 | −0.00002037 | 72950.75367779 | −0.00012733 | REFL |
| M4 | −2867.38401976 | 0.00069495 | −4292.99198405 | 0.00046759 | REFL |
| M3 | — | 0.00002356 | — | 0.00071385 | REFL |
| M2 | −5190.31139364 | 0.00007024 | 7573.47590770 | −0.00144869 | REFL |
| M1 | −5923.95714844 | 0.00031586 | −1898.45455510 | 0.00112603 | REFL |

| Table 3a for FIG. 20/21 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −1133.32747300 | 4406.38826100 | 4739.61979800 |
| C7 | −1.37045485e−08 | 7.46796053e−08 | −2.88085237e−08 |
| C9 | −7.61541557e−09 | −1.45727199e−07 | −1.79062014e−08 |
| C10 | −7.69203582e−12 | 2.92796841e−10 | 4.42007445e−11 |
| C12 | −2.2092406e−11 | 1.13530474e−09 | −8.60191664e−12 |
| C14 | −1.03738908e−11 | 1.40909304e−09 | −4.58761129e−11 |
| C16 | −7.31775261e−15 | −1.31555425e−13 | −1.45618208e−13 |
| C18 | −1.17172291e−14 | −6.54062794e−13 | 4.24616003e−15 |
| C20 | −3.3983632e−15 | −3.50696381e−13 | −8.53811379e−14 |
| C21 | −9.15894595e−18 | 2.09018129e−16 | −9.75508493e−17 |
| C23 | −3.5991906e−17 | 2.50711167e−15 | 3.58424992e−16 |
| C25 | −3.77287782e−17 | 9.96925043e−15 | −1.56598011e−19 |
| C27 | −1.19641397e−17 | 7.56226507e−15 | −2.28737536e−16 |
| C29 | −5.75050439e−21 | 8.60467057e−19 | −9.76080298e−19 |
| C31 | −1.25790723e−20 | 4.36789592e−18 | −8.89549297e−19 |
| C33 | −1.03115676e−20 | −9.69395674e−18 | −3.40251221e−19 |
| C35 | −2.20183332e−21 | −3.27752356e−18 | −6.53545396e−19 |
| C36 | −8.33157821e−24 | 4.55264457e−22 | 4.12907772e−21 |
| C38 | −4.25998322e−23 | 7.24917406e−21 | 1.05866868e−20 |
| C40 | −6.98306225e−23 | 1.43589783e−20 | 3.05154424e−21 |
| C42 | −4.8336845e−23 | 8.43033547e−20 | 2.41517735e−23 |
| C44 | −1.40394078e−23 | 1.97591114e−19 | −1.6250366e−21 |
| C46 | −2.9814906e−27 | −4.16141287e−25 | 6.47812725e−23 |
| C48 | −1.1220021e−26 | −9.85706306e−24 | 2.80300383e−23 |
| C50 | −1.69711254e−26 | 4.09860054e−23 | 1.52687849e−23 |
| C52 | −8.57563301e−27 | 1.47027541e−22 | 7.02362488e−24 |
| C54 | 1.76715393e−28 | −6.99745034e−23 | −2.14951543e−24 |
| C55 | −6.6288945e−30 | 1.42110361e−27 | −2.82086233e−25 |
| C57 | −4.10869525e−29 | −4.51003428e−27 | −7.63377495e−25 |
| C59 | −9.17862325e−29 | 7.25467897e−26 | −2.77480674e−25 |
| C61 | −9.90356193e−29 | 3.9633015e−25 | −3.52163248e−26 |
| C63 | −5.59488161e−29 | 9.95569594e−25 | −8.0432973e−28 |
| C65 | −7.22003129e−30 | −4.21378e−24 | −2.74410127e−27 |
| C67 | −5.24619854e−33 | −8.35761662e−30 | −9.1548449e−28 |
| C69 | −2.01840485e−32 | 5.45404311e−29 | −5.39668302e−28 |
| C71 | −3.79282955e−32 | −2.97201132e−28 | −1.38362877e−27 |
| C73 | −2.44971235e−32 | 3.25227818e−28 | −3.68928781e−28 |
| C75 | −7.62727889e−33 | −8.7212421e−27 | −1.16531263e−28 |
| C77 | −5.7359611e−33 | 4.80554127e−27 | −4.17390192e−29 |
| C78 | −8.047176e−36 | −8.23504213e−33 | 7.06018116e−30 |
| C80 | −5.4403674e−35 | 2.3497042e−31 | 1.86040123e−29 |
| C82 | −1.67551366e−34 | 1.33047058e−30 | 1.3421476e−29 |
| C84 | −2.6900642e−34 | 5.04718453e−30 | 4.72484176e−30 |
| C86 | −2.38083651e−34 | −7.80809697e−30 | 4.75455568e−31 |
| C88 | −9.66546428e−35 | 1.17080611e−29 | −1.51988786e−31 |
| C90 | −2.31041974e−35 | 9.71583268e−29 | −2.31508815e−31 |
| C92 | 3.72879241e−39 | 1.17935322e−34 | 3.7709135e−34 |
| C94 | 1.5141875e−38 | −8.62572106e−36 | −7.82262879e−33 |
| C96 | 3.40542449e−38 | 3.38356865e−33 | 3.57455642e−32 |
| C98 | 3.58688134e−38 | −2.30440813e−34 | 1.60062441e−32 |
| C100 | −4.37695745e−39 | −7.67777542e−33 | 1.17807848e−33 |
| C102 | −9.00258499e−39 | 1.15560849e−31 | 4.06367757e−34 |
| C104 | 9.73217887e−39 | −1.330225e−31 | −5.19167519e−34 |
| C105 | −3.15681223e−43 | 8.5001124e−38 | −6.6141406e−35 |
| C107 | −6.71085246e−42 | −3.50192205e−37 | −1.25784732e−34 |
| C109 | 1.81013759e−41 | −3.77112897e−36 | −1.73593348e−34 |
| C111 | 1.21188506e−40 | −1.79399564e−35 | −1.92852546e−34 |

Table 3a for FIG. 20/21

| Coefficient | M8 | M7 | M6 |
|---|---|---|---|
| C113 | 2.12299664e−40 | 4.42096118e−35 | −1.73174517e−35 |
| C115 | 1.96801677e−40 | 3.78745494e−34 | −5.80388951e−36 |
| C117 | 6.74687492e−41 | −4.55929668e−35 | 7.22309558e−37 |
| C119 | 1.51520616e−41 | −4.50734906e−34 | −4.27492138e−37 |
| C121 | −3.77954419e−45 | 0 | 0 |
| C123 | −5.73506768e−44 | 0 | 0 |
| C125 | −1.67581738e−43 | 0 | 0 |
| C127 | −2.67358045e−43 | 0 | 0 |
| C129 | −2.40296709e−43 | 0 | 0 |
| C131 | −8.92457112e−44 | 0 | 0 |
| C133 | −1.44215565e−44 | 0 | 0 |
| C135 | −1.25305206e−44 | 0 | 0 |
| C136 | −1.34456467e−47 | 0 | 0 |
| C138 | −1.15917807e−46 | 0 | 0 |
| C140 | −4.9202134e−46 | 0 | 0 |
| C142 | −1.261638e−45 | 0 | 0 |
| C144 | −1.92457136e−45 | 0 | 0 |
| C146 | −1.81299242e−45 | 0 | 0 |
| C148 | −1.06311202e−45 | 0 | 0 |
| C150 | −3.31331362e−46 | 0 | 0 |
| C152 | −4.79751657e−47 | 0 | 0 |

Table 3b for FIG. 20/21

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 21144.94473000 | −2867.38402000 | −10853.57484000 |
| C7 | −8.13271685e−08 | −3.58841707e−08 | 5.29876767e−10 |
| C9 | −5.82176386e−08 | −7.04518606e−07 | 2.10519305e−09 |
| C10 | 9.37452981e−12 | 1.30052051e−12 | −6.30399752e−12 |
| C12 | 3.00680111e−11 | 1.85556236e−10 | −5.20862433e−12 |
| C14 | 8.83038021e−11 | 3.5873503e−09 | −3.58045717e−12 |
| C16 | 4.50889445e−14 | −8.90737179e−15 | 1.13557992e−14 |
| C18 | −8.85586769e−15 | −1.37507133e−12 | −1.13089347e−16 |
| C20 | −2.84535698e−13 | −2.40161213e−11 | 1.2693646e−15 |
| C21 | −4.0259975e−17 | 9.84110093e−19 | −1.07753791e−17 |
| C23 | −1.60627908e−16 | 1.18787038e−16 | −4.13074732e−18 |
| C25 | −2.12462221e−16 | 1.07305967e−14 | −2.6198811e−18 |
| C27 | 7.88491781e−16 | 1.62876389e−13 | −1.51826315e−18 |
| C29 | 8.29816991e−20 | −1.42315568e−21 | 8.37815153e−21 |
| C31 | 4.09821249e−19 | −1.53159656e−18 | 2.70592478e−21 |
| C33 | 1.04060872e−18 | −1.00776807e−16 | 9.75607155e−22 |
| C35 | −2.28976537e−18 | −1.25474518e−15 | 1.00241528e−21 |
| C36 | −1.07018867e−22 | 1.36622356e−24 | −3.00882158e−23 |
| C38 | −4.94074303e−23 | 2.88428049e−23 | 2.10003322e−24 |
| C40 | −1.34527055e−21 | 1.98696867e−20 | 8.31511411e−24 |
| C42 | −4.60972729e−21 | 1.12695754e−18 | 3.79721863e−24 |
| C44 | 4.81654378e−21 | 1.6445151e−17 | −1.75074004e−25 |
| C46 | 1.01635491e−24 | −5.39059369e−27 | 2.00075589e−26 |
| C48 | −9.38768461e−25 | 6.02027898e−25 | 1.15956882e−26 |
| C50 | −7.09696896e−24 | 1.64761111e−22 | −5.38272606e−27 |
| C52 | −2.38402664e−24 | 3.42328361e−21 | −2.97501451e−27 |
| C54 | −2.26239625e−23 | −3.23207317e−19 | −5.02183701e−28 |
| C55 | 1.26386187e−28 | 1.71520917e−30 | 9.81733067e−30 |
| C57 | −2.83068278e−27 | 8.46560169e−29 | −3.36674986e−29 |
| C59 | 2.46204893e−26 | −1.62710492e−26 | −9.5444995e−29 |
| C61 | 9.95586051e−26 | −8.19930234e−24 | −8.78074754e−29 |
| C63 | 1.01878932e−25 | 1.62250965e−22 | −3.16474709e−29 |
| C65 | 1.91562178e−25 | −5.94818356e−21 | −4.32421248e−30 |
| C67 | −3.08120032e−30 | −1.7543011e−33 | −6.8780555e−32 |
| C69 | 4.41107086e−30 | −4.30759864e−30 | −8.633439e−32 |
| C71 | −2.847253e−29 | −2.73981339e−27 | 6.96849436e−32 |
| C73 | 4.4951507e−30 | −1.83904472e−25 | 8.79586218e−32 |
| C75 | 8.74287892e−29 | −8.91906155e−24 | 2.23940855e−32 |
| C77 | −6.9255095e−28 | 2.64874371e−22 | 4.81131842e−33 |
| C78 | 2.23687462e−34 | −1.85559281e−36 | −5.94735011e−35 |
| C80 | −7.0923897e−33 | −8.80329782e−35 | 1.42958234e−34 |
| C82 | −2.40355343e−31 | 1.32753328e−31 | 3.76354599e−34 |

Table 3b for FIG. 20/21

| Coefficient | M5 | M4 | M3 |
|---|---|---|---|
| C84 | −1.33477305e−30 | 6.7062528e−29 | 4.22628687e−34 |
| C86 | −3.52926483e−30 | 4.70367187e−27 | 2.68539626e−34 |
| C88 | −4.04944897e−30 | −1.60136059e−25 | 9.37754675e−35 |
| C90 | −2.28582075e−32 | 3.37934991e−24 | 1.01872115e−35 |
| C92 | 1.53053664e−35 | 1.03181863e−38 | 4.49578153e−37 |
| C94 | 1.90635627e−34 | 7.96148268e−37 | 4.15343568e−37 |
| C96 | 1.7721621e−33 | 5.60447131e−33 | −1.33200295e−37 |
| C98 | 7.04887896e−33 | 5.29126054e−31 | −4.53303133e−37 |
| C100 | 1.53325023e−32 | 6.99281316e−29 | −2.18759113e−37 |
| C102 | 1.55847895e−32 | 0 | −2.6400999e−38 |
| C104 | 5.50738373e−33 | 0 | −5.86276203e−39 |
| C105 | −3.29469714e−39 | 2.0787905e−42 | −7.97361647e−43 |
| C107 | −6.03049846e−38 | 8.43168465e−40 | −9.19641517e−40 |
| C109 | −5.38471092e−37 | −2.34623974e−37 | −7.68527335e−40 |
| C111 | −3.36030533e−36 | −1.09110522e−34 | −5.25251603e−40 |
| C113 | −1.05801312e−35 | −2.66122693e−32 | −3.43774941e−40 |
| C115 | −2.05317853e−35 | 0 | −3.0477398e−40 |
| C117 | −1.88191883e−35 | 0 | −1.37941097e−40 |
| C119 | −9.0448429e−36 | 0 | −1.23378749e−41 |

Table 3c for FIG. 20/21

| Coefficient | M2 | M1 |
|---|---|---|
| KY | 0.00000000 | 0.00000000 |
| KX | 0.00000000 | 0.00000000 |
| RX | −5190.31139400 | −5923.95714800 |
| C7 | −5.28973257e−09 | −9.34107203e−08 |
| C9 | 3.16117691e−08 | −3.08170947e−08 |
| C10 | −3.5113151e−11 | 2.15749003e−11 |
| C12 | −5.94839832e−11 | −4.16147444e−11 |
| C14 | 4.15396704e−11 | −9.60232617e−12 |
| C16 | 8.8719325e−14 | −1.38710348e−13 |
| C18 | 2.11910791e−14 | −4.21723708e−13 |
| C20 | 5.83626437e−14 | 1.56831697e−13 |
| C21 | −7.52771425e−17 | 2.2883345e−17 |
| C23 | 2.86726561e−17 | −7.98916101e−17 |
| C25 | −6.07859472e−17 | −6.15893157e−16 |
| C27 | 9.82616796e−17 | 6.98313821e−16 |
| C29 | −1.44090078e−21 | −1.67084874e−20 |
| C31 | 1.04190298e−19 | 1.24909603e−19 |
| C33 | 1.81953338e−20 | −5.55656679e−19 |
| C35 | 2.0422779e−19 | −3.23336886e−18 |
| C36 | −1.68993866e−23 | −3.08540907e−25 |
| C38 | −5.92115931e−23 | −6.92333888e−22 |
| C40 | 3.83068102e−23 | −1.17221531e−21 |
| C42 | −9.31939644e−23 | 1.57625031e−21 |
| C44 | 3.54805796e−22 | −4.85282982e−20 |
| C46 | 1.64542991e−25 | 7.61056694e−26 |
| C48 | −2.94838765e−25 | 1.5289645e−24 |
| C50 | −1.09554398e−24 | 8.66857734e−24 |
| C52 | −1.81472711e−24 | 2.18885048e−23 |
| C54 | −1.10156139e−25 | 2.98501444e−22 |
| C55 | −3.91686651e−28 | −3.84029125e−29 |
| C57 | −9.77388973e−28 | 8.12604652e−27 |
| C59 | −6.14630023e−28 | 4.79732982e−26 |
| C61 | −1.27909521e−27 | 3.3152603e−26 |
| C63 | −4.46201357e−27 | −2.9689908e−25 |
| C65 | −2.14425067e−28 | 2.24300892e−24 |
| C67 | 3.17153528e−32 | −3.98900423e−30 |
| C69 | 6.31254012e−30 | −4.30683926e−29 |
| C71 | 1.77074038e−29 | −3.09345554e−28 |
| C73 | 2.94127232e−29 | −3.2763638e−28 |
| C75 | 1.7371783e−29 | 1.84376033e−28 |
| C77 | 9.59406388e−30 | −9.29242727e−27 |
| C78 | 2.26427738e−33 | 6.44291133e−34 |
| C80 | 6.98015663e−33 | −7.26102976e−32 |
| C82 | 3.90295139e−33 | −8.26037127e−31 |
| C84 | 1.00563556e−32 | −2.47229342e−30 |
| C86 | 5.31207359e−32 | 1.36267497e−30 |
| C88 | 4.68167146e−32 | 1.1558863e−29 |
| C90 | 2.22750927e−32 | −6.48766222e−29 |
| C92 | 4.94909078e−36 | 2.123736e−35 |
| C94 | −2.40458792e−35 | 2.73287712e−34 |
| C96 | −6.91070231e−35 | 2.28462552e−33 |
| C98 | −1.61918658e−34 | 6.85274826e−33 |
| C100 | −1.44300155e−34 | −4.32046035e−33 |
| C102 | −7.93406187e−35 | −1.07655048e−32 |
| C104 | −1.66530071e−35 | 1.27235198e−31 |
| C105 | 5.86498685e−40 | −4.29231126e−39 |
| C107 | −1.54194375e−38 | 2.35882135e−37 |
| C109 | −7.13318326e−39 | 4.70203204e−36 |
| C111 | −1.43456171e−38 | 2.37591177e−35 |
| C113 | −1.90286626e−37 | 3.22170482e−35 |
| C115 | −2.94354338e−37 | −8.87390817e−35 |
| C117 | −2.19039138e−37 | −1.98534313e−34 |
| C119 | −6.06928085e−38 | 8.31104332e−34 |

Table 4a for FIG. 20/21

| Surface | DCX | DCY | DCZ |
|---|---|---|---|
| Image plane | 0.00000000 | 0.00000000 | 0.00000000 |
| M8 | 0.00000000 | 0.35696376 | 928.41215449 |
| M7 | 0.00000000 | −194.00592810 | 123.62549517 |
| M6 | 0.00000000 | 110.73807678 | 1485.21127288 |
| M5 | 0.00000000 | 410.24860809 | 1906.05090667 |
| M4 | 0.00000000 | 989.83215098 | 2227.66851159 |
| M3 | 0.00000000 | −480.76794337 | 1725.54436925 |
| M2 | 0.00000000 | −1586.00680196 | 983.72854005 |
| Stop | 0.00000000 | −1833.30051904 | 630.89726836 |
| M1 | 0.00000000 | −2256.96990972 | 48.20891557 |
| Object plane | 0.00000000 | −2433.04940926 | 1809.33615616 |

Table 4b for FIG. 20/21

| Surface | TLA [deg] | TLB [deg] | TLC [deg] |
|---|---|---|---|
| Image plane | −0.00000000 | 0.00000000 | −0.00000000 |
| M8 | −6.81158601 | 0.00000000 | −0.00000000 |
| M7 | 166.85343770 | 0.00000000 | −0.00000000 |
| M6 | 65.47067671 | 0.00000000 | −0.00000000 |
| M5 | 41.13388792 | 0.00000000 | −0.00000000 |
| M4 | −66.25259654 | 0.00000000 | −0.00000000 |
| M3 | 26.32646837 | 0.00000000 | −0.00000000 |
| M2 | 43.98793212 | 0.00000000 | −0.00000000 |
| Stop | 17.85348492 | 0.00000000 | −0.00000000 |
| M1 | 165.03170476 | 0.00000000 | −0.00000000 |
| Object plane | 0.84183854 | 0.00000000 | −0.00000000 |

Table 5 for FIG. 20/21

| Surface | Êinfallswinkel [deg] | Reflectivity |
|---|---|---|
| M8 | 6.79146457 | 0.66081301 |
| M7 | 0.47255204 | 0.66566232 |
| M6 | 78.11128013 | 0.85242200 |
| M5 | 77.56569142 | 0.84450121 |
| M4 | 4.90369075 | 0.66322257 |
| M3 | 82.65450170 | 0.91169087 |
| M2 | 79.49691949 | 0.87161748 |
| M1 | 20.67887147 | 0.60924189 |
| Overall transmission | | 0.1017 |

Table 6 for FIG. 20/21

| X [mm] | Y [mm] | Z [mm] |
|---|---|---|
| 0.00000000 | −127.83604117 | 0.00000000 |
| −42.47230052 | −125.94642328 | 0.00000000 |
| −84.13944596 | −120.36530056 | 0.00000000 |
| −124.19202701 | −111.34341136 | 0.00000000 |
| −161.81430598 | −99.26141457 | 0.00000000 |
| −196.18564839 | −84.58693884 | 0.00000000 |
| −226.48648672 | −67.83445412 | 0.00000000 |
| −251.91061812 | −49.53759338 | 0.00000000 |
| −271.68668618 | −30.23530779 | 0.00000000 |
| −285.11143299 | −10.46743152 | 0.00000000 |
| −291.59521276 | 9.22826034 | 0.00000000 |
| −290.71624730 | 28.32744481 | 0.00000000 |
| −282.27411538 | 46.34275447 | 0.00000000 |
| −266.32872550 | 62.84972374 | 0.00000000 |
| −243.21383327 | 77.50530904 | 0.00000000 |
| −213.52264822 | 90.05981266 | 0.00000000 |
| −178.07097077 | 100.36136137 | 0.00000000 |
| −137.84767730 | 108.34615051 | 0.00000000 |
| −93.96325338 | 114.01343410 | 0.00000000 |
| −47.60455320 | 117.39298190 | −0.00000000 |
| −0.00000000 | 118.51540025 | 0.00000000 |
| 47.60455320 | 117.39298190 | −0.00000000 |
| 93.96325338 | 114.01343410 | 0.00000000 |
| 137.84767730 | 108.34615051 | 0.00000000 |
| 178.07097077 | 100.36136137 | 0.00000000 |
| 213.52264822 | 90.05981266 | 0.00000000 |
| 243.21383327 | 77.50530904 | 0.00000000 |
| 266.32872550 | 62.84972374 | 0.00000000 |
| 282.27411538 | 46.34275447 | 0.00000000 |
| 290.71624730 | 28.32744481 | 0.00000000 |
| 291.59521276 | 9.22826034 | 0.00000000 |
| 285.11143299 | −10.46743152 | 0.00000000 |
| 271.68668618 | −30.23530779 | 0.00000000 |
| 251.91061812 | −49.53759338 | 0.00000000 |
| 226.48648672 | −67.83445412 | 0.00000000 |
| 196.18564839 | −84.58693884 | 0.00000000 |
| 161.81430598 | −99.26141457 | 0.00000000 |
| 124.19202701 | −111.34341136 | 0.00000000 |

Table 6 for FIG. 20/21

| X [mm] | Y [mm] | Z [mm] |
|---|---|---|
| 84.13944596 | −120.36530056 | 0.00000000 |
| 42.47230052 | −125.94642328 | 0.00000000 |

An overall reflectivity of the projection optical unit 34 is 10.17%.

The projection optical unit 34 has an image-side numerical aperture of 0.55. The image field 8 has an x-extent of two times 13 mm and a y-extent of 1.20 mm. The projection optical unit 34 is optimized for an operating wavelength of the illumination light 3 of 13.5 nm.

The projection optical unit 34 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 34 has exactly four mirrors for grazing incidence, namely the mirrors M2, M3, M5 and M6. The mirrors M1, M4, M7 and M8 are embodied as mirrors for normal incidence.

In the projection optical unit 34, a stop 18 is arranged in the beam path between the mirrors M1 and M2, near the grazing incidence on the mirror M2. Alternatively or additionally, a stop can be arranged directly on the surface of the mirror M2.

In the xz-plane (cf. FIG. 21), an entrance pupil of the projection optical unit 34 lies 2740 mm in front of the object field 4 in the beam path of the illumination light. In the yz-plane, the entrance pupil lies 5430 mm after the object field in the imaging beam path of the projection optical unit 34. An extent of the chief rays 16 emanating from the object field 4 is therefore convergent both in the meridional section according to FIG. 20 and in the view according to FIG. 21.

In the xz-section (cf. FIG. 21), the stop 18 can lie at a position displaced in the z-direction compared to its position in the yz-section. The stop 18 is planar and tilted with respect to the image field. The long extent of the stop 18 in the x-direction is 583.18 mm. The overall extent of the stop 18 in the y-direction is 238.85 mm.

A z-distance between the object field 4 and the image field 8 is approximately 1850 mm.

An object/image offset ($d_{OIS}$) is approximately 2400 mm.

A free working distance between the mirror M7 and the image field 8 is 83 mm.

In the projection optical unit 34, a scanned RMS value for the wavefront aberration is at most 8 mλ and, on average, 7 mλ.

A maximum distortion value is at most 0.10 nm in the x-direction and at most 0.10 nm in the y-direction. A telecentricity value in the x-direction is at most 1.58 mrad on the image field-side and a telecentricity value in the y-direction is at most 0.15 mrad on the image field-side.

Further mirror data emerge from the following table.

TABLE 7 for FIG. 20/21

| | M1 | M2 | M3 | M4 | M5 | M6 | M7 | M8 |
|---|---|---|---|---|---|---|---|---|
| Maximum angle of incidence [deg] | 20.9 | 81.9 | 83.8 | 7.0 | 79.8 | 81.2 | 17.2 | 8.3 |
| Mirror extent (x) [mm] | 525.7 | 662.4 | 847.1 | 984.1 | 675.6 | 325.0 | 482.9 | 1074.4 |

TABLE 7-continued for FIG. 20/21

| | M1 | M2 | M3 | M4 | M5 | M6 | M7 | M8 |
|---|---|---|---|---|---|---|---|---|
| Mirror extent (y) [mm] | 268.1 | 512.7 | 856.1 | 66.4 | 336.1 | 466.1 | 277.4 | 1053.4 |
| Maximum mirror diameter [mm] | 525.8 | 662.5 | 926.3 | 984.1 | 675.6 | 470.0 | 483.0 | 1076.0 |

There is an intermediate image 19 in the beam path in the region of a reflection on the mirror M4 in the yz-plane (FIG. 20) and in the imaging beam path region between the mirrors M6 and M7 parallel to the xz-plane (FIG. 21).

The mirror M8 is obscured and includes a passage opening 17 for the passage of the illumination light 3 in the imaging beam path between the mirrors M6 and M7.

Only the last mirror M8 in the imaging beam path includes a passage opening 17 for the imaging light 3. All other mirrors M1 to M7 have a continuous reflection surface. The reflection surface of the mirror M8 is used around the passage opening 17 thereof.

The mirrors M1, M3, M4 and M8 have negative values for the radius, i.e. are, in principle, concave mirrors. The other mirrors M2, M5, M6 and M7 have positive values for the radius, i.e. are, in principle, convex mirrors. The mirrors M2, M3, M5 and M6 for grazing incidence have very large radii and only constitute small deviations from plane reflection surfaces.

Figure 21A:
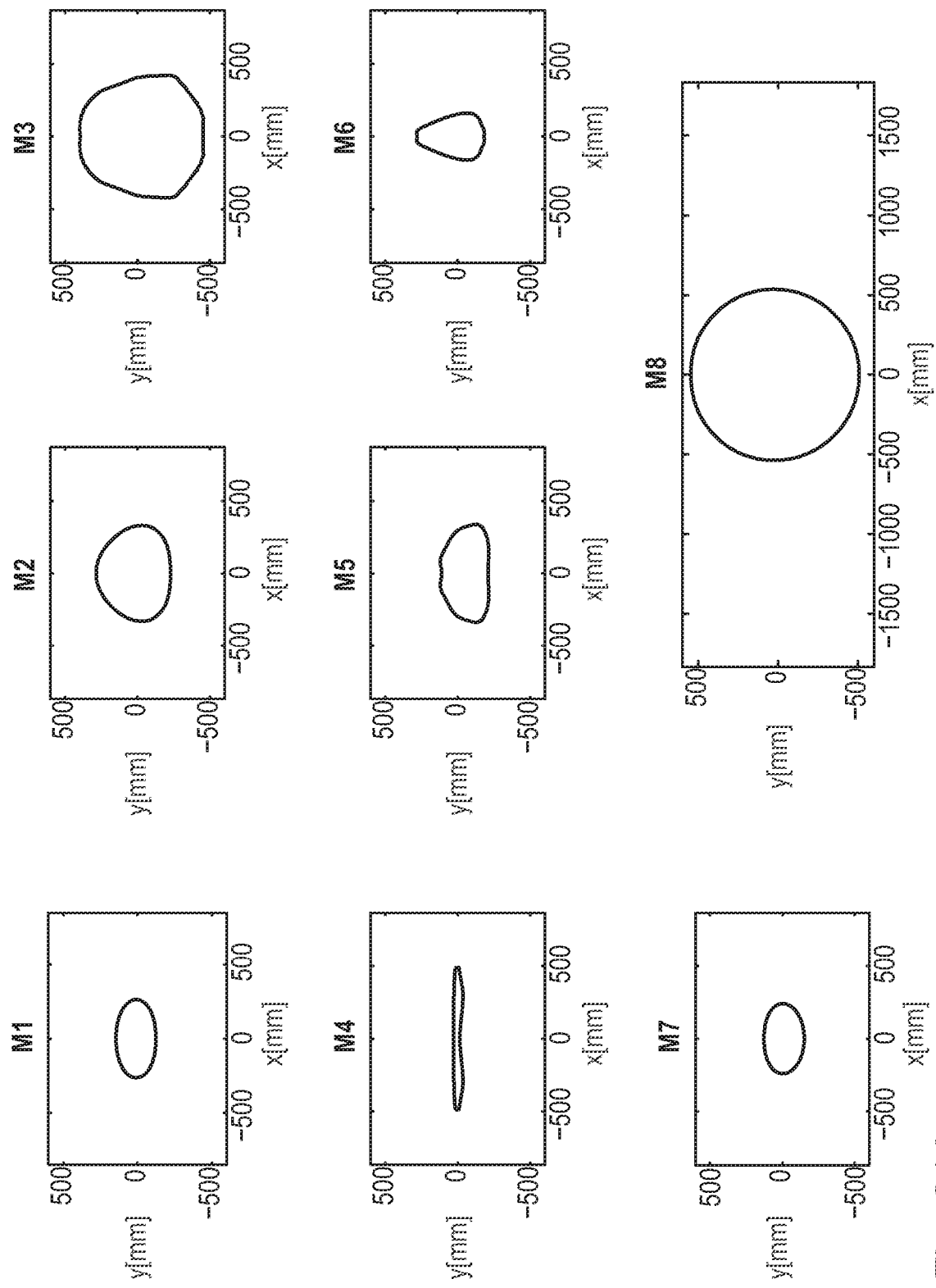
FIG. 21A shows views of edge contours of optically used surfaces of the mirrors of the imaging optical unit according to FIGS. 20 and 21.

FIG. 21A shows edge contours of the surfaces on the mirrors M1 to M8 of the projection optical unit 34 which are in each case impinged upon by illumination light 3, i.e. the so-called footprints of the mirrors M1 to M8. These edge contours are in each case depicted in an x/y-diagram which corresponds to the local x- and y-coordinates of the respective mirror M1 to M8. The illustrations are true to scale in millimeters. The mirrors M2, M3 and M8 have an x/y-aspect ratio which does not deviate, or only deviates slightly, from the value 1. The mirrors M1 and M5 and also M7 have an x/y-aspect ratio of approximately 2. The mirror M4 has an x/y-aspect ratio of approximately 15. The mirror M6 has an x/y-aspect ratio of approximately 0.7.

A further embodiment of a projection optical unit 35, which can be used in the projection exposure apparatus 1 according to FIG. 1 instead of e.g. the projection optical unit 7, is explained in the following text on the basis of FIGS. 22 and 23. Components and functions which were already explained above in the context of FIGS. 1 to 21A are appropriately denoted by the same reference signs and are not discussed again in detail.

Figure 22:
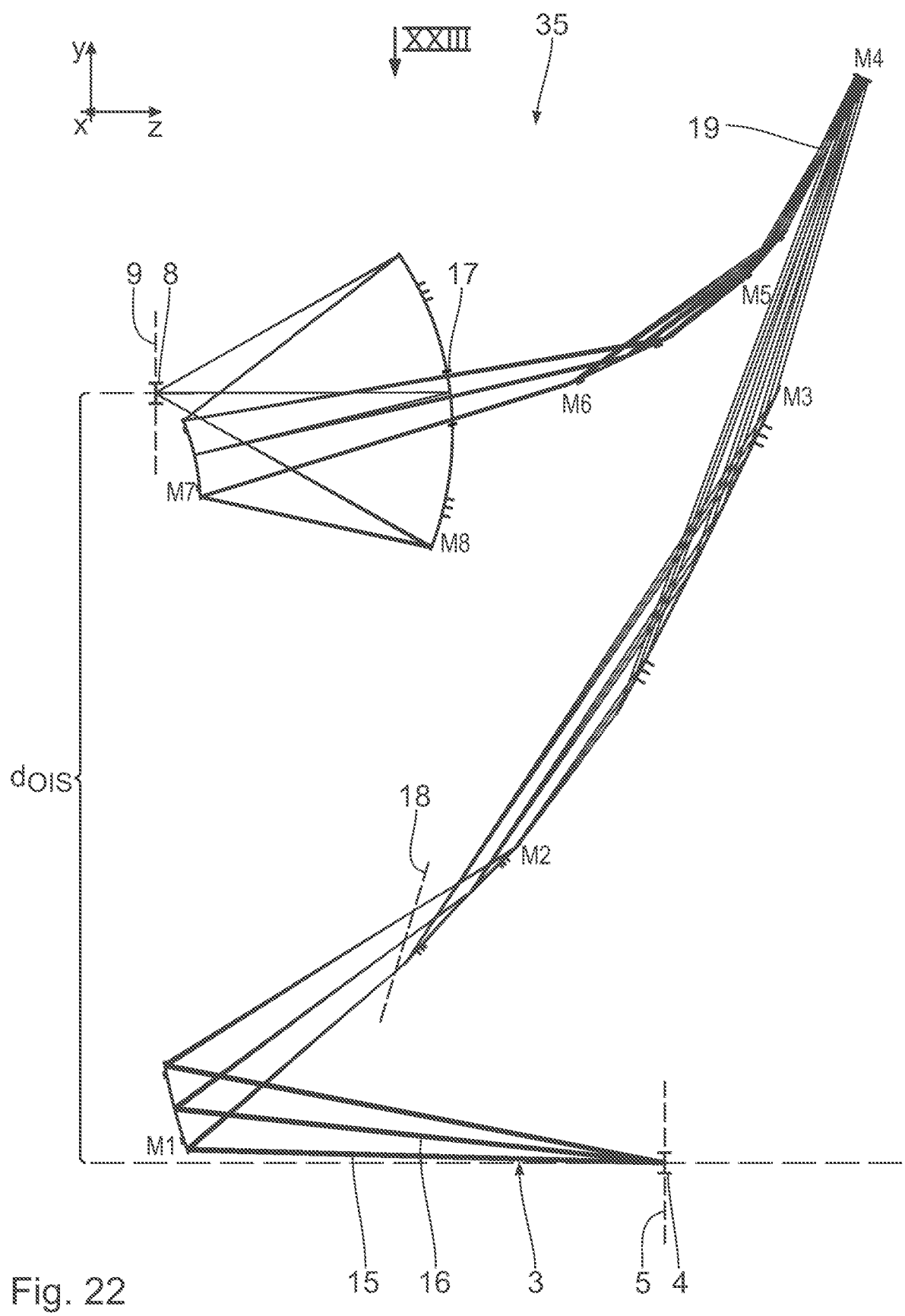
FIG. 22 shows, in an illustration similar to FIG. 2, a further embodiment of an imaging optical unit which can be used as a projection lens in the projection exposure apparatus according to FIG. 1, configured as an anamorphic optical unit.

FIG. 22 shows a meridional section of the projection optical unit 35. FIG. 23 shows a sagittal view of the projection optical unit 35.

The projection optical unit 35 has a total of 8 mirrors M1 to M8 and, in terms of the basic design thereof, it is similar to e.g. the projection optical unit 7 according to FIG. 2.

The projection optical unit 35 is embodied as anamorphic optical unit. In the yz-section according to FIG. 22, the projection optical unit 35 has a reducing imaging scale $\beta_y$ of 6.00. In the xz-plane (cf. FIG. 23) perpendicular thereto, the projection optical unit 35 has a reducing imaging scale $\beta_x$ of 4.00.

Figure 23:
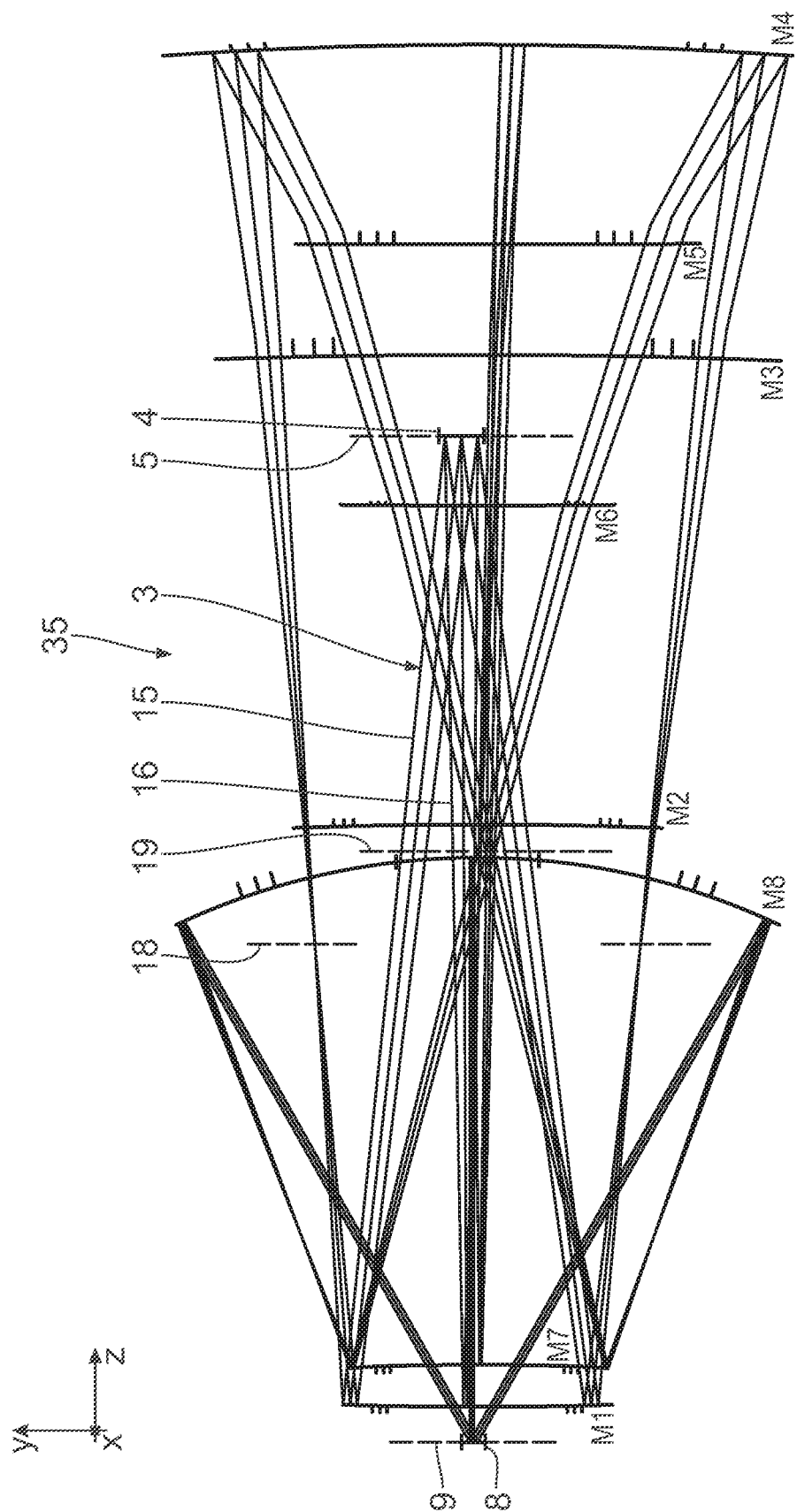
FIG. 23 shows a view of the imaging optical unit according to FIG. 22, seen from the viewing direction XXIII in FIG. 22.

These different imaging scales $\beta_x$, $\beta_y$ lead to an object-side numerical aperture being smaller in the yz-plane than in the xz-plane, as emerges immediately from comparison between FIGS. 22 and 23. As a result of this, an advantageously small chief ray angle CRAO of 6.3° is obtained in the yz-plane.

The anamorphic effect of the projection optical unit 35 is distributed to all optical surfaces of the mirrors M1 to M8.

The mirrors M1 to M8 are once again embodied as free-form surface mirrors, for which the free-form surface equation (1), specified above, applies. The optical design data from the projection optical unit 35 can be gathered from the following tables, which, in terms of their design, correspond to the tables for the projection optical unit 7 according to FIG. 2.

Table 1 for FIG. 22/23

| Exemplary embodiment | FIG. 22/23 |
|---|---|
| NA | 0.49 |
| Wavelength | 13.5 nm |
| Field dimension x | 26.0 mm |
| Field dimension y | 1.6 mm |
| Field curvature | 0.0 1/mm |
| Stop | S9 |

Table 2 for FIG. 22/23

| Surface | Radius x [mm] | Power x [1/mm] | Radius y [mm] | Power y [1/mm] | Operating |
|---|---|---|---|---|---|
| M8 | −1121.37889641 | 0.00177101 | −1023.61301917 | 0.00196766 | REFL |
| M7 | 4813.84973129 | −0.00041545 | 689.47522791 | −0.00290086 | REFL |
| M6 | 7961.52706392 | −0.00005196 | 10472.69061413 | −0.00092320 | REFL |
| M5 | 63451.73749313 | −0.00000674 | — | 0.00013019 | REFL |
| M4 | −2879.29868612 | 0.00069194 | −5323.52677528 | 0.00037714 | REFL |
| M3 | — | 0.00002283 | — | 0.00079438 | REFL |
| M2 | −6051.13629901 | 0.00005747 | 5373.11013087 | −0.00214085 | REFL |
| M1 | −7070.71042694 | 0.00026365 | −1740.13114618 | 0.00123306 | REFL |

| Table 3a for FIG. 22/23 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −1121.37889600 | 4813.84973100 | 7961.52706400 |
| C7 | −1.18303428e−08 | 1.38677591e−07 | 4.50959592e−08 |
| C9 | −9.04489424e−09 | −2.49942276e−07 | −3.22908374e−08 |
| C10 | −5.56852211e−12 | 3.59231824e−10 | 1.39261473e−10 |
| C12 | −2.2156858e−11 | 1.11674106e−09 | −1.58384659e−10 |
| C14 | −6.4485662e−12 | 7.68944651e−10 | −4.64967002e−11 |
| C16 | −5.99476799e−15 | −1.25877621e−13 | −6.14806551e−13 |
| C18 | −1.17154189e−14 | −8.32139172e−13 | 6.1577807e−14 |
| C20 | −6.35164457e−15 | −1.04560226e−12 | −1.56127394e−13 |
| C21 | −1.01505313e−17 | 2.28624052e−16 | −3.24656403e−16 |
| C23 | −3.58157787e−17 | 2.8674558e−15 | 1.48986258e−15 |
| C25 | −3.28325694e−17 | 7.19573474e−15 | −4.96219439e−16 |
| C27 | −7.73325248e−18 | 3.33755229e−15 | −3.25304321e−16 |
| C29 | −4.20439801e−21 | 1.11781377e−18 | 1.99348552e−18 |
| C31 | −1.22366176e−20 | 2.12044512e−18 | −3.13360785e−18 |
| C33 | −1.33129381e−20 | −1.15534587e−17 | −6.05173065e−20 |
| C35 | −4.96149215e−21 | −1.08505991e−17 | −7.96524541e−19 |
| C36 | −8.64520812e−24 | 1.17916451e−21 | 4.32310419e−22 |
| C38 | −4.20401284e−23 | 7.44374387e−21 | −6.15076012e−21 |
| C40 | −6.32215484e−23 | 1.2747226e−20 | 6.73662583e−21 |
| C42 | −3.86493292e−23 | 4.95955342e−20 | −6.33665608e−22 |
| C44 | −7.91782043e−24 | 3.24541865e−20 | −2.74989457e−21 |
| C46 | −2.33453384e−27 | −2.60631426e−24 | −3.91508173e−24 |
| C48 | −1.2111516e−26 | −2.33541368e−23 | 1.99392725e−24 |
| C50 | −2.11068645e−26 | −3.6973872e−23 | −2.14301967e−23 |
| C52 | −1.4752144e−26 | −7.99170432e−23 | −1.74710333e−23 |
| C54 | −2.78281412e−27 | 2.51969672e−22 | −8.23051883e−24 |
| C55 | −9.3090786e−30 | −5.20473578e−28 | −3.87769553e−27 |
| C57 | −4.82558402e−29 | 7.88777677e−27 | 2.66612565e−27 |
| C59 | −1.01014959e−28 | 8.54406184e−26 | −5.91238257e−26 |
| C61 | −1.01884048e−28 | 2.13476338e−25 | −9.52500131e−26 |
| C63 | −4.93105369e−29 | 1.13995538e−24 | −5.50812191e−26 |
| C65 | −8.3687505e−30 | −5.12746033e−25 | −2.47004376e−26 |
| C67 | −7.38344559e−34 | 1.47520112e−29 | 7.1085924e−29 |
| C69 | −5.65274775e−33 | 1.61742091e−28 | 3.53277318e−28 |
| C71 | −1.37764606e−32 | 3.44509275e−28 | 2.93969176e−28 |
| C73 | −1.94275915e−32 | 5.48602534e−28 | 2.20566794e−28 |
| C75 | −1.39583588e−32 | −5.18813001e−27 | 1.06448096e−28 |
| C77 | −4.27384745e−33 | −4.35332176e−27 | −9.78424185e−29 |
| C78 | −8.54420454e−37 | 8.35040636e−33 | 2.58890164e−32 |
| C80 | −2.31228001e−35 | 1.76870158e−31 | −5.38428428e−31 |
| C82 | −5.6838319e−35 | 1.22604787e−31 | −5.84517587e−31 |
| C84 | −7.66291033e−35 | −2.91896005e−31 | 1.4024938e−30 |
| C86 | −6.31178383e−35 | −2.08128795e−30 | 2.01491828e−30 |
| C88 | −3.30768172e−35 | 5.15327359e−30 | 2.88799603e−31 |
| C90 | −6.60293612e−36 | 6.34662561e−30 | −1.56186793e−31 |
| C92 | −6.89240073e−39 | 0 | 0 |
| C94 | −2.22316469e−38 | 0 | 0 |
| C96 | −6.89815447e−38 | 0 | 0 |
| C98 | −9.26549465e−38 | 0 | 0 |
| C100 | −5.535508e−38 | 0 | 0 |
| C102 | −1.37382595e−38 | 0 | 0 |
| C104 | −2.77235312e−39 | 0 | 0 |
| C105 | −1.32648355e−41 | 0 | 0 |
| C107 | −1.08701271e−40 | 0 | 0 |
| C109 | −3.57659282e−40 | 0 | 0 |
| C111 | −6.22339725e−40 | 0 | 0 |
| C113 | −6.31535758e−40 | 0 | 0 |
| C115 | −3.50492314e−40 | 0 | 0 |
| C117 | −8.26138611e−41 | 0 | 0 |
| C119 | −4.09212691e−42 | 0 | 0 |

| Table 3b for FIG. 22/23 | | | |
|---|---|---|---|
| Coefficient | M5 | M4 | M3 |
| KY | 0.00000000 | 0.00000000 | 0.00000000 |
| KX | 0.00000000 | 0.00000000 | 0.00000000 |
| RX | 63451.73749000 | −2879.29868600 | −11586.49414000 |

Table 3b for FIG. 22/23

| Coefficient | M5 | M4 | M3 |
|---|---|---|---|
| C7 | −9.65439819e−08 | −5.21928877e−08 | −5.17057407e−09 |
| C9 | −4.4513793e−08 | −6.81657841e−07 | 3.86113841e−09 |
| C10 | 2.42543649e−11 | 7.64041622e−13 | −1.02639927e−11 |
| C12 | 8.44525177e−11 | 1.99750296e−10 | −4.79572504e−12 |
| C14 | 7.04127351e−11 | 3.06515788e−09 | −4.42190289e−12 |
| C16 | −3.41516947e−14 | −2.37609081e−14 | 8.82004007e−15 |
| C18 | −1.98478544e−13 | −1.56031785e−12 | −9.88386961e−16 |
| C20 | −2.68645804e−13 | −1.9204511e−11 | 1.72706853e−15 |
| C21 | −3.59158408e−17 | 1.13052962e−18 | 3.41000671e−18 |
| C23 | 3.64471697e−17 | 2.10998699e−16 | −3.70359019e−18 |
| C25 | 4.18205639e−16 | 1.08957074e−14 | −1.71679008e−18 |
| C27 | 9.35618672e−16 | 1.32227766e−13 | −1.70575731e−18 |
| C29 | 1.153762e−19 | −1.205391e−20 | −4.77242785e−21 |
| C31 | 1.08387142e−20 | −2.2598668e−18 | 1.1307014e−21 |
| C33 | −1.29076401e−18 | −9.90347004e−17 | 1.61393734e−22 |
| C35 | −3.11679607e−18 | −5.16190495e−16 | 1.06465407e−21 |
| C36 | 3.2037253e−23 | 2.44573623e−25 | −5.23904465e−24 |
| C38 | −3.00422396e−22 | 2.02451858e−22 | 6.39454501e−24 |
| C40 | −5.56453309e−22 | 2.77540352e−20 | −2.38654616e−26 |
| C42 | 1.15075161e−21 | 7.77510206e−19 | −8.27248728e−25 |
| C44 | −8.45545916e−21 | 1.83631375e−16 | −1.10257267e−24 |
| C46 | −7.17799435e−26 | −6.16666974e−27 | 3.71377518e−27 |
| C48 | 4.41056949e−25 | −1.77193124e−24 | 2.26385586e−29 |
| C50 | 3.20645297e−24 | −7.22070937e−25 | 9.11823578e−28 |
| C52 | −6.68431649e−24 | −1.47635262e−20 | 5.14270429e−28 |
| C54 | 8.10978715e−23 | 5.0776662e−18 | 4.13766527e−28 |
| C55 | −8.00938486e−29 | 2.30519335e−31 | 1.16666839e−29 |
| C57 | −4.31210476e−28 | 5.98498871e−29 | −1.67242338e−29 |
| C59 | 1.263643e−27 | −2.81679351e−27 | −1.76007666e−30 |
| C61 | 1.612983e−26 | 3.572795e−24 | −2.19437814e−30 |
| C63 | 2.7883773e−25 | −5.88261071e−22 | −8.93045154e−31 |
| C65 | 1.0678073e−24 | −1.29361634e−19 | 3.33090397e−32 |
| C67 | 4.23448748e−31 | −5.49562737e−33 | −4.02324014e−34 |
| C69 | 6.71940992e−30 | −4.72770157e−30 | −6.06669725e−33 |
| C71 | −5.19192758e−29 | −1.4523395e−27 | −5.05696725e−33 |
| C73 | 1.0131755e−29 | −1.68084682e−25 | −2.25708995e−34 |
| C75 | −3.04215249e−27 | −8.27631336e−24 | 9.90529604e−34 |
| C77 | −9.47988848e−27 | −6.68913918e−21 | 1.03314337e−33 |
| C78 | 1.37830298e−34 | 3.39532895e−38 | −3.00501581e−35 |
| C80 | −2.20614706e−33 | 2.60606795e−34 | 3.47983183e−35 |
| C82 | −1.55885934e−32 | 1.18728779e−31 | 9.0614728e−36 |
| C84 | 2.36759125e−31 | −9.90754189e−30 | 6.42501344e−36 |
| C86 | −8.92393833e−31 | −2.12722713e−27 | 2.44225001e−36 |
| C88 | 1.11751611e−29 | 2.57988212e−25 | −1.1318051e−36 |
| C90 | 1.68895246e−29 | −6.02795443e−23 | −1.48883018e−36 |

Table 3c for FIG. 22/23

| Coefficient | M2 | M1 |
|---|---|---|
| KY | 0.00000000 | 0.00000000 |
| KX | 0.00000000 | 0.00000000 |
| RX | −6051.13629900 | −7070.71042700 |
| C7 | 5.13565486e−08 | −5.53709138e−08 |
| C9 | 8.48166415e−08 | −2.81784911e−08 |
| C10 | −7.13439177e−11 | 1.35470045e−11 |
| C12 | −6.78217449e−11 | 2.22349088e−12 |
| C14 | 1.07389017e−10 | −2.17100764e−11 |
| C16 | 9.40090645e−14 | −9.25413819e−14 |
| C18 | 4.12391946e−14 | −1.96114428e−13 |
| C20 | 1.58260544e−13 | 1.03943487e−13 |
| C21 | 3.47522486e−18 | 1.82335443e−17 |
| C23 | 6.4536786e−17 | −9.18926095e−17 |
| C25 | −9.48899205e−17 | 1.8538804e−16 |
| C27 | 2.49339094e−16 | −1.11389293e−16 |
| C29 | 5.35403925e−20 | 1.8436518e−20 |
| C31 | 7.5637834e−20 | 1.96646409e−19 |
| C33 | −3.4158977e−20 | −9.81835487e−20 |
| C35 | 4.85861223e−19 | 1.66148938e−20 |
| C36 | −4.94601583e−23 | −7.08072737e−23 |
| C38 | −4.05348385e−23 | −4.11801448e−22 |
| C40 | −1.32203024e−22 | −3.45175171e−22 |
| C42 | −4.03609525e−22 | 2.73466405e−21 |
| C44 | 1.11739328e−21 | 2.14025934e−21 |
| C46 | 4.93708892e−25 | −4.4788586e−25 |
| C48 | 8.43130272e−25 | −2.07813692e−24 |
| C50 | 3.73873009e−25 | −1.03853204e−24 |
| C52 | −6.68290603e−25 | 8.00799065e−24 |
| C54 | 2.70267769e−24 | 8.41515359e−24 |
| C55 | 7.69118669e−28 | 1.51282519e−28 |
| C57 | −6.45916145e−28 | 3.17074481e−27 |
| C59 | −2.33699309e−27 | 1.22333041e−26 |
| C61 | −1.59593012e−27 | 2.79500485e−26 |
| C63 | −1.26314552e−27 | 3.67365838e−26 |
| C65 | 6.27135853e−27 | 6.16865377e−27 |
| C67 | −4.95148641e−31 | 9.10808295e−31 |
| C69 | −1.46516796e−30 | 1.89542207e−29 |
| C71 | −4.91881917e−31 | 3.64294099e−29 |
| C73 | 5.75845525e−30 | 1.8163786e−28 |

Table 3c for FIG. 22/23

| Coefficient | M2 | M1 |
|---|---|---|
| C75 | 3.15049294e−30 | 1.86166005e−28 |
| C77 | 1.11362439e−29 | 6.30936726e−29 |
| C78 | −5.94716839e−33 | 2.0215274e−34 |
| C80 | 8.05983005e−33 | −1.50601813e−32 |
| C82 | 1.4626007e−32 | −7.53087591e−32 |
| C84 | 5.40117622e−33 | −9.52174202e−32 |
| C86 | 3.4651056e−33 | 3.12650323e−31 |
| C88 | 1.81935676e−34 | 1.56079676e−30 |
| C90 | 8.55586176e−33 | −9.50142408e−31 |

Table 4a for FIG. 22/23

| Surface | DCX | DCY | DCZ |
|---|---|---|---|
| Image plane | 0.00000000 | 0.00000000 | 0.00000000 |
| M8 | 0.00000000 | 0.43487770 | 929.54103257 |
| M7 | 0.00000000 | −195.16970097 | 122.97869898 |
| M6 | 0.00000000 | 111.85985762 | 1489.32638973 |
| M5 | 0.00000000 | 410.81949788 | 1904.78959323 |
| M4 | 0.00000000 | 992.15730872 | 2222.31723561 |
| M3 | 0.00000000 | −482.56707270 | 1729.00568653 |
| M2 | 0.00000000 | −1585.17397046 | 981.97338980 |
| Stop | 0.00000000 | −1727.72829897 | 783.13904832 |
| M1 | 0.00000000 | −2266.52701125 | 58.05513346 |
| Object plane | 0.00000000 | −2431.23130607 | 1600.02829943 |

Table 4b for FIG. 22/23

| Surface | TLA [deg] | TLB [deg] | TLC [deg] |
|---|---|---|---|
| Image plane | −0.00000000 | 0.00000000 | −0.00000000 |
| M8 | −6.81330581 | 0.00000000 | −0.00000000 |
| M7 | 166.92645295 | 0.00000000 | −0.00000000 |
| M6 | 65.44761820 | 0.00000000 | −0.00000000 |
| M5 | 41.17768289 | 0.00000000 | 0.00000000 |
| M4 | −66.32591576 | 0.00000000 | 0.00000000 |
| M3 | 26.39370949 | 0.00000000 | −0.00000000 |
| M2 | 43.84283645 | 0.00000000 | −0.00000000 |
| Stop | 16.95641469 | 0.00000000 | −0.00000000 |
| M1 | 164.87624817 | 0.00000000 | −0.00000000 |
| Object plane | 0.14372063 | 0.00000000 | −0.00000000 |

Table 5 for FIG. 22/23

| Surface | Angle of incidence [deg] | Reflectivity |
|---|---|---|
| M8 | 6.78879174 | 0.66081702 |
| M7 | 0.47469061 | 0.66566222 |
| M6 | 78.06166814 | 0.85171082 |
| M5 | 77.64639609 | 0.84568699 |
| M4 | 5.02606661 | 0.66309175 |
| M3 | 82.39990131 | 0.90859365 |
| M2 | 79.98727228 | 0.87813250 |
| M1 | 21.23546659 | 0.60543423 |
| Overall transmission | | 0.1015 |

Table 6 for FIG. 22/23

| X [mm] | Y [mm] | Z [mm] |
|---|---|---|
| 0.00000000 | −103.18045715 | 0.00000000 |
| −38.19587382 | −101.80911486 | 0.00000000 |
| −75.61417532 | −97.73837268 | 0.00000000 |
| −111.48060482 | −91.09640307 | 0.00000000 |
| −145.02805526 | −82.09029073 | 0.00000000 |
| −175.50222111 | −70.99475403 | 0.00000000 |
| −202.17051799 | −58.13708869 | 0.00000000 |
| −224.33612423 | −43.88214370 | 0.00000000 |
| −241.35841193 | −28.62051048 | 0.00000000 |
| −252.67986085 | −12.76035334 | 0.00000000 |
| −257.85795356 | 3.27889145 | 0.00000000 |
| −256.59867271 | 19.07356199 | 0.00000000 |
| −248.78648356 | 34.20626311 | 0.00000000 |
| −234.50514232 | 48.28188025 | 0.00000000 |
| −214.04516542 | 60.94874828 | 0.00000000 |
| −187.89688337 | 71.92090722 | 0.00000000 |
| −156.73117956 | 80.99526522 | 0.00000000 |
| −121.37190551 | 88.05708287 | 0.00000000 |
| −82.76429617 | 93.07042816 | 0.00000000 |
| −41.94278561 | 96.05359314 | 0.00000000 |
| −0.00000000 | 97.04230242 | −0.00000000 |
| 41.94278561 | 96.05359314 | 0.00000000 |
| 82.76429617 | 93.07042816 | −0.00000000 |
| 121.37190551 | 88.05708287 | 0.00000000 |
| 156.73117956 | 80.99526522 | −0.00000000 |
| 187.89688337 | 71.92090722 | 0.00000000 |
| 214.04516542 | 60.94874828 | −0.00000000 |
| 234.50514232 | 48.28188025 | 0.00000000 |
| 248.78648356 | 34.20626311 | 0.00000000 |
| 256.59867271 | 19.07356199 | 0.00000000 |
| 257.85795356 | 3.27889145 | 0.00000000 |
| 252.67986085 | −12.76035334 | 0.00000000 |
| 241.35841193 | −28.62051048 | 0.00000000 |
| 224.33612423 | −43.88214370 | 0.00000000 |
| 202.17051799 | −58.13708869 | 0.00000000 |
| 175.50222111 | −70.99475403 | 0.00000000 |
| 145.02805526 | −82.09029073 | 0.00000000 |
| 111.48060482 | −91.09640307 | 0.00000000 |
| 75.61417532 | −97.73837268 | 0.00000000 |
| 38.19587382 | −101.80911486 | 0.00000000 |

An overall reflectivity of the projection optical unit 35 is 10.15%.

The projection optical unit 35 has an image-side numerical aperture of 0.49. The image field 8 has an x-extent of two times 13 mm and a y-extent of 1.20 mm. The projection optical unit 35 is optimized for an operating wavelength of the illumination light 3 of 13.5 nm.

The projection optical unit 35 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 35 has exactly four mirrors for grazing incidence, namely the mirrors M2, M3, M5 and M6. The mirrors M1, M4, M7 and M8 are embodied as mirrors for normal incidence.

In the projection optical unit 35, a stop 18 is arranged in the beam path between the mirrors M1 and M2, near the grazing incidence on the mirror M2. Alternatively or additionally, a stop can be arranged directly on the surface of the mirror M2.

An angle of incidence of the chief rays 16 in the object plane 5 is 6.3°.

In the meridional section according to FIG. 22, the chief rays extend between the object field 4 and the mirror M1 in a divergent manner. In the yz-plane, an entrance pupil of the projection optical unit 35 lies approximately −6640 mm in front of the object field 4 in the beam path of the illumination light. In the xz-plane (cf. FIG. 23), the entrance pupil lies approximately 2750 mm after the object field in the imaging beam path of the projection optical unit 35. The mirror M8 defines an image-side obscuration which is less than 15% of the image-side numerical aperture of the projection optical unit 35 in the x-dimension.

In the xz-section (cf. FIG. 23), the stop 18 can lie at a position displaced in the z-direction compared to its position in the yz-section.

A z-distance between the object field 4 and the image field 8 is approximately 1600 mm.

An object/image offset ($d_{OIS}$) is approximately 2430 mm.

A free working distance between the mirror M7 and the image field 8 is 88 mm.

In the projection optical unit 35, a scanned RMS value for the wavefront aberration is at most 10 mλ and, on average, 7 mλ.

A maximum distortion value is at most 0.27 nm in the x-direction and at most 0.17 nm in the y-direction. A telecentricity value in the x-direction is at most 0.01 mrad on the image field-side and a telecentricity value in the y-direction is at most 0.06 mrad on the image field-side.

Further mirror data emerge from the following table.

TABLE 7 for FIG. 22/23

| | M1 | M2 | M3 | M4 | M5 | M6 | M7 | M8 |
|---|---|---|---|---|---|---|---|---|
| Maximum angle of incidence [deg] | 21.6 | 82.4 | 82.8 | 7.4 | 80.1 | 81.4 | 14.8 | 8.5 |
| Mirror extent (x) [mm] | 427.1 | 563.6 | 810.3 | 985.6 | 705.3 | 352.4 | 414.1 | 951.7 |
| Mirror extent (y) [mm] | 286.3 | 514.2 | 1144.8 | 52.4 | 219.4 | 367.8 | 248.0 | 928.2 |
| Maximum mirror diameter [mm] | 427.5 | 569.8 | 1172.5 | 985.6 | 705.3 | 390.7 | 414.3 | 951.9 |

There is an intermediate image 19 in the beam path in the region of a reflection on the mirror M5 in the yz-plane (FIG. 22) and in the imaging beam path region between the mirrors M6 and M7 in the xz-plane (FIG. 23).

The mirror M8 is obscured and includes a passage opening 17 for the passage of the illumination light 3 in the imaging beam path between the mirrors M6 and M7. A value for the obscuration is 15%.

Only the last mirror M8 in the imaging beam path includes a passage opening 17 for the imaging light 3. All other mirrors M1 to M7 have a continuous reflection surface. The reflection surface of the mirror M8 is used around the passage opening 17 thereof.

The mirrors M1, M3, M4, M5 and M8 have negative values for the radius, i.e. are, in principle, concave mirrors. The other mirrors M2, M6 and M7 have positive values for the radius, i.e. are, in principle, convex mirrors. The mirrors M2, M3, M5 and M6 for grazing incidence have very large radii and only constitute small deviations from plane reflection surfaces.

Figure 24:
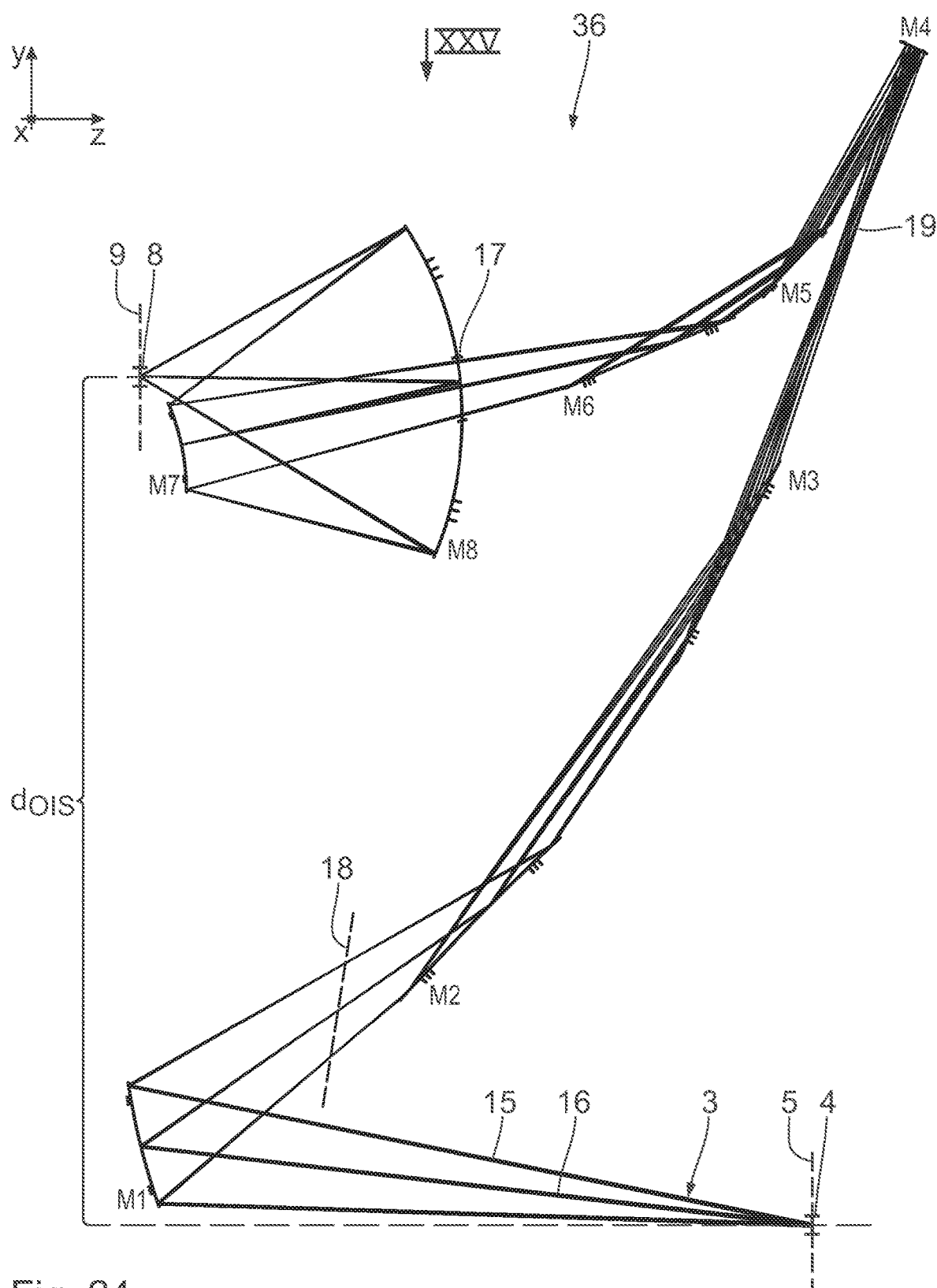
FIG. 24 shows, in an illustration similar to FIG. 2, a further embodiment of an imaging optical unit which can be used as a projection lens in the projection exposure apparatus according to FIG. 1, configured as an anamorphic optical unit.
Figure 25:
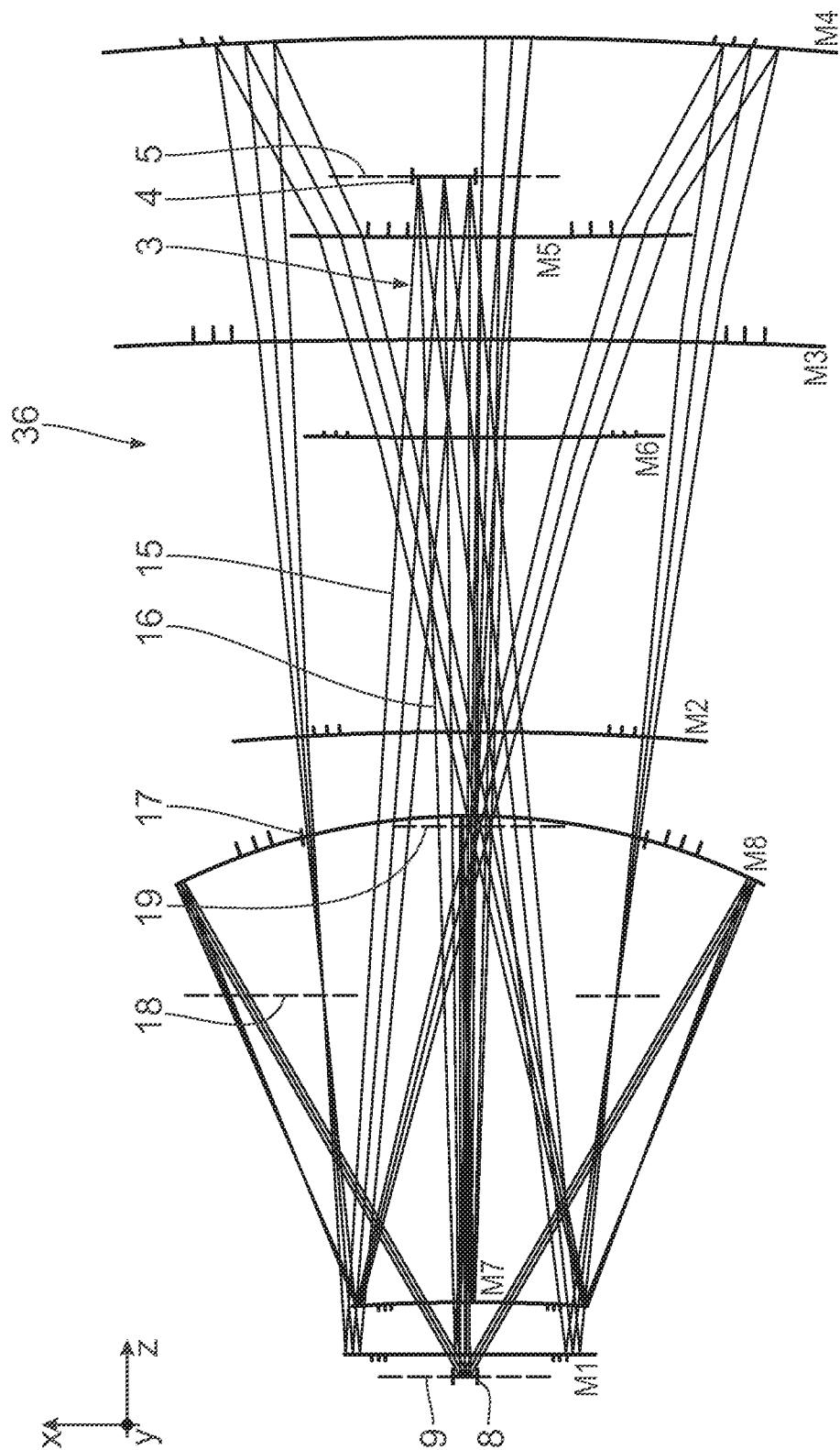
FIG. 25 shows a view of the imaging optical unit according to FIG. 24, seen from the viewing direction XXV in FIG. 24.

A further embodiment of a projection optical unit 36, which can be used in the projection exposure apparatus 1 according to FIG. 1 instead of e.g. the projection optical unit 7, is explained in the following text on the basis of FIGS. 24 and 25. Components and functions which were already explained above in the context of FIGS. 1 to 23 are appropriately denoted by the same reference signs and are not discussed again in detail. FIG. 24 shows a meridional section of the projection optical unit 36. FIG. 25 shows a sagittal view of the projection optical unit 36.

The projection optical unit 36 has a total of 8 mirrors M1 to M8 and, in terms of the basic design thereof, it is similar to e.g. the projection optical unit 7 according to FIG. 2.

The projection optical unit 36 is embodied as anamorphic optical unit. In the yz-section according to FIG. 24, the projection optical unit 36 has a reducing imaging scale $\beta_y$ of 6.00. In the xz-plane (cf. FIG. 25) perpendicular thereto, the projection optical unit 36 has a reducing imaging scale $\beta_x$ of 5.40.

These different imaging scales $\beta_x$, $\beta_y$ lead to an object-side numerical aperture being smaller in the yz-plane than in the xz-plane, as emerges from comparison between FIGS. 24 and 25. As a result of this, an advantageously small chief ray angle CRAO of 6.7° is obtained in the yz-plane.

The anamorphic effect of the projection optical unit 36 is distributed to all optical surfaces of the mirrors M1 to M8.

The mirrors M1 to M8 are once again embodied as free-form surface mirrors, for which the free-form surface equation (1), specified above, applies. The optical design data from the projection optical unit 36 can be gathered from the following tables, which, in terms of their design, correspond to the tables for the projection optical unit 7 according to FIG. 2.

Table 1 for FIG. 24/25

| Exemplary embodiment | FIG. 24/25 |
|---|---|
| NA | 0.5 |
| Wavelength | 13.5 nm |
| Field dimension x | 26.0 mm |
| Field dimension y | 1.2 mm |
| Field curvature | 0.0 1/mm |
| Stop | S9 |

Table 2 for FIG. 24/25

| Surface | Radius x [mm] | Power x [1/mm] | Radius y [mm] | Power y [1/mm] | Operating |
|---|---|---|---|---|---|
| M8 | −898.65384451 | 0.00220986 | −841.56029276 | 0.00239341 | REFL |
| M7 | 2519.21415981 | −0.00079387 | 549.64538748 | −0.00363883 | REFL |
| M6 | 5235.46738689 | −0.00007321 | 18583.02763769 | −0.00056159 | REFL |
| M5 | 10320.35903473 | −0.00004533 | 7043.08337008 | −0.00121403 | REFL |
| M4 | −2368.58450824 | 0.00084156 | −1677.61856878 | 0.00119617 | REFL |
| M3 | — | 0.00001752 | — | 0.00044930 | REFL |
| M2 | −3162.96579252 | 0.00011478 | 6044.71230342 | −0.00182278 | REFL |
| M1 | — | 0.00005542 | −1659.85010449 | 0.00128773 | REFL |

| Table 3a for FIG. 24/25 | | | |
|---|---|---|---|
| Coefficient | M8 | M7 | M6 |
| KY | 0.00000000 | 0.00000000 | 0.00000000 |
| KX | 0.00000000 | 0.00000000 | 0.00000000 |
| RX | −898.65384450 | 2519.21416000 | 5235.46738700 |
| C7 | −3.09391603e−08 | −1.79559389e−07 | 1.24390263e−08 |
| C9 | −7.26824159e−09 | 6.05374011e−08 | 1.79529464e−08 |
| C10 | −9.17661523e−12 | 7.52464303e−10 | 7.73452408e−11 |
| C12 | −2.9215991e−11 | 2.51411627e−09 | 5.01854597e−11 |
| C14 | −1.54578064e−11 | 1.71853031e−09 | 1.59214758e−11 |
| C16 | −3.78292895e−14 | −1.78811844e−12 | −1.78827188e−13 |
| C18 | −3.15725802e−14 | −3.28279723e−12 | 1.1629587e−13 |
| C20 | −3.25627497e−15 | 1.74708334e−12 | 2.90732297e−14 |
| C21 | −2.16930672e−17 | 1.21979378e−16 | −1.17216554e−16 |
| C23 | −7.40935074e−17 | 8.73459133e−15 | 6.3593323e−16 |
| C25 | −8.27264393e−17 | 2.78760075e−14 | 3.63957206e−16 |
| C27 | −2.47378025e−17 | 7.97309374e−15 | 4.64399505e−17 |
| C29 | −4.00833778e−20 | 3.04883362e−18 | 1.20940283e−18 |
| C31 | −6.74348668e−20 | 1.05351029e−17 | −7.33386432e−19 |
| C33 | −3.33712007e−20 | −2.53301039e−17 | 1.04598017e−18 |
| C35 | −1.60060561e−21 | 5.51279308e−18 | 3.15382288e−20 |
| C36 | −3.38618723e−23 | 1.09644503e−20 | 2.10543991e−21 |
| C38 | −1.52108183e−22 | 5.20557325e−20 | −7.17116902e−21 |
| C40 | −2.50184393e−22 | 9.91293267e−20 | 1.9344533e−21 |
| C42 | −1.55242331e−22 | 4.49100492e−20 | 5.1810958e−21 |
| C44 | −3.21754195e−23 | 6.12504902e−20 | 4.00057253e−22 |
| C46 | −2.56622324e−26 | −2.34811653e−23 | −2.20054661e−23 |
| C48 | −7.12044814e−26 | −1.38827791e−22 | 2.11379653e−23 |
| C50 | −8.35229848e−26 | −2.27120568e−22 | 4.24710944e−24 |
| C52 | −3.25877822e−26 | 1.63931776e−21 | 2.81218781e−23 |
| C54 | 2.31523308e−27 | 2.29596466e−21 | 4.11520106e−24 |
| C55 | −3.22044427e−29 | −8.38570398e−26 | −3.16289259e−26 |
| C57 | −9.9283758e−29 | −3.98833111e−25 | 7.96014291e−26 |
| C59 | −1.59623677e−28 | 4.49981655e−25 | −2.36125333e−26 |
| C61 | −2.26350041e−28 | 4.86885671e−24 | 2.20987927e−26 |
| C63 | −2.16360896e−28 | 4.81078139e−24 | 9.17694081e−26 |
| C65 | −7.19034294e−29 | 3.12706869e−24 | 1.70276521e−26 |
| C67 | −1.66086944e−31 | −1.00921794e−28 | 1.20992206e−28 |
| C69 | −7.09674851e−31 | 2.62297907e−28 | −3.33093899e−28 |
| C71 | −1.00405146e−30 | 1.59366409e−27 | 7.45906143e−29 |
| C73 | −4.84392005e−31 | 6.24841362e−27 | −1.78519939e−28 |
| C75 | 1.6840288e−32 | 9.81013953e−27 | 1.67183371e−28 |
| C77 | 5.33123321e−32 | −2.64352603e−26 | 3.33232457e−29 |
| C78 | −7.76624666e−35 | 7.70090407e−31 | 2.36244673e−31 |
| C80 | −1.37504248e−33 | 7.418665e−30 | 3.27117525e−31 |
| C82 | −4.9730902e−33 | 1.12937368e−29 | 1.58945015e−30 |
| C84 | −6.93445436e−33 | −2.16643844e−29 | −1.71056833e−30 |
| C86 | −4.05050995e−33 | −1.48561291e−28 | −4.22081835e−31 |
| C88 | −7.44238878e−34 | −3.70834394e−28 | 1.38420773e−31 |
| C90 | 8.08789051e−35 | −3.48344195e−28 | 2.57211573e−32 |
| C92 | 3.79975278e−37 | 0 | 0 |
| C94 | 2.54205485e−36 | 0 | 0 |
| C96 | 5.28074116e−36 | 0 | 0 |
| C98 | 4.78458863e−36 | 0 | 0 |
| C100 | 1.78186461e−36 | 0 | 0 |
| C102 | 1.09169331e−38 | 0 | 0 |
| C104 | −1.69802736e−37 | 0 | 0 |
| C105 | −3.93526201e−41 | 0 | 0 |
| C107 | 3.66634759e−39 | 0 | 0 |
| C109 | 1.99100717e−38 | 0 | 0 |
| C111 | 3.88960174e−38 | 0 | 0 |
| C113 | 3.36275392e−38 | 0 | 0 |
| C115 | 1.23397826e−38 | 0 | 0 |
| C117 | 5.74500356e−40 | 0 | 0 |
| C119 | −5.43216154e−40 | 0 | 0 |
| C121 | −8.13063603e−43 | 0 | 0 |
| C123 | −6.57853328e−42 | 0 | 0 |
| C125 | −1.84219693e−41 | 0 | 0 |
| C127 | −2.4128622e−41 | 0 | 0 |
| C129 | −1.58805249e−41 | 0 | 0 |
| C131 | −4.8328677e−42 | 0 | 0 |
| C133 | −1.37774875e−44 | 0 | 0 |
| C135 | 3.70992132e−43 | 0 | 0 |
| C136 | −1.82426978e−46 | 0 | 0 |
| C138 | −8.82948521e−45 | 0 | 0 |
| C140 | −5.13522224e−44 | 0 | 0 |
| C142 | −1.2576407e−43 | 0 | 0 |
| C144 | −1.54936749e−43 | 0 | 0 |

-continued

Table 3a for FIG. 24/25

| Coefficient | M8 | M7 | M6 |
|---|---|---|---|
| C146 | −1.00539254e−43 | 0 | 0 |
| C148 | −3.21138841e−44 | 0 | 0 |
| C150 | −2.48902466e−45 | 0 | 0 |
| C152 | 8.34369753e−46 | 0 | 0 |

Table 3b for FIG. 24/25

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 10320.35903000 | −2368.58450800 | −14606.85238000 |
| C7 | −9.43984452e−08 | −3.19780054e−08 | 3.42335843e−09 |
| C9 | −3.73977119e−08 | −1.20873717e−08 | 5.71457986e−09 |
| C10 | 2.4885219e−11 | 3.51515054e−13 | −2.7196639e−11 |
| C12 | 3.31374515e−11 | 3.35936518e−11 | −8.28556705e−12 |
| C14 | 1.23001091e−10 | −4.20689147e−10 | −4.37520677e−12 |
| C16 | 9.60921501e−14 | 6.35312252e−16 | 3.97165731e−14 |
| C18 | 3.06969842e−14 | −2.04642026e−13 | 4.6038851e−16 |
| C20 | −1.81914837e−13 | 1.42057888e−12 | 4.04652695e−15 |
| C21 | −1.50139489e−16 | 3.20784131e−18 | −6.41123154e−17 |
| C23 | −3.67530123e−16 | −1.59859373e−17 | −6.98459168e−18 |
| C25 | −5.85422242e−16 | 5.10844386e−16 | −1.91809193e−18 |
| C27 | 5.96794634e−16 | −8.63505265e−15 | −3.65944728e−18 |
| C29 | 8.05074272e−19 | 9.21434731e−21 | 6.08393666e−20 |
| C31 | 9.67423637e−19 | −6.41403775e−20 | 1.32184653e−20 |
| C33 | 2.74697274e−18 | −3.17400432e−18 | 5.64881549e−21 |
| C35 | −2.10574097e−18 | −5.68113418e−18 | 4.62810551e−21 |
| C36 | −4.19331352e−22 | 5.4673575e−24 | −1.20159738e−22 |
| C38 | −1.48291097e−21 | −5.66829369e−23 | 9.99813448e−24 |
| C40 | −8.89078399e−23 | 3.3289796e−21 | −1.51187874e−24 |
| C42 | −1.30043929e−20 | 2.13230879e−20 | 2.57105484e−24 |
| C44 | −5.61941157e−23 | 1.28852422e−18 | −2.83232079e−24 |
| C46 | 1.22910541e−24 | −3.93269304e−26 | −8.4259963e−26 |
| C48 | 2.63475255e−25 | 1.29025934e−24 | −6.73035076e−27 |
| C50 | −1.61930052e−24 | 9.58130418e−23 | −2.23952211e−26 |
| C52 | 9.54851986e−23 | −6.49564266e−22 | −3.32643796e−26 |
| C54 | 6.18740883e−23 | 2.13466405e−20 | −1.30243929e−26 |
| C55 | −1.88937216e−28 | 4.62453335e−30 | 4.32699323e−29 |
| C57 | 7.92134564e−27 | −6.42166267e−28 | 2.58160954e−28 |
| C59 | −3.81767476e−26 | −3.40516712e−27 | −1.33435452e−28 |
| C61 | −7.40042015e−26 | 1.13636915e−25 | −1.31816559e−28 |
| C63 | −5.91737902e−25 | −2.28464211e−23 | −6.13175237e−30 |
| C65 | −5.90657031e−26 | 3.90274961e−23 | −7.57941398e−30 |
| C67 | −4.71910372e−30 | −4.00537288e−32 | −3.78181987e−31 |
| C69 | −3.80842075e−29 | 9.29769453e−31 | 3.15234014e−32 |
| C71 | 3.45306237e−28 | −9.14633256e−31 | 6.81155634e−31 |
| C73 | 4.06923505e−28 | −7.07463203e−27 | 3.52501713e−31 |
| C75 | 1.89818188e−27 | 3.11226568e−25 | 4.51613912e−31 |
| C77 | −1.59359386e−27 | −1.02694094e−23 | 8.58516649e−32 |
| C78 | 5.39005499e−34 | 7.60475402e−36 | 5.47282581e−35 |
| C80 | 1.28802722e−32 | 1.82429692e−33 | 2.27708016e−34 |
| C82 | 8.88526683e−32 | −1.0368376e−31 | −5.0870717e−34 |
| C84 | −1.07852034e−30 | −7.6912987e−30 | −3.01511969e−34 |
| C86 | 8.12932285e−32 | 7.77307244e−29 | −6.5410886e−34 |
| C88 | −2.93141855e−30 | 2.55070847e−27 | −5.55696921e−34 |
| C90 | 4.98139974e−30 | −9.99949267e−26 | −6.9232932e−35 |

Table 3c for FIG. 24/25

| Coefficient | M2 | M1 |
|---|---|---|
| KY | 0.00000000 | 0.00000000 |
| KX | 0.00000000 | 0.00000000 |
| RX | −3162.96579300 | −33768.32491000 |
| C7 | −5.63006995e−09 | −1.85162177e−07 |
| C9 | 2.52603119e−08 | −5.82002845e−08 |
| C10 | −1.63939568e−10 | 2.19843459e−11 |
| C12 | −1.45434544e−10 | 4.34395623e−12 |
| C14 | 3.07914787e−11 | −3.90398966e−11 |
| C16 | 1.19978873e−13 | −4.02854058e−13 |
| C18 | 2.91665979e−14 | −3.53269108e−13 |
| C20 | 7.14507418e−14 | −8.06536713e−14 |
| C21 | −1.26157584e−16 | 1.50658497e−16 |
| C23 | −7.76330156e−17 | 1.09978734e−17 |
| C25 | −1.72160645e−16 | −2.64878411e−16 |
| C27 | 1.30511683e−16 | −9.7675593e−17 |
| C29 | 4.97077758e−19 | 1.94104108e−19 |
| C31 | 7.3469712e−19 | 2.13721124e−19 |
| C33 | −1.6248826e−19 | −1.17732749e−18 |
| C35 | 2.44811103e−19 | 3.66216487e−19 |
| C36 | 2.74716093e−22 | −1.46887345e−21 |
| C38 | −4.42878488e−22 | −2.52169606e−21 |
| C40 | 4.31546413e−22 | −4.89313142e−21 |
| C42 | −1.2501295e−21 | −3.10103922e−21 |
| C44 | 1.72029553e−22 | −9.49213909e−21 |
| C46 | −1.32233821e−24 | 7.79166706e−25 |
| C48 | −5.97471372e−25 | 4.56312854e−25 |
| C50 | −1.02312238e−25 | 7.6643113e−24 |
| C52 | −5.04494501e−24 | 3.67536202e−23 |
| C54 | 3.49233317e−25 | 1.65632978e−23 |
| C55 | −5.35422344e−27 | 2.17389317e−26 |
| C57 | −1.44886077e−26 | 6.10103532e−26 |
| C59 | −1.68015387e−26 | 3.72656392e−26 |
| C61 | −1.69820125e−27 | 4.8382551e−26 |
| C63 | −4.06228599e−27 | 7.94819696e−26 |
| C65 | 4.73934877e−27 | 9.99358955e−26 |
| C67 | 1.48192042e−29 | −5.37391586e−30 |
| C69 | 2.75293606e−29 | −7.66284246e−29 |
| C71 | 3.29720353e−29 | −4.12938667e−28 |
| C73 | 6.35559729e−29 | −6.45953223e−28 |
| C75 | 3.17464557e−29 | −8.69448659e−28 |
| C77 | 1.55333959e−29 | −5.55442684e−28 |
| C78 | 2.17458628e−32 | −1.65616708e−31 |
| C80 | 8.59099937e−32 | −4.90253105e−31 |
| C82 | 1.25586211e−31 | 8.5337234e−32 |
| C84 | 1.36897347e−31 | 9.42500117e−31 |
| C86 | 1.31238686e−31 | 7.66948893e−31 |
| C88 | 5.58974151e−32 | 8.26964826e−31 |
| C90 | 1.55246521e−32 | 5.2747466e−31 |

Table 4a for FIG. 24/25

| Surface | DCX | DCY | DCZ |
|---|---|---|---|
| Image plane | 0.00000000 | 0.00000000 | 0.00000000 |
| M8 | 0.00000000 | −1.67688632 | 764.65279783 |
| M7 | 0.00000000 | −161.54058747 | 101.44072569 |
| M6 | 0.00000000 | 107.77496443 | 1280.58144822 |
| M5 | 0.00000000 | 296.98597488 | 1553.84576956 |
| M4 | 0.00000000 | 819.24626664 | 1826.49875285 |
| M3 | 0.00000000 | −411.29452134 | 1414.13408128 |
| M2 | 0.00000000 | −1223.76315336 | 879.35100849 |
| Stop | 0.00000000 | −1504.18673115 | 497.47373340 |

-continued

Table 4a for FIG. 24/25

| Surface | DCX | DCY | DCZ |
|---|---|---|---|
| M1 | 0.00000000 | −1814.12306458 | 26.60210356 |
| Object plane | 0.00000000 | −1997.79973260 | 1636.55227043 |

Table 4b for FIG. 24/25

| Surface | TLA [deg] | TLB [deg] | TLC [deg] |
|---|---|---|---|
| Image plane | −0.00000000 | 0.00000000 | −0.00000000 |
| M8 | −6.69273798 | 0.00000000 | −0.00000000 |
| M7 | 166.94928575 | 0.00000000 | −0.00000000 |
| M6 | 66.32026554 | 0.00000000 | −0.00000000 |
| M5 | 41.57752409 | 0.00000000 | −0.00000000 |
| M4 | −66.84946365 | 0.00000000 | −0.00000000 |
| M3 | 26.18846526 | 0.00000000 | −0.00000000 |
| M2 | 44.25467874 | 0.00000000 | −0.00000000 |
| Stop | 7.97043789 | 0.00000000 | −0.00000000 |
| M1 | 165.88786281 | 0.00000000 | −0.00000000 |
| Object plane | −0.94682585 | 0.00000000 | −0.00000000 |

Table 5 for FIG. 24/25

| Surface | Angle of incidence [deg] | Reflectivity |
|---|---|---|
| M8 | 6.80770562 | 0.66078858 |
| M7 | 0.46825946 | 0.66566251 |
| M6 | 78.95126382 | 0.86420515 |
| M5 | 76.47302523 | 0.82792785 |
| M4 | 4.68878693 | 0.66344392 |
| M3 | 82.64944000 | 0.91162945 |
| M2 | 79.54179192 | 0.87221922 |
| M1 | 20.65816981 | 0.60938007 |
| Overall transmission | | 0.1012 |

Table 6 for FIG. 24/25

| X [mm] | Y [mm] | Z [mm] |
|---|---|---|
| 0.00000000 | −112.35689068 | 0.00000000 |
| −28.34197084 | −110.84444041 | 0.00000000 |
| −56.16590328 | −106.34781797 | 0.00000000 |
| −82.95239148 | −98.98955006 | 0.00000000 |
| −108.17910149 | −88.97362778 | 0.00000000 |
| −131.31951112 | −76.58171221 | 0.00000000 |
| −151.84357438 | −62.16431302 | 0.00000000 |
| −169.22272201 | −46.12805914 | 0.00000000 |
| −182.94128521 | −28.92188102 | 0.00000000 |
| −192.51547539 | −11.02355542 | 0.00000000 |
| −197.52003878 | 7.07501300 | 0.00000000 |
| −197.62122485 | 24.88594680 | 0.00000000 |
| −192.61263704 | 41.94672857 | 0.00000000 |
| −182.44806396 | 57.84053853 | 0.00000000 |
| −167.26402703 | 72.21001749 | −0.00000000 |
| −147.38653025 | 84.76311384 | −0.00000000 |
| −123.32070623 | 95.27376291 | −0.00000000 |
| −95.72644632 | 103.57890521 | −0.00000000 |
| −65.38585433 | 109.57098767 | −0.00000000 |
| −33.16868503 | 113.18678340 | −0.00000000 |
| −0.00000000 | 114.39509163 | 0.00000000 |
| 33.16868503 | 113.18678340 | 0.00000000 |
| 65.38585433 | 109.57098767 | 0.00000000 |
| 95.72644632 | 103.57890521 | 0.00000000 |
| 123.32070623 | 95.27376291 | −0.00000000 |
| 147.38653025 | 84.76311384 | 0.00000000 |
| 167.26402703 | 72.21001749 | −0.00000000 |
| 182.44806396 | 57.84053853 | 0.00000000 |
| 192.61263704 | 41.94672857 | 0.00000000 |
| 197.62122485 | 24.88594680 | 0.00000000 |
| 197.52003878 | 7.07501300 | 0.00000000 |
| 192.51547539 | −11.02355542 | 0.00000000 |
| 182.94128521 | −28.92188102 | 0.00000000 |
| 169.22272201 | −46.12805914 | 0.00000000 |
| 151.84357438 | −62.16431302 | −0.00000000 |
| 131.31951112 | −76.58171221 | 0.00000000 |
| 108.17910149 | −88.97362778 | 0.00000000 |
| 82.95239148 | −98.98955006 | −0.00000000 |
| 56.16590328 | −106.34781797 | 0.00000000 |
| 28.34197084 | −110.84444041 | 0.00000000 |

An overall reflectivity of the projection optical unit 36 is 10.11%.

The projection optical unit 36 has an image-side numerical aperture of 0.50. The image field 8 has an x-extent of two times 13 mm and a y-extent of 1.20 mm. The projection optical unit 36 is optimized for an operating wavelength of the illumination light 3 of 13.5 nm.

The projection optical unit 36 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The projection optical unit 36 has exactly four mirrors for grazing incidence, namely the mirrors M2, M3, M5 and M6. The mirrors M1, M4, M7 and M8 are embodied as mirrors for normal incidence.

In the projection optical unit 36, a stop 18 is arranged in the beam path between the mirrors M1 and M2, near the grazing incidence on the mirror M2. Alternatively or additionally, a stop can be arranged directly on the surface of the mirror M2.

An angle of incidence of the chief rays 16 in the object plane 5 is 6.7°.

In the xz-plane (cf. FIG. 25), an entrance pupil of the projection optical unit 36 lies 2225 mm in front of the object field 4 in the beam path of the illumination light. In the yz-plane, the entrance pupil lies 4000 mm after the object field in the imaging beam path of the projection optical unit 36. An extent of the chief rays 16 emanating from the object field 4 is therefore convergent both in the meridional section according to FIG. 24 and in the view according to FIG. 25. The mirror M8 defines an image-side obscuration which is less than 18% of the image-side numerical aperture of the projection optical unit 36 in the x-dimension.

In the xz-section (cf. FIG. 25), the stop 18 can lie at a position displaced in the z-direction compared to its position in the yz-section.

A z-distance between the object field 4 and the image field 8 is approximately 1600 mm.

An object/image offset ($d_{OIS}$) is approximately 2000 mm.

A free working distance between the mirror M7 and the image field 8 is 71 mm.

In the projection optical unit 36, a scanned RMS value for the wavefront aberration is at most 11 mλ and, on average, 10 mλ.

A maximum distortion value is at most 0.10 nm in the x-direction and at most 0.32 nm in the y-direction. A telecentricity value in the x-direction is at most 0.61 mrad on the image field-side and a telecentricity value in the y-direction is at most 0.74 mrad on the image field-side.

Further mirror data emerge from the following table.

TABLE 7 for FIG. 24/25

|  | M1 | M2 | M3 | M4 | M5 | M6 | M7 | M8 |
|---|---|---|---|---|---|---|---|---|
| Maximum angle of incidence [deg] | 21.3 | 83.2 | 84.3 | 6.2 | 78.6 | 81.9 | 15.1 | 8.3 |
| Mirror extent (x) [mm] | 337.8 | 498.9 | 706.6 | 851.1 | 595.2 | 330.2 | 321.8 | 800.4 |
| Mirror extent (y) [mm] | 293.4 | 499.9 | 596.7 | 91.9 | 262.9 | 436.4 | 205.1 | 782.9 |
| Maximum mirror diameter [mm] | 337.9 | 529.5 | 807.8 | 851.2 | 595.3 | 442.3 | 321.9 | 801.2 |

There is an intermediate image 19 in the beam path in the region between the mirrors M3 and M4 in the yz-plane (FIG. 24) and in the imaging beam path region between the mirrors M6 and M7 in the xz-plane (FIG. 25).

The mirror M8 is obscured and includes a passage opening 17 for the passage of the illumination light 3 in the imaging beam path between the mirrors M6 and M7.

Only the last mirror M8 in the imaging beam path includes a passage opening 17 for the imaging light 3. All other mirrors M1 to M7 have a continuous reflection surface. The reflection surface of the mirror M8 is used around the passage opening 17 thereof.

The mirrors M1, M3, M4 and M8 have negative values for the radius, i.e. are, in principle, concave mirrors. The other mirrors M2, M5, M6 and M7 have positive values for the radius, i.e. are, in principle, convex mirrors. The mirrors M2, M3, M5 and M6 for grazing incidence have very large radii and only constitute small deviations from plane reflection surfaces.

A further embodiment of a projection optical unit 37, which can be used in the projection exposure apparatus 1 according to FIG. 1 instead of e.g. the projection optical unit 7, is explained in the following text on the basis of FIGS. 26 and 27. Components and functions which were already explained above in the context of FIGS. 1 to 25 are appropriately denoted by the same reference signs and are not discussed again in detail.

Figure 26:
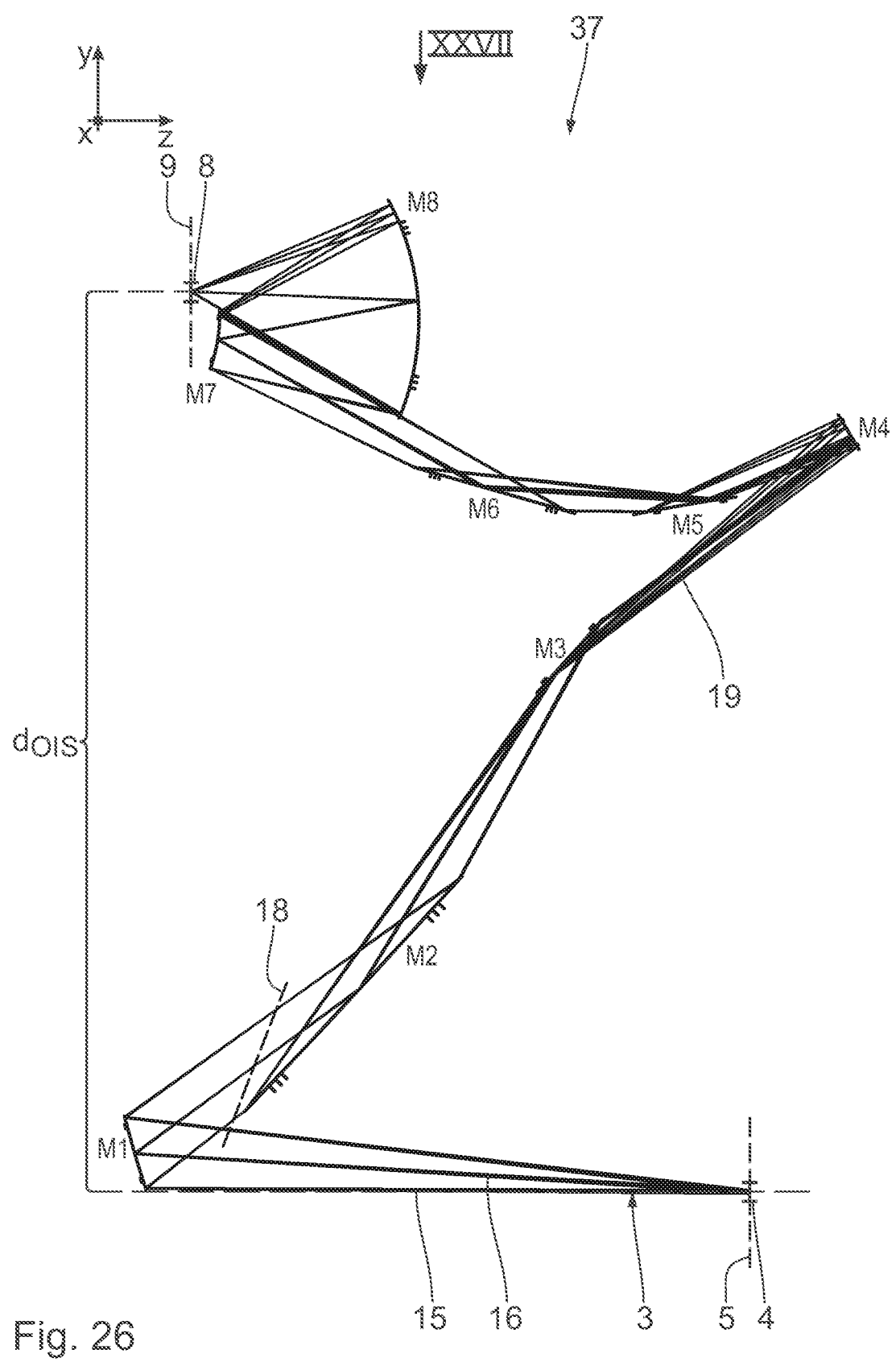
FIG. 26 shows, in an illustration similar to FIG. 2, a further embodiment of an imaging optical unit which can be used as a projection lens in the projection exposure apparatus according to FIG. 1, configured as an anamorphic optical unit without pupil obscuration.

FIG. 26 shows a meridional section of the projection optical unit 37. FIG. 27 shows a sagittal view of the projection optical unit 37.

The projection optical unit 37 has a total of 8 mirrors M1 to M8 and, in terms of the basic design thereof, it is similar to e.g. the projection optical unit 7 according to FIG. 2.

The projection optical unit 37 is embodied as anamorphic optical unit. In the yz-section according to FIG. 26, the projection optical unit 37 has a reducing imaging scale $\beta_y$ of 8.00. In the xz-plane (cf. FIG. 27) perpendicular thereto, the projection optical unit 37 has a reducing imaging scale $\beta_x$ of 4.00.

Figure 27:
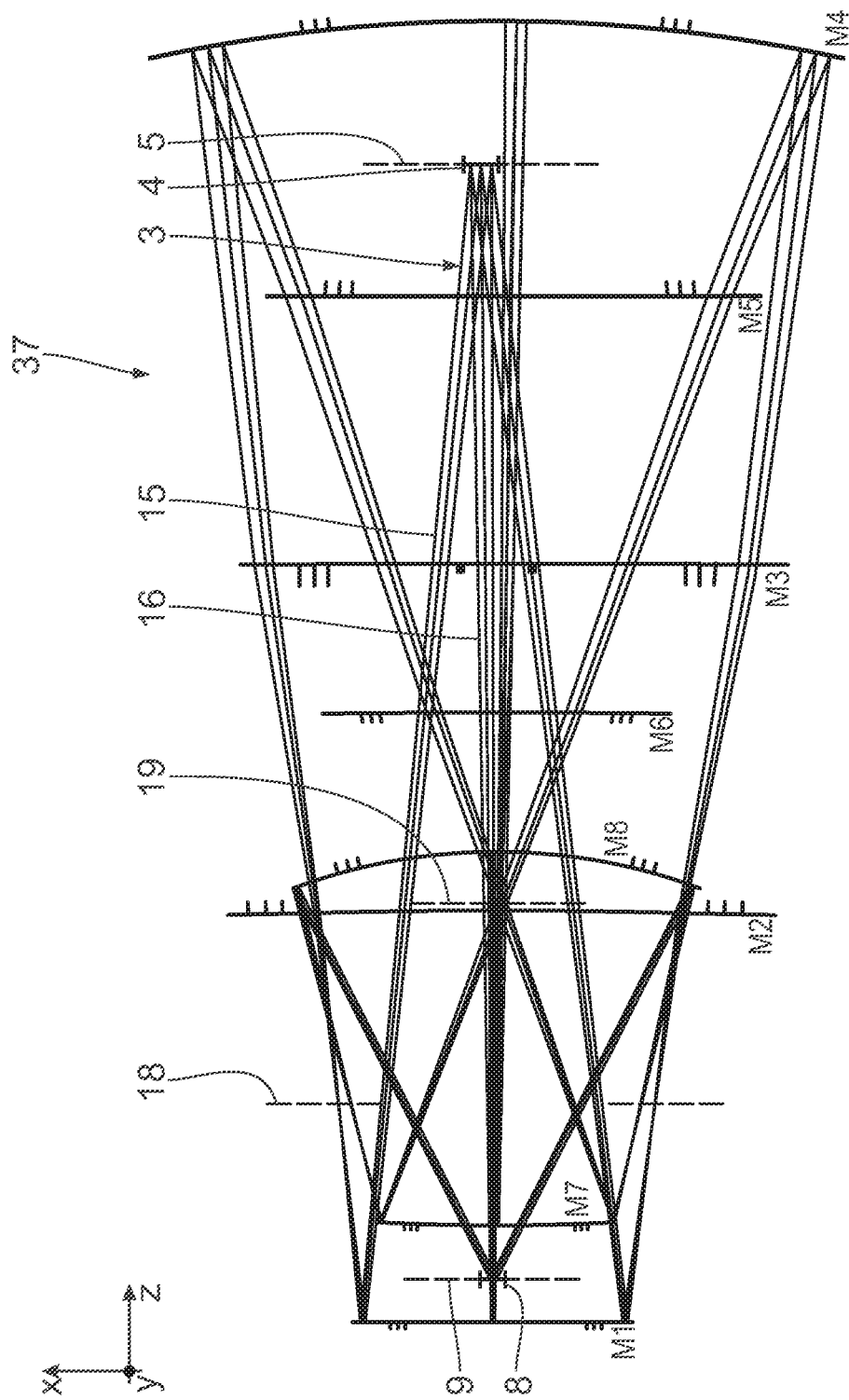
FIG. 27 shows a view of the imaging optical unit according to FIG. 26, seen from the viewing direction XXVII in FIG. 26.

These different imaging scales $\beta_x$, $\beta_y$ lead to an object-side numerical aperture being half the size in the yz-plane compared to the xz-plane, as emerges immediately from comparison between FIGS. 26 and 27. As a result of this, an advantageously small chief ray angle CRAO of 3.6° is obtained in the yz-plane.

The anamorphic effect of the projection optical unit 37 is distributed to all optical surfaces of the mirrors M1 to M8.

The mirrors M1 to M8 are once again embodied as free-form surface mirrors, for which the free-form surface equation (1), specified above, applies. The optical design data from the projection optical unit 37 can be gathered from the following tables, which, in terms of their design, correspond to the tables for the projection optical unit 7 according to FIG. 2.

Table 1 for FIG. 26/27

| Exemplary embodiment | FIG. 26/27 |
|---|---|
| NA | 0.45 |
| Wavelength | 13.5 nm |
| Field dimension x | 26.0 mm |
| Field dimension y | 1.2 mm |
| Field curvature | 0.007085 1/mm |
| Stop | S9 |

Table 2 for FIG. 26/27

| Surface | Radius x [mm] | Power x [1/mm] | Radius y [mm] | Power y [1/mm] | Operating |
|---|---|---|---|---|---|
| M8 | −1175.11369749 | 0.00169070 | −952.26534854 | 0.00211425 | REFL |
| M7 | −3724.82086885 | 0.00050451 | 645.33108835 | −0.00329838 | REFL |
| M6 | 4206.42425174 | −0.00010535 | — | 0.00001879 | REFL |
| M5 | 29363.70859574 | −0.00001475 | 10812.21558149 | −0.00085442 | REFL |
| M4 | −2837.31613225 | 0.00069810 | −1775.43828212 | 0.00113745 | REFL |
| M3 | 14646.09252672 | −0.00002459 | 20193.39993088 | −0.00054992 | REFL |
| M2 | −8591.25984962 | 0.00004428 | −35101.90303378 | 0.00029955 | REFL |
| M1 | — | 0.00004251 | −3327.73936048 | 0.00063940 | REFL |

Table 3a for FIG. 26/27

| Coefficient | M8 | M7 | M6 |
|---|---|---|---|
| KY | 0.00000000 | 0.00000000 | 0.00000000 |
| KX | 0.00000000 | 0.00000000 | 0.00000000 |
| RX | −1175.11369700 | −3724.82086900 | 4206.42425200 |
| C7 | −1.45376933e−08 | 1.36379606e−07 | −7.10374101e−08 |
| C9 | −1.22873208e−08 | −2.63387155e−08 | −3.11941218e−08 |
| C10 | −2.1470539e−11 | 3.8586011e−10 | −2.47199046e−10 |
| C12 | −3.96186575e−11 | 5.63942817e−10 | 4.909512e−11 |
| C14 | −1.98735779e−11 | 2.24402337e−09 | −4.82549835e−11 |
| C16 | −1.30420456e−15 | 7.62990824e−13 | 8.40182189e−13 |
| C18 | −6.32426869e−15 | 5.2611787e−12 | −1.54721191e−13 |
| C20 | −2.91618922e−14 | −8.64296247e−12 | −6.95092865e−14 |
| C21 | −1.68020917e−17 | 1.79337812e−16 | 4.704138e−16 |
| C23 | −6.25679388e−17 | 6.25344238e−15 | −1.98020462e−15 |
| C25 | −8.80198872e−17 | 9.42589658e−15 | 2.8630395e−16 |
| C27 | −2.15377736e−17 | 3.16333951e−15 | −7.77736805e−17 |
| C29 | −4.600369e−20 | 8.50826753e−19 | −8.89962473e−19 |
| C31 | −2.88783883e−20 | 2.46500403e−18 | 5.70734704e−18 |
| C33 | −8.24469634e−20 | 6.11421542e−18 | −4.94608169e−19 |
| C35 | 2.99965283e−20 | 2.68054245e−16 | −5.37362862e−20 |
| C36 | −9.14144609e−23 | −7.61482446e−22 | −1.16419356e−20 |
| C38 | 4.56746146e−23 | −2.10318024e−20 | −9.74634025e−21 |
| C40 | −7.5942581e−23 | −5.13442867e−20 | −1.73898241e−20 |
| C42 | −9.34952004e−23 | −3.80153592e−19 | 1.16341028e−21 |
| C44 | 8.70041492e−23 | −1.58149457e−18 | −5.56161657e−23 |

Table 3a for FIG. 26/27

| Coefficient | M8 | M7 | M6 |
|---|---|---|---|
| C46 | 2.46539099e−25 | 1.26001421e−23 | 2.22991592e−23 |
| C48 | 8.63975279e−26 | 2.26904047e−22 | −1.33814512e−23 |
| C50 | −4.64231072e−26 | −6.94971301e−22 | 2.69140707e−23 |
| C52 | 6.06567137e−26 | −6.14162469e−21 | −5.72930293e−24 |
| C54 | −1.27628469e−25 | −1.39892604e−20 | −3.17383225e−26 |
| C55 | 2.6730632e−28 | 1.6124594e−26 | 2.37901686e−25 |
| C57 | −4.04681746e−28 | 1.79194869e−26 | 5.74908171e−25 |
| C59 | −6.13934671e−28 | −1.07916138e−24 | 5.16858652e−25 |
| C61 | −6.82989222e−28 | −1.84874159e−24 | 2.29934781e−26 |
| C63 | 3.76587364e−29 | 5.28129065e−24 | 1.41744145e−26 |
| C65 | −5.97299103e−28 | 4.17347416e−23 | −6.38021913e−28 |
| C67 | −8.00678063e−31 | −1.43486698e−28 | −1.37565501e−27 |
| C69 | −1.53299808e−30 | −1.07367054e−26 | −2.50594871e−27 |
| C71 | −2.2827634e−30 | −5.11892322e−26 | −1.5202136e−27 |
| C73 | −9.22430613e−31 | 5.3567633e−26 | 5.54122224e−29 |
| C75 | −2.04873095e−31 | 5.18408279e−25 | −2.72156696e−30 |
| C77 | −6.4177289e−32 | 5.33075313e−25 | −1.86793706e−30 |
| C78 | −7.06113511e−34 | −2.43461881e−32 | −2.29557514e−30 |
| C80 | 1.65419247e−33 | −3.36354314e−30 | −3.59407598e−30 |
| C82 | 2.92887405e−33 | −5.11443547e−29 | −5.23025061e−30 |
| C84 | 2.38944422e−33 | −1.21605902e−28 | −1.39956581e−30 |
| C86 | 1.43540305e−33 | 3.51950254e−28 | −9.71779804e−31 |
| C88 | −8.40166712e−34 | 1.05641088e−27 | −2.99362195e−32 |
| C90 | 2.0391317e−33 | 4.65391348e−28 | −5.23904991e−33 |
| C92 | 1.00499798e−36 | −8.58357662e−34 | 1.34776694e−32 |
| C94 | 4.02569735e−36 | 4.77402789e−32 | 4.44047422e−32 |
| C96 | 7.01500616e−36 | 4.67883986e−31 | 4.16406381e−32 |
| C98 | 8.04929982e−36 | 9.55009976e−31 | 1.04273961e−32 |
| C100 | 4.68663927e−36 | −3.2932887e−30 | 1.93974596e−33 |
| C102 | −1.29112855e−37 | −1.71231238e−29 | −1.56753621e−34 |
| C104 | 9.67137076e−37 | −7.97131674e−30 | −1.47926534e−37 |
| C105 | 1.11271388e−39 | −3.44544264e−37 | 8.43323406e−36 |
| C107 | −4.76286158e−39 | 4.82999866e−36 | −3.41901443e−35 |
| C109 | −1.118952e−38 | 3.91182791e−34 | −8.08948161e−35 |
| C111 | −7.53155915e−39 | 2.39245204e−33 | −5.40349834e−35 |
| C113 | 9.30385061e−40 | 2.7404568e−33 | −1.00364838e−35 |
| C115 | 1.87013187e−39 | −2.89625364e−32 | −8.7229565e−37 |
| C117 | 6.90121236e−40 | −5.01404328e−32 | 3.65273911e−37 |
| C119 | −3.74212372e−39 | −4.09799797e−32 | 1.12325475e−38 |
| C121 | −9.54707202e−43 | 0 | 0 |
| C123 | −2.62679834e−42 | 0 | 0 |
| C125 | −8.36961189e−42 | 0 | 0 |
| C127 | −1.27197695e−41 | 0 | 0 |
| C129 | −1.69138752e−41 | 0 | 0 |
| C131 | −1.47039402e−41 | 0 | 0 |
| C133 | −6.44328143e−43 | 0 | 0 |
| C135 | −1.4137325e−42 | 0 | 0 |
| C136 | −6.29707457e−46 | 0 | 0 |
| C138 | 7.90022937e−45 | 0 | 0 |
| C140 | 1.78795966e−44 | 0 | 0 |
| C142 | 9.78046993e−46 | 0 | 0 |
| C144 | −2.43869352e−44 | 0 | 0 |
| C146 | −3.47062344e−44 | 0 | 0 |
| C148 | −1.50798531e−44 | 0 | 0 |
| C150 | 1.06161581e−45 | 0 | 0 |
| C152 | 1.98865409e−45 | 0 | 0 |

Table 3b for FIG. 26/27

| Coefficient | M5 | M4 | M3 |
|---|---|---|---|
| KY | 0.00000000 | 0.00000000 | 0.00000000 |
| KX | 0.00000000 | 0.00000000 | 0.00000000 |
| RX | 29363.70860000 | −2837.31613200 | 14646.09253000 |
| C7 | −4.08679454e−08 | −2.2313771e−08 | −2.40261236e−08 |
| C9 | −8.36871827e−08 | −2.32045837e−07 | −2.73422915e−08 |
| C10 | 2.09705971e−12 | 3.04092615e−12 | −2.9513388e−11 |
| C12 | 2.51272222e−11 | 3.61049914e−11 | −9.15077185e−12 |
| C14 | 1.69227063e−10 | −2.42492909e−10 | 2.00210463e−11 |
| C16 | 5.53060661e−16 | −2.0819334e−15 | 6.86342081e−15 |
| C18 | −9.23199034e−15 | −7.74983288e−14 | 4.41510207e−16 |
| C20 | −4.027388e−13 | −6.80249784e−13 | −2.58531088e−14 |
| C21 | −3.47291575e−18 | 2.26580114e−19 | −2.20608669e−18 |
| C23 | −3.45747429e−17 | 2.377501e−17 | −2.05484907e−17 |
| C25 | −7.65596175e−17 | 5.04278865e−16 | −3.59068158e−17 |
| C27 | 9.79386352e−16 | 7.19302412e−15 | 1.79584203e−16 |
| C29 | 2.90897557e−20 | −1.01345449e−21 | −6.1251551e−21 |
| C31 | 1.0408761e−19 | −1.71410922e−19 | 3.62781965e−20 |
| C33 | 4.42359728e−19 | −2.04391929e−18 | 1.22971099e−19 |
| C35 | −2.18936205e−18 | −1.54712261e−16 | 1.94648572e−18 |
| C36 | 1.30619995e−23 | 1.43899323e−26 | 1.07492344e−23 |
| C38 | −3.65876394e−23 | −3.4203498e−24 | 5.58625518e−23 |
| C40 | −1.52815438e−22 | −7.30927606e−22 | 1.48075572e−22 |
| C42 | −2.96583741e−21 | −1.1688423e−20 | 1.16917436e−21 |
| C44 | 5.7262241e−21 | 3.59003428e−18 | −5.57317878e−21 |
| C46 | −1.6972836e−25 | 1.14473368e−27 | −6.48101479e−28 |
| C48 | −4.74294826e−25 | 5.43217288e−26 | −4.63479637e−25 |
| C50 | −7.95753522e−25 | −1.137132e−23 | −2.24743327e−24 |
| C52 | −3.26107419e−24 | −4.83879624e−22 | −4.28781689e−24 |
| C54 | −2.26528951e−23 | 4.56671842e−20 | −1.67533641e−22 |
| C55 | −4.30900642e−29 | 5.10227319e−31 | −1.05264632e−28 |
| C57 | 2.89748678e−28 | 5.65706438e−29 | −1.05218012e−28 |
| C59 | 2.11195041e−27 | 4.28804717e−27 | −1.31683082e−27 |
| C61 | 5.0160429e−27 | 1.38412296e−24 | −1.05261953e−26 |
| C63 | 7.19967176e−26 | −9.83289711e−24 | −3.85154123e−26 |
| C65 | −4.08256809e−26 | −1.6982784e−21 | −4.65379054e−25 |
| C67 | 5.05025434e−31 | −6.95990045e−33 | −3.11256872e−32 |
| C69 | 1.42714944e−30 | −1.33890648e−30 | 1.65988582e−30 |
| C71 | 7.45092588e−30 | −5.83117347e−29 | 1.56036122e−29 |
| C73 | 1.99335578e−29 | −2.28709957e−26 | 7.80549941e−29 |
| C75 | 6.23811627e−28 | 2.13086029e−25 | 6.62602459e−29 |
| C77 | −2.27266233e−28 | 9.58109313e−24 | 3.88182163e−27 |
| C78 | 5.21616902e−35 | −2.18826289e−37 | 2.25858762e−34 |
| C80 | −3.89851427e−34 | 2.51802019e−35 | 1.96804001e−35 |
| C82 | −6.6719409e−33 | 6.15191756e−34 | 7.16915829e−33 |
| C84 | 2.59908145e−32 | −1.57558885e−30 | 8.22440794e−32 |
| C86 | −2.38366597e−31 | 1.52473073e−28 | 3.31913873e−31 |
| C88 | −6.81072162e−31 | 2.46751442e−27 | 5.7378916e−31 |
| C90 | 2.30360439e−30 | 7.51106446e−26 | 2.96813954e−29 |
| C92 | −8.0899315e−37 | 6.76836149e−29 | 4.61223413e−38 |
| C94 | −9.2704549e−36 | 1.45298999e−36 | −2.33835226e−36 |
| C96 | −6.4688252e−35 | 1.62712528e−34 | −3.24259664e−35 |
| C98 | −9.76323269e−35 | 3.29916833e−32 | −2.83361995e−34 |
| C100 | −1.72013015e−33 | −5.56840797e−31 | −9.31180311e−34 |
| C102 | −1.4852411e−32 | −5.59819448e−29 | −1.23445076e−34 |
| C104 | 1.76323714e−32 | −9.11469106e−28 | 7.59914928e−32 |
| C105 | 2.70851366e−41 | −3.10685744e−43 | −1.38859727e−40 |
| C107 | 2.70717847e−39 | −1.41829562e−40 | 4.12766595e−40 |
| C109 | 4.3484992e−38 | −9.43723768e−39 | −1.19038711e−38 |
| C111 | 7.71332614e−38 | −1.1727652e−36 | −2.06952102e−37 |
| C113 | 3.20979484e−37 | −1.56794917e−34 | −1.38822649e−36 |
| C115 | −2.94924599e−36 | 1.70010457e−33 | −3.67358357e−36 |
| C117 | −3.38333116e−35 | 2.40858822e−31 | −2.35890929e−36 |
| C119 | 5.46219248e−35 | 2.39253918e−30 | 7.02180934e−35 |

Table 3c for FIG. 26/27

| Coefficient | M2 | M1 |
|---|---|---|
| KY | 0.00000000 | 0.00000000 |
| KX | 0.00000000 | 0.00000000 |
| RX | −8591.25985000 | −44223.29270000 |
| C7 | 2.99148093e−08 | −3.51511776e−08 |
| C9 | −2.75260874e−09 | −7.11448809e−08 |
| C10 | 5.55081545e−11 | −4.10270779e−11 |
| C12 | −5.97183171e−12 | −2.8217723e−11 |
| C14 | −4.06031762e−13 | 2.14989264e−10 |
| C16 | −2.79778356e−14 | 1.40795276e−13 |
| C18 | 1.79288313e−14 | 8.05770554e−13 |
| C20 | −3.38327995e−15 | −2.59389473e−13 |
| C21 | −3.48066202e−17 | 4.10045555e−17 |
| C23 | 1.63939639e−17 | −7.17948803e−16 |
| C25 | 1.84526437e−18 | −1.3121289e−15 |
| C27 | −1.02528315e−18 | 2.72912338e−16 |

-continued

Table 3c for FIG. 26/27

| Coefficient | M2 | M1 |
|---|---|---|
| C29 | −1.3014589e−19 | −4.68210382e−20 |
| C31 | −5.87409678e−21 | 1.02547618e−19 |
| C33 | −1.16533212e−20 | −3.15126138e−18 |
| C35 | 5.34922803e−21 | −3.27597939e−18 |
| C36 | 5.03657859e−22 | 3.82370931e−23 |
| C38 | −1.91027438e−22 | 1.12562095e−21 |
| C40 | −7.7852516e−23 | 8.84579475e−21 |
| C42 | −1.1265141e−23 | 6.72624215e−20 |
| C44 | −6.20839372e−25 | −2.03858478e−20 |
| C46 | −2.10802913e−25 | 3.84408406e−24 |
| C48 | 2.31729842e−25 | 4.44222408e−23 |
| C50 | 5.57599755e−26 | −2.10654686e−23 |
| C52 | 7.03833262e−28 | −3.99067489e−22 |
| C54 | −1.44691171e−26 | −4.82876579e−22 |
| C55 | −5.4662909e−28 | −5.75573129e−29 |
| C57 | 7.13770069e−28 | 1.05708712e−26 |
| C59 | 9.05959984e−28 | 4.45669379e−26 |
| C61 | 3.90484003e−28 | −3.24661836e−27 |
| C63 | 2.9845833e−29 | −1.59551772e−24 |
| C65 | −2.62761246e−30 | 4.84788324e−24 |
| C67 | 7.20493267e−31 | −2.6429913e−29 |
| C69 | −1.50894693e−30 | −9.20367529e−28 |
| C71 | −9.91502164e−31 | −4.32416568e−27 |
| C73 | −1.90214439e−31 | 1.34332393e−27 |
| C75 | 2.61487275e−32 | 2.39717536e−26 |
| C77 | 2.34033428e−32 | 2.51255795e−26 |
| C78 | −2.16847329e−33 | −8.54089655e−33 |
| C80 | −3.95387479e−33 | −1.24782323e−31 |
| C82 | −5.79159657e−33 | 1.15198274e−30 |
| C84 | −3.51740059e−33 | 7.37679351e−30 |
| C86 | −9.22238958e−34 | −4.65048215e−30 |
| C88 | −3.05983814e−35 | −6.03530894e−30 |
| C90 | 9.8645578e−36 | −1.90490163e−28 |
| C92 | 1.31596904e−36 | 2.57330157e−35 |
| C94 | 7.63172154e−36 | 2.82127945e−33 |
| C96 | 4.69550164e−36 | 2.41325577e−32 |
| C98 | 1.33696127e−36 | 6.70244162e−32 |
| C100 | 1.54304009e−37 | −8.05861336e−32 |
| C102 | −3.22616636e−38 | −4.38796518e−31 |
| C104 | −1.43000965e−38 | −2.82969243e−31 |
| C105 | 8.01929474e−40 | 3.73241981e−38 |
| C107 | 3.2676891e−39 | 1.45855716e−36 |
| C109 | 7.46821996e−39 | 3.02629332e−36 |
| C111 | 9.81393372e−39 | −3.70759447e−35 |
| C113 | 4.50117184e−39 | −1.1474833e−34 |
| C115 | 7.30739397e−40 | 5.05238578e−34 |
| C117 | 1.09045016e−42 | 1.19088272e−33 |
| C119 | −8.75346337e−42 | 3.36419998e−33 |

Table 4a for FIG. 26/27

| Surface | DCX | DCY | DCZ |
|---|---|---|---|
| Image plane | 0.00000000 | 0.00000000 | 0.00000000 |
| M8 | 0.00000000 | 0.00000000 | 859.88832187 |
| M7 | 0.00000000 | −176.20561941 | 108.16423659 |
| M6 | 0.00000000 | −698.54439441 | 1140.58633390 |
| M5 | −0.00000000 | −716.55400301 | 1977.10005031 |
| M4 | 0.00000000 | −472.43792140 | 2531.29159348 |
| M3 | 0.00000000 | −1379.51266357 | 1438.63634577 |
| M2 | 0.00000000 | −2608.29927284 | 741.99389453 |
| Stop | 0.00000000 | −2918.25887054 | 352.59739373 |
| M1 | 0.00000000 | −3267.93714103 | −86.69693993 |
| Object plane | 0.00000000 | −3324.46014880 | 2242.98343748 |

Table 4b for FIG. 26/27

| Surface | TLA [deg] | TLB [deg] | TLC [deg] |
|---|---|---|---|
| Image plane | −0.00000000 | 0.00000000 | −0.00000000 |
| M8 | −6.59603822 | 0.00000000 | −0.00000000 |
| M7 | 186.82219104 | 0.00000000 | −0.00000000 |
| M6 | 104.03490485 | −0.00000000 | 0.00000000 |
| M5 | 78.73015909 | −0.00000000 | −0.00000000 |
| M4 | −31.73550573 | −0.00000000 | −0.00000000 |
| M3 | 219.92622552 | −0.00000000 | −0.00000000 |
| M2 | 40.51532074 | 0.00000000 | −0.00000000 |
| Stop | 19.04239581 | 180.00000000 | 0.00000000 |
| M1 | 161.43502849 | −0.00000000 | −0.00000000 |
| Object plane | −2.21167135 | 0.00000000 | −0.00000000 |

Table 5 for FIG. 26/27

| Surface | Angle of incidence [deg] | Reflectivity |
|---|---|---|
| M8 | 6.59603822 | 0.66110189 |
| M7 | 20.01426748 | 0.61355760 |
| M6 | 77.19844633 | 0.83904083 |
| M5 | 77.49680791 | 0.84348513 |
| M4 | 7.96247272 | 0.65888448 |
| M3 | 79.62420397 | 0.87332138 |
| M2 | 79.03510874 | 0.86535589 |
| M1 | 19.95481648 | 0.61393176 |
| Overall transmission | | 0.0878 |

Table 6 for FIG. 26/27

| X [mm] | Y [mm] | Z [mm] |
|---|---|---|
| 0.00000000 | −219.15646259 | 0.00000000 |
| 46.68638707 | −216.35703508 | 0.00000000 |
| 92.44920291 | −208.03952648 | 0.00000000 |
| 136.36850701 | −194.43093148 | 0.00000000 |
| 177.53246672 | −175.88140650 | 0.00000000 |
| 215.04126471 | −152.86453345 | 0.00000000 |
| 248.01037220 | −125.99517818 | 0.00000000 |
| 275.57900231 | −96.03396498 | 0.00000000 |
| 296.93376542 | −63.85746854 | 0.00000000 |
| 311.35383746 | −30.38963121 | 0.00000000 |
| 318.27003544 | 3.49290551 | 0.00000000 |
| 317.31667274 | 37.05306325 | 0.00000000 |
| 308.35620881 | 69.73467689 | 0.00000000 |
| 291.47003488 | 101.08900987 | 0.00000000 |
| 266.93645742 | 130.63667071 | 0.00000000 |
| 235.22482493 | 157.78791628 | 0.00000000 |
| 197.00574657 | 181.83055596 | 0.00000000 |
| 153.16053621 | 201.92815248 | 0.00000000 |
| 104.79070426 | 217.17246634 | 0.00000000 |
| 53.22556587 | 226.71903168 | 0.00000000 |
| 0.00000000 | 229.97244838 | −0.00000000 |
| −53.22556587 | 226.71903168 | 0.00000000 |
| −104.79070426 | 217.17246634 | 0.00000000 |
| −153.16053621 | 201.92815248 | −0.00000000 |
| −197.00574657 | 181.83055596 | 0.00000000 |
| −235.22482493 | 157.78791628 | 0.00000000 |
| −266.93645742 | 130.63667071 | 0.00000000 |
| −291.47003488 | 101.08900987 | 0.00000000 |
| −308.35620881 | 69.73467689 | 0.00000000 |
| −317.31667274 | 37.05306325 | 0.00000000 |
| −318.27003544 | 3.49290551 | 0.00000000 |
| −311.35383746 | −30.38963121 | 0.00000000 |
| −296.93376542 | −63.85746854 | 0.00000000 |
| −275.57900231 | −96.03396498 | 0.00000000 |
| −248.01037220 | −125.99517818 | 0.00000000 |
| −215.04126471 | −152.86453345 | 0.00000000 |
| −177.53246672 | −175.88140650 | 0.00000000 |
| −136.36850701 | −194.43093148 | 0.00000000 |

-continued

Table 6 for FIG. 26/27

| X [mm] | Y [mm] | Z [mm] |
|---|---|---|
| −92.44920291 | −208.03952648 | 0.00000000 |
| −46.68638707 | −216.35703508 | 0.00000000 |

An overall reflectivity of the projection optical unit 37 is 8.78%.

The projection optical unit 37 has an image-side numerical aperture of 0.45. The image field 8 has an x-extent of two times 13 mm and a y-extent of 1.20 mm. The projection optical unit 37 is optimized for an operating wavelength of the illumination light 3 of 13.5 nm.

The projection optical unit 37 has exactly eight mirrors M1 to M8. The mirrors M2 and M3 on the one hand, and M5, M6 on the other hand are embodied as mirrors for grazing incidence and are arranged in each case as a mirror pair directly behind one another in the imaging beam path. The mirrors M2 and M3 deflect the chief rays 16 in opposite directions in the xy-plane. The projection optical unit 37 has exactly four mirrors for grazing incidence, namely the mirrors M2, M3, M5 and M6. The mirrors M1, M4, M7 and M8 are embodied as mirrors for normal incidence.

In the projection optical unit 37, a stop 18 is arranged in the beam path between the mirrors M1 and M2, near the grazing incidence on the mirror M2. Alternatively or additionally, a stop can be arranged directly on the surface of the mirror M2.

In the xz-plane (cf. FIG. 27), an entrance pupil of the projection optical unit 37 lies 3000 mm after the object field 4 in the beam path of the illumination light. In the yz-plane, the entrance pupil lies 3100 mm after the object field in the imaging beam path of the projection optical unit 37. An extent of the chief rays 16 emanating from the object field 4 is therefore convergent both in the meridional section according to FIG. 26 and in the view according to FIG. 27.

In the xz-section (cf. FIG. 27), the stop 18 can lie at a position displaced in the z-direction compared to its position in the yz-section.

A z-distance between the object field 4 and the image field 8 is approximately 2100 mm.

An object/image offset ($d_{OIS}$) is approximately 3400 mm.

A free working distance between the mirror M7 and the image field 8 is 86 mm.

In the projection optical unit 37, a scanned RMS value for the wavefront aberration is at most 18 m$\lambda$ and, on average, 14 m$\lambda$.

A maximum distortion value is at most 0.15 nm in the x-direction and at most 0.14 nm in the y-direction. A telecentricity value in the x-direction is at most 1.17 mrad on the image field-side and a telecentricity value in the y-direction is at most 2.77 mrad on the image field-side.

Further mirror data emerge from the following table.

Table 7 for FIG. 26/27

|  | M1 | M2 | M3 | M4 | M5 | M6 | M7 | M8 |
|---|---|---|---|---|---|---|---|---|
| Maximum angle of incidence [deg] | 21.3 | 81.7 | 83.1 | 8.8 | 78.7 | 80.3 | 31.6 | 8.5 |
| Mirror extent (x) [mm] | 548.7 | 753.9 | 1041.9 | 1335.9 | 970.3 | 391.0 | 475.7 | 814.4 |
| Mirror extent (y) [mm] | 282.8 | 1204.8 | 373.1 | 115.5 | 344.4 | 626.7 | 219.4 | 791.0 |
| Maximum mirror diameter [mm] | 548.7 | 1204.8 | 1042.0 | 1336.0 | 970.3 | 628.1 | 475.8 | 815.2 |

There is an intermediate image 19 in the beam path in the region of a reflection on the mirror M3 in the yz-plane (FIG. 26) and in the imaging beam path region between the mirrors M6 and M7 parallel to the xz-plane (FIG. 27).

The last mirror M8 in the beam path is not obscured. The illumination light 3 is guided past the continuously used mirror M8 in the partial beam path between the mirrors M6 and M7. All mirrors M1 to M8 have a continuously used reflection surface.

The mirrors M1, M2, M4, M6 and M8 have negative values for the radius, i.e. are, in principle, concave mirrors. The other mirrors M3, M5 and M7 have positive values for the radius, i.e. are, in principle, convex mirrors. The mirrors M2, M3, M5 and M6 for grazing incidence have very large radii and only constitute small deviations from plane reflection surfaces.

Some of the data of the above-described projection optical units are once again summarized in the following Tables I and II. The respective first column serves to assign the data to the respective exemplary embodiment.

The following Table I summarizes the following optical parameters: numerical aperture (NA), image field extent in the x-direction (Fieldsize X), image field extent in the y-direction (Fieldsize Y), image field curvature (Field Curvature) and overall reflectivity or system transmission (Transmission).

The following Table II specifies the following parameters: "order of the mirror types" (Mirror Type Order), "order of the mirror deflection effect" (Mirror Rotation Order), "refractive power order in the xz-plane" (x Power Order) and "refractive power order in the yz-plane" (y Power Order). These sequences in each case start with the last mirror in the beam path, i.e. follow the reverse beam direction. By way of example, the sequence "L0RRLLLR" relates to the deflection effect in the sequence M8 to M1 in the embodiment according to FIG. 2.

TABLE 1

| FIG. | NA | FIELDSIZE X [mm] | FIELDSIZE Y [mm] | FIELD CURVATURE [1/mm] | TRANS-MISSION % |
|---|---|---|---|---|---|
| 2 | 0.45 | 13 | 0.784 | 0 | 10.43 |
| 3 | 0.45 | 13 | 0.95 | 0 | 13.09 |
| 4 | 0.45 | 13 | 0.72 | 0 | 13.32 |
| 5 | 0.45 | 13 | 0.98 | 0 | 14.73 |
| 6 | 0.45 | 13 | 0.784 | 0 | 8.11 |
| 7 | 0.45 | 13 | 0.784 | 0 | 9.88 |
| 8 | 0.45 | 13 | 0.784 | 0 | 10.04 |
| 9 | 0.45 | 13 | 0.784 | 0 | 8.83 |
| 10 | 0.45 | 13 | 0.784 | 0 | 7.89 |
| 14, 15 | 0.6 | 13 | 1.2 | 0.04931455 | 8.67 |
| 16, 17 | 0.63 | 13 | 1.2 | 0 | 9.95 |
| 18, 19 | 0.55 | 13 | 1.2 | 0 | 10.03 |
| 20, 21 | 0.55 | 26 | 1.2 | 0 | 10.17 |
| 22, 23 | 0.49 | 26 | 1.6 | 0 | 10.15 |
| 24, 25 | 0.5 | 26 | 1.2 | 0 | 10.12 |
| 26, 27 | 0.45 | 26 | 1.2 | 0.0070855 | 8.78 |

TABLE 2

| FIG. | MIRROR TYPE ORDER | MIRROR ROTATION ORDER | x POWER ORDER | y POWER ORDER |
|---|---|---|---|---|
| 2 | NNGGNGGN | L0RRLLLR | +−−++++− | +−−++−++ |
| 3 | NNNNGG | 00RLLL | +−−−++ | +−−+−+ |
| 4 | NNNNGG | R0RRRR | +−−+++ | +−−+−+ |
| 5 | NNNNGGG | 00RLRLR | +−−+−+ | +−−+−−+ |
| 6 | NNGGNGGN | RRLRRLRL | +−−+++−+ | +−−+−−+ |
| 7 | NNGGNGGN | R0LRRLRL | +−−+++++ | +−+−++−+ |
| 8 | NNGGNGGN | R0RLRLRL | +−−++−++ | +−−+++−+ |
| 9 | NNGGNGGN | R0LLRRRL | +−+−+−−+ | +−−−+−++ |
| 10 | NNGGNGGNG | R0LLRRRLL | +−+−+−−+− | +−−−+−++− |
| 14, 15 | NNGGNGGN | LRRRLLLR | +−−++++− | +−+−++−+ |
| 16, 17 | NNGGNGGN | LRRRLLLR | +−−−+++− | +−−−++−+ |
| 18, 19 | NNGGNGGN | L0RRLLLR | +−−−+++− | +−−−++−+ |
| 20, 21 | NNGGNGGN | L0RRLLLR | +−−−++++ | +−−−++−+ |
| 22, 23 | NNGGNGGN | L0RRLLLR | +−−−++++ | +−+−++−+ |
| 24, 25 | NNGGNGGN | L0RRLLLR | +−−−++++ | +−−+++−+ |
| 26, 27 | NNGGNGGN | LRRRLRLR | ++−−+−++ | +−+−+−++ |

In the mirror type, the specification "N" relates to a normal incidence (NI) mirror and the designation "G" relates to a grazing incidence (GI) mirror. In the refractive power orders, "+" denotes a concave mirror surface and "−" denotes a convex mirror surface. When comparing the refractive power orders in x and y, it is possible to see that practically all exemplary embodiments, with the exception of e.g. the embodiment according to FIG. 5, have different refractive power orders in x and y. By way of example, the mirror M1 of the embodiment according to FIG. 2 is convex (refractive power "−", negative refractive power) in the x-direction and concave (refractive power "+", positive refractive power) in the y-direction. These mirrors with different signs of the refractive power in x and y constitute saddle surfaces.

With the exception of the embodiments according to FIGS. 5 and 10, GI mirrors always occur in pairs, as can be gathered from the order of the mirror types in Table II. In the embodiment according to FIG. 5, three GI mirrors lie one behind the other, namely the mirrors M1 to M3. In the embodiment according to FIG. 10, there is a single GI mirror, namely the mirror M1.

The orders of the mirror types of the embodiments according to FIGS. 6 to 9 and 14 to 27 are identically NNGGNGGN for mirrors M8 to M1. The embodiments according to FIGS. 14 to 17 and 27 have an identical deflection effect order, namely LRRRLLLR, for mirrors M8 to M1. The embodiments according to FIGS. 18 to 25 in turn have an identical deflection effect order, namely L0RRLLLR, for mirrors M8 to M1.

In respect of the refractive power order, the embodiment according to FIG. 7 has five successive mirrors with positive refractive power in the xz-plane, namely mirrors M1 to M5. Other embodiments have up to four successive mirrors with positive refractive power in the xz-plane. The embodiments according to FIGS. 8 and 22 have three mirrors arranged behind one another with in each case a positive refractive power in the yz-plane, namely mirrors M3 to M5 in each case. The other exemplary embodiments, the design data of which were discussed above, do not have more than two successive mirrors with positive refractive power in the yz-plane.

A plurality of embodiments of the above-described projection optical units do not have two successive mirrors with positive refractive power in either the xz-plane or in the yz-plane. The embodiment according to FIG. 5 does not have two successive mirrors with positive refractive power in both planes xz and yz.

In order to produce a microstructured or nanostructured component, the projection exposure apparatus 1 is used as follows: initially, the reflection mask 10 or the reticle and the substrate or the wafer 11 are provided. Subsequently, a structure on the reticle 10 is projected onto a light-sensitive layer of the wafer 11 with the aid of the projection exposure apparatus 1. By developing the light-sensitive layer, a microstructure or nanostructure is then generated on the wafer 11, and hence the microstructured component is generated.

What is claimed is:

1. An EUV projection optical unit configured to image an object field in an image field, the EUV projection optical unit comprising:
   a plurality of mirrors configured to guide imaging light from the object field to the image field,
   wherein:
   the EUV projection optical unit has an image-side numerical aperture of at least 0.4;
   an overall reflectivity of the EUV projection optical unit is a product of the reflectivity of each of the plurality of mirrors;
   the overall reflectivity of the EUV projection optical unit is greater than 7%; and
   the EUV projection optical unit has a total of eight mirrors.

2. The EUV projection optical unit of claim 1, wherein:
   the plurality of mirrors is configured to guide the imaging light from the object field to the image field along a beam path;
   the plurality of mirrors comprises first and second mirrors;
   the second mirror is directly behind the first mirror in the beam path; and
   for each of the first and second mirrors, an angle of incidence of the imaging light with the mirror is greater than 60°.

3. The EUV projection optical unit of claim 2, wherein, among the plurality of mirrors, only the first and second mirrors have an angle of incidence of the imaging light with the mirror is greater than 60°.

4. The EUV projection optical unit of claim 2, wherein:
   the plurality of mirrors further comprises third and fourth mirrors; and
   among the plurality of mirrors, only the first, second, third and fourth mirrors have an angle of incidence of the imaging light with the mirror is greater than 60°.

5. The EUV projection optical unit of claim 4, wherein:
the second mirror is directly behind the first mirror in the beam path; and
the fourth mirror is directly behind the third mirror in the beam path.

6. The EUV projection optical unit of claim 1, wherein:
the object field is in an object plane of the EUV projection optical unit;
the image field is in an image plane of the EUV projection optical unit; and
an angle between the object plane and the image plane is different from 0°.

7. The EUV projection optical unit of claim 1, wherein the EUV projection optical unit comprises at least two mirrors configured to have an angle of incidence with the imaging light that is less than 45°.

8. The EUV projection optical unit of claim 1, wherein the EUV projection optical unit comprises at least four mirrors configured to have an angle of incidence with the imaging light that is less than 45°.

9. The EUV projection optical unit of claim 1, wherein the overall reflectivity of the EUV projection optical unit is greater than 9%.

10. The EUV projection optical unit of claim 1, wherein the EUV projection optical unit has an object-side chief ray angle for a field center point that is less than 7°.

11. The EUV projection optical unit of claim 10, wherein the image field has an extent of more than 13 mm along a field dimension.

12. The EUV projection optical unit of claim 1, wherein the image field has an extent of more than 13 mm along a field dimension.

13. The EUV projection optical unit of claim 12, wherein the extent of the image field is more than 20 mm along the field dimension.

14. The EUV projection optical unit of claim 1, wherein the image-side numerical aperture is at least 0.5.

15. The EUV projection optical unit of claim 1, wherein at least one of the mirrors has a free-form reflection surface.

16. An optical system, comprising:
an EUV projection optical unit according to claim 1; and
an illumination optical unit configured to illuminate the object field with illumination and imaging light.

17. The optical system of claim 16, further comprising an EUV light source.

18. The optical system of claim 16, wherein the optical system is an EUV projection exposure apparatus.

19. The optical system of claim 18, further comprising a reticle holder configured to hold a reticle, wherein the reticle holder is configured to move the reticle in a scanning direction, and an imaging scale of the EUV projection optical unit in the scanning direction is greater than in a direction perpendicular thereto.

20. A method of using an EUV projection exposure apparatus comprising an EUV projection optical unit and an illumination optical unit, the method comprising:
using the illumination optical unit to illuminate an object plane; and
using the EUV projection optical unit to project the illuminated object plane onto a field plane,
wherein the EUV projection optical unit comprises EUV projection optical unit according to claim 1.

* * * * *

UNITED STATES PATENT AND TRADEMARK OFFICE
CERTIFICATE OF CORRECTION

PATENT NO. : 10,558,026 B2
APPLICATION NO. : 16/139474
DATED : February 11, 2020
INVENTOR(S) : Markus Schwab Page 1 of 1

It is certified that error appears in the above-identified patent and that said Letters Patent is hereby corrected as shown below:

In the Specification

Column 18, Line 46, delete "do's" and insert -- $d_{OIS}$ --;

Column 24, Line 12, delete "do's," and insert -- $d_{OIS}$, --;

Column 31, Line 24 (approx.), delete "l/mm" and insert -- 1/mm --;

Column 36, Line 26 (approx.), delete "l/mm" and insert -- 1/mm --.

Signed and Sealed this
Fifth Day of May, 2020

Andrei Iancu
*Director of the United States Patent and Trademark Office*